US008728686B2

(12) United States Patent
Tsuchimura

(10) Patent No.: US 8,728,686 B2
(45) **Date of Patent: *May 20, 2014**

(54) PHOTOSENSITIVE COMPOSITIONS, CURABLE COMPOSITIONS, NOVEL COMPOUNDS, PHOTOPOLYMERIZABLE COMPOSITIONS, COLOR FILTERS, AND PLANOGRAPHIC PRINTING PLATE PRECURSORS

(75) Inventor: Tomotaka Tsuchimura, Shizuoka-ken (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 1054 days.

This patent is subject to a terminal disclaimer.

(21) Appl. No.: 12/174,883

(22) Filed: Jul. 17, 2008

(65) Prior Publication Data

US 2009/0023085 A1 Jan. 22, 2009

(30) Foreign Application Priority Data

| | | |
|---|---|---|
| Jul. 17, 2007 | (JP) | 2007-185795 |
| Aug. 27, 2007 | (JP) | 2007-220226 |
| Jan. 18, 2008 | (JP) | 2008-009317 |

(51) Int. Cl.
*G03F 1/00* (2012.01)
*G03C 1/00* (2006.01)

(52) U.S. Cl.
USPC .......................... 430/7; 430/270.1; 430/281.1

(58) Field of Classification Search
USPC ....................................... 430/7, 270.1, 281.1
See application file for complete search history.

(56) References Cited

U.S. PATENT DOCUMENTS 3,558,309 A 1/1971 Laridon et al.
4,255,513 A 3/1981 Laridon et al.

(Continued)

FOREIGN PATENT DOCUMENTS

DE 10061947 A1 6/2001
EP 0009832 A2 4/1980

(Continued)

OTHER PUBLICATIONS

Translation JP-2007-119686(May 2007).*

(Continued)

*Primary Examiner* — Stewart Fraser
(74) *Attorney, Agent, or Firm* — Buchanan Ingersoll & Rooney PC

(57) ABSTRACT

A photosensitive composition includes a compound represented by Formula (I) and a curable composition contains the compound of Formula (I) and a polymerizable compound. A compound is represented by a Formula (1) and a photocurable composition contains the compound of Formula (1) and a polymerizable compound. In Formula (I), R, $R^1$ and $R^2$ each independently represent a hydrogen atom or a monovalent substituent. In Formula (1), R and B each independently represent a monovalent substituent, A represents a divalent organic group, and Ar represents an aryl group.

(I)

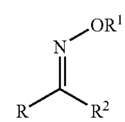

(1)

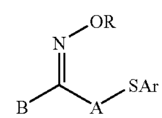

28 Claims, 2 Drawing Sheets

(56) References Cited

U.S. PATENT DOCUMENTS

| | | | | |
|---|---|---|---|---|
| 4,590,145 | A | 5/1986 | Itoh et al. | |
| 5,703,140 | A | 12/1997 | Kunita et al. | |
| 6,703,182 | B1 * | 3/2004 | Birbaum et al. | 430/270.1 |
| 6,949,678 | B2 | 9/2005 | Kunimoto et al. | |
| 2001/0012596 | A1 | 8/2001 | Kunimoto et al. | |
| 2004/0170924 | A1 | 9/2004 | Kunimoto et al. | |
| 2005/0191567 | A1 | 9/2005 | Kunimoto et al. | |
| 2007/0072096 | A1 * | 3/2007 | Takakuwa et al. | 430/7 |
| 2007/0128548 | A1 * | 6/2007 | Kim et al. | 430/281.1 |
| 2008/0096133 | A1 | 4/2008 | Kato et al. | |
| 2011/0025981 | A1 | 2/2011 | Redmann et al. | |

FOREIGN PATENT DOCUMENTS

| | | | | |
|---|---|---|---|---|
| EP | 0 567 828 | | | 11/1993 |
| EP | 0724197 | A1 | | 7/1996 |
| EP | 1635220 | A2 | | 3/2006 |
| EP | 1 826 200 | A2 | | 8/2007 |
| EP | 1887425 | A1 | | 2/2008 |
| JP | 06-080621 | | | 3/1994 |
| JP | 08-202035 | | | 8/1996 |
| JP | 09-062001 | | * | 3/1997 |
| JP | 2000-080068 | A | | 3/2000 |
| JP | 2000-314956 | A | | 11/2000 |
| JP | 2001-233842 | A | | 8/2001 |
| JP | 2004-534797 | A | | 11/2004 |
| JP | 2005-187678 | A | | 7/2005 |
| JP | 2005-202252 | A | | 7/2005 |
| JP | 2006-036750 | | | 2/2006 |
| JP | 2006-072134 | A | | 3/2006 |
| JP | 2006-195425 | A | | 7/2006 |
| JP | 2006-010793 | | | 11/2006 |
| JP | 2006-351996 | | | 12/2006 |
| JP | 2007-108629 | A | | 4/2007 |
| JP | 2007-119686 | | * | 5/2007 |
| JP | 2007-219362 | A | | 8/2007 |
| JP | 2008-065040 | A | | 3/2008 |
| JP | 2008-089732 | A | | 4/2008 |
| WO | WO 2005-080337 | | | 9/2005 |
| WO | WO 2006/059458 | A1 | | 6/2006 |
| WO | WO 2006-129697 | | | 12/2006 |
| WO | WO 2008/032652 | A1 | | 3/2008 |

OTHER PUBLICATIONS

Translation of JP-09-062001(Mar. 1997).*

Office Action issued in a corresponding Taiwanese Patent Application dated Jun. 28, 2013.

Notice of Reasons for Rejection issued in corresponding Japanese Patent Application No. 2008-185872 dated Oct. 16, 2012.

Office Action issued in corresponding Japanese Patent Application No. 2008-185872 dated Feb. 12, 2013.

Yamanaka et al., Studies on Pyrimidine Derivatives. VIII. Ring-Cleavage Reaction of 4,6-Dimethylpyrimidine 1-oxide, Chemical & Pharmaceutical Bulletin, 1978, vol. 26, No. 11, pp. 3404-3409.

Severin et al., Verlangerung CH-acider Verbindungen um eine gerade Anzahl von Methingruppen durch Umsetzung mit Nitroenamien, Chemische Berichte, 1978, vol. 111, No. 2, pp. 692-697.

Song Yang, et al, Synthesis and anti-TMV activity of 2-(Benzo[d]thiazol-2-ylthio)-1-(2,3,4-trimethoxyphenyl) Ethanoxime Ester and Derivatives, Youji Huaxe, 2005 25(9), pp. 1116-1120.

Bao-An Song, et al., Synthesis and Anticancer Activity of 2,3,4-trimethoxyacetophenoxime Ester Containing Benzothiazole Moiety, Chinese Journal of Chemistry, 2005, 23(9), pp. 1236-1240.

Office Action issued in corresponding Chinese Patent Application No. 20120023983.1 dated Sep. 16, 2013 with English translation.

Office Action issued in corresponding Korean Patent Application No. 2008-0069416 dated Jan. 17, 2014, with English translation.

* cited by examiner

PHOTOSENSITIVE COMPOSITIONS, CURABLE COMPOSITIONS, NOVEL COMPOUNDS, PHOTOPOLYMERIZABLE COMPOSITIONS, COLOR FILTERS, AND PLANOGRAPHIC PRINTING PLATE PRECURSORS

CROSS REFERENCE TO RELATED APPLICATIONS

This application claims priority under 35 USC 119 from Japanese patent Application Nos. 2007-185795, 2007-220226, and 2008-009317, the disclosures of which are incorporated by reference herein.

BACKGROUND OF THE INVENTION

1. Field of the Invention

The present invention relates to photosensitive compositions, curable compositions, curable compositions for color filters, color filters, and methods for production thereof. The invention also relates to novel oxime compounds, photopolymerizable compositions, photopolymerizable compositions for color filters, color filters and methods for production thereof, solid-state imaging devices, and planographic printing plate precursors.

2. Description of Related Art

Photosensitive or photopolymerizable compositions may include, for example, an ethylenic unsaturated bond-containing polymerizable compound and a photopolymerization initiator. Such photosensitive or photopolymerizable compositions polymerize and cure when they are irradiated with light, and are therefore used for, for example, photosetting inks, photosensitive printing plates, color filters, and a variety of photoresists.

In other types of photosensitive or photopolymerizable compositions, for example, an acid is generated upon application of light, and the acid serves as a catalyst. Specifically, such compositions may be used in materials for image formation, anti-counterfeiting or detection of energy-ray dose, in which a color reaction of a pigment precursor in the presence of the generated acid serving as a catalyst is used, or may be used for positive resists for use in manufacture of semiconductors, TFTs, color filters, micromachine components, and the like, in which a decomposition reaction in the presence of the generated acid serving as a catalyst is used.

In recent years, photosensitive or photopolymerizable compositions sensitive to shorter wavelength (365 nm or 405 nm) light sources have been demanded in various applications, and demands for such compounds (e.g. photopolymerizable initiators) capable of exhibiting high sensitivity to such short wavelength light sources have been increasing. However, highly sensitive photopolymerization initiators are generally poor in stability. Therefore, there is a demand for photopolymerization initiators having both of improved sensitivity and stability over time.

Under the circumstances, it is proposed to use oxime ester derivatives as photopolymerization initiators for photosensitive or photopolymerizable compositions, for example in U.S. Pat. Nos. 4,255,513 and 4,590,145 and Japanese Patent Application Laid-Open (JP-A) Nos. 2000-80068 and 2001-233842. However, these known oxime ester compounds have low absorbance at a wavelength of 365 nm or 405 nm and are not satisfactory in terms of sensitivity.

At present, there have been a demand for photosensitive or photopolymerizable compositions having not only high stability over time but also high sensitivity to light with a short wavelength such as 365 nm or 405 nm.

For example, JP-A No. 2006-195425 discloses a colored radiation-sensitive composition for color filters that contains an oxime compound. However, the stability over time and short-wavelength sensitivity of such a composition is still insufficient. There have also been a demand for colored radiation-sensitive compositions having improved reproducibility of hue after pattern formation, and suppression of change in coloring property over time has been strongly demanded.

On the other hand, there have been a demand for color filters for image sensors having high color concentrations and small thicknesses, in order to enhance the light-gathering power of solid-state imaging devices such as CCDs and in order to improve the image quality by improving color-separation properties. If a large amount of a coloring material is added to achieve a high color concentration, the sensitivity may be insufficient for faithful reproduction of the shape of a fine image pattern of 2.5 μm or less, so that pattern defects can frequently occur over the product. In order to avoid such defects, photo-irradiation has to be performed with higher energy, which requires a long exposure time and leads to a significant reduction in manufacturing yield. Under the circumstances, there have been a demand for colored radiation-sensitive compositions for color filters having a high content of a coloring material (colorant) and also having high sensitivity in order to achieve excellent pattern forming property.

SUMMARY OF THE INVENTION

It is an object of the present invention to provide a photosensitive composition and a curable composition having high sensitivity to light with a wavelength of 365 nm or 405 nm and having high stability over time.

It is another object of the invention to provide a curable composition for a color filter, wherein the curable composition has high stability over time and excellent pattern forming property, can be cured with high sensitivity, and can form a colored pattern with excellent adhesion to a support.

It is still another object of the invention to provide a color filter that is produced by using the curable composition for a color filter, has an excellent pattern shape and includes a colored pattern with excellent adhesion to a support, and to provide a method capable of producing such a color filter with high productivity.

As a result of investigations, the inventor has found that the use of a specific oxime compound is effective in achieving high absorbance of light with a wavelength of 365 nm or 405 nm and in providing high stability over time.

A curable composition according to the invention includes a compound represented by the following Formula (I).

(I)

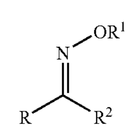

In Formula (I), R, $R^1$ and $R^2$ each independently represent a hydrogen atom or a monovalent substituent.

The compound represented by Formula (I) preferably has a molar absorption coefficient of 20,000 or more at 365 nm or 405 nm.

In the photosensitive composition of the invention, the compound represented by Formula (I) is preferably a compound represented by the following Formula (I-I).

(I-I)

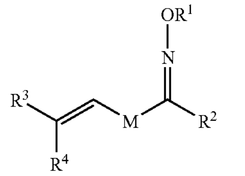

In Formula (I-I), $R^1$ and $R^2$ each independently represent a hydrogen atom or a monovalent substituent, M represents a divalent linking group, and $R^3$ and $R^4$ each independently represent a hydrogen atom or a monovalent substituent. $R^3$ and $R^4$ may be bonded to each other to form a ring.

In the photosensitive composition of the invention, the compound represented by Formula (I) is preferably a compound represented by the following Formula (I-II).

(I-II)

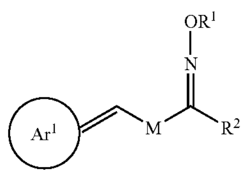

In Formula (I-II), $R^1$ and $R^2$ each independently represent a hydrogen atom or a monovalent substituent, M represents a divalent linking group, and $Ar^1$ represents a hydrocarbon ring group or a heterocyclic group.

The curable composition of the invention may include the compound represented by Formula (I) and a polymerizable compound. In particular, the compound represented by Formula (I) is preferably a compound represented by Formula (I-I), more preferably a compound represented by Formula (I-II).

The curable composition of the invention preferably includes at least selected from the group consisting of a sensitizer, a thiol compound and a colorant.

A curable composition for a color filter according to the invention includes the above-mentioned curable composition of the invention.

A color filter according to the invention includes a colored pattern provided on a support, the colored pattern being produced by using the above-mentioned curable composition for a color filter.

A method for producing a color filter according to the invention includes: applying the curable composition for a color filter to a support to form a curable composition layer; exposing the curable composition layer to light through a mask; and developing the exposed composition layer to form a colored pattern.

According to the invention, a photosensitive composition and a curable composition having high sensitivity to light with a wavelength of 365 nm or 405 nm and having high stability over time may be provided.

According to the invention, a curable composition for a color filter may be provided which has high stability over time and excellent pattern forming property, and which can be cured with high sensitivity and can form a colored pattern with excellent adhesion to a support.

According to the invention, a color filter may be provided which is obtained by using the curable composition for a color filter, and which has an excellent pattern shape and includes a colored pattern with excellent adhesion to a support. A method capable of producing such a color filter with high productivity may be also provided.

It is another object of the invention to provide a photopolymerizable composition that has high sensitivity to light with a wavelength of 365 nm or 405 nm, has high stability over time and is capable of forming a cured film in which coloration by heating over time can be suppressed, and to provide a novel oxime compound suitable for use in such a photopolymerizable composition.

It is still another object of the invention to provide a photopolymerizable composition for a color filter, wherein the composition has high stability over time and excellent pattern forming property, can be cured with high sensitivity, and can form a colored pattern with excellent adhesion to a support.

It is still another object of the invention to provide a color filter which is produced by using the photopolymerizable composition for a color filter, and which has an excellent pattern shape and includes a colored pattern with excellent adhesion to a support, and to provide a method capable of producing such a color filter with high productivity, and also to provide a solid-state imaging device including such a color filter.

It is a further object of the invention to provide a planographic printing plate precursor that includes a photosensitive layer produced by using the photopolymerizable composition and has a high level of sensitivity, stability over time and printing durability.

As a result of investigations, the inventor has found that the use of an oxime compound with a novel structure is effective in obtaining high absorbance of light with a wavelength of 365 nm or 405 nm and in achieving high stability over time.

<1> A compound represented by the following Formula (1):

(1)

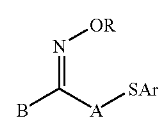

wherein, in Formula (1), R and B each independently represent a monovalent substituent, A represents a divalent organic group, and Ar represents an aryl group.

<2> The compound of <1>, wherein the compound is represented by the following Formula (2):

(2)

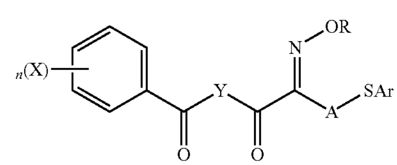

wherein, in Formula (2), R and X each independently represent a monovalent substituent, A and Y each independently represent a divalent organic group, Ar represents an aryl group, and n represents an integer of 0 to 5.

<3> The compound of <1> or <2>, wherein the compound is represented by the following Formula (3):

(3)

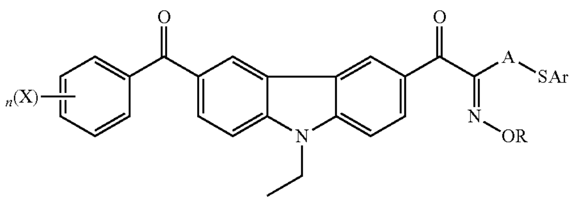

wherein, in Formula (3), R and X each independently represent a monovalent substituent, A represents a divalent organic group, Ar represents an aryl group, and n represents an integer of 0 to 5.

<4> A photopolymerizable composition comprising:

(A) the compound of any of <1> to <3>; and (B) a polymerizable compound.

<5> The photopolymerizable composition of <4>, further comprising (C) a colorant.

<6> The photopolymerizable composition of <4> or <5>, wherein (C) the colorant is a pigment, and the photopolymerizable composition further comprises (D) a pigment dispersing agent.

<7> The photopolymerizable composition of <5> or <6>, wherein (C) the colorant is a black colorant.

<8> A photopolymerizable composition for a color filter, comprising the photopolymerizable composition of any one of <5> to <7>.

<9> A color filter comprising a colored pattern provided on a support, wherein the colored pattern is produced by using the photopolymerizable composition of <8>.

<10> A method for producing a color filter comprising:

applying the photopolymerizable composition of <8> to a support to form a photopolymerizable composition layer;

exposing the photopolymerizable composition layer to light through a mask; and developing the exposed composition layer to form a colored pattern.

<11> A solid-state imaging device comprising the color filter of <9>.

<12> A planographic printing plate precursor comprising a photosensitive layer provided on a support, wherein the photosensitive layer comprises the photopolymerizable composition of <4> (i.e., a photopolymerizable composition comprising the compound of any of <1> to <3> and a polymerizable compound).

According to the invention, a photopolymerizable composition may be provided which has high sensitivity to light with a wavelength of 365 nm or 405 nm, and which has high stability over time and is capable of forming a cured film in which coloration by heating over time can be suppressed. A novel oxime compound suitable for use in such a photopolymerizable composition may be also provided.

According to the invention, a photopolymerizable composition for a color filter may be provided, wherein the composition has high stability over time and excellent pattern forming property, can be cured with high sensitivity, and can form a colored pattern with excellent adhesion to a support.

According to the invention a color filter may be provided which is produced by using the photopolymerizable composition for a color filter, and which has an excellent pattern shape and includes a colored pattern with excellent adhesion to a support. A method capable of producing such a color filter with high productivity, and a solid-state imaging device including such a color filter may also be provided.

According to the invention a planographic printing plate precursor may be provided which includes a photosensitive layer produced by using the photopolymerizable composition and has a high level of sensitivity, stability over time and printing durability.

DETAILED DESCRIPTION OF THE INVENTION

Figure 1:
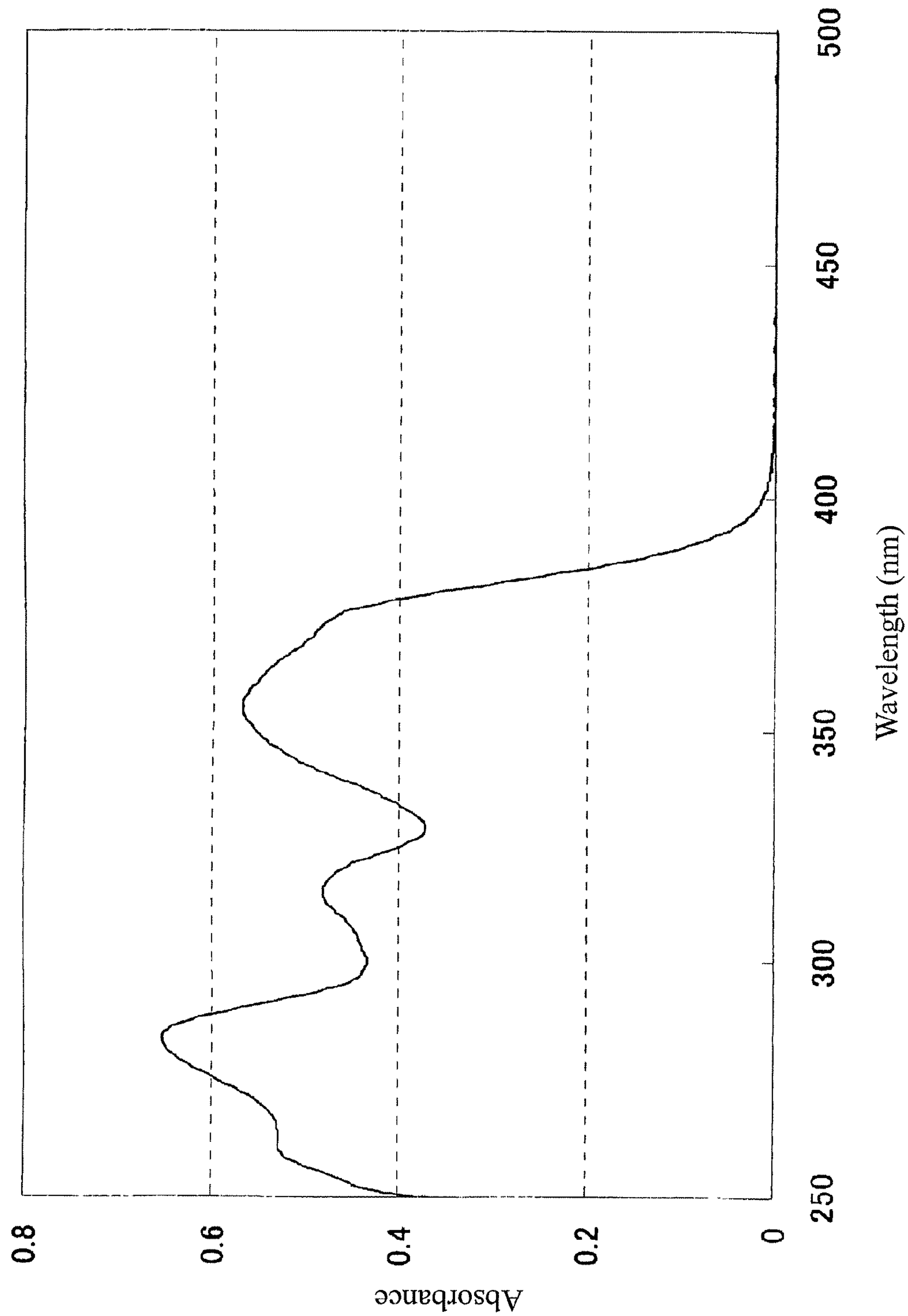
FIG. 1 is the UV absorption spectrum of Compound 1, which is a specific oxime compound according to the invention.

A photosensitive composition of the present invention includes a compound represented by Formula (I) (hereinafter referred to as "the specific oxime compound" in some cases).

The specific oxime compound, which is a component of the photosensitive composition of the invention, is described in detail below.

(a) Specific Oxime Compound

In an embodiment of the invention, (a) the specific oxime compound is represented by Formula (I):

(I)

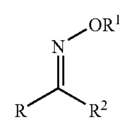

In Formula (I), R, $R^1$ and $R^2$ each independently represent a hydrogen atom or a monovalent substituent.

In Formula (I), the substituent represented by R may be an aryl group which may have a substituent or a heterocyclic group which may have a substituent, and is preferably any one of the groups shown below.

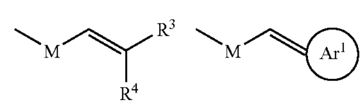

In these groups, M, $R^3$, $R^4$, and $Ar^1$ respectively have the same definitions as those of M, $R^3$, $R^4$, and $Ar^1$ in Formulae (I-I) and (I-II) shown later, and preferred examples are also the same.

In Formula (I), $R^1$ and $R^2$ respectively have the same definitions as those of $R^1$ and $R^2$ in Formula (I-I), and preferred examples are also the same.

In the invention, the specific oxime compound represented by Formula (I) preferably has a molar absorption coefficient of 20,000 or more at 365 nm or 405 nm.

If the specific oxime compound has such a high absorption coefficient for light with such a short wavelength, the sensitivity of a photosensitive composition containing the specific oxime compound to a short-wavelength light can be heightened.

In the invention, the specific oxime compound is preferably represented by Formula (I-I) below.

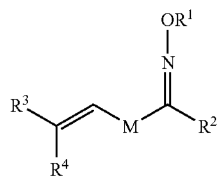

(I-I)

In Formula (I-I), $R^1$ and $R^2$ each independently represent a hydrogen atom or a monovalent substituent; M represent a divalent linking group; $R^3$ and $R^4$ each independently represent a hydrogen atom or a monovalent substituent; and $R^3$ and $R^4$ may be bonded to each other to form a ring.

The monovalent substituent represented by $R^1$ is preferably a monovalent nonmetallic atom group, such as those described below.

Examples of the monovalent nonmetallic atom group represented by $R^1$ include an optionally substituted alkyl group, an optionally substituted aryl group, an optionally substituted alkenyl group, an optionally substituted alkynyl group, an optionally substituted alkylsulfinyl group, an optionally substituted arylsulfinyl group, an optionally substituted alkylsulfonyl group, an optionally substituted arylsulfonyl group, an optionally substituted acyl group, an optionally substituted alkoxycarbonyl group, an optionally substituted aryloxycarbonyl group, an optionally substituted phosphinoyl group, an optionally substituted heterocyclic group, an optionally substituted alkylthiocarbonyl group, an optionally substituted arylthiocarbonyl group, an optionally substituted dialkylaminocarbonyl group, and an optionally substituted dialkylaminothiocarbonyl group.

The optionally substituted alkyl is preferably an alkyl group having 1 to 30 carbon atoms, and examples include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The optionally substituted aryl group is preferably an aryl group having 6 to 30 carbon atoms, and examples include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a quarternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarteranthracenyl group, an anthraquinonyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The optionally substituted alkenyl group is preferably an alkenyl group having 2 to 10 carbon atoms, and examples include a vinyl group, an allyl group and a styryl group.

The optionally substituted alkynyl group is preferably an alkynyl group having 2 to 10 carbon atoms, and examples include an ethynyl group, a propynyl group and a propargyl group.

The optionally substituted alkylsulfinyl group is preferably an alkylsulfinyl group having 1 to 20 carbon atoms, and examples include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, and a methoxymethylsulfinyl group.

The optionally substituted arylsulfinyl group is preferably an arylsulfinyl group having 6 to 30 carbon atoms, and examples include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

The optionally substituted alkylsulfonyl group is preferably an alkylsulfonyl group having 1 to 20 carbon atoms, and examples include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The optionally substituted arylsulfonyl group is preferably an arylsulfonyl group having 6 to 30 carbon atoms, and examples include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The optionally substituted acyl group is preferably an acyl group having 2 to 20 carbon atoms, and examples include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The optionally substituted alkoxycarbonyl group is preferably an alkoxycarbonyl group having 2 to 20 carbon atoms, and examples include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the optionally substituted aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The optionally substituted phosphinoyl group is preferably a phosphinoyl group having 2 to 50 carbon atoms in total, and examples include a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

The optionally substituted heterocyclic group is preferably an aromatic or aliphatic heterocyclic group containing at least one atom selected from nitrogen, oxygen, sulfur, and phosphorus atoms. Examples include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acrindinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Examples of the optionally substituted alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Examples of the optionally substituted arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

Examples of the optionally substituted dialkylaminocarbonyl group include a dimethylaminocarbonyl group, a diethylaminocarbonyl group, a dipropylaminocarbonyl group, and a dibutylaminocarbonyl group.

Examples of the optionally substituted dialkylaminothiocarbonyl group include a dimethylaminothiocarbonyl group, a dipropylaminothiocarbonyl group and a dibutylaminothiocarbonyl group.

In order to achieve high sensitivity, $R^1$ is preferably an acyl group, and specifically, an acetyl group, a propionyl group, a benzoyl group, or a toluyl group is particularly preferred.

The monovalent substituent represented by $R^2$ is preferably selected from the following: an optionally substituted alkyl group having 1 to 20 carbon atoms; an alkenyl group having 1 to 20 carbon atoms; a halogen atom; an aryl group; a cycloalkyl group having 3 to 8 carbon atoms; an alkanoyl group having 2 to 20 carbon atoms; an alkoxycarbonyl group having 2 to 12 carbon atoms; an aryloxycarbonyl group; CN; $—CONR^{01}R^{02}$ wherein $R^{01}$ and $R^{02}$ each independently represent an alkyl group or an aryl group; a haloalkyl group having 1 to 4 carbon atoms; $—S(O)_i$alkyl; $—S(O)_2$alkyl; $—S(O)_2$aryl; $—S(O)_2$aryl; a diarylphosphinoyl group; a di($C_1$ to $C_4$ alkoxy)-phosphinoyl group; a dialkylphosphinoyl group; or a heterocyclic group.

In view of sensitivity, an alkyl group, an alkenyl group, a haloalkyl group, or cyano group is preferred as $R^2$.

The divalent linking group represented by M may be a phenylene group, a naphthylene group, a phenylenecarbonyl group, a naphthylenecarbonyl group, or the group (A), (B), (C), or (D) below.

(A)

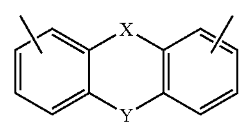

(B)

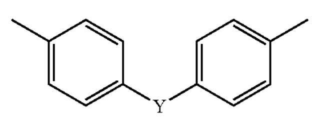

(C)

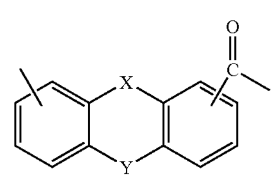

(D)

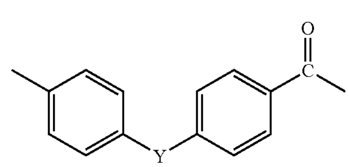

In the groups (A), (B), (C), and (D), X is a single bond, —O—, —S—, $—NR^5—$, or —CO—, and Y is —O—, —S—, —$NR^5$—, —CO—, or —$CH_2$—, wherein $R^5$ represents a hydrogen atom, an alkyl group having 1 to 20 carbon atoms, a hydroxyalkyl group having 2 to 4 carbon atoms, an alkoxyalkyl group having 2 to 10 carbon atoms, an alkenyl group having 2 to 5 carbon atoms, a cycloalkyl group having 3 to 8 carbon atoms, a phenyl-$C_1$ to $C_3$ alkyl group, an alkanoyl group having 1 to 8 carbon atoms, an alkenoyl group having 3 to 12 carbon atoms, a benzoyl group, a phenyl group, or a naphthyl group, each of which may be unsubstituted or substituted by an alkyl of 1 to 12 carbon atoms, a benzoyl group or an alkoxy group having 1 to 12 carbon atoms. In particular, M is preferably any one of the structures shown below.

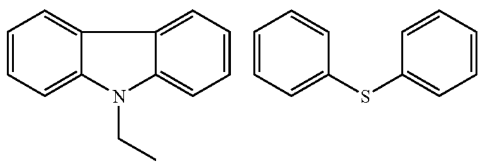

$R^3$ and $R^4$ each independently represent a hydrogen atom or a monovalent substituent. $R^3$ and $R^4$ may be bonded to each other to form a ring.

Examples of the monovalent substitituents represented by $R^3$ and $R^4$ include an optionally substituted alkyl group, an optionally substituted aryl group, an optionally substituted alkenyl group, an optionally substituted alkynyl group, an optionally substituted alkylsulfinyl group, an optionally substituted arylsulfinyl group, an optionally substituted alkylsulfonyl group, an optionally substituted arylsulfonyl group, an optionally substituted acyl group, an optionally substituted alkoxycarbonyl group, an optionally substituted aryloxycarbonyl group, an optionally substituted phosphinoyl group, an optionally substituted heterocyclic group, an optionally substituted alkylthioxy group, an optionally substituted arylthioxy group, an optionally substituted alkyloxy group, an optionally substituted aryloxy group, an optionally substituted alkylthiocarbonyl group, an optionally substituted arylthiocarbonyl group, an optionally substituted dialkylaminocarbonyl group, an optionally substituted dialkylaminothiocarbonyl group, a carboxylic acid group, a sulfonic acid group, a cyano group, a halogen atom, an optionally substituted amino group, and any combination thereof.

In view of sensitivity improvement and stability over time, a hydrogen atom, an alkoxycarbonyl group, a cyano group, or a phenyl group is particularly preferred as $R^3$ or $R^4$.

The combination of $R^3$ and $R^4$ is preferably the combination shown below. In the combination below, the mark * indicates the position to which the carbon atom that is adjacent to $R^3$ and $R^4$ and involved in the double bond in Formula (I-I) is bound.

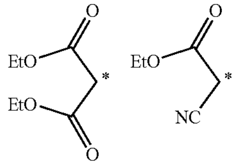

$R^3$ and $R^4$ may be bonded to each other to form an aliphatic or aromatic ring. Examples of the ring include an aliphatic or aromatic hydrocarbon ring and a heterocycle containing a heteroatom. These may be combined to form a polycyclic condensed ring.

The aliphatic or aromatic hydrocarbon ring may be a five-, six-, or seven-membered hydrocarbon ring, more preferably a five- or six-membered ring, particularly preferably a five-membered ring.

The heterocycle may contain a sulfur, oxygen or nitrogen atom as the hetero atom, and a sulfur atom-containing heterocycle is more preferred.

When a polycyclic condensed ring is formed by condensation of aliphatic and/or aromatic hydrocarbon rings, the polycyclic condensed ring may be, for example, a condensed ring obtained by condensation of one to four benzene rings, or a condensed ring obtained by condensation of at least one benzene ring and at least one five-membered unsaturated ring. When the condensed ring includes a heteroatom-containing heterocycle, the condensed ring may be, for example, a condensed ring obtained by condensation of at least one five-membered ring containing a sulfur, oxygen or nitrogen atom and at least one benzene ring, or a condensed ring obtained by condensation of at least one six-membered ring containing a sulfur, oxygen or nitrogen atom and at least one benzene ring.

Examples of the ring that may be formed when $R^3$ and $R^4$ are bonded to each other include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, a dithiolane ring, an oxirane ring, a dioxirane ring, a thiirane ring, a pyrrolidine ring, a piperidine ring, an imidazole ring, an isoxazole ring, a benzodithiol ring, an oxazole ring, a thiazole ring, a benzothiazole ring, a benzimidazole ring, a benzoxazole ring, a pyridine ring, a pyrazine ring, a pyrimidine ring, a pyridazine ring, an indolizine ring, an indole ring, a benzofuran ring, a benzothiophene ring, a benzodithiole ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Above all, a dithiolane ring, a benzodithiol ring, a benzothiazole ring, a benzimidazole ring, and a benzoxazole ring are particularly preferred.

In Formula (I-I), $R^3$ and $R^4$ are preferably bonded to each other to form a hetero atom-containing hydrocarbon ring or a heterocycle, in order to suppress deactivation of the olefin moiety through isomerization at the time of light absorption.

The specific oxime compound according to the invention is more preferably a compound represented by Formula (I-II) below.

(I-II)

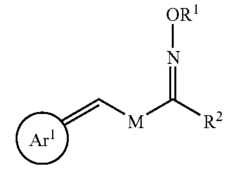

In Formula (I-II), $R^1$ and $R^2$ each independently represent a hydrogen atom or a monovalent substituent; M represents a divalent linking group; and $Ar^1$ represents a hydrocarbon ring group or a heterocyclic group. $R^1$, $R^2$ and M in Formula (I-II)

respectively have the same definitions as those of $R^1$, $R^2$ and M in Formula (I-I), and preferred examples are also the same.

The hydrocarbon ring group or the heterocyclic group represented by $Ar^1$ is preferably any of the groups shown below. In the groups shown below, the mark * indicates the position of the double bond adjacent to $Ar^1$ in Formula (I-II).

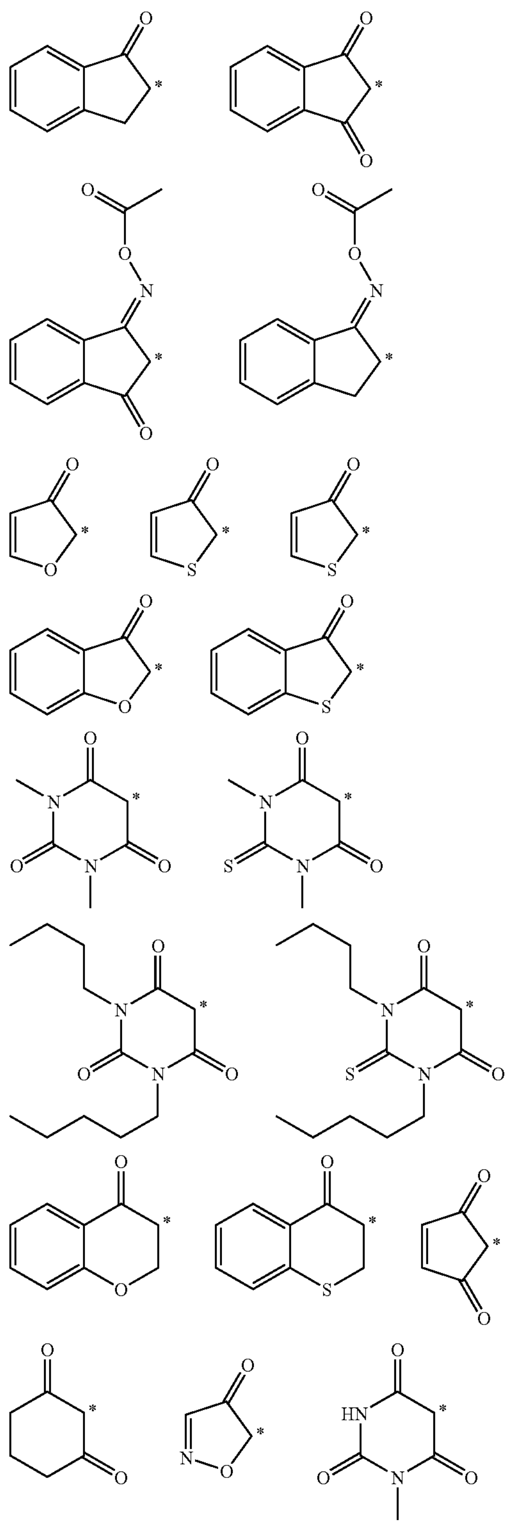

-continued

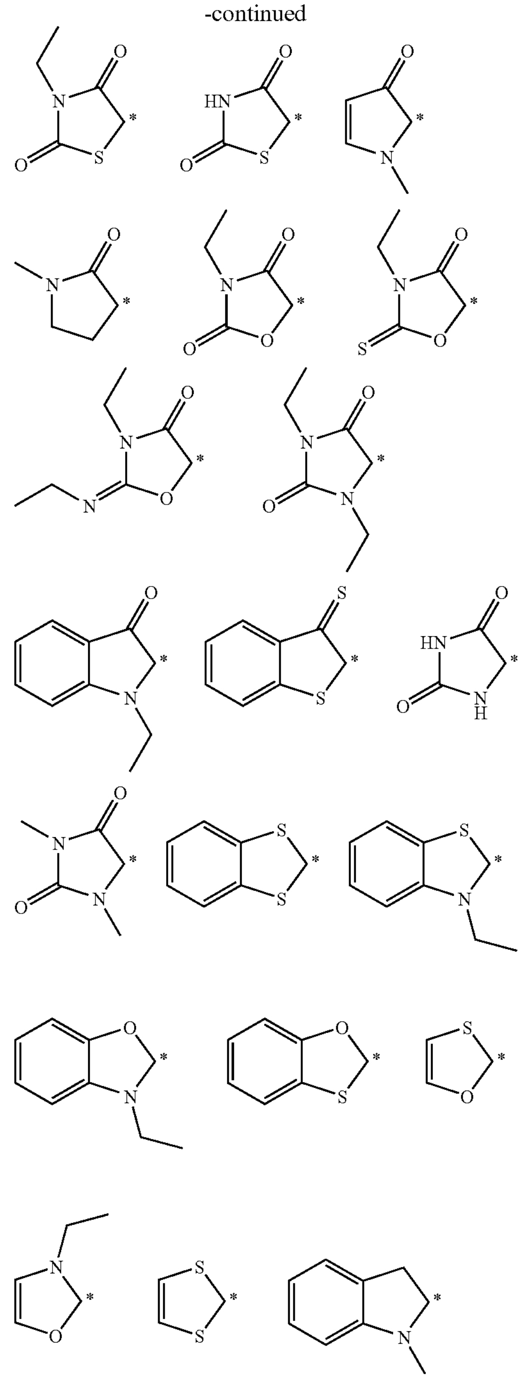

Examples of the specific oxime compound according to the invention include, but are not limited to, the compounds shown below.

Examples of the compound represented by Formula (I-I) include compounds having any combination of the respective examples of $R^1$, $R^2$, M, $R^3$, and $R^4$ shown below.

In the examples of M below, the marks * indicates the positions of the bonds to the carbon atoms adjacent to M in Formula (I-I). In the examples of $R^3$ and $R^4$ below, the mark * indicates the position of the double bond adjacent to the ring that is formed when $R^3$ and $R^4$ are bonded to each other in Formula (I-I).

(I-I)
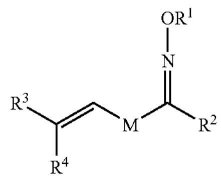
R[1]:
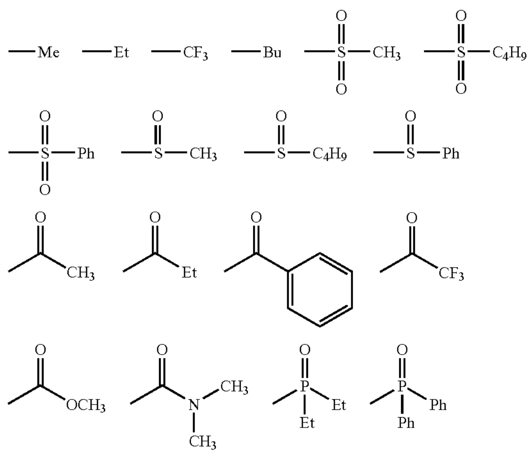
R[2]: —H —Et —Me —Ph -t-Bu -n-Bu —$C_6H_{13}$
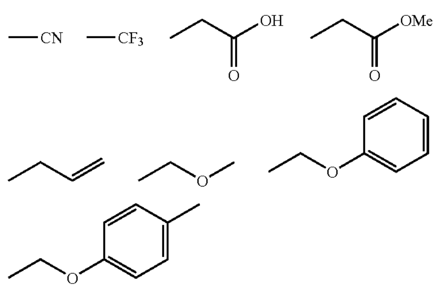
M:
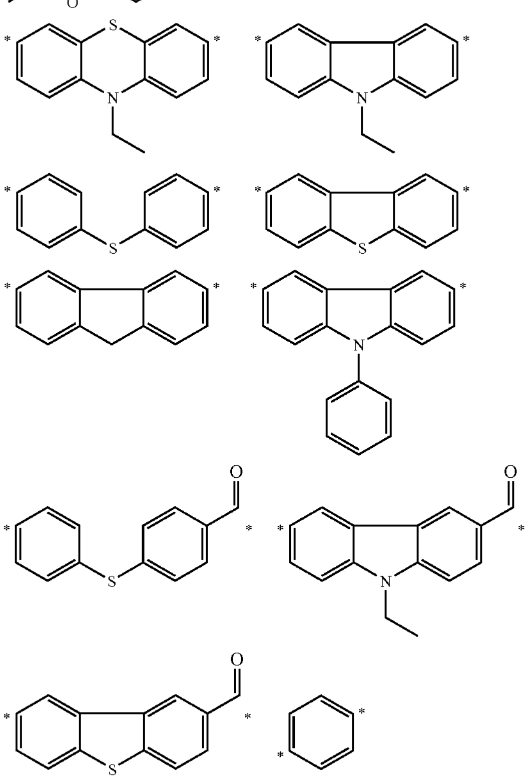
-continued
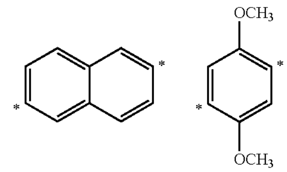
R[3], R[4]: —H —Ph —CN —C(=O)OEt
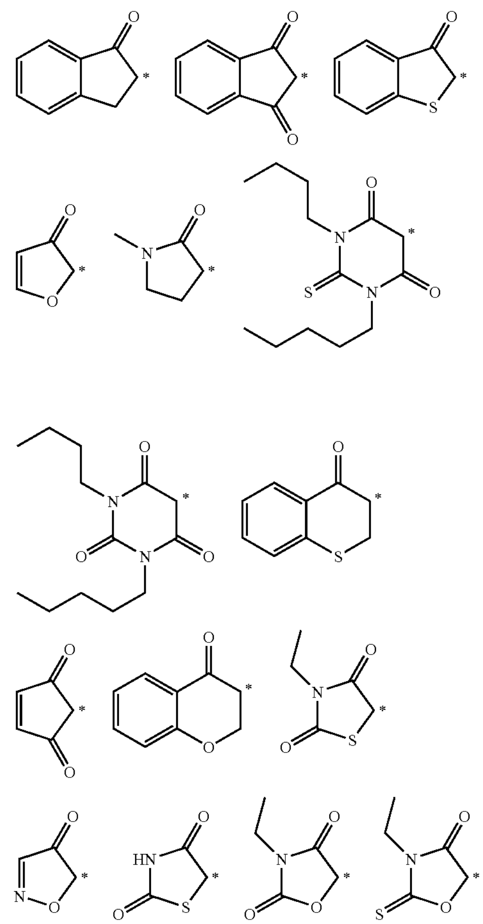
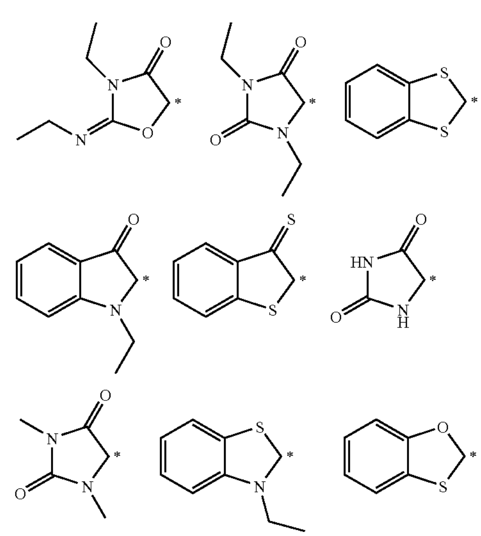

-continued
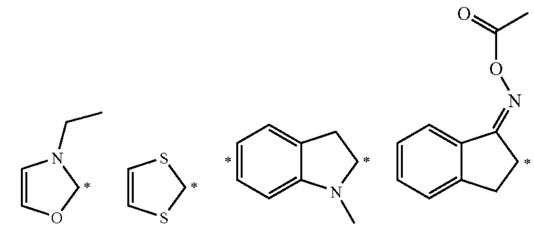
Specific examples of the specific oxime compound are shown below. However, the present invention is by no means limited by the specific examples.
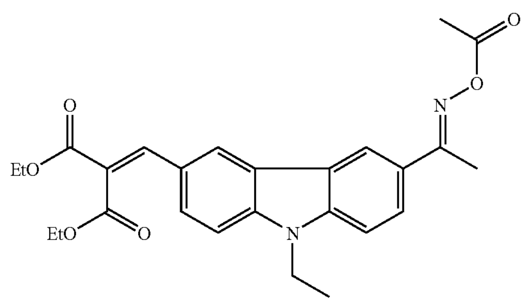
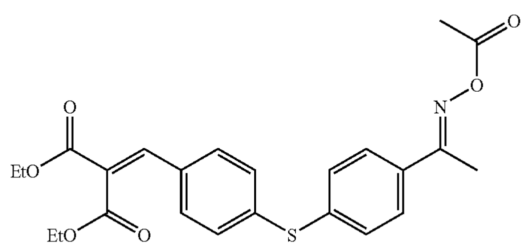
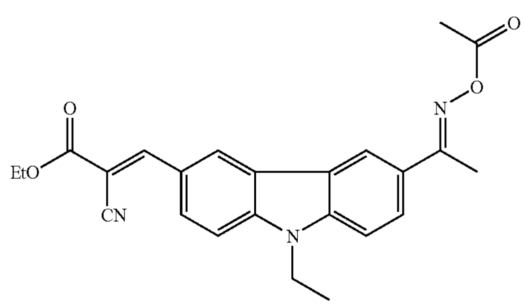
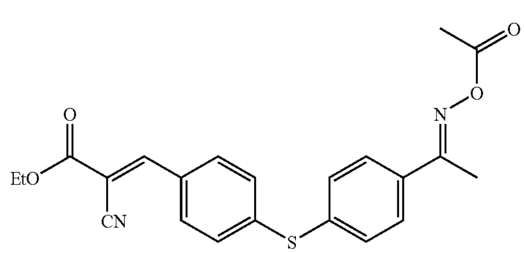
-continued
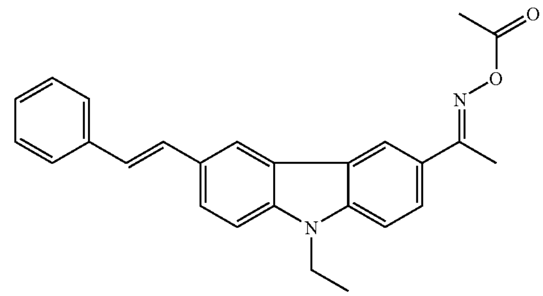
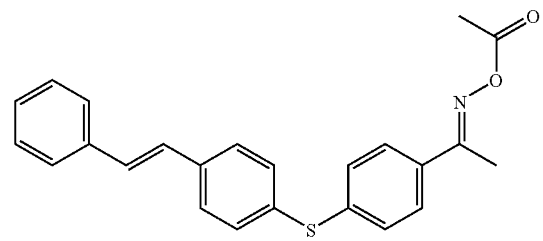
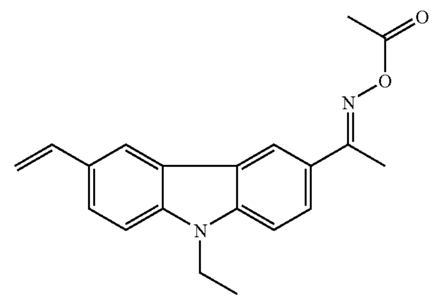
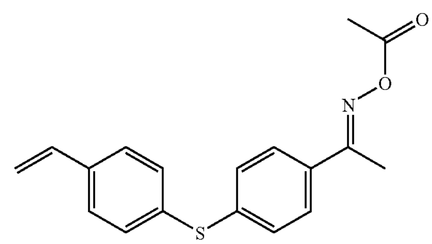
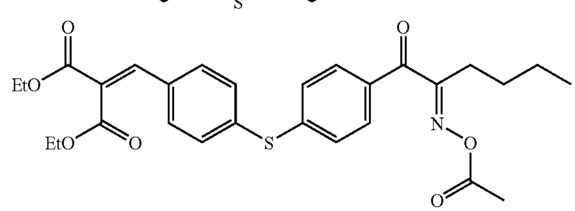
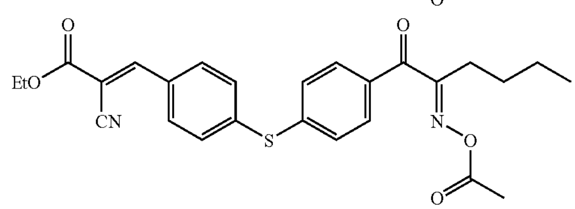
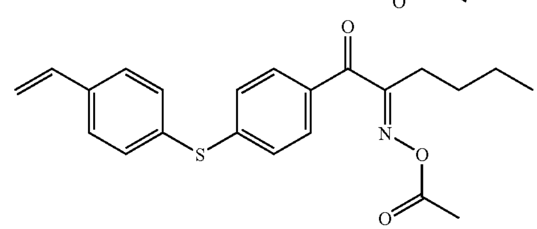

-continued
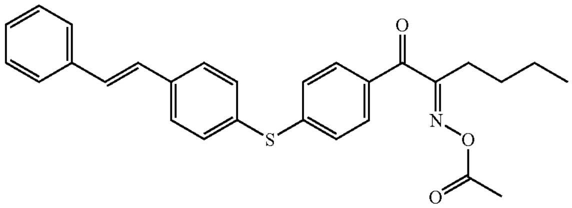
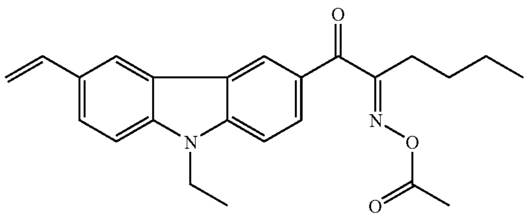
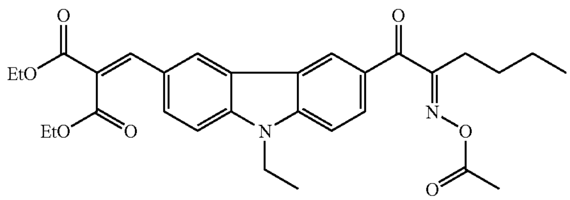
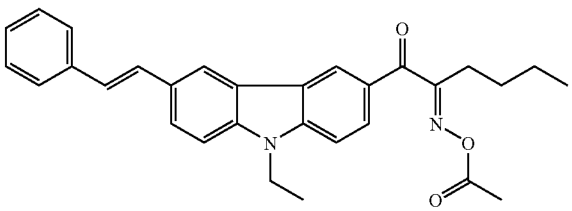
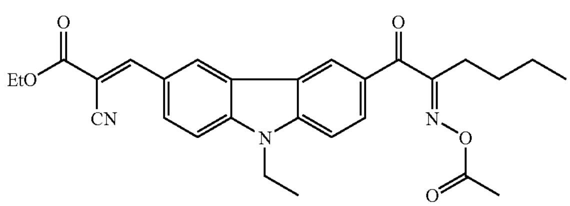
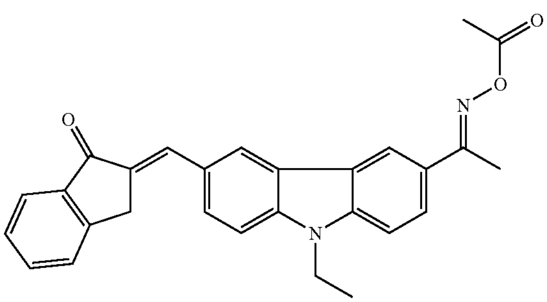
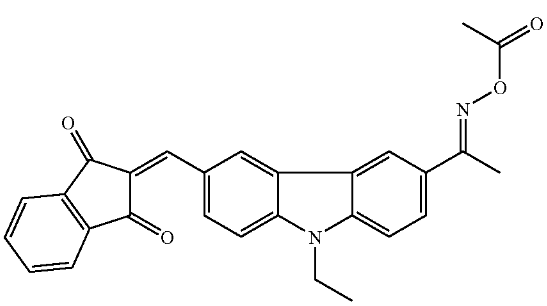
-continued
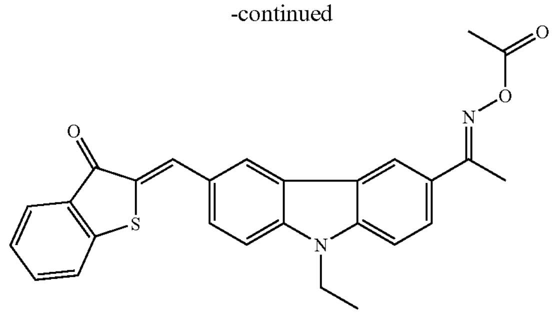
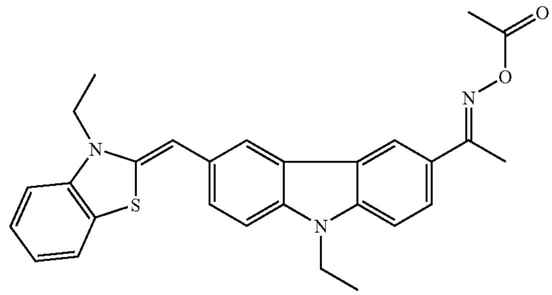
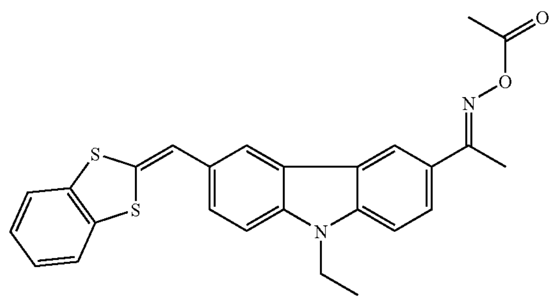
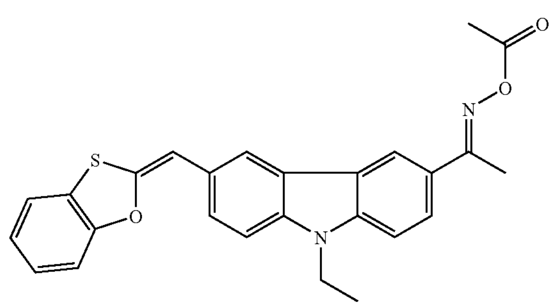
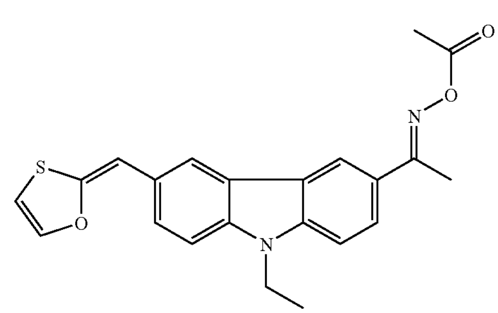

-continued
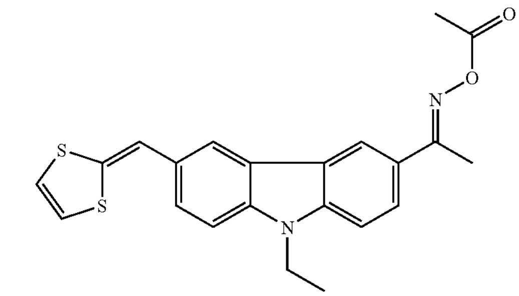
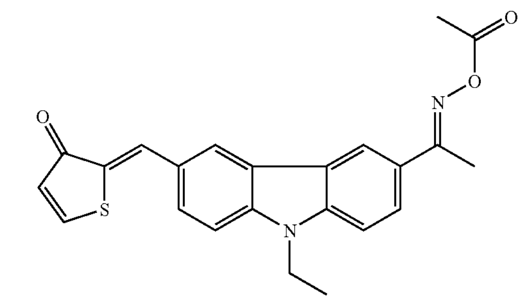
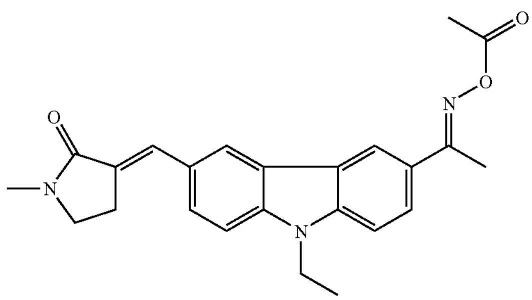
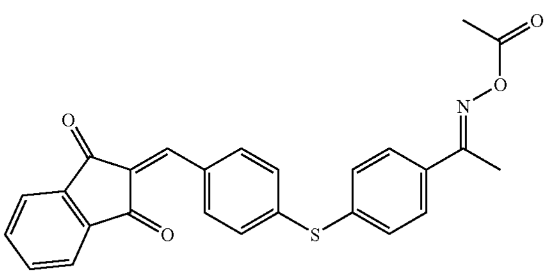
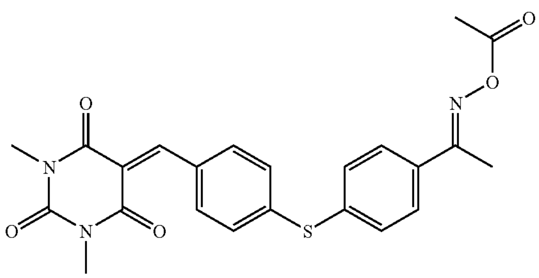
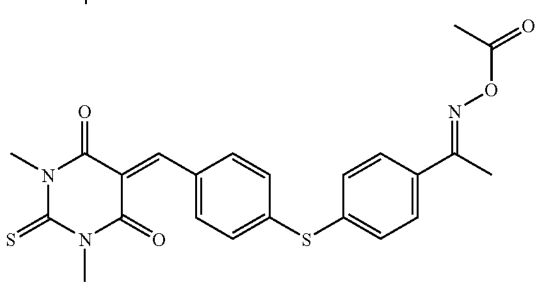
-continued
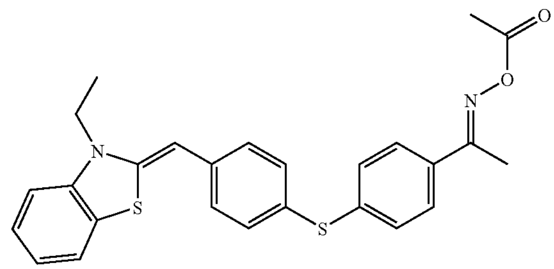
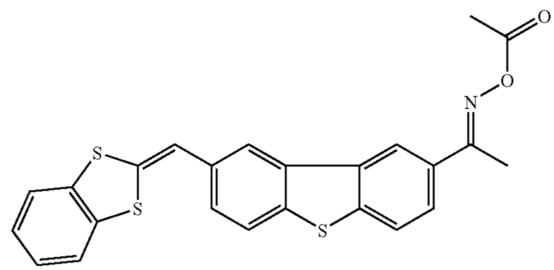
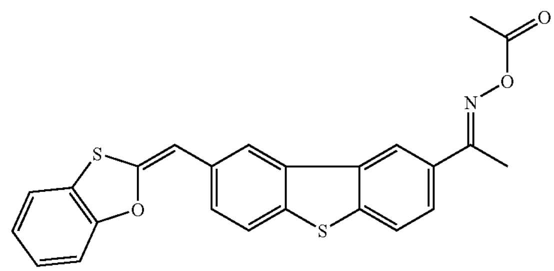
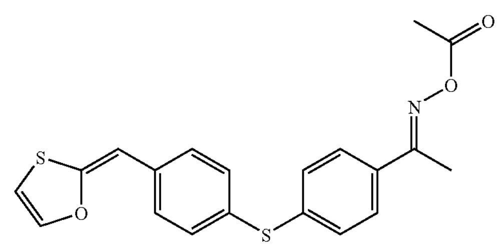
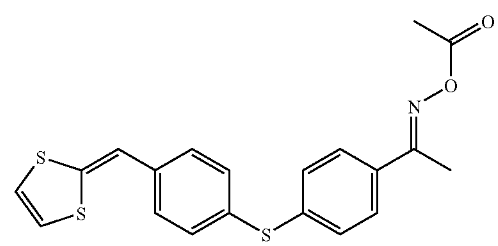
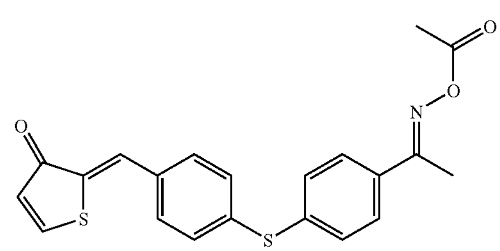

-continued
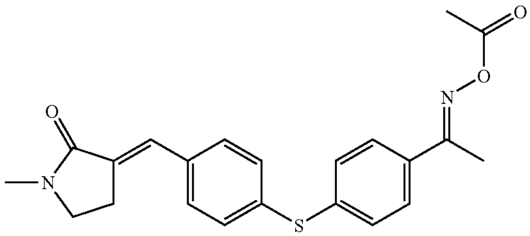
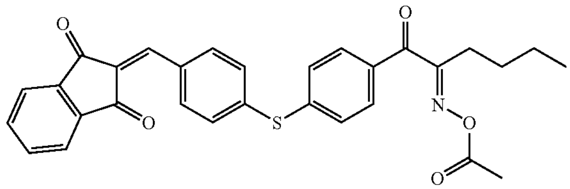
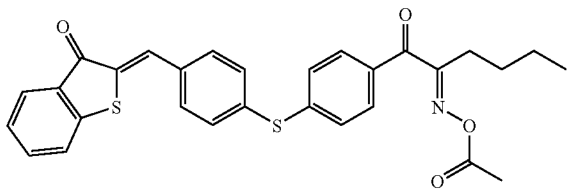
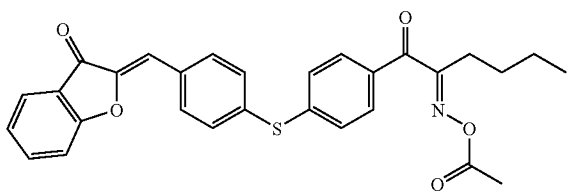
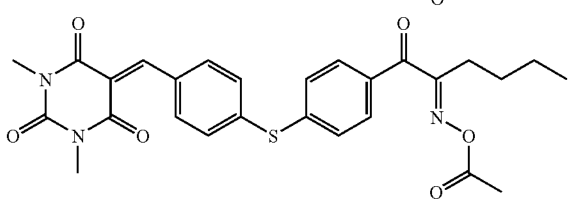
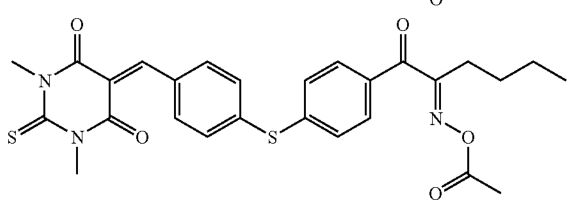
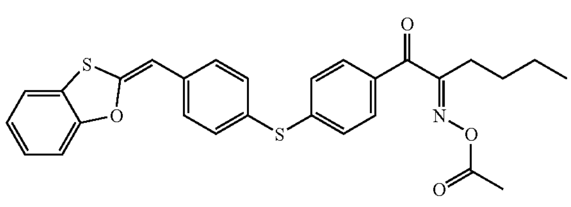
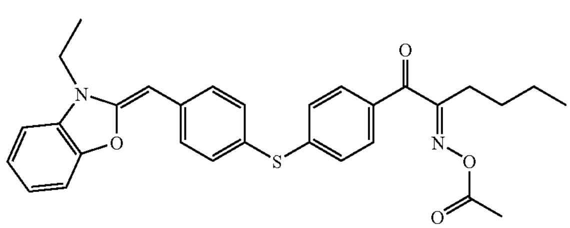
-continued
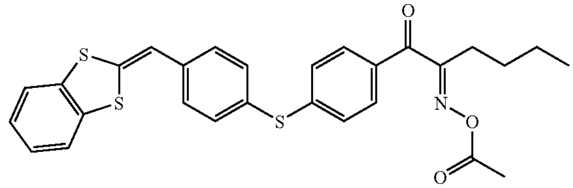
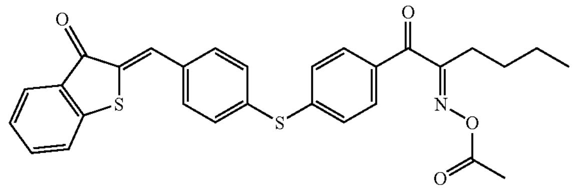
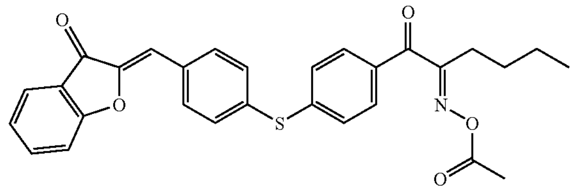
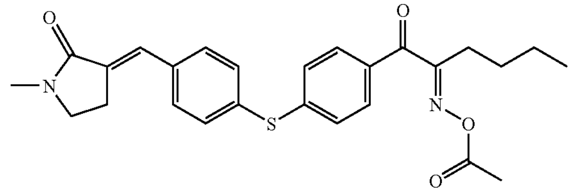 [SMILES: CCCC/C(=N\OC(C)=O)C(=O)c1ccc2sc3ccc(/C=C4\CCN(C)C4=O)cc3c2c1]
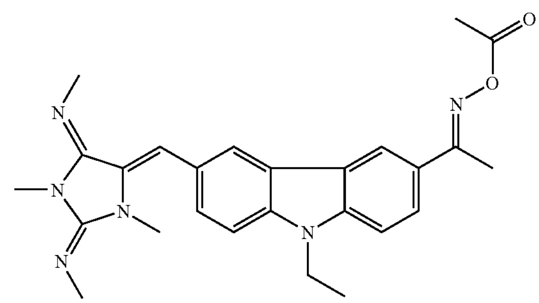
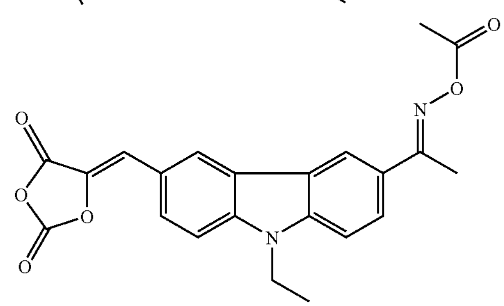
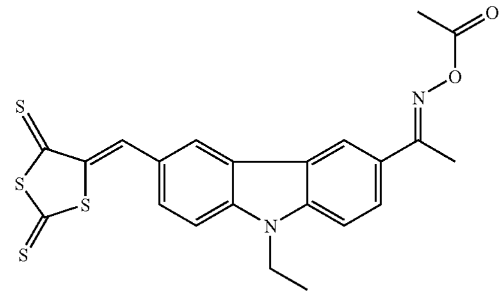

-continued
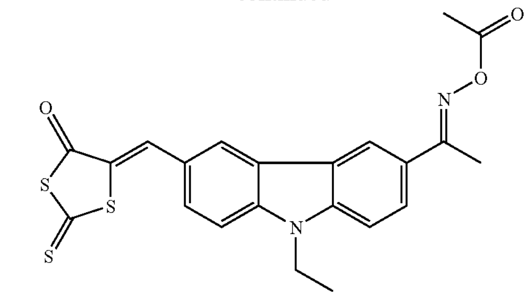
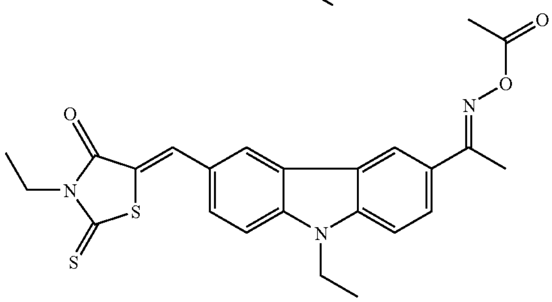
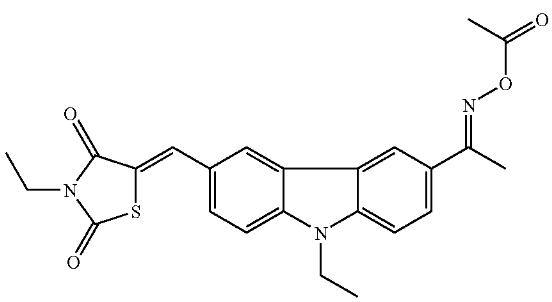
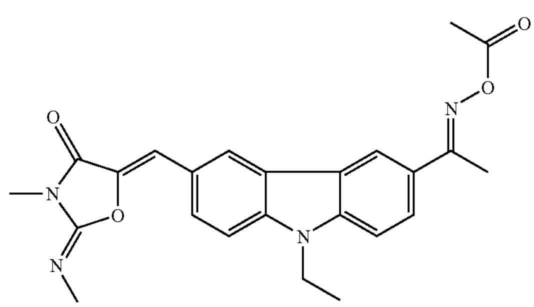
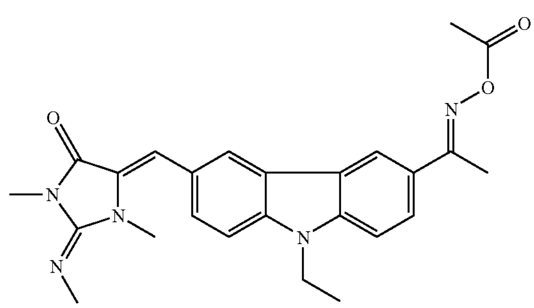
-continued
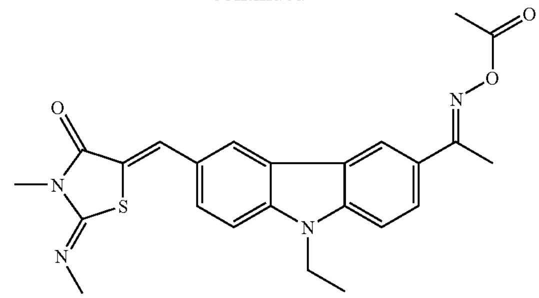
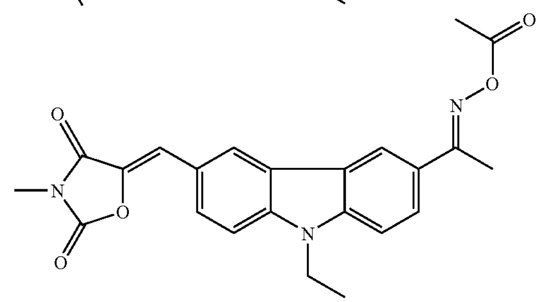
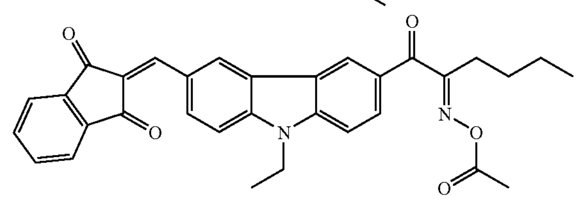
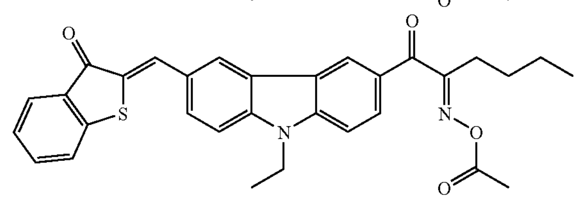
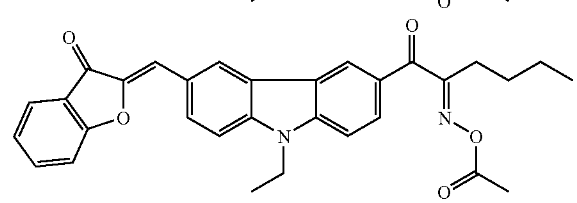
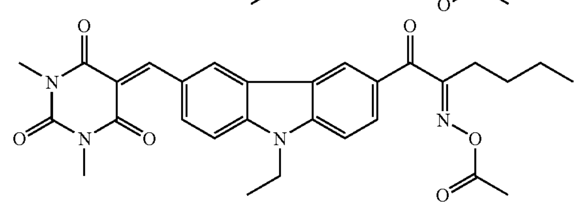
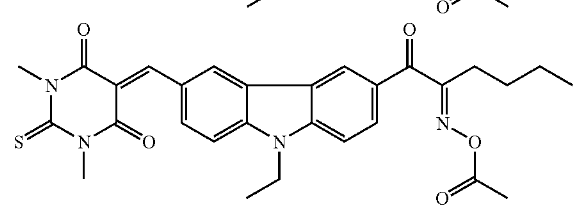
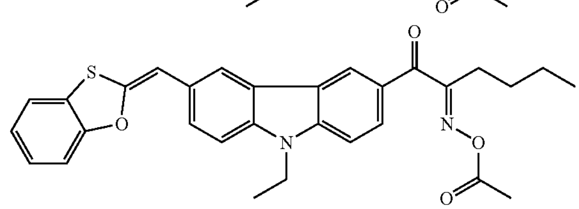

-continued

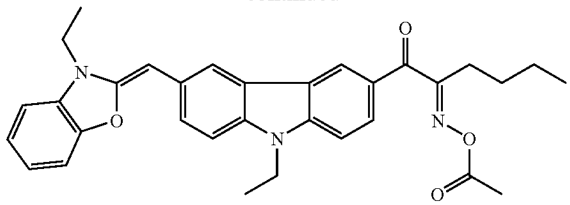

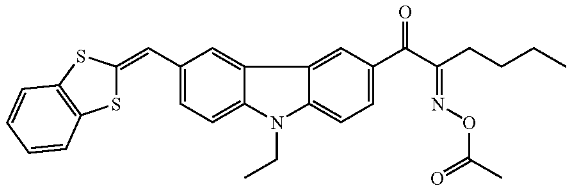

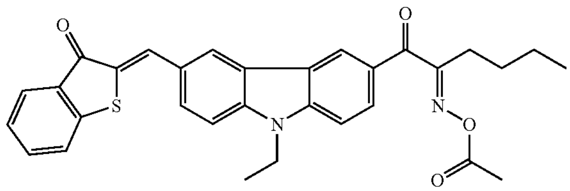

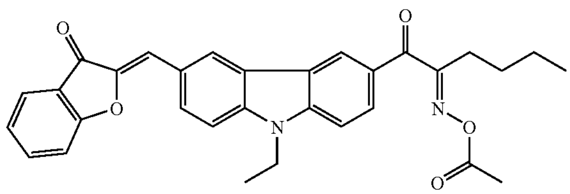

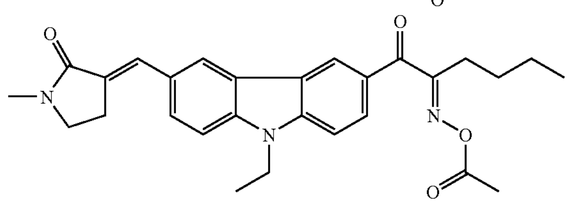

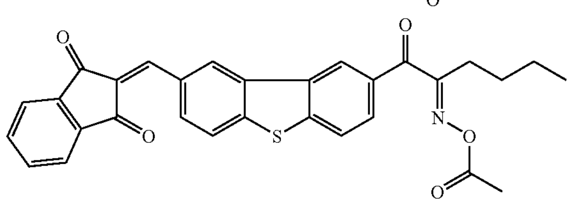

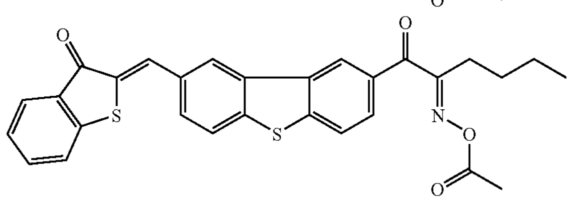

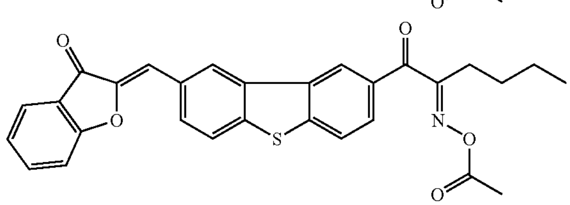

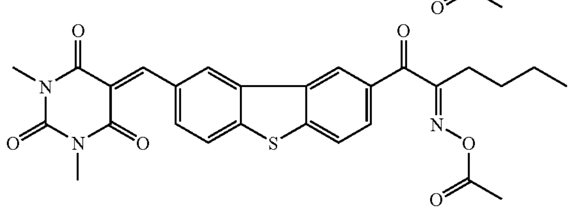

-continued

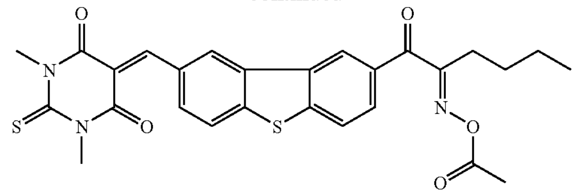

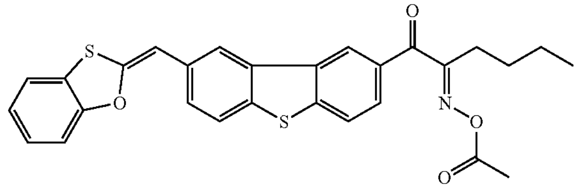

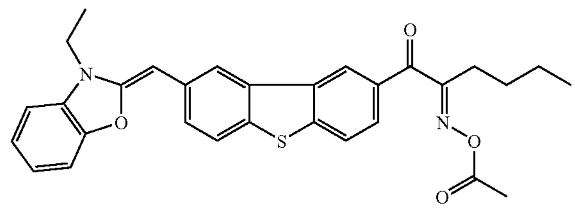

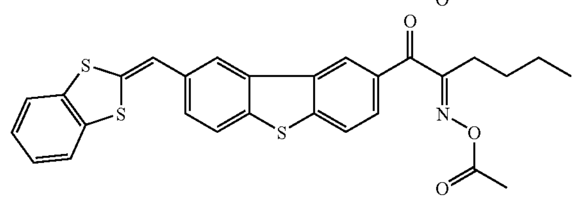

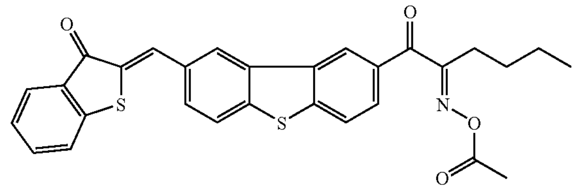

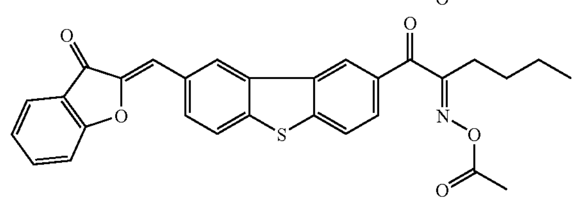

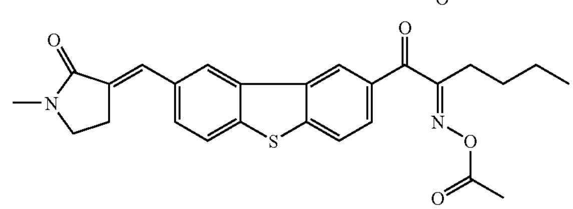

In the invention, the specific oxime compound may have a maximum absorption wavelength in the wavelength range of 350 nm to 500 nm, more preferably has an absorption wavelength in the range of 360 nm to 480 nm. In particular, the specific oxime compound preferably has a high absorbance at 365 nm and 455 nm.

Therefore, the specific oxime compound has absorption in a longer wavelength region as compared with conventional oxime compounds, so that it can exhibit high sensitivity when exposed to light from a 365 nm or 405 nm light source.

In the invention, the specific oxime compound preferably has a molar absorption coefficient at 365 nm or 405 nm of 10,000 to 300,000, more preferably of 15,000 to 300,000, particularly preferably of 20,000 to 200,000, in view of sensitivity.

The molar absorption coefficient of the specific oxime compound was measured at a concentration of 0.01 g/L in a solvent of ethyl acetate with an ultraviolet-visible spectrophotometer (trade name: CARRY-5 Spectrophotometer, manufactured by Varian Inc.).

In the invention, for example, the specific oxime compound may be synthesized, for example, by the method described below.

Synthesis of Compounds Represented by Formula (I-I)

(I-I)

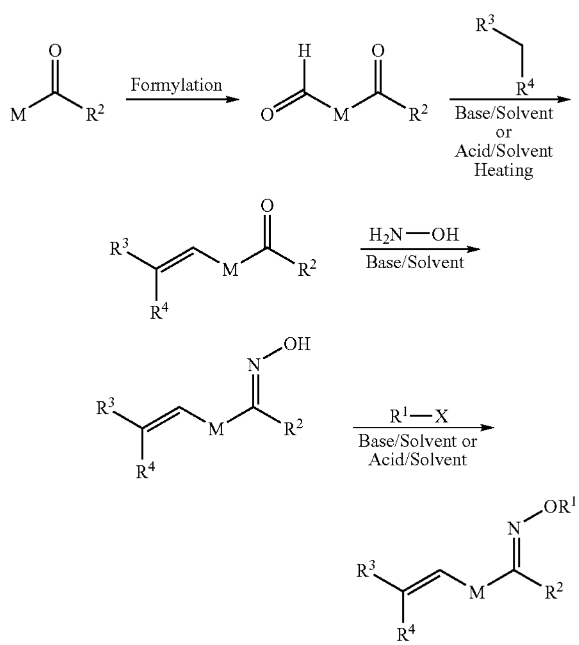

Synthesis of Compounds Represented by Formula (I-II)

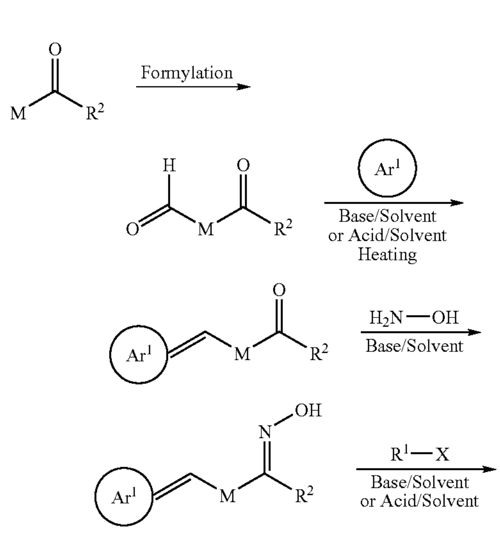

-continued

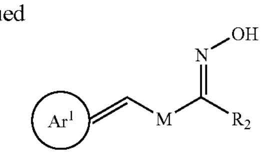

(I-II)

The content of the specific oxime compound in the photosensitive composition of the invention may be from 0.1 to 30% by mass, more preferably from 1 to 25% by mass, particularly preferably from 2 to 20% by mass, based on the mass of the total solids of the photosensitive composition.

A single specific compound may be used, or two or more specific oxime compounds may be used in combination.

The photosensitive composition of the invention contains the specific oxime compound and thus has high sensitivity to light with a wavelength of 365 nm or 405 nm. The specific oxime compound has a highly hydrophobic structure so that hydrolysis or the like is suppressed. Therefore, the photosensitive composition containing the specific oxime compound has excellent stability over time.

The photosensitive composition of the invention, having high stability over time and high sensitivity to short wavelength light as described above, may be used for molding resins, casting resins, photo-molding resins, sealing materials, dental polymerizing materials, printing inks, paints, photosensitive resins for printing plates, color proofs for printing, resists for color filters, resists for black matrices, resists for printed boards, resists for semiconductor production, resists for microelectronics, resists for manufacture of micromachine components, insulating materials, hologram materials, waveguide materials, overcoat materials, adhesives, tackifiers, pressure-sensitive adhesives, and release coating agents.

The photosensitive composition of the invention is also suitable for use in other applications where an acid is generated by irradiation with energy rays, for example light, and then the generated acid serves as a catalyst. For example, it may also be used for materials for image formation, anti-counterfeit techniques, and detection of energy-ray dose wherein a color reaction of a pigment precursor in the presence of the generated acid serving as a catalyst is used, and positive resists for use in manufacture of, for example, semiconductors, TFTs, color filters, and micromachine components wherein a decomposition reaction in the presence of the produced acid serving as a catalyst is used.

In the invention, the specific oxime compound is decomposed by light and functions as a photopolymerization initiator that initiates and enhances the polymerization of polymerizable compounds. In particular, the specific oxime compound has excellent sensitivity to a 365 nm or 405 nm light source and thus can produce a superior effect when used as a photopolymerization initiator in a photosensitive composition.

Therefore, the photosensitive composition of the invention may include the specific oxime compound as a photopolymerization initiator in combination with a polymerizable compound. Such a composition is preferably in a form of a curable composition that polymerizes and cures upon irradiation with light.

A curable composition as a preferred aspect of the photosensitive composition of the invention (the curable composition of the invention) is described below, which is not intended to limit the scope of the invention.

Curable Composition

The curable composition of the invention includes (a) the specific oxime ester and (b) a polymerizable compound.

In the curable composition of the invention, the content of (a) the specific oxime ester is preferably from 0.1 to 30% by mass, more preferably from 1 to 25% by mass, particularly preferably from 2 to 20% by mass, based on the mass of the total solids of the curable composition.

A single specific oxime compound may be used, or two or more types of the specific oxime compounds may be used in combination.

A description is given below of (b) the curable compound, an essential component of the curable composition of the invention, and other optional components. Various optional components as described later may also be used to form any photosensitive composition other than the curable composition, depending on their function.

(b) Polymerizable Compound

The polymerizable compound that may be used in the curable composition of the invention may be an addition-polymerizable compound having at least one ethylenic unsaturated double bond and may be selected from compounds each having at least one ethylenic unsaturated terminal bond, preferably two or more ethylenic unsaturated terminal bonds. Such a class of compounds is widely known in the relevant industrial field, and such compounds may be used in the invention without particular limitations. Such compounds may be in the chemical form of a monomer or a prepolymer, specifically a dimer, a trimer or an oligomer, or any mixture thereof or any copolymer thereof. Examples of monomers and copolymer thereof include unsaturated carboxylic acids (such as acrylic acid, methacrylic acid, itaconic acid, crotonic acid, isocrotonic acid, and maleic acid), esters thereof, and amides thereof. Esters of unsaturated carboxylic acids and aliphatic polyhydric alcohol compounds, or amides of unsaturated carboxylic acids and aliphatic polyamines, are preferably used. Also preferably used are addition reaction products of unsaturated carboxylic acid esters or amides having a nucleophilic substituent such as a hydroxyl group, an amino group or a mercapto group, with monofunctional or polyfunctional isocyanates or epoxy compounds, and dehydration condensation reaction products of such esters or amides with monofunctional or polyfunctional carboxylic acids. Also preferred are addition reaction products of unsaturated carboxylic acid esters or amides having an electrophilic substituent such as an isocyanate group or an epoxy group, with monofunctional or polyfunctional alcohols, amines or thiols, and substitution reaction products of unsaturated carboxylic acid esters or amides having a halogen group or a leaving substituent such as a tosyloxy group, with monofunctional or polyfunctional alcohols, amines, or thiols. Other examples of preferable compounds include compounds obtained by replacing the unsaturated carboxylic acid in the above examples by an unsaturated phosphonic acid, styrene, vinyl ether, or the like.

Examples of the monomer of the ester of the aliphatic polyhydric alcohol compound and the unsaturated carboxylic acid include acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and isocyanurate EO-modified triacrylate.

Examples of the monomer of the ester also include methacrylates such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the monomer of the ester also include itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate; crotonates such as ethylene glycol dicrotonate, tetramethylene glycol dicrotonate, pentaerythritol dicrotonate, and sorbitol tetradicrotonate; isocrotonates such as ethylene glycol diisocrotonate, pentaerythritol diisocrotonate, and sorbitol tetraisocrotonate; and maleates such as ethylene glycol dimaleate, triethylene glycol dimaleate, pentaerythritol dimaleate, and sorbitol tetramaleate.

Examples of other esters include the aliphatic alcohol esters described in Japanese Patent Application Publication (JP-B) No. 51-47334 and JP-A No. 57-196231, the aromatic skeleton-containing compounds described in JP-A Nos. 59-5240, 59-5241 and 02-226149, and the amino group-containing compounds described in JP-A No. 01-165613. A mixtures of monomers selected from the ester monomers described above may also be used.

Examples of the monomer of the amide of the aliphatic polyamine compound and the unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide.

Examples of other preferred amide monomers include the cyclohexylene structure-containing compounds described in JP-B No. 54-21726.

Addition-polymerizable urethane compounds produced by an addition reaction of isocyanate with a hydroxyl group are also preferred, examples of which include the vinyl urethane compounds described in JP-B No. 48-41708, which have two or more polymerizable vinyl groups within a molecule and are produced by adding a hydroxyl group-containing vinyl monomer represented by Formula (A) below to a polyisocyanate compound having two or more isocyanate groups within a molecule.

$$CH_2{=}C(R^4)COOCH_2CH(R^5)OH \qquad (A)$$

In Formula (A), $R^4$ and $R^5$ each represent H or $CH_3$.

Also preferred are the urethane acrylates described in JP-A No. 51-37193, JP-B No. 02-32293 and JP-B No. 02-16765, and the ethylene oxide skeleton-containing urethane compounds described in JP-B Nos. 58-49860, 56-17654, 62-39417, and 62-39418. Photopolymerizable compositions having excellent photoresponsive speed can also be obtained using addition-polymerizable compounds having an amino or sulfide structure in the molecule, which are disclosed in JP-A Nos. 63-277653, 63-260909 and 01-105238.

Other examples include polyfunctional acrylates and methacrylates such as polyester acrylates and epoxy acrylates produced by a reaction of epoxy resins with (meth)acrylic acid (for example those disclosed in JP-A No. 48-64183, JP-B No. 49-43191 and JP-B No. 52-30490); and the specific unsaturated compounds described in JP-B Nos. 46-43946, 01-40337 and 01-40336, and the vinylphosphonic acid compounds described in JP-A No. 02-25493. In some cases, the perfluoroalkyl group-containing structures described in JP-A No. 61-22048 are preferably used. Photosetting monomers and oligomers as described in Journal of the Adhesion Society of Japan Vol. 20, No. 7 pp. 300 to 308 (1984) may also be used.

Details of how to use the addition-polymerizable compounds, such as what structure should be used, whether they should be used alone or in combination, or what amount should be added, may be freely determined depending on the final performance design of the curable composition. For example, they may be selected from the following viewpoints.

In view of sensitivity, a structure having a higher content of the unsaturated groups per molecule is preferable, and difunctional or higher functional structures are preferred in many cases. In order to increase the strength of the cured film, tri- or higher-functional structures are preferred. A method of using a combination of compounds having different numbers of functional groups and/or different types of polymerizable groups (for example, compounds selected from an acrylic ester, a methacrylic ester, a styrene compound, a vinyl ether compound) is also effective for controlling both of sensitivity and strength.

How to select and use the addition-polymerizable compound is also an important factor for the compatibility with or dispersibility to other components of the curable composition (such as a photopolymerization initiator, a colorant (a pigment and/or a dye), and a binder polymer). For example, in some cases, the compatibility may be improved by using a low-purity compound or by using a combination of two or more compounds. A particular structure may also be selected in order to improve adhesion to the hard surface of a support or the like.

(c) Sensitizer

The curable composition of the invention may contain a sensitizer for the purpose of improving the radical generation efficiency of a radical initiator or achieving a longer photosensitive wavelength.

The sensitizer that may be used in the invention preferably sensitizes (a) the specific oxime compound based on the electron-transfer mechanism or the energy-transfer mechanism.

The sensitizer for use in the invention may belong to any of the groups of compounds described below and may have an absorption wavelength in the range of 300 nm to 450 nm.

Examples include polynuclear aromatic compounds (such as phenanthrene, anthracene, pyrene, perylene, triphenylene, and 9,10-dialkoxyanthracene), xanthenes (such as fluorescein, eosin, erythrosine, rhodamine B, and rosebengal), thioxanthones (such as isopropylthioxanthone, diethylthioxanthone and chlorothioxanthone), cyanines (such as thiacarbocyanine and oxacarbocyanine), merocyanines (such as merocyanine and carbomerocyanine), phthalocyanines, thiazines (such as thionine, methylene blue and toluidine blue), acridines (such as acridine orange, chloroflavin and acriflavin), anthraquinones (such as anthraquinone), squaliums (such as squalium), acridine orange, coumarins (such as 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl compounds, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone, and Michler's ketone, and heterocyclic compounds such as N-aryloxazolidinone.

Examples of more preferred sensitizers include compounds represented by Formulae (e-1) to (e-4) below.

(e-1)

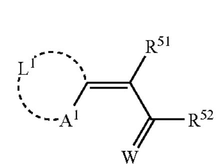

In Formula (e-1), $A^1$ represents a sulfur atom or $NR^{50}$, $R^{50}$ represents an alkyl group or an aryl group, $L^1$ represents a nonmetallic atom group that forms a basic nuclear of the pigment together with $A^1$ and the carbon atom adjacent to $L^1$, $R^{51}$ and $R^{52}$ each independently represent a hydrogen atom or a monovalent nonmetallic atom group, and $R^{51}$ and $R^{52}$ may be bonded to each other to form an acidic nuclear of the pigment, and W represents an oxygen atom or a sulfur atom.

(e-2)

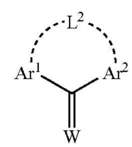

In Formula (e-2), $Ar^1$ and Ar2 each independently represent an aryl group and are linked to each other via $-L^2-$, wherein $-L^2-$ represents —O— or —S—, and W has the same definition as in Formula (e-1).

(e-3)

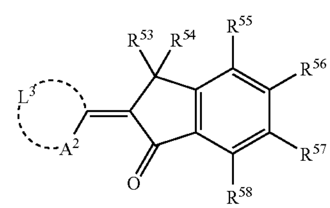

In Formula (e-3), $A^2$ represents a sulfur atom or $NR^{59}$; $L^3$ represents a nonmetallic atom group that forms a basic nuclear of the pigment together with $A^2$ and the carbon atom adjacent to $L^3$; $R^{53}$, $R^{54}$, $R^{55}$, $R^{56}$, $R^{57}$, and $R^{58}$ each independently represent a monovalent nonmetallic atom group; and $R^{59}$ represents an alkyl group or an aryl group.

(e-4)

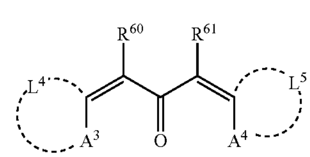

In Formula (e-4), $A^3$ and $A^4$ each independently represent —S— or $—NR^{62}$; $R^{62}$ represents a substituted or unsubstituted alkyl group or a substituted or unsubstituted aryl group;

$L^4$ and $L^5$ each independently represent a nonmetallic atom group that forms a basic nuclear of the pigment together with adjacent $A^3$ or $A^4$ and the carbon atom adjacent to $L^4$ or $L^5$; and $R^{60}$ and $R^{61}$ each independently represent a monovalent nonmetallic atom group or may be bonded to each other to form an aliphatic or aromatic ring.

The content of the sensitizer in the curable composition of the invention (or in (1) the photopolymerizable composition) is preferably from 0.1 to 20% by mass, more preferably from 0.5 to 15% by mass, based on the mass of the solids, in view of the efficiency of light absorption efficiency at a deep portion or the efficiency of initiation decomposition.

A single sensitizer may be used, or two or more sensitizers may be used in combination.

The sensitizer that is preferably contained in the curable composition of the invention may be at least one selected from a compound represented by Formula (II) below and a compound represented by Formula (III) shown later.

A single compound selected from these sensitizers may be used, or two or more compounds selected from these sensitizers may be used in combination.

(II)

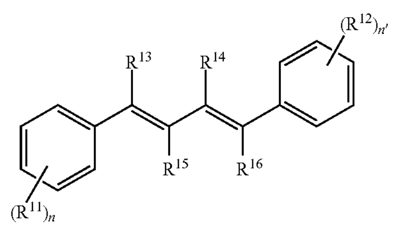

In Formula (II), $R^{11}$ and $R^{12}$ each independently represent a monovalent substituent, $R^{13}$, $R^{14}$, $R^{15}$, and $R^{16}$ each independently represent a hydrogen atom or a monovalent substituent, n represents an integer of 0 to 5, n' represents an integer of 0 to 5, and n and n' are not simultaneously 0. When n is 2 or greater, there are plural $R^{11}$s, and they may be the same or different. When n' is 2 or greater, there are plural $R^{12}$s, and they may be the same or different. Formula (II) may represent any of isomers caused by the presence of the double bonds.

The compound represented by Formula (II) preferably has a molar absorption coefficient $\epsilon$ at a wavelength of 365 nm of 500 $mol^{-1}\cdot L\cdot cm^{-1}$ or more, more preferably of 3000 $mol^{-1}\cdot L\cdot cm^{-1}$ or more, most preferably of 20000 $mol^{-1}\cdot L\cdot cm^{-1}$ or more. If the molar absorption coefficient $\epsilon$ is in the above range at each wavelength, the sensitivity enhancing effect may be high in terms of light absorption efficiency, which is preferable.

Preferred examples of the compound represented by Formula (II) include, but are not limited to, the compounds illustrated below.

In the description, some chemical formulae are simplified structural formulae in which solid lines represent hydrocarbon groups, unless elements and substituents are explicitly indicated. In the examples below, Me represents a methyl group, Et represents an ethyl group, Bu represents a butyl group, n-Bu represents a n-butyl group, and Ph represents a phenyl group.

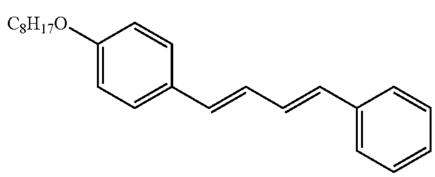

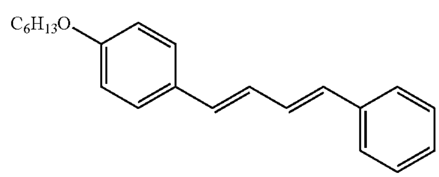

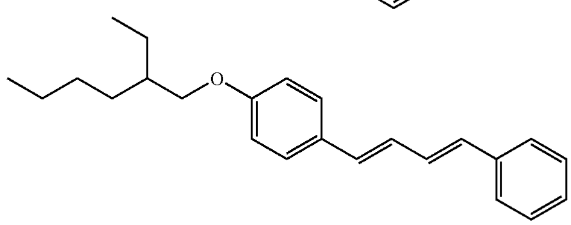

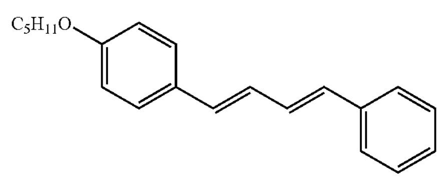

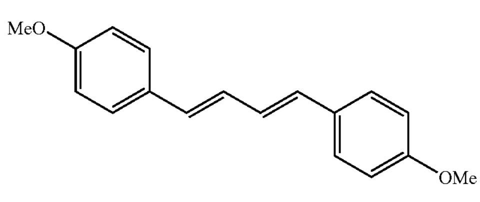

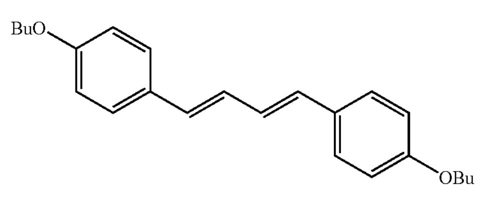

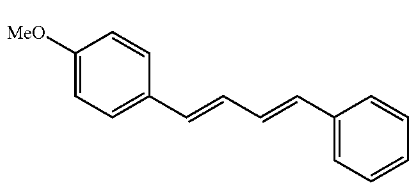

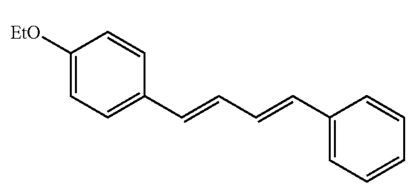

-continued
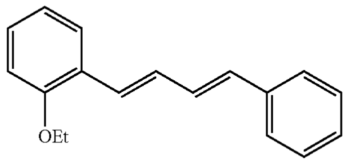
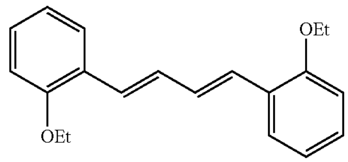
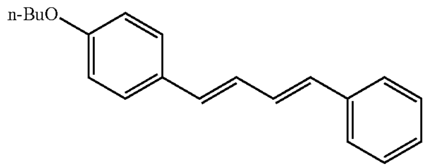
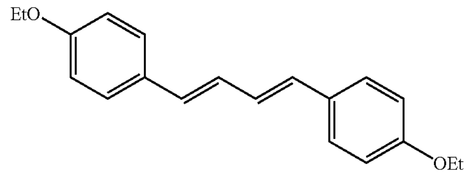
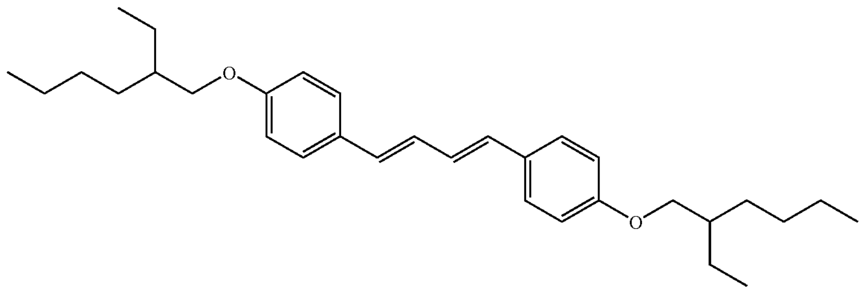
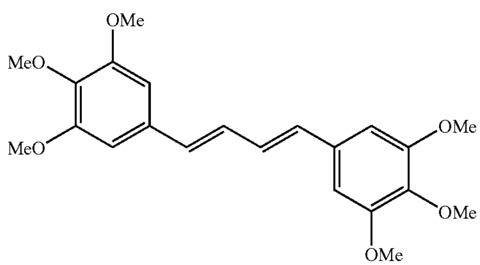
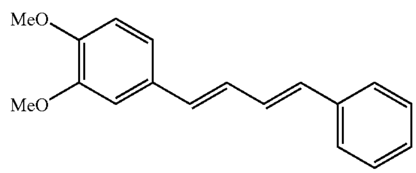
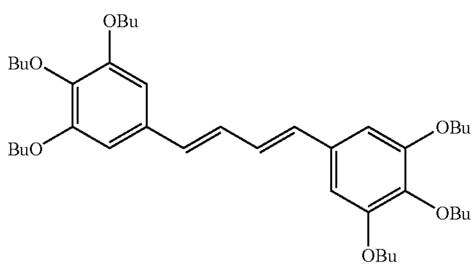
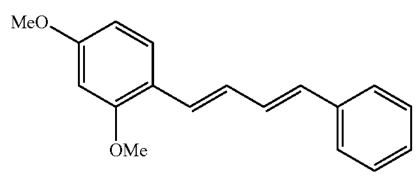
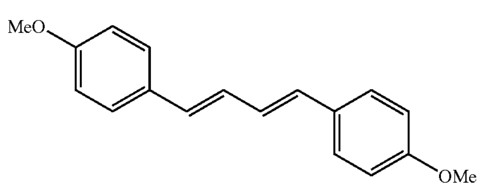
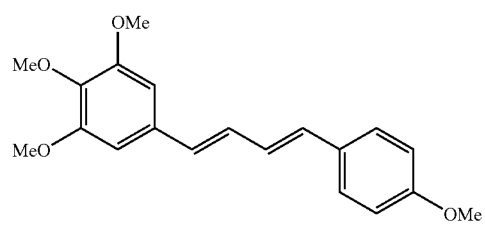
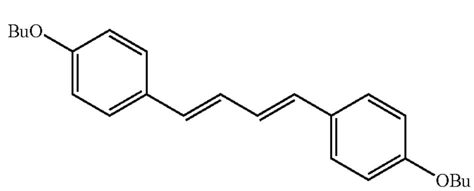
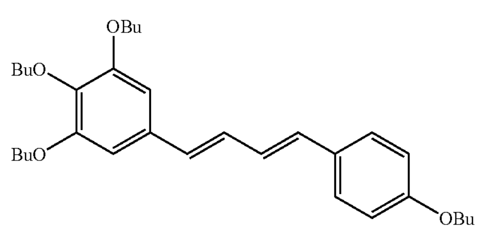

-continued
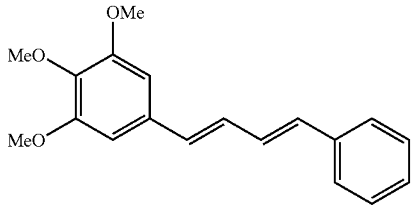
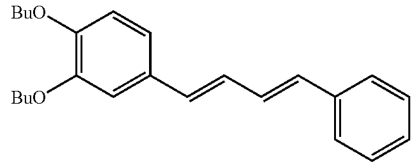
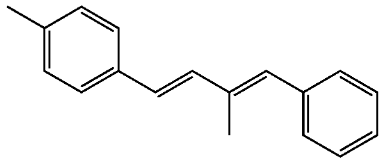
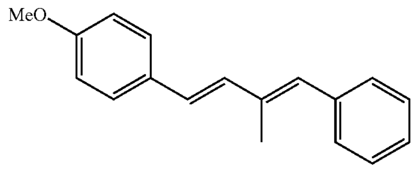
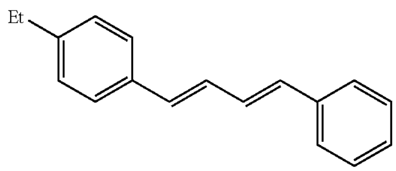
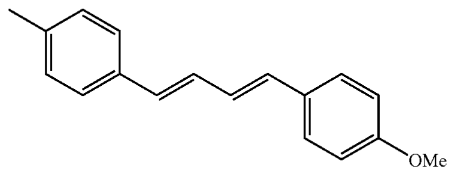
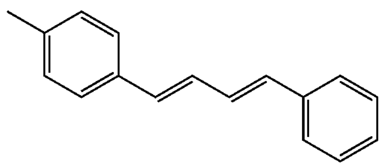
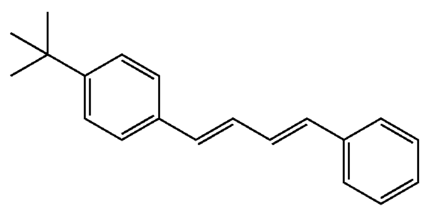
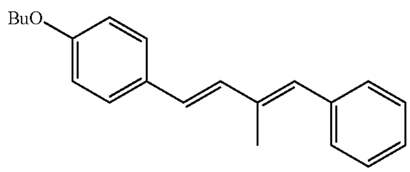
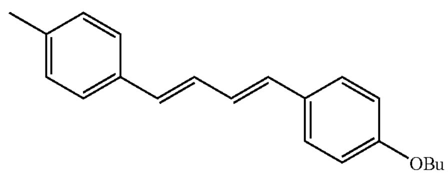
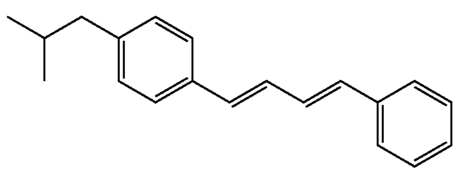
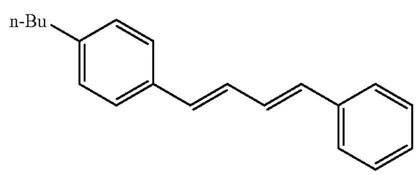
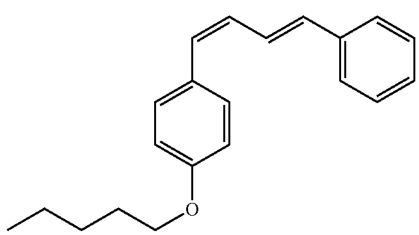
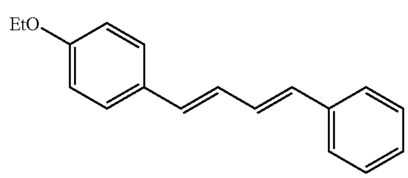
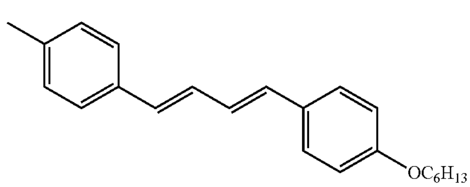
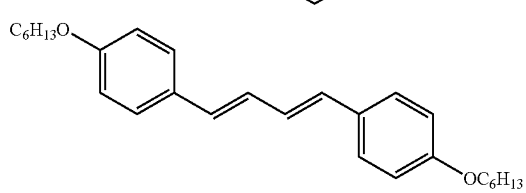
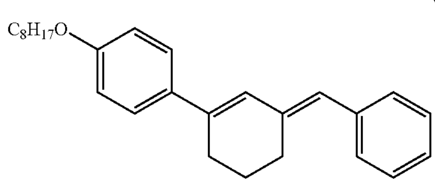
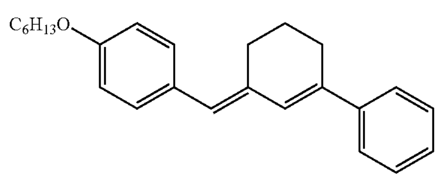

-continued
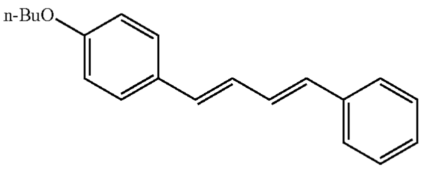
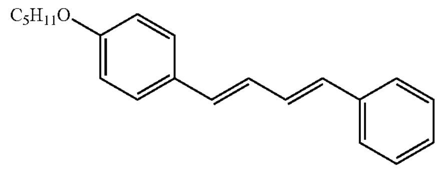
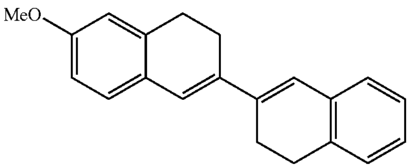
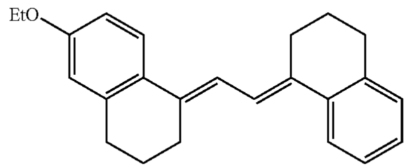
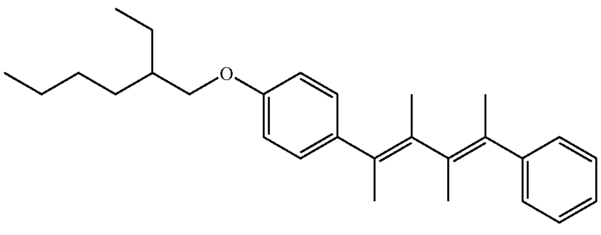
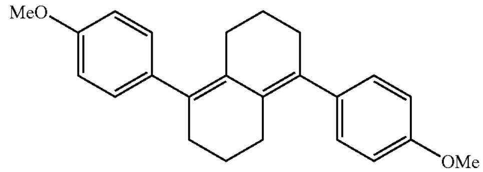
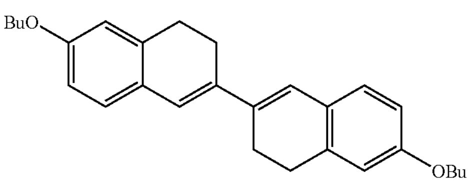
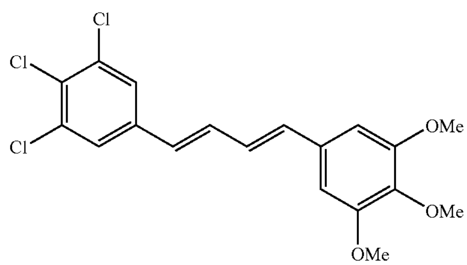
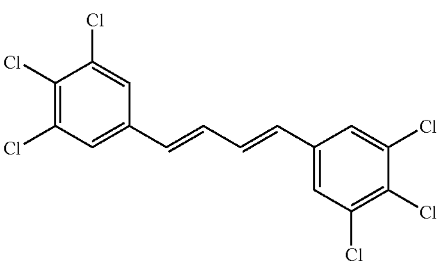
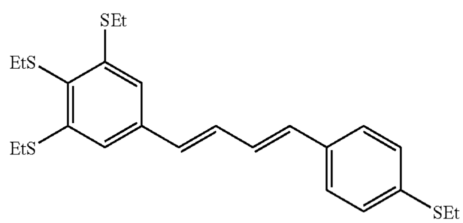
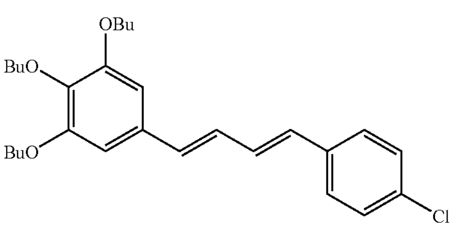
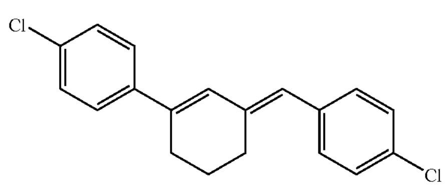
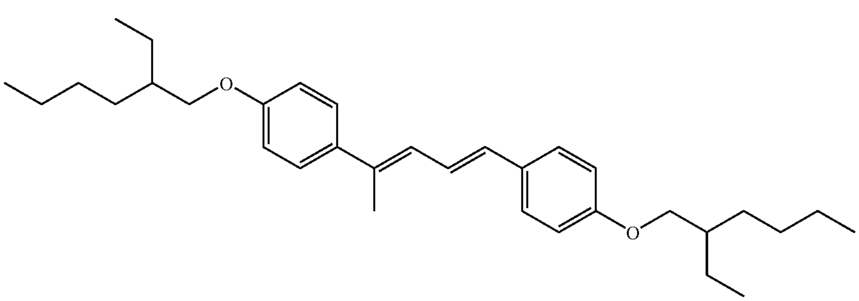

-continued
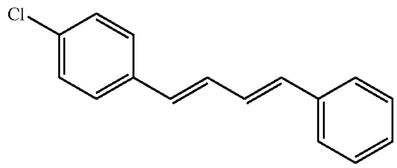
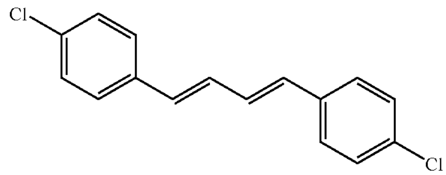
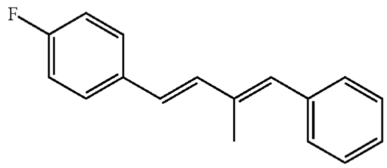
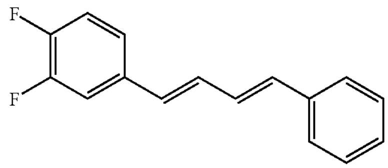
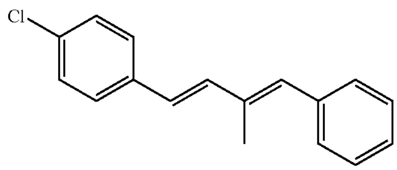
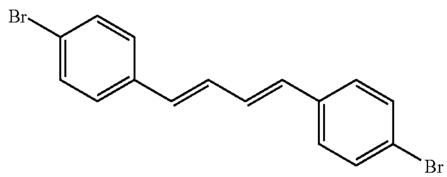
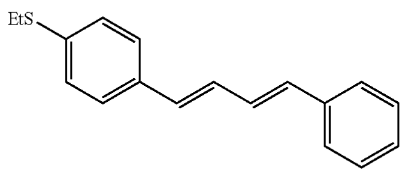
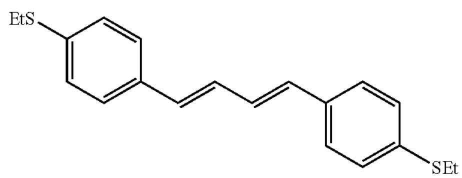
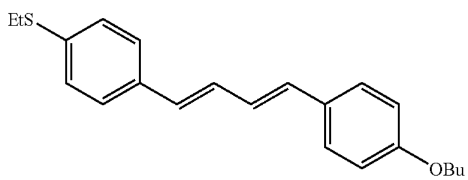
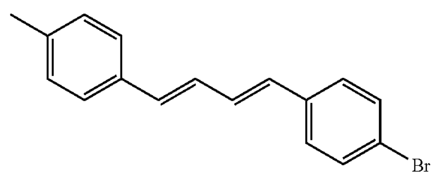
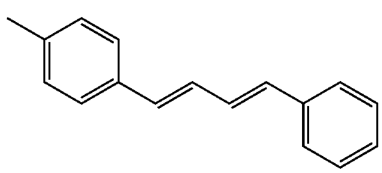
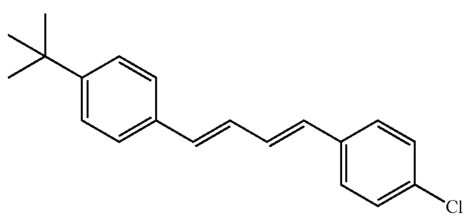
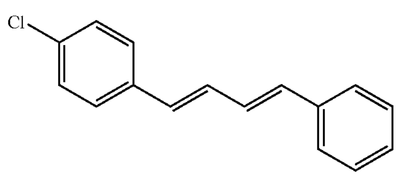
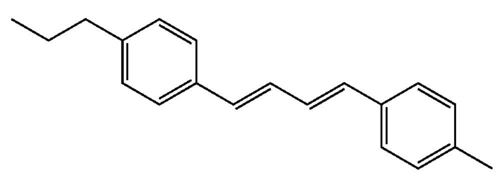
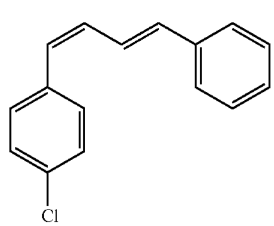
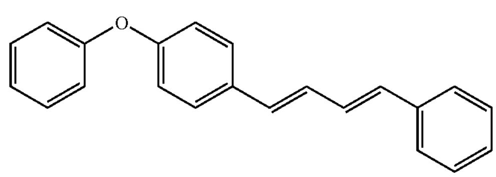
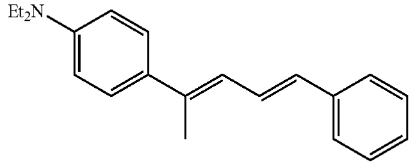
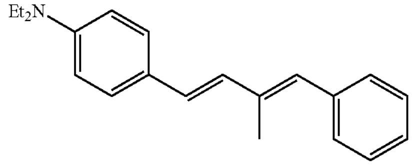

-continued
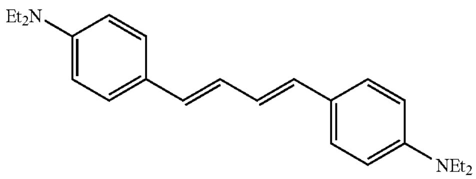
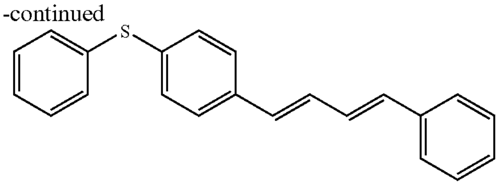
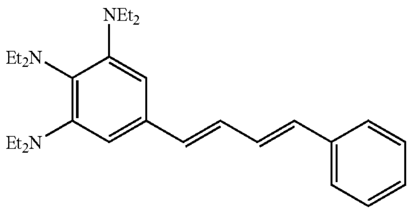
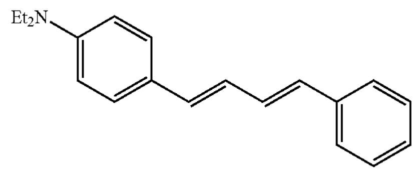
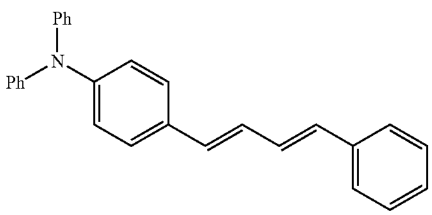
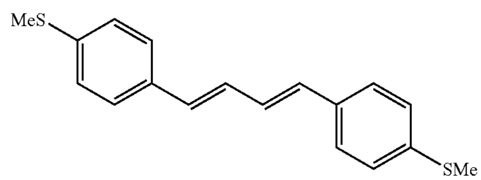
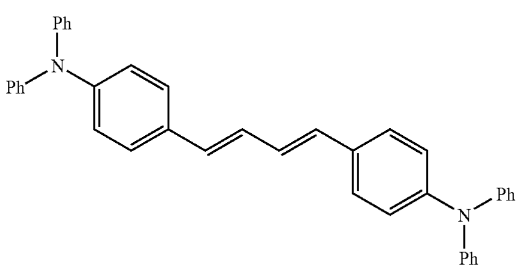
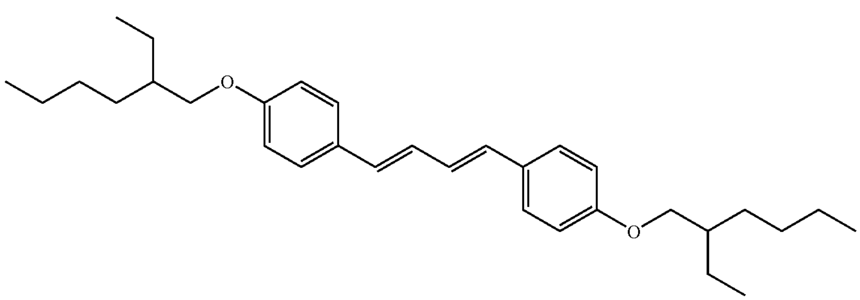
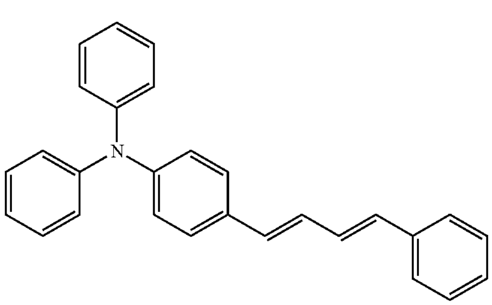
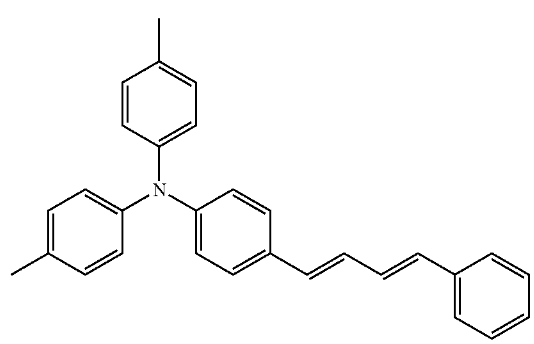

-continued
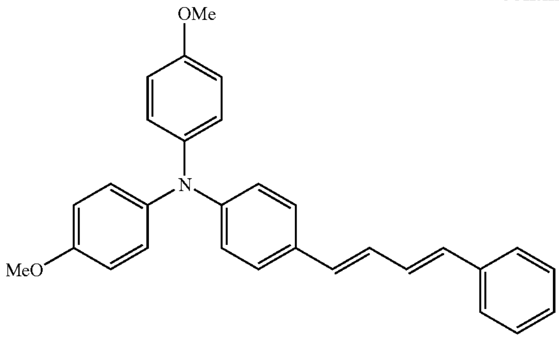
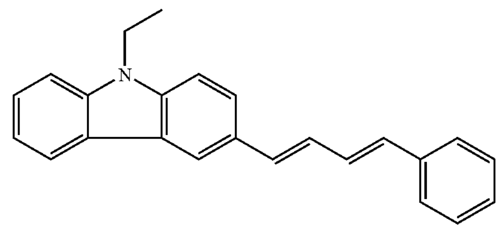
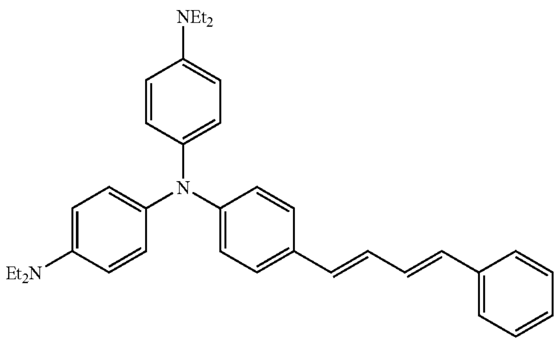
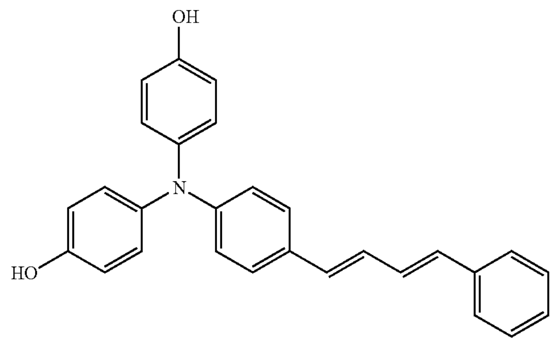
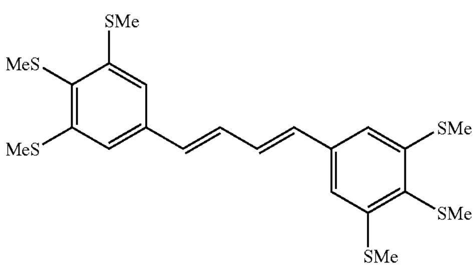
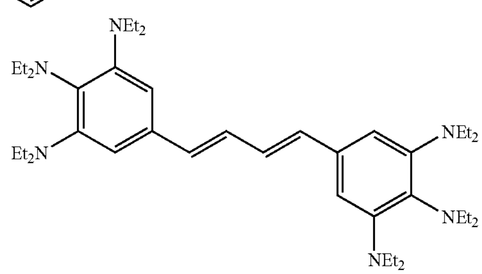
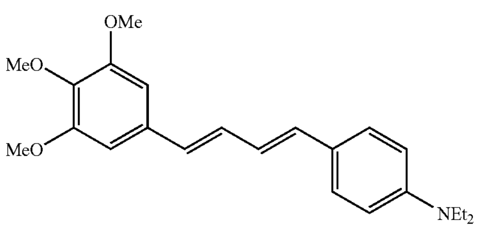
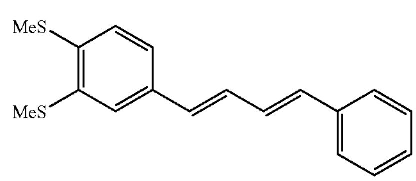
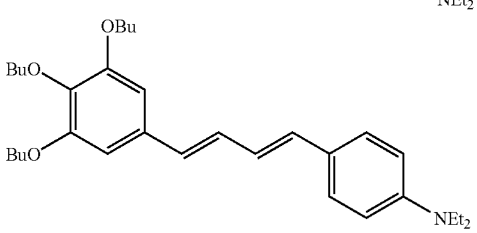
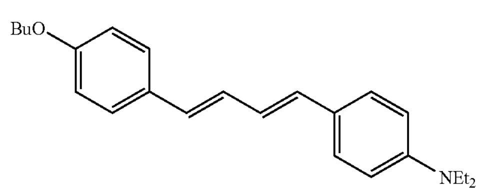
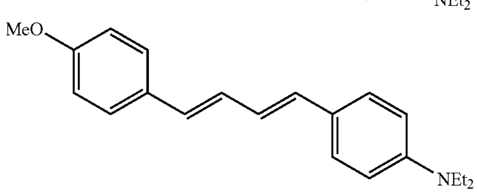
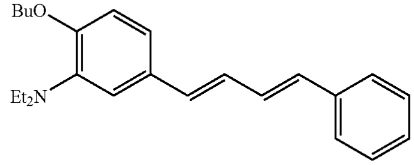
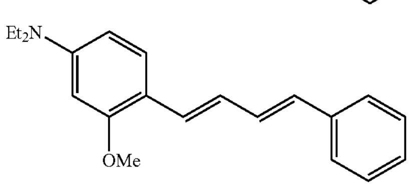
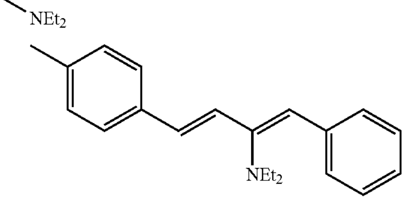

-continued

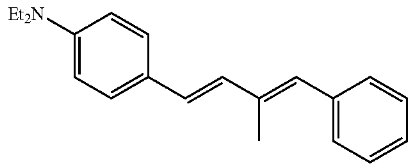

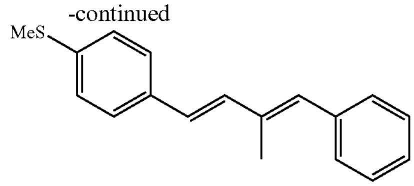

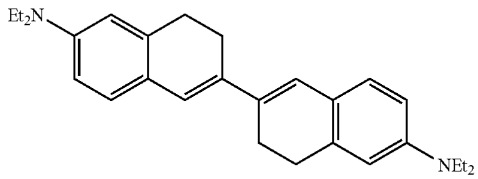

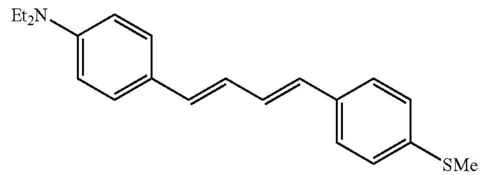

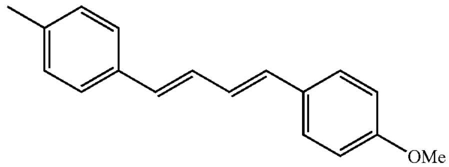

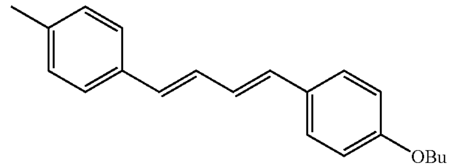

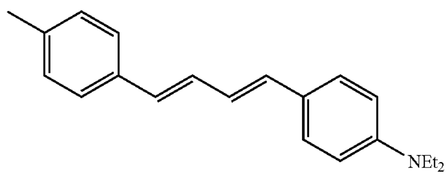

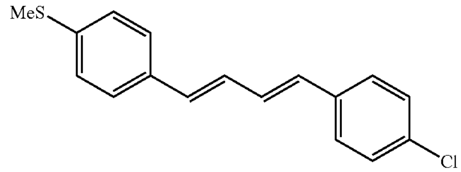

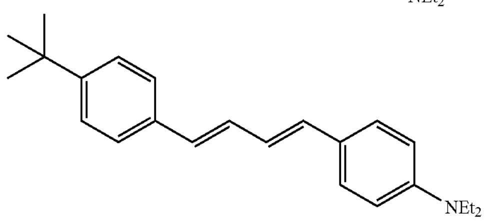

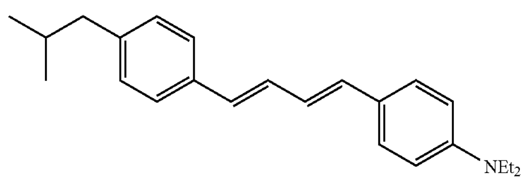

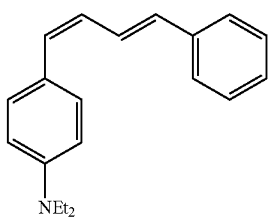

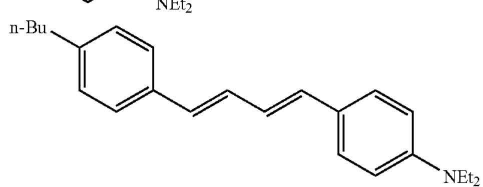

(III)

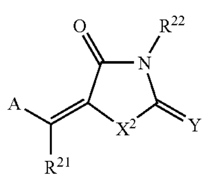

In Formula (III), A represents an optionally substituted aromatic or heterocyclic group; $X^2$ represents an oxygen atom, a sulfur atom or —N($R^{23}$)—; Y represents an oxygen atom, a sulfur atom or =N($R^{23}$); $R^{21}$, $R^{22}$ and $R^{23}$ each independently represent a hydrogen atom or a monovalent nonmetallic atom group; and A, $R^{21}$, $R^{22}$, and $R^{23}$ may be bonded to one another to form one or more aliphatic or aromatic rings.

In Formula (III), $R^{21}$, $R^{22}$ and $R^{23}$ each independently represent a hydrogen atom or a monovalent nonmetallic atom group. The monovalent nonmetallic atom group represented by $R^{21}$, $R^{22}$ or $R^{23}$ is preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxyl group, or a halogen atom.

In the compound represented by Formula (III), Y is preferably an oxygen atom or =N($R^{23}$) in terms of increasing the efficiency of decomposition of the photopolymerization initiator. $R^{23}$ each independently represent a hydrogen atom or a monovalent nonmetallic atom group. Y is most preferably =N($R^{23}$).

Preferred examples of the compound represented by Formula (III) include, but are not limited to, Compounds (VI1) to (VI124) below. In the invention, the isomers caused by the presence of the double bond(s) between the acidic nuclear and the basic nuclear are not explicitly specified, and the structure is not limited to a particular isomer. Accordingly, any isomer may be used in the invention.

-continued
(VI1)
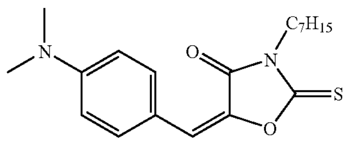
(VI2)
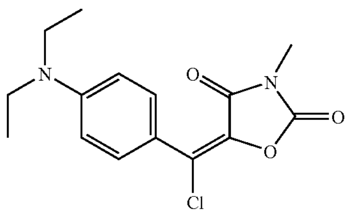
(VI3)
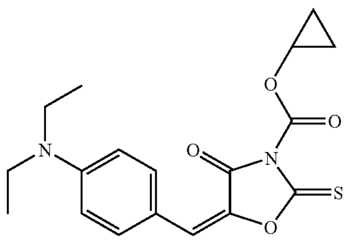
(VI4)
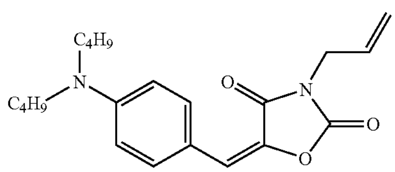
(VI5)
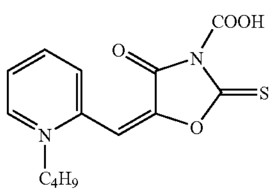
(VI6)
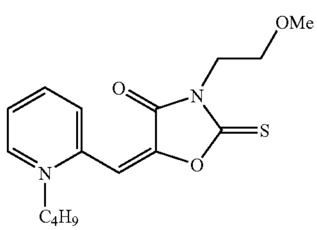
(VI7)
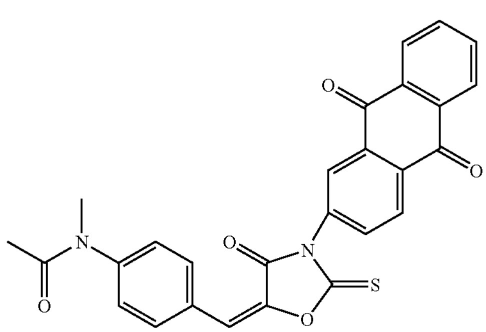
(VI8)
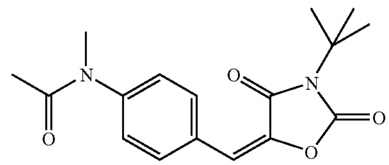
(VI9)
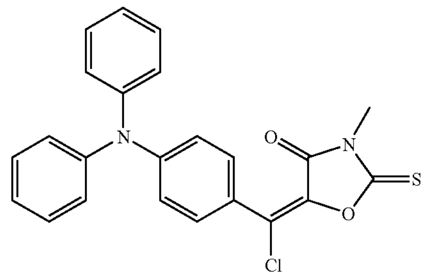
(VI10)
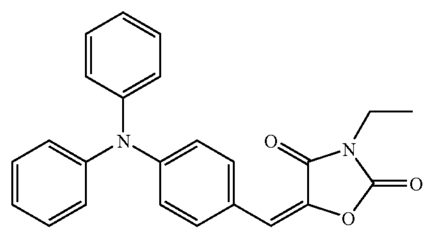
(VI11)
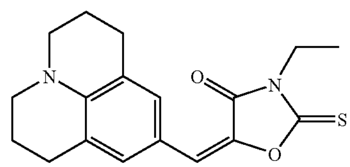
(VI12)
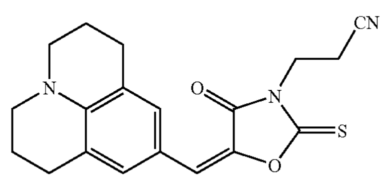
(VI13)
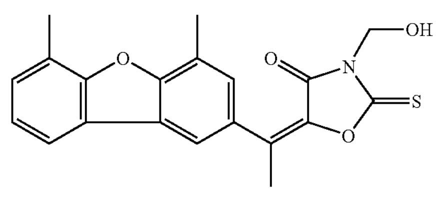
(VI14)
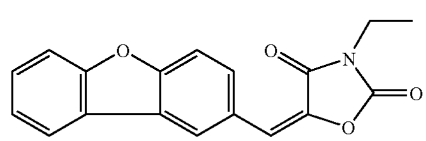
(VI15)
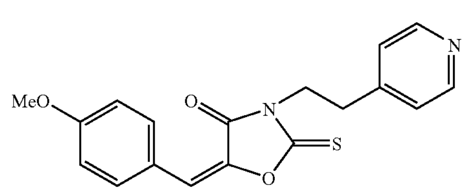

-continued
(VI16)
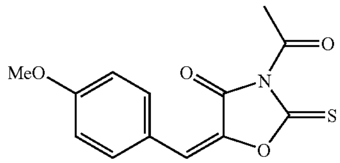
(VI17)
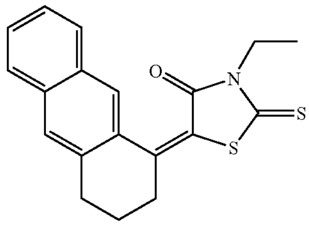
(VI18)
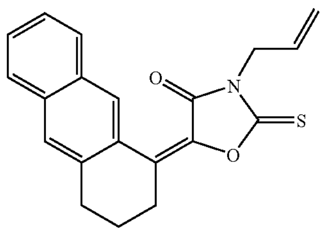
(VI19)
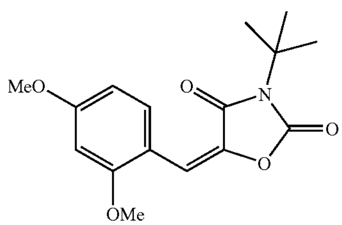
(VI20)
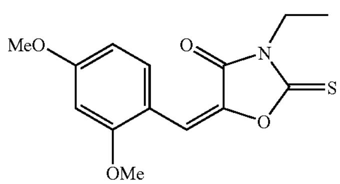
(VI21)
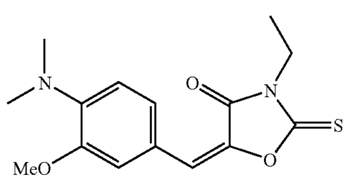
(VI22)
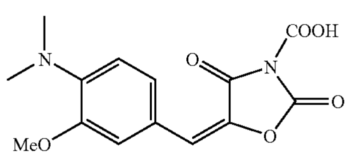
(VI23)
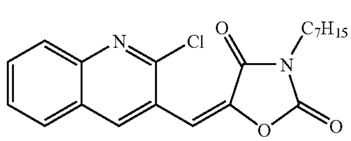
-continued
(VI24)
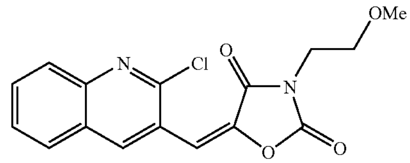
(VI25)
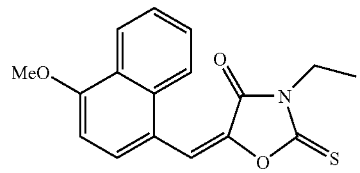
(VI26)
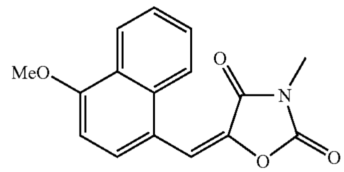
(VI27)
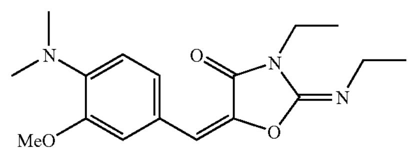
(VI28)
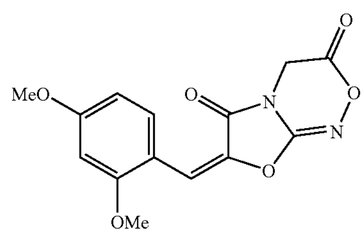
(VI29)
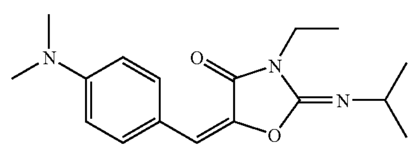
(VI30)
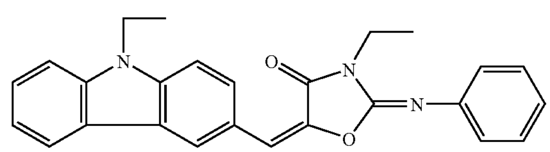
(VI31)
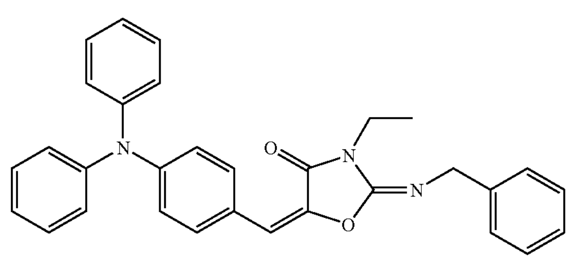

-continued
(VI32)
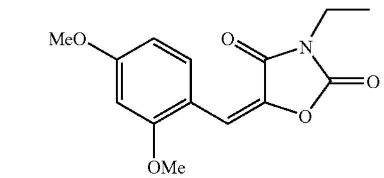
(VI33)
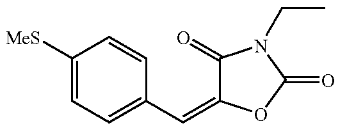
(VI34)
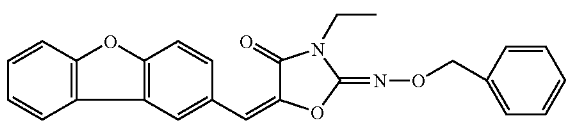
(VI35)
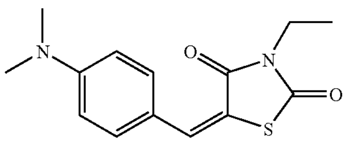
(VI36)
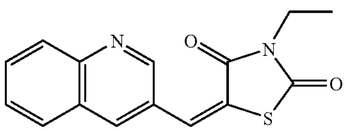
(VI37)
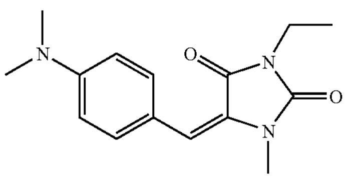
(VI38)
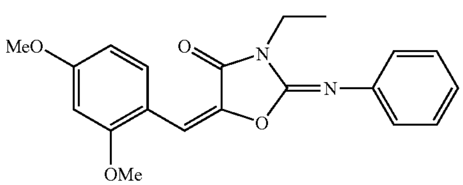
(VI39)
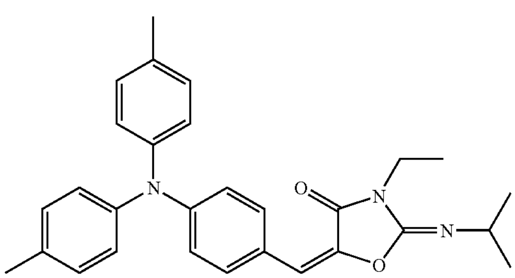
(VI40)
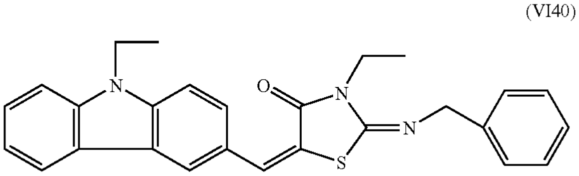
-continued
(VI41)
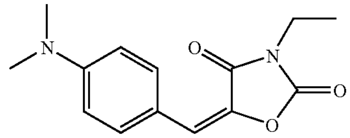
(VI42)
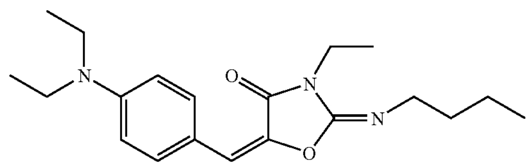
(VI43)
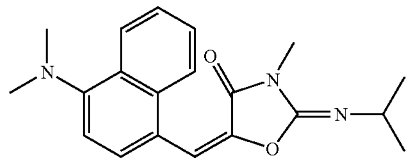
(VI44)
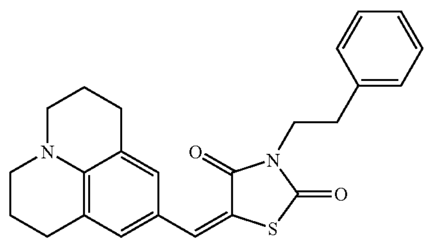
(VI45)
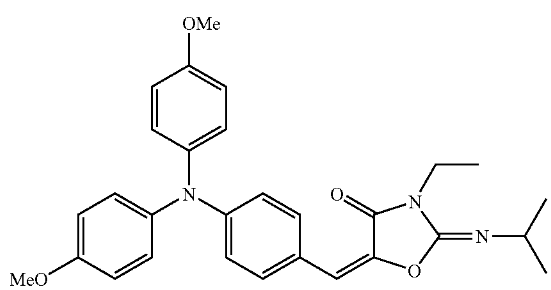
(VI46)
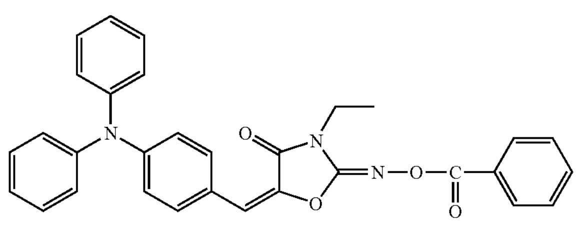
(VI47)
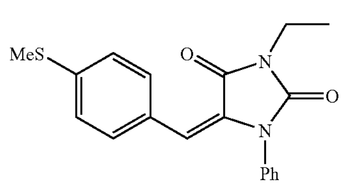

-continued
(VI48)
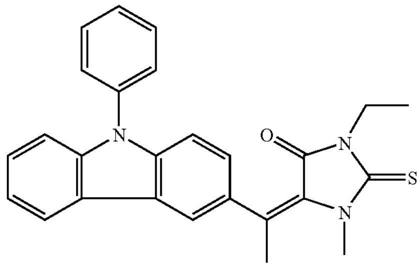
(VI49)
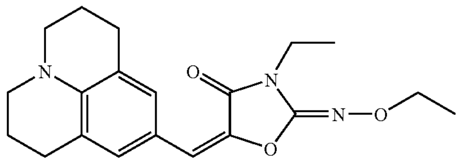
(VI50)
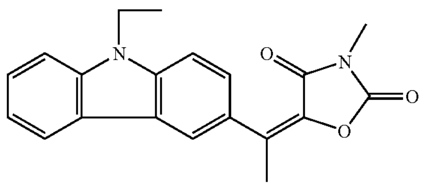
(VI51)
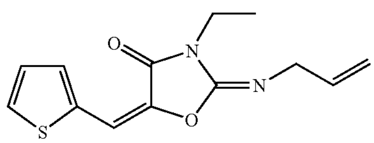
(VI52)
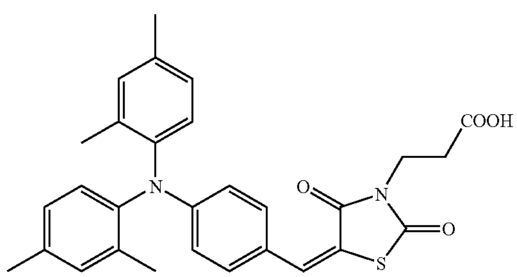
(VI53)
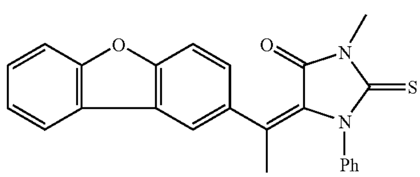
(VI54)
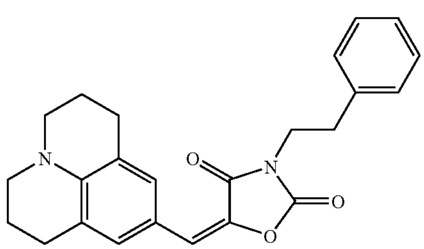
(VI55)
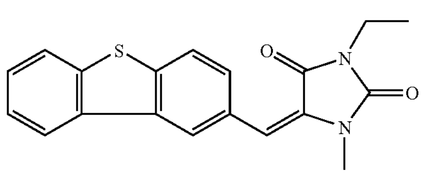
-continued
(VI56)
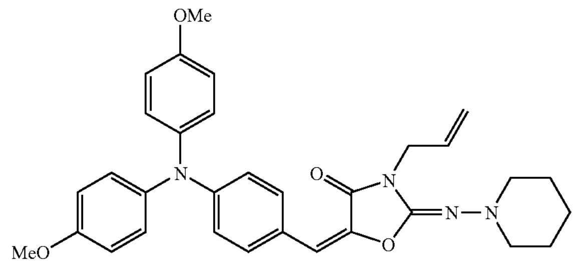
(VI57)
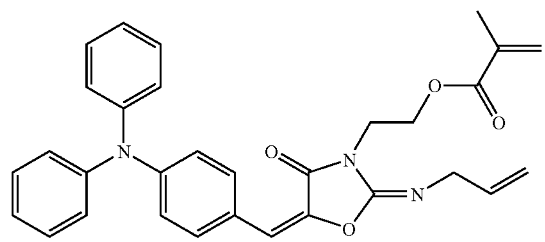
(VI58)
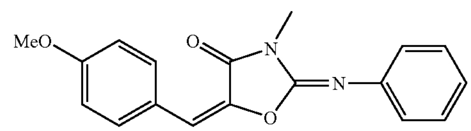
(VI59)
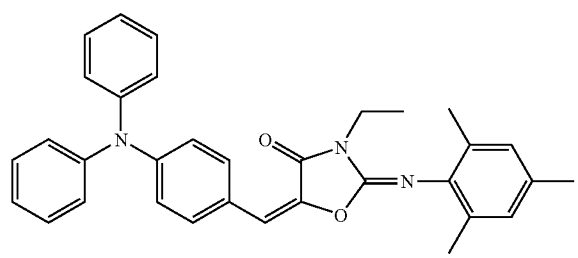
(VI60)
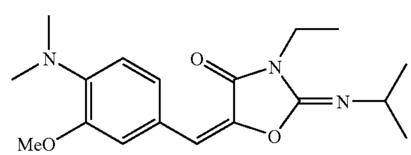
(VI61)
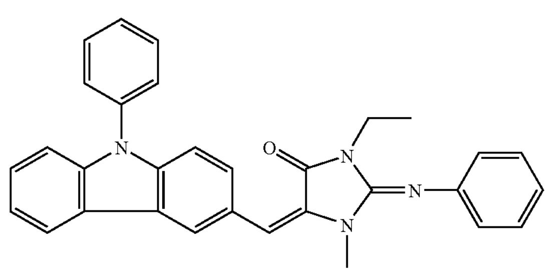
(VI62)
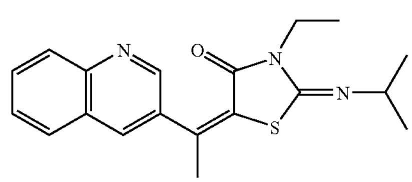

-continued
(VI63)
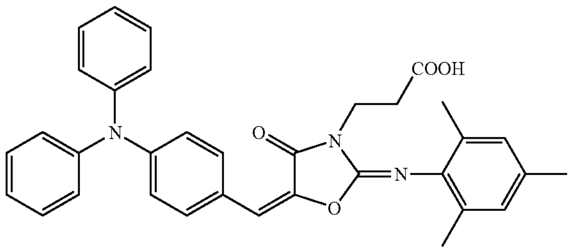
(VI64)
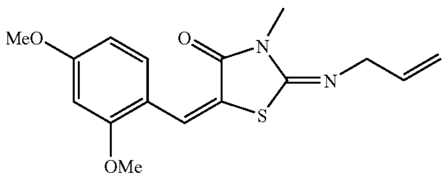
(VI65)
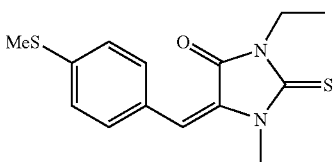
(VI66)
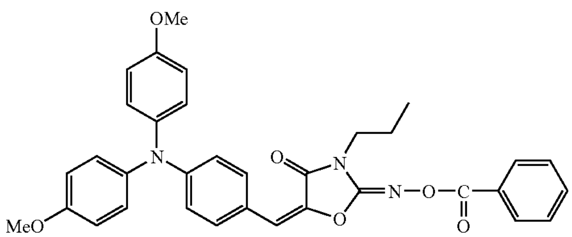
(VI67)
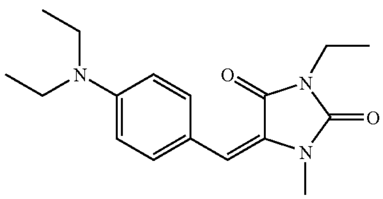
(VI68)
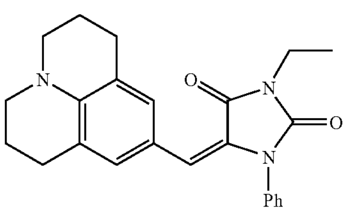
(VI69)
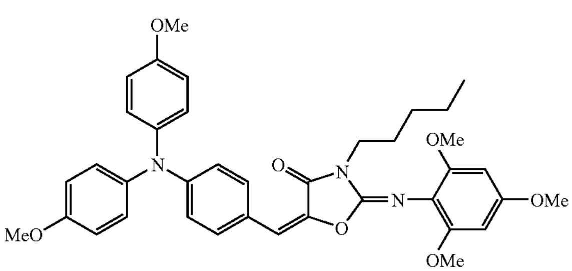
-continued
(VI70)
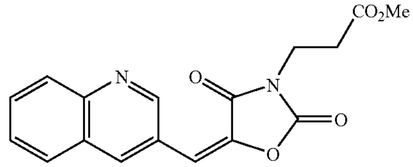
(VI71)
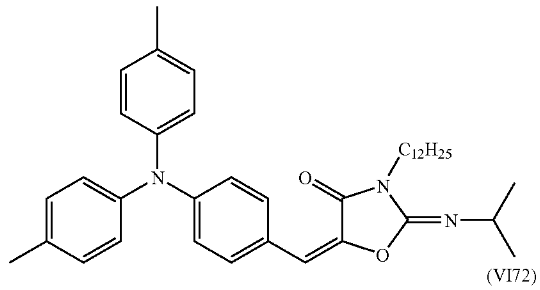
(VI72)
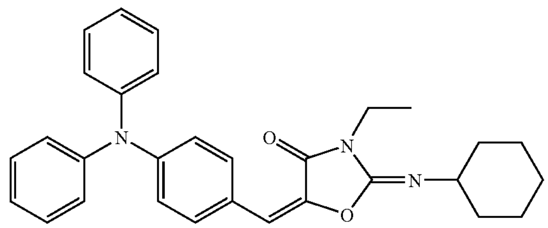
(VI73)
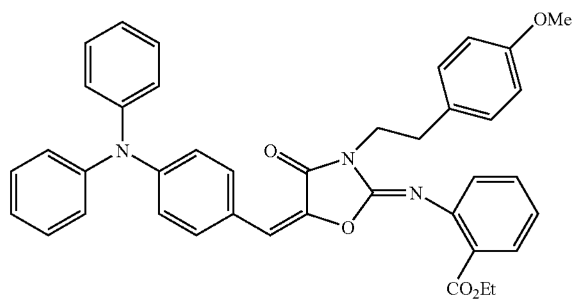
(VI74)
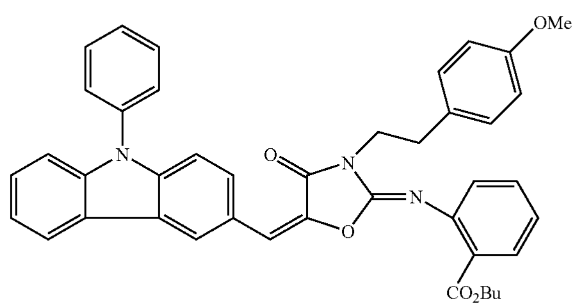
(VI75)
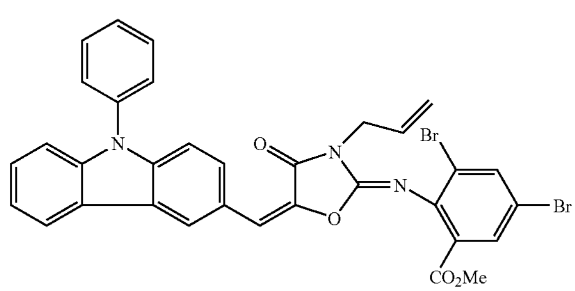

-continued
(VI76)
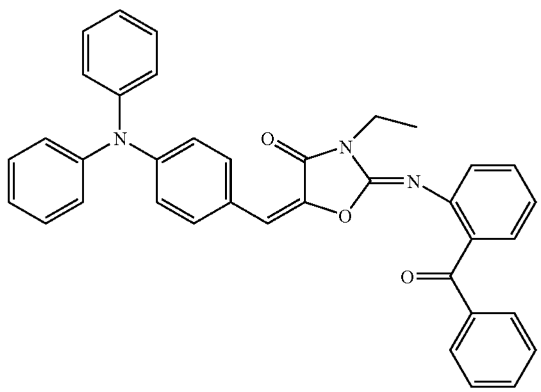
(VI77)
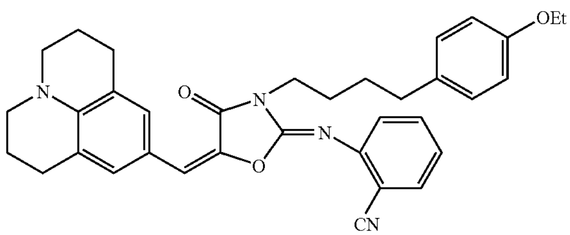
(VI78)
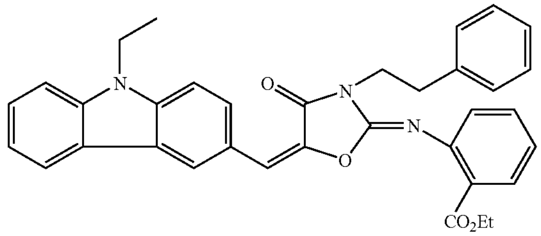
(VI79)
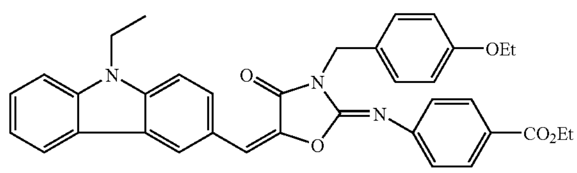
(VI80)
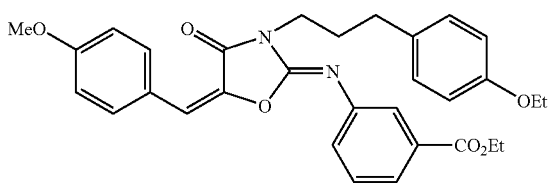
(VI81)
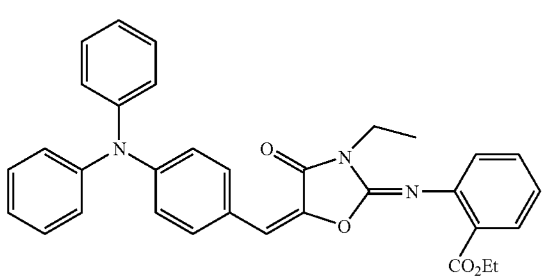
-continued
(VI82)
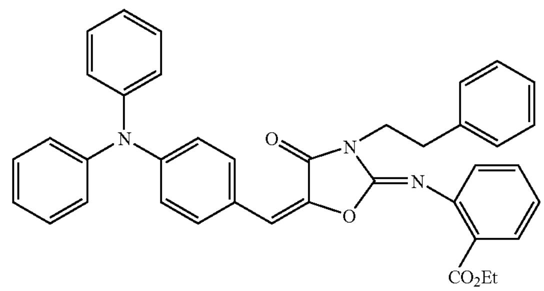
(VI83)
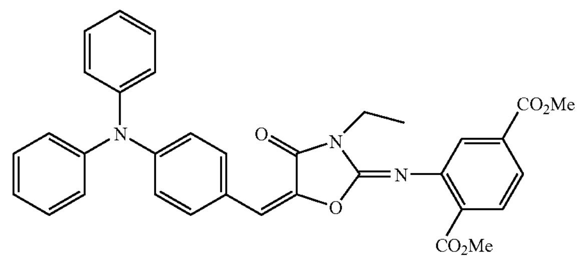
(VI84)
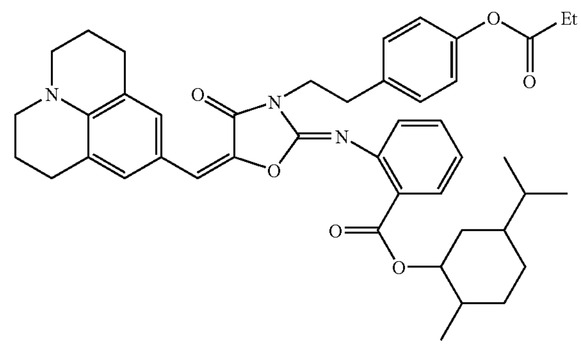
(VI85)
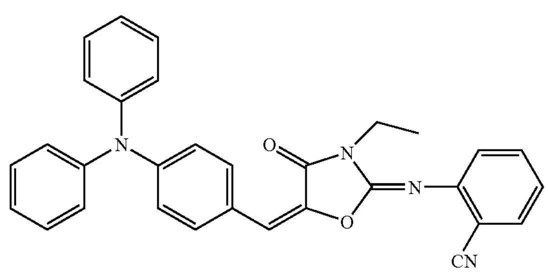
(VI86)
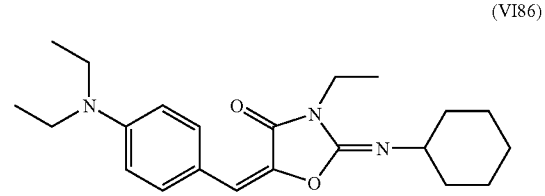
(VI87)
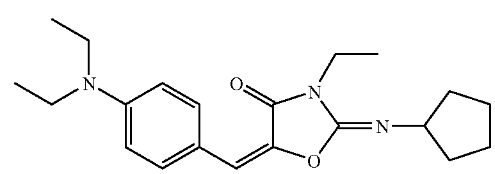

(VI88)
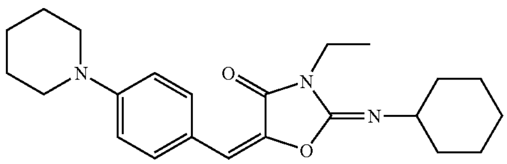
(VI89)
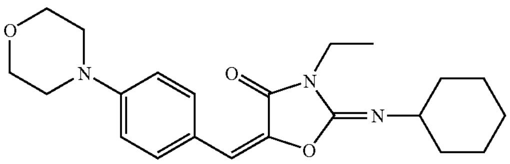
(VI90)
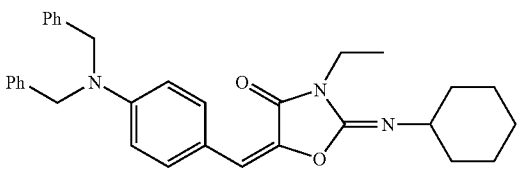
(VI91)
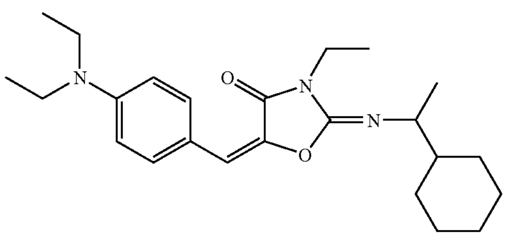
(VI92)
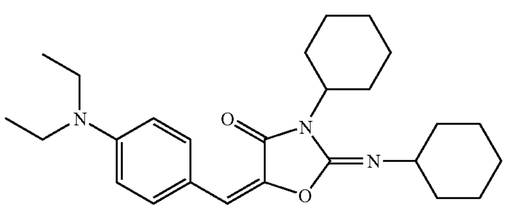
(VI93)
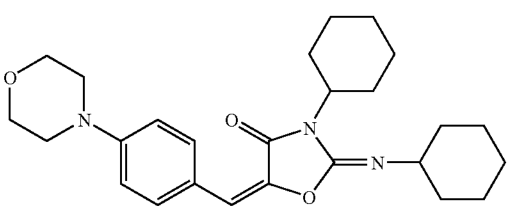
(VI94)
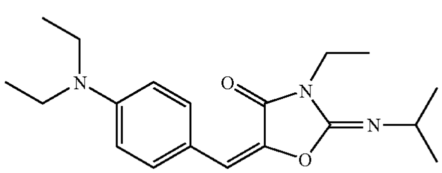
(VI95)
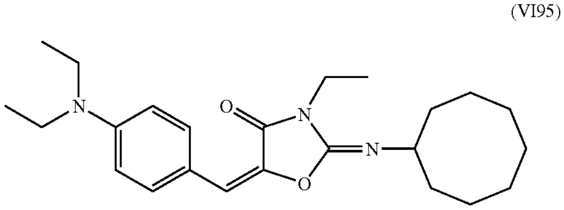
(VI96)
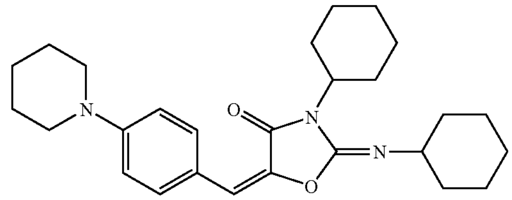
(VI97)
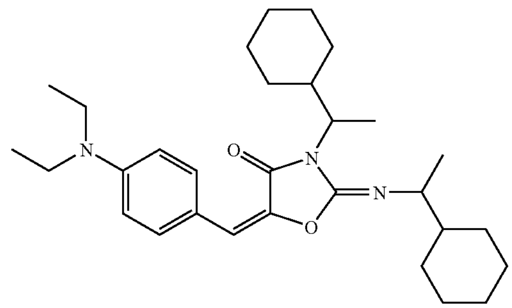
(VI98)
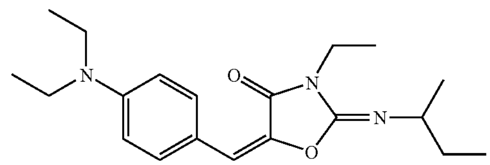
(VI99)
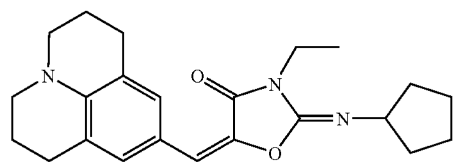
(VI100)
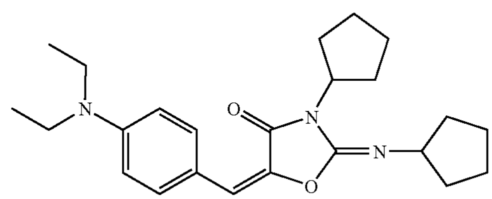
(VI101)
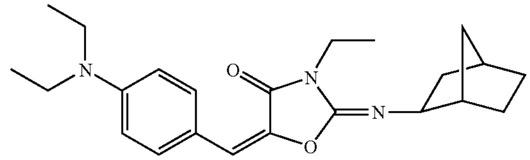
(VI102)
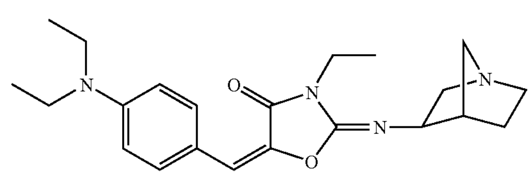

-continued
(VI103)
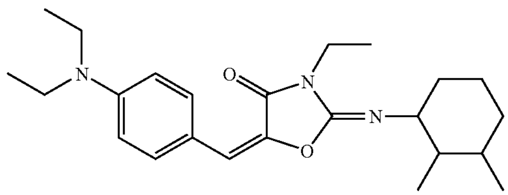
(VI104)
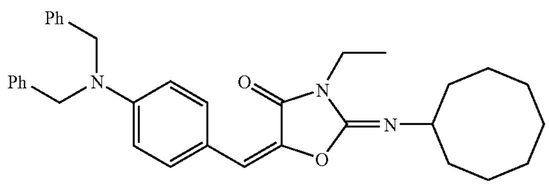
(VI105)
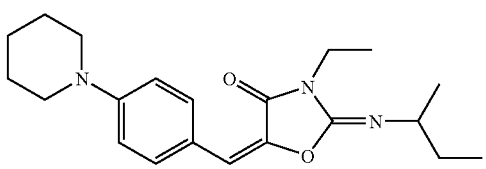
(VI106)
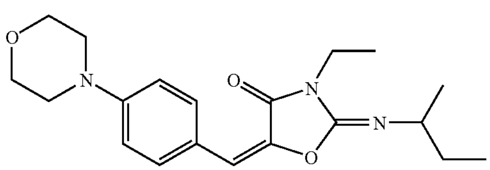
(VI107)
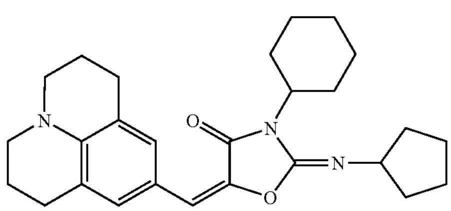
(VI108)
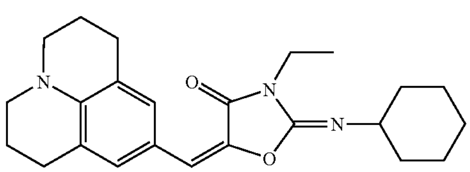
(VI109)
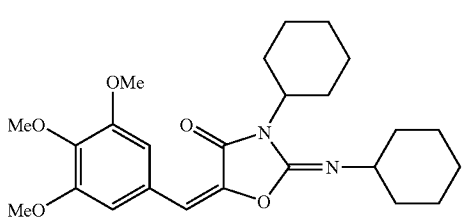
(VI110)
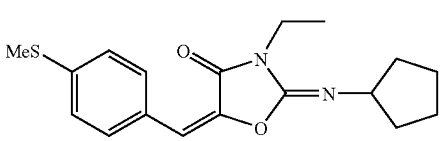
-continued
(VI111)
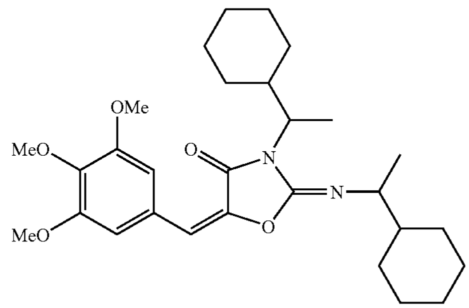
(VI112)
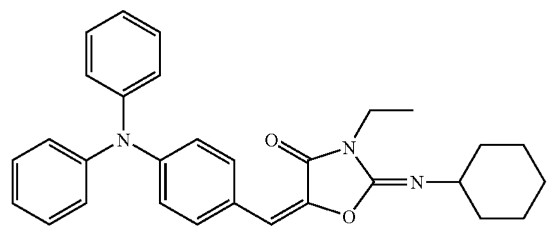
(VI113)
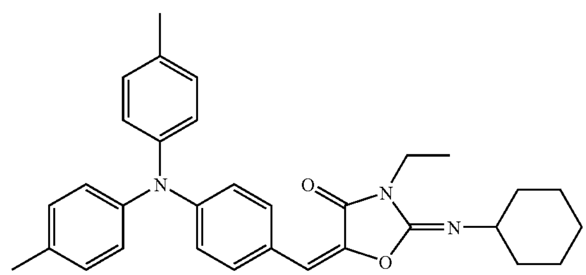
(VI114)
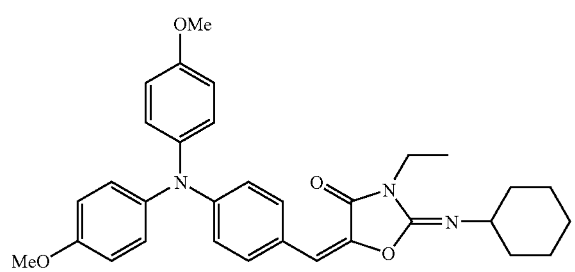
(VI115)
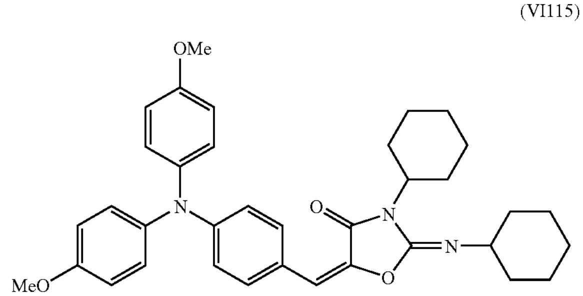

-continued (VI116)

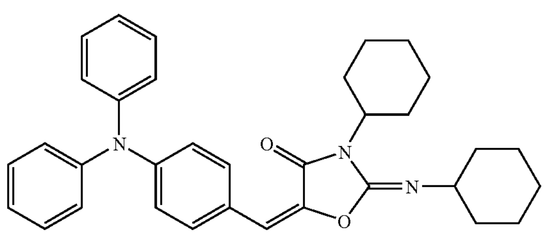

(VI117)

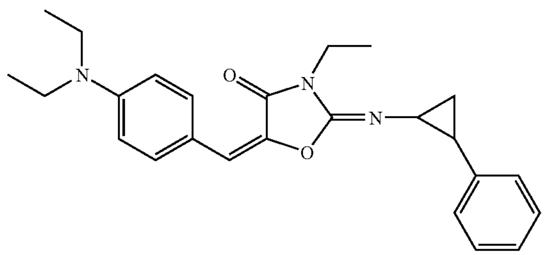

(VI118)

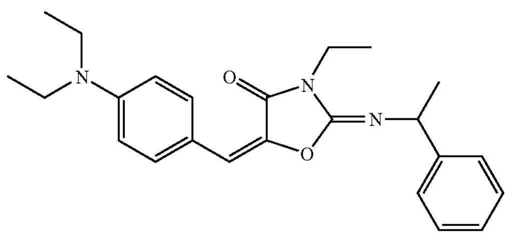

(VI119)

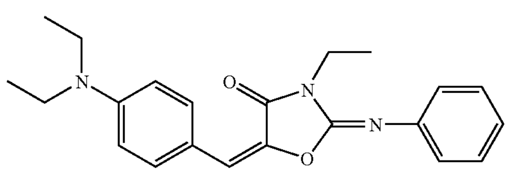

(VI120)

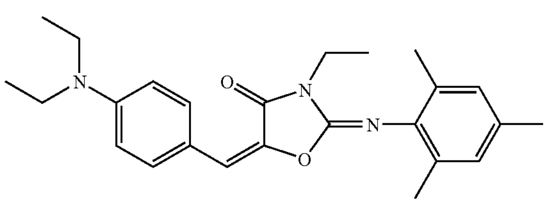

(VI121)

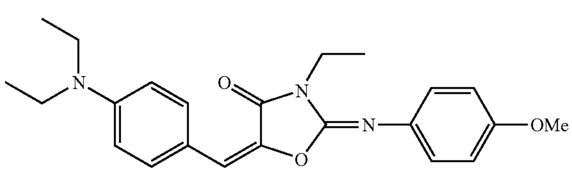

(VI122)

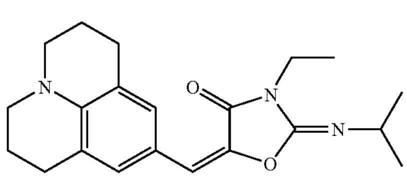

-continued (VI123)

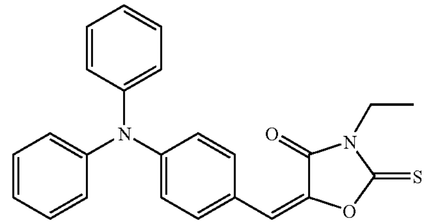

(VI124)

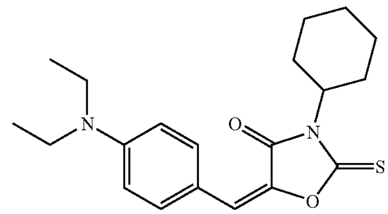

(d) Co-Sensitizer

The curable composition of the invention preferably contains (d) a co-sensitizer.

In the invention, the co-sensitizer has effects of further improving the sensitivity to active radiation of (a) the specific oxime compound or (c) the sensitizer and/or an effect of suppressing inhibition of polymerization of (b) the polymerizable compound caused by oxygen.

Examples of the co-sensitizer include amines such as the compounds described in M. R. Sander et al., Journal of Polymer Society, Vol. 10, p. 3173 (1972), JP-B No. 44-20189, JP-A Nos. 51-82102, 52-134692, 59-138205, 60-84305, 62-18537, and 64-33104, and Research Disclosure 33825. Specific examples include triethanolamine, ethyl p-dimethylaminobenzoate, p-formyldimethylaniline, and p-methylthiodimethylaniline.

Other examples of the co-sensitizer include thiols and sulfides such as the thiol compounds described in JP-A No. 53-702, JP-B No. 55-500806 and JP-A No. 05-142772 and the disulfide compounds described in JP-A No. 56-75643, and specific examples include 2-mercaptobenzothiazole, 2-mercaptobenzoxazole, 2-mercaptobenzimidazole, 2-mercapto-4(3H)-quinazoline, and β-mercaptonaphthalene.

Other examples of the co-sensitizer also include amino acid compounds (such as N-phenylglycine), the organometallic compounds described in JP-B No. 48-42965 (such as tributyltin acetate), the hydrogen donators described in JP-B No. 55-34414, and the sulfur compounds (such as trithiane) described in JP-A No. 06-308727.

In order to increase the curing rate with a balance between polymer growth rate and chain transfer, the content of the co-sensitizer is preferably from 0.1 to 30% by mass, more preferably from 1 to 25% by mass, even more preferably from 1.5 to 20% by mass, based on the mass of the total solids of the curable composition (or the photopolymerizable composition (1)).

The curable composition (or the photopolymerizable composition (1)) of the invention preferably contains a thiol compound as the co-sensitizer.

The thiol compound that may be contained in the curable composition (or the photopolymerizable composition (1)) of the invention is preferably a compound represented by Formula (IV) below.

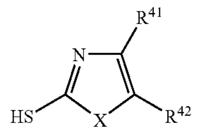

(IV)

In Formula (IV), X represents a sulfur atom, an oxygen atom or —N($R^{43}$)—; $R^{43}$ represents a hydrogen atom, an alkyl group having 1 to 5 carbon atoms or an aryl group having 6 to 13 carbon atoms; $R^{41}$ and $R^{42}$ each independently represent a hydrogen atom, an alkyl group having 1 to 5 carbon atoms, a hydroxyalkyl group having 1 to 3 carbon atoms, a phenyl group optionally substituted by an alkoxy group having 1 to 8 carbon atoms, a nitro group, an alkoxycarbonyl group having an alkyl group having 1 to 8 carbon atoms, a phenoxycarbonyl group, an acetyl group, or a carboxyl group, or $R^{41}$, $R^{42}$ and the double bond therebetween together may form a benzene ring; and the double bond between $R^{41}$ and $R^{42}$ may be hydrogenated.

The thiol compound may be, for example, selected from the compounds described in JP-A No. 53-702, JP-B No. 55-500806, and JP-A No. 05-142772.

In the invention, the thiol compound is preferably a compound represented by Formula (V) below.

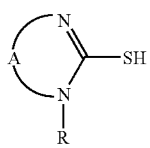

(V)

In Formula (V), R represents an alkyl group or an aryl group, and A represents an atom group that forms a heterocycle together with N═C—N.

In Formula (V), R represents an alkyl group or an aryl group.

The alkyl group may be a linear, branched or cyclic alkyl group having 1 to 20 carbon atoms, more preferably a linear alkyl group having 1 to 12 carbon atoms, a branched alkyl group having 3 to 12 carbon atoms or a cyclic alkyl group having 5 to 10 carbon atoms.

Examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicocyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

The aryl group may have a monocyclic structure, structure having a condensed ring formed by condensation of 1 to 3 benzene rings, or a structure having a condensed ring formed by condensation of at least one benzene ring and at least one five-membered unsaturated ring. Examples thereof include a phenyl group, a naphthyl group, an anthryl group, a phenanthryl group, an indenyl group, an acenaphthenyl group, and a fluorenyl group. In particular, a phenyl group or a naphthyl group is more preferred.

The alkyl group or the aryl group may further have at least one substituent. Examples of the substituent that may be introduced include a linear, branched or cyclic alkyl group having 1 to 20 carbon atoms, a linear group, a branched or cyclic alkenyl group having 2 to 20 carbon atoms, an alkynyl group having 2 to 20 carbon atoms, an aryl group having 6 to 20 carbon atoms, an acyloxy group having 1 to 20 carbon atoms, an alkoxycarbonyloxy group having 2 to 20 carbon atoms, an aryloxycarbonyloxy group having 7 to 20 carbon atoms, a carbamoyloxy group having 1 to 20 carbon atoms, a carbonamide group having 1 to 20 carbon atoms, a sulfonamide group having 1 to 20 carbon atoms, a carbamoyl group having 1 to 20 carbon atoms, a sulfamoyl group, a substituted sulfamoyl group having 1 to 20 carbon atoms, an alkoxy group having 1 to 20 carbon atoms, an aryloxy group having 6 to 20 carbon atoms, an aryloxycarbonyl group having 7 to 20 carbon atoms, an alkoxycarbonyl group having 2 to 20 carbon atoms, an N-acylsulfamoyl group having 1 to 20 carbon atoms, an N-sulfamoylcarbamoyl group having 1 to 20 carbon atoms, an alkylsulfonyl group having 1 to 20 carbon atoms, an arylsulfonyl group having 6 to 20 carbon atoms, an alkoxycarbonylamino group having 2 to 20 carbon atoms, an aryloxycarbonylamino group having 7 to 20 carbon atoms, an amino group, a substituted amino group having 1 to 20 carbon atoms, an imino group having 1 to 20 carbon atoms, an ammonio group having 3 to 20 carbon atoms, a carboxyl group, a sulfo group, an oxy group, a mercapto group, an alkylsulfinyl group having 1 to 20 carbon atoms, an arylsulfinyl group having 6 to 20 carbon atoms, an alkylthio group having 1 to 20 carbon atoms, an arylthio group having 6 to 20 carbon atoms, a ureide group having 1 to 20 carbon atoms, a heterocyclic group having 2 to 20 carbon atoms, an acyl group having 1 to 20 carbon atoms, a sulfamoylamino group, a substituted sulfamoylamino group having 1 to 2 carbon atoms, a silyl group having 2 to 20 carbon atoms, an isocyanate group, an isocyanide group, a halogen atom (such as a fluorine, chlorine or bromine atom), a cyano group, a nitro group, and an onium group.

In Formula (V), A represents an atom group that forms a heterocycle together with N═C—N.

The at least one atom that forms the atom group may include atoms selected from carbon, nitrogen, hydrogen, sulfur, and selenium atoms.

The heterocycle formed by A and N═C—N may further have at least one substituent. Examples of introducible substituents may include the same substituents as those introducible into the above-mentioned alkyl group or aryl group.

In the invention, the thiol compound is more preferably a compound represented by Formula (VI) or (VII) below.

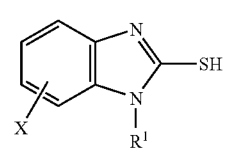

(VI)

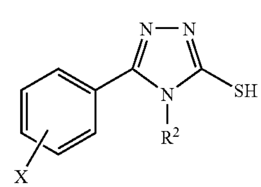

(VII)

In Formula (VI), $R^1$ represents an aryl group, and X represents a hydrogen atom, a halogen atom, an alkoxy group, an alkyl group, or an aryl group.

In Formula (VII), $R^2$ represents an alkyl group or an aryl group, and X represents a hydrogen atom, a halogen atom, an alkoxy group, an alkyl group, or an aryl group.

In Formulae (VI) and (VII), the halogen atom is preferably a fluorine, chlorine, bromine, or iodine atom.

In Formulae (VI) and (VII), the alkoxy group may be a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumetyloxy group, a methoxyphenyloxy group, an ethoxyphenyloxy group, a chlorophenyloxy group, a bromophenyloxy group, an acetyloxy group, a benzoyloxy group, or a naphthyloxy group.

In Formulae (VI) and (VII), the alkyl group has the same definition as the alkyl group represented by R in Formula (V), and their preferred ranges are also the same.

In Formulae (VI) and (VII), the aryl group has the same definition as the aryl group represented by R in Formula (V), and their preferred ranges are also the same.

In Formulae (VI) and (VII), each group may further have at least one substituent. Examples of the substituent include those mentioned above as substituents introducible to the alkyl or aryl group represented by R in Formula (R).

In Formulae (VI) and (VII), X is preferably a hydrogen atom in view of solubility in PGMEA.

In Formula (VI), $R^1$ is most preferably a phenyl group in view of sensitivity and solubility in PGMEA.

In Formula (VII), $R^2$ is more preferably a methyl group, an ethyl group, a phenyl group, or a benzyl group in view of sensitivity and solubility in PGMEA.

Among the compounds represented by Formulae (VI) and (VII), the compound represented by Formula (VII) is most preferred in terms of solubility in PGMEA.

Preferred examples of the thiol compound that may be used in an embodiment of the invention include, but are not limited to, the compounds illustrated below.

In the description, some chemical formulae are simplified structural formulae in which solid lines represent hydrocarbon groups, unless elements and substituents are explicitly indicated. In the examples below, Me represents a methyl group.

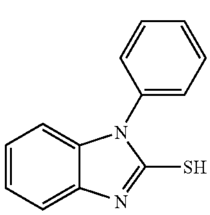

Solubility: 20g/L or more

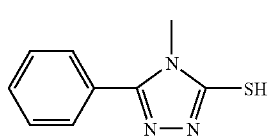

Solubility: 20g/L or more

-continued

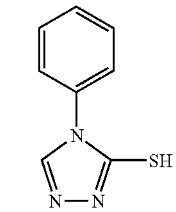

Solubility: 20g/L or more

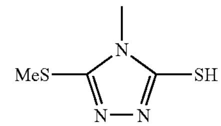

Solubility: 20g/L or more

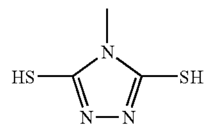

Solubility: 20g/L or more

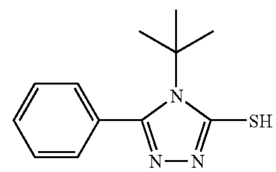

Solubility: 20g/L or more

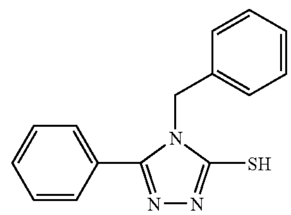

Solubility: 20g/L or more

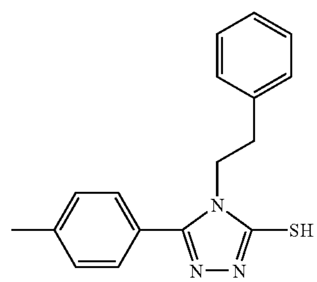

Solubility: 20g/L or more

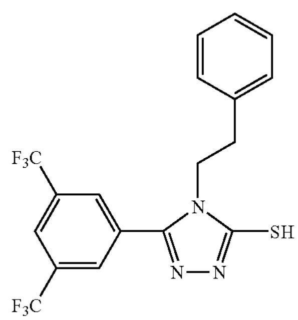

Solubility: 20g/L or more

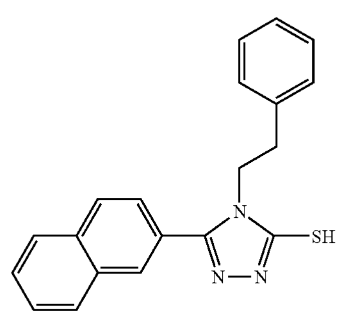

Solubility: 20g/L or more

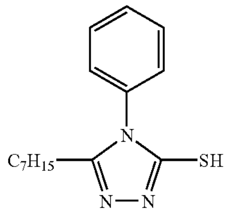
Solubility: 20g/L or more

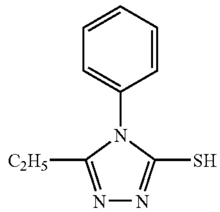
Solubility: 20g/L or more

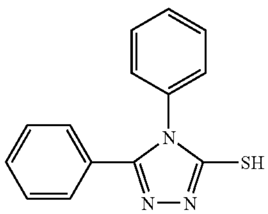
Solubility: 20g/L or more

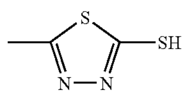
Solubility: 20g/L or more

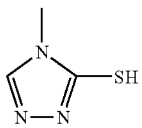
Solubility: 20g/L or more

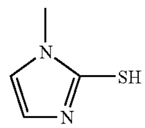
Solubility: 20g/L or more

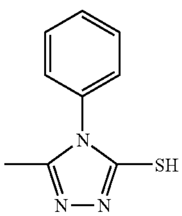
Solubility: 20g/L or more

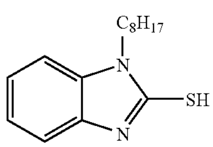
Solubility: 20g/L or more

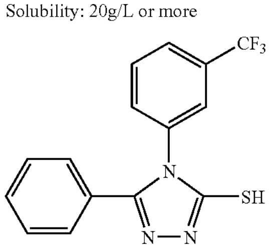
Solubility: 20g/L or less

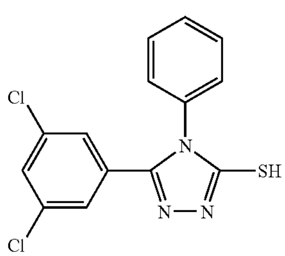
Solubility: less than 20g/L

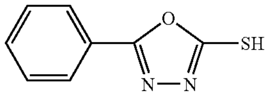
Solubility: less than 20g/L

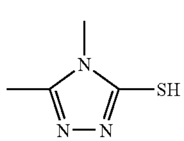
Solubility: less than 20g/L

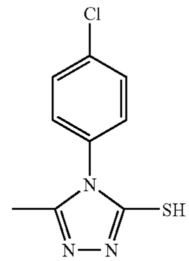
Solubility: less than 20g/L

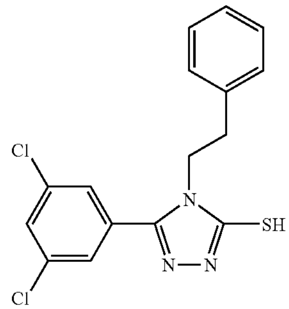
Solubility: less than 20g/L

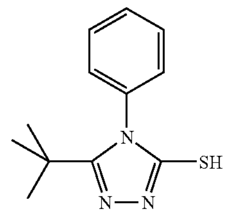
Solubility: less than 20g/L

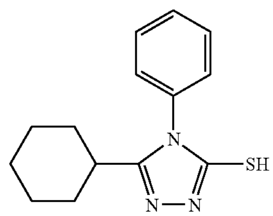
Solubility: less than 20g/L

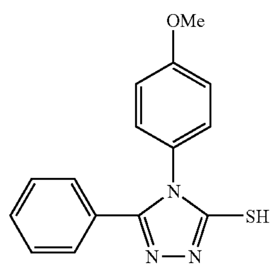
Solubility: less than 20g/L

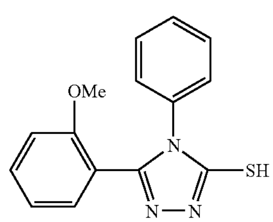
Solubility: less than 20g/L

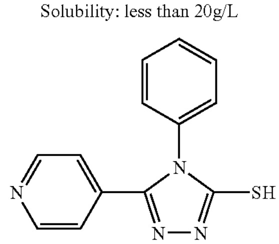
Solubility: less than 20g/L

The solubility of these thiol compounds in PGMEA solvent is preferably 20 g/L or more, more preferably from 20 g/L to 50 g/L, even more preferably from 20 g/L to 40 g/L, in view of coating uniformity.

Solubility Measurement Method

In the description, the solubility of the thiol compound is defined as follows.

The specific thiol compound is added to 5 mL of propylene glycol monomethyl ether acetate (PGMEA) solvent and stirred at 25° C. for one hour. In this process, the greatest amount of the specific thiol compound that can completely dissolve in the solvent is assumed as the solubility.

These thiol compounds may be synthesized by the method described in J. Appl. Chem., 34, 2203-2207 (1961).

Only a single thiol compound may be used alone, or two or more thiol compounds may be used in combination.

When a combination of thiol compounds is used, the thiol compounds may include two or more compounds represented by any one of the above-described formulae, or may include compounds respectively represented by different formulae (in an embodiment, for example, at least one compound selected from the class of compounds represented by Formula (VI) may be used in combination with at least one compound selected from the class of compounds represented by Formula (VII).

When the curable composition (or the photopolymerizable composition (1)) of the invention contains the thiol compound, the content of the thiol compound is preferably from 0.5 to 30% by mass, more preferably from 1 to 25% by mass, even more preferably from 3 to 20% by mass, based on the mass of the total solids of the curable composition (or the photopolymerizable composition (1)), in terms of increasing the curing rate with a balance between polymer growth rate and chain transfer.

(e) Colorant

The curable composition of the invention may contain (e) a colorant. When the colorant is added, a colored curable composition of a desired color may be obtained. The curable composition of the invention contains (a) the specific oxime compound having excellent sensitivity to a short-wavelength light source such as a 365 nm or 406 nm light source. Therefore, the curable composition of the invention can be cured with high sensitivity, even when it contains a colorant at a high concentration.

The colorant used in the invention is not particularly limited. One of, or a mixture of two or more of, various known conventional dyes and pigments may be used, which may be appropriately selected depending on the use of the curable composition. When the colored curable composition of the invention is used for the production of a color filter, either of a colorant of a chromatic color such as R, G or B for forming color pixels of the color filter or a black colorant generally used for forming black matrices may be employed.

Colorants applicable to the curable composition of the invention are described in detail below, by describing colorants suitable for color filters as examples.

Chromatic pigments to be used may be various known conventional inorganic or organic pigments. Higher transparency is preferable regardless of whether the pigment is inorganic or organic. From this point of view, pigment particles are preferably smaller. When also considering handleability, the average particle size of the pigments is preferably from 0.01 μm to 0.1 μm, more preferably from 0.01 μm to 0.05 μm.

Examples of the inorganic pigments include metal compounds, typical examples of which include metal oxides and metal complex salts. Specific examples include oxides of iron, cobalt, aluminum, cadmium, lead, copper, titanium, magnesium, chromium, zinc, antimony, or other metals, and complex oxides of the above metals.

Examples of the organic pigments include:

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37;

C.I. Pigment Brown 25, 28;

C.I. Pigment Black 1, 7; and carbon black.

In the invention, pigments having a basic N atom in their structures are particularly preferably used. The basic N atom-containing pigments exhibit high dispersibility in the curable composition (or the photopolymerizable composition (1)) of the invention. Although the reason for that has not been clearly understood yet, it is suggested that high affinity between the photosensitive polymerizable component and the pigment may have an effect.

In the invention, examples of pigments that are preferably used include, but are not limited to, the pigments listed below.

C.I. Pigment Yellow 11, 24, 108, 109, 110, 138, 139, 150, 151, 154, 167, 180, 185;

C.I. Pigment Orange 36, 71;

C.I. Pigment Red 122, 150, 171, 175, 177, 209, 224, 242, 254, 255, 264;

C.I. Pigment Violet 19, 23, 32;

C.I. Pigment Blue 15:1, 15:3, 15:6, 16, 22, 60, 66; and

C.I. Pigment Black 1.

Only a single organic pigment may be used, or a combination of plural organic pigments may be used to heighten color purity. Some examples of the combination are described below. For example, a red pigment of one or more of an anthraquinone pigment, a perylene pigment and a diketopyrrolopyrrole pigment may be mixed with a diazo yellow pigment, an isoindoline yellow pigment, a quinophthalone yellow pigment, or a perylene red pigment. For example, the anthraquinone pigment may be C.I. Pigment Red 177, the perylene pigment may be C.I. Pigment Red 155 or C.I. Pigment Red 224, and the diketopyrrolopyrrole pigment may be C.I. Pigment Red 254. In view of color reproducibility, C.I. Pigment Yellow 139 is preferably used to form a mixture. The mass ratio of the yellow pigment to the red pigment (yellow pigment / red pigment) is preferably in the range of from 5/100 to 50/100. If the mass ratio is 4/100or lower, it can be difficult to inhibit the light transmittance in the range of 400 nm to 500 nm, and color purity cannot be heightened in some cases. If the ratio is 51/100 or higher, the dominant wavelength can be shifted to the shorter wavelength side, so that a relatively large deviation from the NTSC target hue can be observed in some cases. In particular, the mass ratio is most preferably in the range of from 10/100 to 30/100. In the case of a combination of different red pigments, the, mass ratio thereof may be adjusted depending on the hue.

A green pigment of a halogenated phthalocyanine pigment may be used alone or in a form of a mixture with a diazo yellow pigment, a quinophthalone yellow pigment, an azomethine yellow pigment, or an isoindoline yellow pigment. For example, C.I. Pigment Green 7, 36 or 37 is preferably mixed with C.I. Pigment Yellow 83, C.I. Pigment Yellow 138, C.I. Pigment Yellow 139, C.I. Pigment Yellow 150, C.I. Pigment Yellow 180, or C.I. Pigment Yellow 185. The mass ratio of the yellow pigment to the green pigment (yellow pigment / green pigment) is preferably in the range of from 5/100 to 150/100 . If the mass ratio is lower than 5/100, it can be difficult to inhibit the light transmittance in the range of 400 nm to 450 nm, so that color purity cannot be heightened in some cases. If the ratio is higher than 150/100, the dominant wavelength can be shifted to the longer wavelength side, so that a relatively large deviation from the NTSC target hue can be observed in some cases. In particular, the mass ratio is preferably in the range of from 30/100 to 120/100.

A blue pigment of a phthalocyanine pigment may be used alone or in a form of a mixture with a dioxazine violet pigment. For example, C.I. Pigment Blue 15:6 is preferably mixed with C.I. Pigment Violet 23. The mass ratio of the violet pigment to the blue pigment (violet pigment/blue pigment) is preferably in the range of from 0/100 to 30/100, more preferably 10/100 or less.

Carbon, titanium carbon, iron oxide, and titanium oxide may be used alone or in any combination thereof as a pigment for black matrices, and a combination of carbon and titanium carbon is preferred. The mass ratio of titanium carbon to carbon (titanium carbon/carbon) is preferably from 0/100 to 60/100. If the ratio is 61/100 or higher, the dispersibility can be reduced in some cases.

In the invention, when the colorant is a dye, a colored composition can be obtained in which the dye is uniformly dissolved.

Examples of the dye that may be used as the colorant in the curable composition of the invention include, but are not limited to, known dyes for conventional color filters. Examples of dyes that may be used include the dyes disclosed in JP-A Nos. 64-90403, 64-91102, 01-94301, and 06-11614, Japanese Patent No. 2592207, U.S. Pat. Nos. 4,808,501, 5,667,920 and 5,059,500, and JP-A Nos. 05-333207, 06-35183, 06-51115, 06-194828, 08-211599, 04-249549, 10-123316, 11-302283, 07-286107, 2001-4823, 08-15522, 08-29771, 08-146215, 11-343437, 08-62416, 2002-14220, 2002-14221, 2002-14222, 2002-14223, 08-302224, 08-73758, 08-179120, and 08-151531.

Concerning chemical structure, pyrazole azo dyes, anilino azo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, and indigo dyes may be used.

In some resist systems involving water or alkali development, acid dyes and/or derivatives thereof may be preferably used in order to completely remove the binder and/or dye in an unirradiated portion by development.

Other dyes such as direct dyes, basic dyes, mordant dyes, acid mordant dyes, azoic dyes, disperse dyes, oil-soluble dyes, food dyes, and/or derivatives thereof may be effectively used.

Any acid dye having an acidic group such a sulfonic acid group or a carboxylic acid group may be used. The acid dye may be selected taking into account all the necessary properties such as solubility in an organic solvent or developer, ability to form a salt with a basic compound, absorbance, interaction with other components in the composition, light resistance, and heat resistance.

Examples of the acid dye include, but are not limited to, the following dyes: Acid Alizarin Violet N: Acid Black 1, 2, 24, 48; Acid Blue 1, 7, 9, 15, 18, 23, 25, 27, 29, 40, 45, 62, 70, 74, 80, 83, 86, 87, 90, 92, 103, 112, 113, 120, 129, 138, 147, 158, 171, 182, 192, 243, 324:1; Acid Chrome Violet K; Acid Fuchsin; Acid Green 1, 3, 5, 9, 16, 25, 27, 50; Acid Orange 6, 7, 8, 10, 12, 50, 51, 52, 56, 63, 74, 95; Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274; Acid Violet 6B, 7, 9, 17, 19; Acid Yellow 1, 3, 7, 9, 11, 17, 23, 25, 29, 34, 36, 42, 54, 72, 73, 76, 79, 98, 99, 111, 112, 114, 116, 184, 243; Food Yellow 3; and derivatives of these dyes.

Particularly preferred examples of the acid dye include Acid Black 24; Acid Blue 23, 25, 29, 62, 80, 86, 87, 92, 138, 158, 182, 243, 324:1; Acid Orange 8, 51, 56, 63, 74; Acid Red 1, 4, 8, 34, 37, 42, 52, 57, 80, 97, 114, 143, 145, 151, 183, 217; Acid Violet 7; Acid Yellow 17, 25, 29, 34, 42, 72, 76, 99, 111, 112, 114, 116, 184, 243; Acid Green 25; and derivatives of these dyes.

Acid dyes such as azo, xanthene and phthalocyanine dyes other than the above are also preferred. Acid dyes such as C.I. Solvent Blue 44, 38, C.I. Solvent Orange 45, Rhodamine B, and Rhodamine 110, and derivatives of these acid dyes are also preferably used.

In particular, the colorant is preferably selected from triarylmethane dyes, anthraquinone dyes, azomethine dyes, benzylidene dyes, oxonol dyes, cyanine dyes, phenothiazine dyes, pyrrolopyrazole azomethine dyes, xanthene dyes, phthalocyanine dyes, benzopyran dyes, indigo dyes, pyrazole azo dyes, anilino azo dyes, pyrazolotriazole azo dyes, pyridone azo dyes, and anthrapyridone dyes.

The colorant that may be used in the invention is preferably a dye, or a pigment whose average particle size (unit: nm) satisfies the relation $20 \leq r \leq 300$, more preferably $125 \leq r \leq 250$, particularly preferably $30 \leq r \leq 200$. Red and green pixels with high contrast ratio and high light transmittance can be obtained by using pigments with such an average particle size r. As used herein, the term “average particle size” refers to the average particle size of secondary particles formed by aggregation of primary particles (single fine crystals) of a pigment.

The particle size distribution of the secondary particles of the pigment for use in the invention (hereinafter, simply referred to as “particle size distribution”) is preferably such that 70% by mass or more, more preferably 80% by mass or more, of the whole of the secondary particles fall within (the average particle size ±100) nm.

The pigment with the average particle size and the particle size distribution described above may be prepared by a process including mixing and dispersing a commercially available pigment and another optional pigment (generally having an average particle size more than 300 nm), preferably as a pigment mixture liquid with a dispersing agent and a solvent, while grinding them with a grinding machine such as a bead mill or a roll mill. The resulting pigment is generally in the form of a pigment dispersion liquid.

The content of the colorant in the curable composition of the invention is preferably from 25 to 95% by mass, more preferably from 30 to 90% by mass, even more preferably from 40 to 80% by mass, based on the mass of the total solids of the curable composition.

If the colorant content is too low, it may be difficult to obtain proper chromaticity when producing a color filter by using the curable composition. If the colorant content is too high, photocuring may not sufficiently proceed, and the strength of the film may be reduced or the development latitude may be narrow in the process of alkali development. However, since (a) the specific oxime compound for use in the invention has high light absorption efficiency, the sensitivity enhancing effect can be significantly produced even when the curable composition contains a high concentration of the colorant.

If necessary, the curable composition of the invention may contain one or more optional components described in detail below.

Optional components that the curable composition of the invention may contain are described below.

Other Photopolymerization Initiators

Any known photopolymerization initiator other than the specific oxime compound may also be used in the curable composition of the invention, as long as the effects of the invention are not impaired.

The photopolymerization initiator that may be used in combination with the specific oxime compound is a compound that is decomposed by light to initiate and enhance the polymerization of the curable compound as described later, and preferably has absorption in the wavelength range of 300 to 500 nm.

Examples of the photopolymerization initiator include organic halide compounds, oxydiazole compounds, carbonyl compounds, ketal compounds, benzoin compounds, acridine compounds, organic peroxide compounds, azo compounds, coumarin compounds, azide compounds, metallocene compounds, biimidazole compounds, organic borate compounds, disulfonic acid compounds, oxime ester compounds, onium salt compounds, and acyl phosphine (oxide) compounds.

Dispersing Agent

When the curable composition of the invention contains a pigment as (e) the colorant, a dispersing agent is preferably added to the composition in order to improve the dispersibility of the pigment.

Examples of dispersing agents (pigment dispersing agents) that may be used in the invention include polymeric dispersants (such as polyamide amines, salts thereof, polycarboxylic acids, salts thereof, high-molecular-weight unsaturated acid esters, modified polyurethanes, modified polyesters, modified poly(meth)acrylates, (meth)acrylic copolymers, and naphthalenesulfonic acid formalin condensates), and polyoxyethylene alkyl phosphates, polyoxyethylene alkylamines, alkanolamines, and pigment derivatives.

Polymeric dispersants may be further classified by structure into linear polymers, terminal-modified polymers, graft polymers, and block polymers.

The polymeric dispersant is adsorbed on the surface of the pigment and acts to prevent reaggregation. Therefore, block polymers, graft polymers and terminal-modified polymers having an anchor moiety to the surface of the pigment are preferred structures.

On the other hand, a pigment derivative has an effect of facilitating adsorption of a polymer dispersant by modifying the surface of a pigment.

Examples of pigment dispersing agents that may be used in the invention include DISPERBYK 101 (polyamide amine phosphate), 107 (carboxylic acid ester), 110 (acid group-containing copolymer), 130 (polyamide), 161, 162, 163, 164, 165, 166, and 170 (high-molecular-weight polymer), and BYK-P104 and P105 (high-molecular-weight unsaturated polycarboxylic acid) each manufactured by BYK Chemie; EFKA 4047, 4050, 4010, and 4165 (polyurethane dispersants), EFKA 4330, 4340 (block copolymer), 4400, 4402 (modified polyacrylate), 5010 (polyester amide), 5765 (high-molecular-weight polycarboxylate), 6220 (fatty acid polyester), 6745 (phthalocyanine derivative), and 6750 (azo pigment derivative) each manufactured by EFKA; AJISPER PB821 and PB822 manufactured by Ajinomoto Fine-Teclmo Co., Inc.); FLOWLEN TG-710 (urethane oligomer) and POLYFLOW Nos. 50E and 300 (acrylic copolymer) each manufactured by Kyoeisha Chemical Co., Ltd.; DISPARLON KS-860, 873SN, 874, #2150 (aliphatic polycarboxylic acid), #7004 (polyether ester), DA-703-50, DA-705, and DA-725 each manufactured by Kusumoto Chemicals, Ltd.; DEMOL RN, N (naphthalenesulfonic acid formalin polycondensate), MS, C, SN-B (aromatic sulfonic acid formalin polycondensate), HOMOGENOL L- 18 (high-molecular weight polycarboxylic acid), EMULGEN 920, 930, 935, and 985 (polyoxyethylene nonyl phenyl ether), and ACETAMIN 86 (stearylamine acetate) each manufactured by Kao Corporation; SOLSPERSE 5000 (phthalocyanine derivative), 22000 (azo pigment derivative), 13240 (polyester amine), 3000, 17000, 27000 (polymer having a functional part at a terminal), 24000, 28000, 32000, and 38500 (graft polymers) each manufactured by The Lubrizol Corporation; and NIKKOL T106 (polyoxyethylene sorbitan monooleate) and MYS-IEX (polyoxyethylene monostearate) each manufactured by Nikko Chemicals Co., Ltd.

Only a single dispersing agent may be used, or two or more of dispersing agents may be used in combination. In the invention, it is particularly preferable to use a pigment derivative and a polymeric dispersant in combination.

In the invention, the content of the dispersing agent is preferably from 1 to 80% by mass, more preferably from 5 to 70% by mass, even more preferably from 10 to 60% by mass, based on the mass of the pigment.

For example, when a polymeric dispersant is used, the content thereof is preferably from 5 to 100% by mass, more preferably from 10 to 80% by mass of the pigment.

When a pigment derivative is used, the content thereof is preferably from 1 to 30% by mass, more preferably from 3 to 20% by mass, particularly preferably from 5 to 15% by mass of the pigment.

In the invention, when a pigment as a colorant and a dispersing agent are used, the total content of the colorant and the dispersing agent is preferably from 30 to 90% by mass, more preferably from 40 to 85% by mass, even more preferably from 50 to 80% by mass, based on the mass of the total solids of the curable composition, in view of curing sensitivity and color density.

Binder Polymer

If necessary, a binder polymer may also be used in the curable composition (or the photopolymerizable composition (1)) of the invention for the purpose of improving film characteristics and the like. A linear organic polymer is preferably used as the binder. Any known "linear organic polymer" may be used. In order to enable development with water or a weakly alkaline aqueous solution, a linear organic polymer soluble or swellable in water or a weakly alkaline aqueous solution is preferably selected. The linear organic polymer may be selected and used as depending on applications not only as a film-forming agent but also in consideration of the developer such as water, a weakly alkaline aqueous solution or an organic solvent. For example, water development can be performed when a water-soluble organic polymer is used. Examples of such a linear organic polymer include radical polymerization products having a carboxylic acid group in a side chain, such as those described in JP-A No. 59-44615, JP-B Nos. 54-34327, 58-12577 and 54-25957, and JP-A Nos. 54-92723, 59-53836 and 59-71048, specifically, resins produced by homopolymerization or copolymerization of carboxyl group-containing monomers, resins produced by homopolymerization or copolymerization of acid anhydride-containing monomers and subsequent hydrolysis, half-esterification or half-amidation of the acid anhydride units, and epoxy acrylates produced by modification of epoxy reins with unsaturated monocarboxylic acids and/or acid anhydrides. Examples of the carboxyl group-containing monomers include acrylic acid, methacrylic acid, itaconic acid, crotonic acid, maleic acid, fumaric acid, and 4-carboxylstyrene. Examples of the acid anhydride-containing monomers include maleic anhydride.

Examples also include acidic cellulose derivatives having carboxylic acid groups in side chains. Besides the above, a product of addition of a cyclic acid anhydride to a hydroxyl group-containing polymer is also useful.

When the alkali-soluble resin to be used is a copolymer, monomers other than the above monomers may also be used as the compounds to be copolymerized. Examples of other monomers include the following compounds of (1) to (12):

(1) aliphatic hydroxyl group-containing acrylates and methacrylates such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate;

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylviyl acrylate, 1-propenyl acrylate, allyl acrylate, 2-allyloxyethyl acrylate, and propargyl acrylate;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylviyl methacrylate, 1-propenyl methacrylate, allyl methacrylate, 2-allyloxyethyl methacrylate, and propargyl methacrylate;

(4) acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinyl acrylamide, vinyl methacrylamide, N,N-diallylacrylamide, N,N-diallylmethacrylamide, allylacrylamide, and allylmethacrylamide;

vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(6) vinyl esters such as vinyl acetate, vinyl chloroacetate, vinyl butyrate, and vinyl benzoate;

(7) styrenes such as styrene, α-methylstyrene, methylstyrene, chloromethylstyrene, and p-acetoxystyrene;

(8) vinyl ketones such as methyl vinyl ketone, ethyl vinyl ketone, propyl vinyl ketone, and phenyl vinyl ketone;

(9) olefins such as ethylene, propylene, isobutylene, butadiene, and isoprene;

(10) N-vinylpyrrolidone, acrylonitrile, methacrylonitrile, and the like;

(11) unsaturated imides such as maleimide, N-acryloylacrylamide, N-acetylmethacrylamide, N-propionylmethacrylamide, and N-(p-chlorobenzoyl)methacrylamide; and

(12) methacrylic acid monomers having a hetero atom at the α-position, such as the compounds described in Japanese Patent Application Nos. 2001-115595 and 2001-115598.

Particularly preferred are (meth)acrylic resins having an allyl or vinyl ester group and a carboxyl group in a side chain, the alkali-soluble resins having a double bond in a side chain described in JP-A Nos. 2000-187322 and 2002-62698, and the alkali-soluble resins having an amide group in a side chain described in JP-A No. 2001-242612, in view of excellent balance between film strength, sensitivity and developability.

The acid group-containing urethane binder polymers described in JP-B Nos. 07-12004, 07-120041, 07-120042, and 08-12424, JP-A Nos. 63-287944, 63-287947 and 01-271741, and Japanese Patent Application No. 10-116232 and the urethane binder polymers having acid groups and double bonds in side chains described in JP-A No. 2002-107918 are advantageous in terms of printing durability or low exposure properties, because they have very high strength.

The acid group-containing, acetal-modified, polyvinyl alcohol binder polymers such as those described in European Patent Nos. 993966 and 1204000 and JP-A No. 2001-318463 are also preferred, because they have an excellent balance between film strength and developability.

Useful water-soluble linear organic polymers also include polyvinyl pyrrolidone and polyethylene oxide. Alcohol-soluble nylon or polyether of 2,2-bis-(4-hydroxyphenyl)-propane and epichlorohydrin is also useful for increasing the strength of the cured film.

Binder polymers that may be used in an embodiment of the invention preferably have a weight average molecular weight of 5,000 or more, more preferably of 10,000 to 300,000, and preferably have a number average molecular weight of 1,000 or more, more preferably of 2,000 to 250,000. The polydispersity (weight average molecular weight/number average molecular weight) is preferably 1 or more, more preferably from 1.1 to 10.

These binder polymers may be any of random, block or graft polymers.

Binder polymers that may be used in the invention may be synthesized by known conventional methods. Examples of solvents that may be used for the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. Only one solvent may be used, or a mixture of two or more solvents may be used.

In the process of synthesizing binder polymers that may be used in the invention, known compounds such as azo initiators and peroxide initiators may be used as radical-polymerization initiators.

Polymerization Inhibitor

In the invention, a small amount of a thermal polymerization inhibitor is preferably added in order to inhibit unnecessary thermal polymerization of (b) the polymerizable compound during the production or storage of the curable composition.

Examples of the thermal polymerization inhibitor that may be used in the invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and cerous N-nitrosophenyl-hydroxylamine.

The content of the thermal polymerization inhibitor is preferably from about 0.01 to about 5% by mass, based on the mass of the total solids of the curable composition.

If necessary, behenic acid or a higher fatty acid derivative such as behenic acid amide may be added to prevent oxygen-induced inhibition of polymerization and may be localized to the surface of a coating film during a drying process after coating. The content of the higher fatty acid derivative is preferably from about 0.5 to about 10% by mass based on the entire composition.

Adhesion Improving Agent

The curable composition of the invention may contain an adhesion improving agent for increasing adhesion to a hard surface, such as of a support. The adhesion improving agent may be a silane coupling agent, a titanium coupling agent or the like.

Examples of the silane coupling agent include γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysilane, γ-isocyanatopropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl) methyldiethoxysilane, and (acryloxymethyl) methyldimethoxysilane.

In particular, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferred, and γ-methacryloxypropyltrimethoxysilane is most preferred.

The content of the adhesion improving agent is preferably from 0.5 to 30% by mass, more preferably from 0.7 to 20% by mass, based on the mass of the total solids of the curable composition (or the photopolymerizable composition (1)).

Diluent

Any of various organic solvents may be used as a diluent for the curable composition of the invention.

Examples of the organic solvent that may be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylfornamide, dimethylsulfoxide, γ-butyrolactone, methyl lactate, and ethyl lactate.

Only a single solvent may be used, or a mixture of two or more solvents may be used. The solids content relative to the organic solvent is preferably from 2 to 60% by mass.

Other Additives

In addition, known additives for modifying the physical properties of cured films, such as an inorganic filler, a plasticizer and a lipophilizing agent, may also be added to the curable composition of the invention.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerol. When a binder is used, the plasticizer may be added in an amount of 10% by mass or less, based on the total mass of the polymerizable compound and the binder polymer.

The curable composition of the invention contains (a) the specific oxime compound and therefore can be cured with high sensitivity and have high storage stability. When the curable composition of the invention is applied to a hard material surface and cured, the cured product can exhibit excellent adhesion to the surface.

The curable composition of the invention described above may be preferably used in the fields of image forming materials such as three-dimensional photo-molding materials, holographic materials, color filters, photoresists, planographic printing materials, and color proofs, and inks, paints, adhesives, coating agents, and dental materials, as described above. In particular, the curable composition of the invention including (a) the specific oxime ester, (b) the polymerizable compound and (e) the colorant is preferably used as a curable composition for color filters (the curable composition for a color filter of the invention).

Color Filter and Methods for Production Thereof

A description is given below on the color filter and the method for producing a color filter according to the invention.

The color filter of the invention includes a support and a colored pattern that is produced by using the curable composition for a color filter of the invention.

The color filter of the invention is described in detail below together with the method for production thereof (the method of the invention for producing a color filter).

The method of the invention for producing a color filter includes the steps of: applying to a support the curable composition for a color filter of the invention to form a colored curable composition layer (hereinafter also simply referred to as "the colored curable composition layer-forming step"); exposing the colored curable composition layer to light through a mask (hereinafter also simply referred to as "the exposure step"); and developing the exposed composition layer to form a colored pattern (hereinafter also simply referred to as "the development step").

Specifically, the curable composition for a color filter of the invention is applied to a support (substrate) directly or with another layer interposed therebetween to form a photopolymerizable composition layer (the colored curable composition layer-forming step); the coating film is exposed to light through a specific patterned mask to cure the irradiated portion of the coating film (the exposure step); and the coating film is developed with a liquid developer to form a patterned film including pixels of the respective colors (three or four colors) so that the color filter of the invention is produced.

Each step of the method of the invention for producing a color filter is described below.

<Colored Curable Composition Layer-Forming Step>

In the colored curable composition layer forming step, the curable composition for a color filter of the invention is applied to a support to form a colored curable composition layer.

Examples of the support that may be used in this step include soda glass substrates, PYREX (registered trademark)

glass substrates, quartz glass substrates, and a substrate obtained by attaching a transparent electrically-conductive film onto any of the above glass substrates, which are for use in liquid crystal displays and the like, and photoelectric converting substrates for use in imaging devices, such as silicon substrates and complementary metal oxide film semiconductors (CMOS). In some cases, these substrates may have black stripes that separate pixels from one another.

If necessary, an undercoat layer may be formed on the support in order to improve adhesion to the upper layer, prevent the substance diffusion or flatten the substrate surface.

The curable composition for a color filter of the invention may be applied to the support by various coating methods such as slit coating, inkjet method, spin coating, cast coating, roll coating, and screen printing.

The thickness of the coating film of the curable composition is preferably from 0.1 μm to 10 μm, more preferably from 0.2 μm to 5 μm, even more preferably from 0.2 μm to 3 μm.

The coating of the curable composition for a color filter on the support is generally dried under the conditions of 70 to 110° C. for 2 to 4 minutes to form a colored curable composition layer.

<Exposure Step>

In the exposure step, the colored curable composition layer formed in the colored curable composition layer forming step is exposed to light through a mask so that only the irradiated portion of the coating film is cured.

The exposure is preferably performed by irradiation with a radiation. In particular, ultraviolet rays such as g-line or i-line is preferably used as the radiation for exposure, and high-pressure mercury lamps are more preferred. The irradiation intensity is preferably from 5 mJ to 1500 mJ, more preferably from 10 mJ to 1000 mJ, most preferably from 10 mJ to 800 mJ.

<Development Step>

After the exposure step, alkali development (the development step) may be performed so that the unexposed portion resulting from the exposure step can be dissolved in an aqueous alkali solution. In this step, only the photo-cured portion is left.

The liquid developer is preferably an organic alkali developer that does not damage underlying circuits or the like. The development is generally performed at a temperature of 20° C. to 30° C. for a time period of 20 to 90 seconds.

Examples of the alkali for use in the liquid developer include ammonia water and organic alkaline compounds such as ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene. An aqueous alkaline solution prepared by diluting the alkali with pure water to a concentration of 0.001 to 10% by mass, preferably of 0.01 to 1% by mass may be used. When a liquid developer comprising such an aqueous alkaline solution is used, washing (rinsing) with pure water is generally performed after the development.

If necessary, the method of the invention for producing a color filter may further include a step of curing the colored pattern by heating and/or exposure to light after the curable composition layer-forming step, the exposure step and the development step have been conducted.

The colored curable composition layer-forming step, the exposure step and the development step (and optionally the curing step) may be repeated for the number of times corresponding to the number of the desired hues, whereby a color filter having the desired hues may be produced.

The color filter of the invention is produced by using the curable composition for a color filter of the invention. In the color filter, therefore, the colored pattern exhibits excellent adhesion to the supporting substrate, and the cured composition has excellent resistance to development. Therefore, the exposure sensitivity is high, the adhesion to the substrate of the exposed portion is excellent, and a high-resolution pattern having a desired cross-sectional shape can be formed. Therefore, the color filter of the invention is suitable for use in liquid crystal displays and solid-state imaging devices such as CCDs and particularly suitable for use in high-resolution CCD devices or CMOS devices having more than a million pixels. For example, the color filter of the invention may be placed between the light-receiving part of each pixel of a CCD and a converging microlens.

<Novel Oxime Compound>

The novel oxime compound of the invention is represented by Formula (1) below (hereinafter also referred to as "the novel oxime compound").

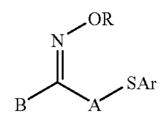

(1)

In Formula (1), R and B each independently represent a monovalent substituent, A represents a divalent organic group, and Ar represents an aryl group.

Examples of the monovalent substituent represented by R are the same as those of the monovalent substituent represented by $R^1$ in Formula (I-I) above, and preferred examples and ranges thereof are also the same.

In order to heighten the sensitivity, R is more preferably an acyl group, and specifically, an acetyl group, a propionyl group, a benzoyl group, or a toluyl group is preferred.

The monovalent substituent represented by B may be an optionally substituted aryl group, an optionally substituted heterocyclic group, an optionally substituted arylcarbonyl group, or an optionally substituted heterocyclic carbonyl group and is particularly preferably any one of the structures shown below.

In the structures below, Y, X and n respectively have the same definitions as those of Y, X and n in Formula (2) described later, and preferred examples are also the same.

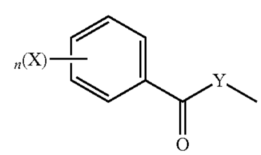

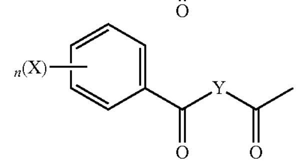

The divalent organic group represented by A may be optionally substituted alkylene of 1 to 12 carbon atoms, optionally substituted cyclohexylene, or optionally substituted alkynylene.

Examples of substituents introducible into these groups include a halogen group such as a fluorine, chlorine, bromine, or iodine atom; an alkoxy group such as a methoxy group, an ethoxy group, or a tert-butoxy group; an aryloxy group such as a phenoxy group or a p-tolyloxy group; an alkoxycarbonyl group such as a methoxycarbonyl group, a butoxycarbonyl group or a phenoxycarbonyl group; an acyloxy group such as an acetoxy group, a propionyloxy group or a benzoyloxy group; an acyl group such as an acetyl group, a benzoyl group, an isobutyryl group, an acryloyl group, a methacryloyl group, or a methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group, a diethylamino group, a morpholino group, or a piperidino group; an arylamino group such as a phenylamino group or a p-tolylamino group; an alkyl group such as a methyl group, an ethyl group, a tert-butyl group, or a dodecyl group; an aryl group such as a phenyl group, a p-tolyl group, a xylyl group, a cumenyl group, a naphthyl group, an anthryl group, or a phenanthryl group; a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, and a triphenylphenacylphosphoniumyl group.

In particular, A is preferably an unsubstituted alkylene group, an alkylene group substituted with an alkyl group (such as a methyl group, an ethyl group, a tert-butyl group, or a dodecyl group), an alkylene group substituted with an alkenyl group (such as a vinyl group or an allyl group), or an alkylene group substituted with an aryl group (such as a phenyl group, a p-tolyl group, a xylyl group, a cumenyl group, a naphthyl group, an anthryl group, a phenanthryl group, or a styryl group).

The aryl group represented by Ar preferably has 6 to 30 carbon atoms and may have a substituent(s).

Examples include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a quarternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarteranthracenyl group, an anthraquinonyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group. In particular, a substituted or unsubstituted phenyl group is preferred in terms of heightening sensitivity and/or suppressing coloration caused by heating over time.

Examples of the substituent of the substituted phenyl group include a halogen group such as a fluorine, chlorine, bromine, or iodine atom; an alkoxy group such as a methoxy group, an ethoxy group, or a tert-butoxy group; an aryloxy group such as a phenoxy group or a p-tolyloxy group; an alkylthioxy group such as a methylthioxy group, an ethylthioxy group or a tert-butylthioxy group; an arylthioxy group such as a phenylthioxy group or a p-tolylthioxy group; an alkoxycarbonyl group such as a methoxycarbonyl group, a butoxycarbonyl group or a phenoxycarbonyl group; an acyloxy group such as an acetoxy group, a propionyloxy group or a benzoyloxy group; an acyl group such as an acetyl group, a benzoyl group, an isobutyryl group, an acryloyl group, a methacryloyl group, or a methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group, a diethylamino group, a morpholino group, or a piperidino group; an arylamino group such as a phenylamino group or a p-tolylamino group; an alkyl group such as an ethyl group, a tert-butyl group or a dodecyl group; a hydroxyl group, a carboxyl group, a formyl group, a mercapto group, a sulfo group, a mesyl group, a p-toluenesulfonyl group, an amino group, a nitro group, a cyano group, a trifluoromethy group, a trichloromethyl group, a trimethylsilyl group, a phosphinico group, a phosphono group, a trimethylammoniumyl group, a dimethylsulfoniumyl group, or a triphenylphenacylphosphoniumyl group.

In Formula (1), the SAr structure composed of the substituent Ar and the adjacent S is preferably any of the structures shown below, in view of sensitivity.

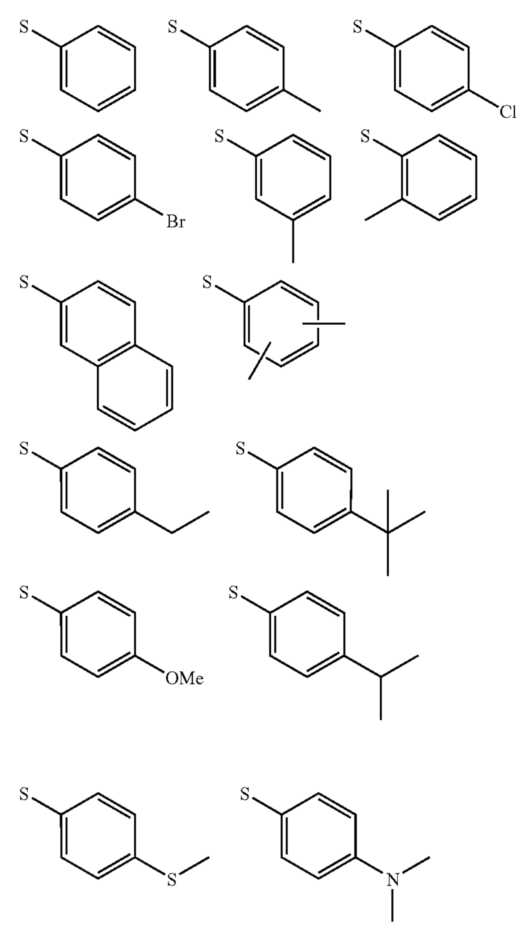

-continued

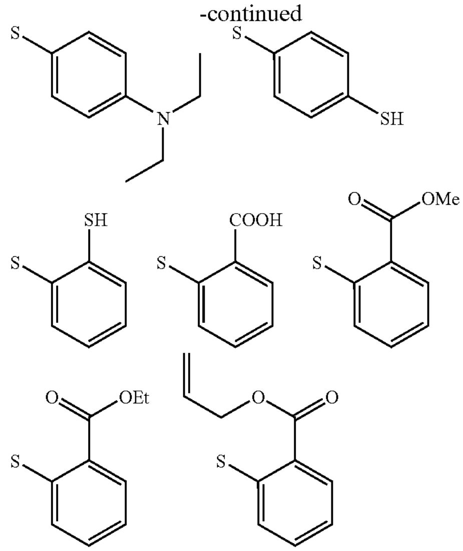

The novel oxime compound of the invention is preferably a compound represented by Formula (2) below.

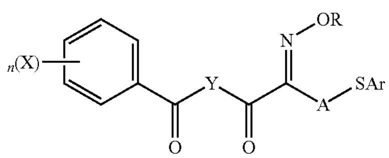

(2)

In Formula (2), R and X each independently represent a monovalent substituent, A and Y each independently represent a divalent organic group, and Ar represents an aryl group, and n represents an integer of 0 to 5.

In Formula (2), R, A and Ar respectively have the same definitions as those of R, A and Ar in Formula (1), and preferred examples are also the same.

The monovalent substituent represented by X may be an optionally substituted alkyl group, an optionally substituted aryl group, an optionally substituted alkenyl group, an optionally substituted alkynyl group, an optionally substituted alkoxy group, an optionally substituted aryloxy group, an optionally substituted alkylthioxy group, an optionally substituted arylthioxy group, an optionally substituted acyloxy group, an optionally substituted alkylsulfanyl group, an optionally substituted arylsulfanyl group, an optionally substituted alkylsulfinyl group, an optionally substituted arylsulfinyl group, an optionally substituted alkylsulfonyl group, an optionally substituted arylsulfonyl group, an optionally substituted acyl group, an optionally substituted alkoxycarbonyl group, an optionally substituted carbamoyl group, an optionally substituted sulfamoyl group, an optionally substituted amino group, an optionally substituted phosphinoyl group, an optionally substituted heterocyclic group, a halogen group, or the like.

The optionally substituted alkyl group is preferably an alkyl group having 1 to 30 carbon atoms, and examples include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The optionally substituted aryl group is preferably an aryl group having 6 to 30 carbon atoms, and examples include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a quarternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarteranthracenyl group, an anthraquinonyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The optionally substituted alkenyl group is preferably an alkenyl group having 2 to 10 carbon atoms, and examples include a vinyl group, an allyl group and a styryl group.

The optionally substituted alkynyl group is preferably an alkynyl group having 2 to 10 carbon atoms, and examples include an ethynyl group, a propynyl group and a propargyl group.

The optionally substituted alkoxy group is preferably an alkoxy group having 1 to 30 carbon atoms, and examples include a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, a 2-ethylhexyloxycarbonylmethyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzylaminocarbonylmethyloxy group, a benzyloxy group, and a cyanomethyloxy group.

The optionally substituted aryloxy group is preferably an aryloxy group having 6 to 30 carbon atoms, and examples include a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxyphenyloxy group, a 4-dimethylaminophenyloxy group, a 4-methylsulfanylphenyloxy group, and a 4-phenylsulfanylphenyloxy group.

The optionally substituted alkylthioxy group is preferably a thioalkoxy group having 1 to 30 carbon atoms, and examples include a methylthioxy group, an ethylthioxy group, a propylthioxy group, an isopropylthioxy group, a butylthioxy group, an isobutylthioxy group, a sec-butylthioxy group, a tert-butylthioxy group, a pentylthioxy group, an isopentylthioxy group, a hexylthioxy group, a heptylthioxy group, an octylthioxy group, a 2-ethylhexylthioxy group, a decylthioxy group, a dodecylthioxy group, an octadecylthioxy group, and a benzylthioxy group.

The optionally substituted arylthioxy group is preferably an arylthioxy group having 6 to 30 carbon atoms, and examples include a phenylthioxy group, a 1-naphthylthioxy group, a 2-naphthylthioxy group, a 2-chlorophenylthioxy group, a 2-methylphenylthioxy group, a 2-methoxyphenylthioxy group, a 2-butoxyphenylthioxy group, a 3-chlorophenylthioxy group, a 3-trifluoromethylphenylthioxy group, a 3-cyanophenylthioxy group, a 3-nitrophenylthioxy group, a 4-fluorophenylthioxy group, a 4-cyanophenylthioxy group, a 4-methoxyphenylthioxy group, a 4-dimethylaminophenylthioxy group, a 4-methylsulfanylphenylthioxy group, and a 4-phenylsulfanylphenylthioxy group.

The optionally substituted acyloxy group is preferably an acyloxy group having 2 to 20 carbon atoms, and examples include an acetyloxy group, a propanoyloxy group, a butanoyloxy group, a pentanoyloxy group, a trifluoromethylcarbonyloxy group, a benzoyloxy group, a 1-naphthylcarbonyloxy group, and a 2-naphthylcarbonyloxy group.

The optionally substituted alkylsulfanyl group is preferably an alkylsulfanyl group having 1 to 20 carbon atoms, and examples include a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, and a methoxymethylsulfanyl group.

The optionally substituted arylsulfanyl group is preferably an arylsulfanyl group having 6 to 30 carbon atoms, and examples include a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethylphenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-methylsulfanylphenylsulfanyl group, a 4-phenylsulfanylphenylsulfanyl group, and a 4-dimethylaminophenylsulfanyl group.

The optionally substituted alkylsulfinyl group is preferably an alkylsulfinyl group having 1 to 20 carbon atoms, and examples include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, and a methoxymethylsulfinyl group.

The optionally substituted arylsulfinyl group is preferably an arylsulfinyl group having 6 to 30 carbon atoms, and examples include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

The optionally substituted alkylsulfonyl group is preferably an alkylsulfonyl group having 1 to 20 carbon atoms, and examples include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, and a methoxymethylsulfonyl group.

The optionally substituted arylsulfonyl group is preferably an arylsulfonyl group having 6 to 30 carbon atoms, and examples include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The optionally substituted acyl group is preferably an acyl group having 2 to 20 carbon atoms, and examples include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The optionally substituted alkoxycarbonyl group is preferably an alkoxycarbonyl group having 2 to 20 carbon atoms, and examples include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a phenoxycarbonyl group, a trifluoromethyloxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The optionally substituted carbamoyl group is preferably a carbamoyl group having 1 to 30 carbon atoms in total, and examples include a N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-dibutylcarbamoyl group, and an N,N-diphenylcarbamoyl group.

The optionally substituted sulfamoyl group is preferably a sulfamoyl group having 0 to 30 carbon atoms in total, and examples include a sulfamoyl group, an N-alkylsulfamoyl group, an N-arylsulfamoyl group, an N,N-dialkylsulfamoyl group, an N,N-diarylsulfamoyl group, and an N-alkyl-N-arylsulfamoyl group. More specifically, examples include an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenylsulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-methylsulfanylphenylsulfamoyl group, an N-4-phenylsulfanylphenylsulfamoyl group, an N-methyl-N-phenylsulfamoyl group, an N,N-dimethylsulfamoyl group, an N,N-dibutylsulfamoyl group, and an N,N-diphenylsulfamoyl group.

The optionally substituted amino group is preferably an amino group having 0 to 50 carbon atoms in total, and examples include —$NH_2$, an N-alkylamino group, an N-arylamino group, an N-acylamino group, an N-sulfonylamino group, an N,N-dialkylamino group, an N,N-diarylamino group, an N-alkyl-N-arylamino group, and an N,N-disulfonylamino group. More specifically, examples include an N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzoylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, and a carbazole group.

The optionally substituted phosphinoyl group is preferably a phosphinoyl group having 2 to 50 carbon atoms in total, and examples include a dimethylphosphinoyl group, a dietliylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

The optionally substituted heterocyclic group is preferably an aromatic or aliphatic heterocyclic group containing a nitrogen, oxygen, sulfur, or phosphorus atom. Examples include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acrindinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

The halogen group may be a fluorine atom, a chlorine atom, a bromine atom, an iodine atom, or the like.

The optionally substituted alkyl group, optionally substituted aryl group, optionally substituted alkenyl group, optionally substituted alkynyl group, optionally substituted alkoxy group, optionally substituted aryloxy group, optionally substituted alkylthioxy group, optionally substituted arylthioxy group, optionally substituted acyloxy group, optionally substituted alkylsulfanyl group, optionally substituted arylsulfanyl group, optionally substituted alkylsulfinyl group, optionally substituted arylsulfinyl group, optionally substituted alkylsulfonyl group, optionally substituted arylsulfonyl group, optionally substituted acyl group, optionally substituted alkoxycarbonyl group, optionally substituted carbamoyl group, optionally substituted sulfamoyl group, optionally substituted amino group, or optionally substituted heterocyclic group may themselves be further substituted by any other substituent.

Examples of such a further substituent include a halogen group such as a fluorine, chlorine, bromine, or iodine atom; an alkoxy group such as a methoxy group, an ethoxy group, or a tert-butoxy group; an aryloxy group such as a phenoxy group or a p-tolyloxy group; an alkoxycarbonyl group such as a methoxycarbonyl group, a butoxycarbonyl group or a phenoxycarbonyl group; an acyloxy group such as an acetoxy group, a propionyloxy group or a benzoyloxy group; an acyl group such as an acetyl group, a benzoyl group, an isobutyryl group, an acryloyl group, a methacryloyl group, or a methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group, a diethylamino group, a morpholino group, or a piperidino group; an arylamino group such as a phenylamino group or a p-tolylamino group; an alkyl group such as a methyl group, an ethyl group, a tert-butyl group or a dodecyl group; an aryl group such as a phenyl group, a p-tolyl group, a xylyl group, a cumenyl group, a naphthyl group, an anthryl group, or a phenanthryl group; a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, or a triphenylphenacylphosphoniumyl group.

Above all, X is preferably an optionally substituted alkyl group, an optionally substituted aryl group, an optionally substituted alkenyl group, an optionally substituted alkynyl group, an optionally substituted alkoxy group, an optionally substituted aryloxy group, an optionally substituted alkylthioxy group, an optionally substituted arylthioxy group, or an optionally substituted amino group, in terms of improving solubility in solvents and absorption efficiency in a long wavelength region.

In Formula (2), n represents an integer of 0 to 5, preferably of 0 to 2.

Examples of the divalent organic group represented by Y include the structures shown below. In the groups shown below, the marks * indicate the positions of the bonds to the carbon atoms adjacent to Y in Formula (2).

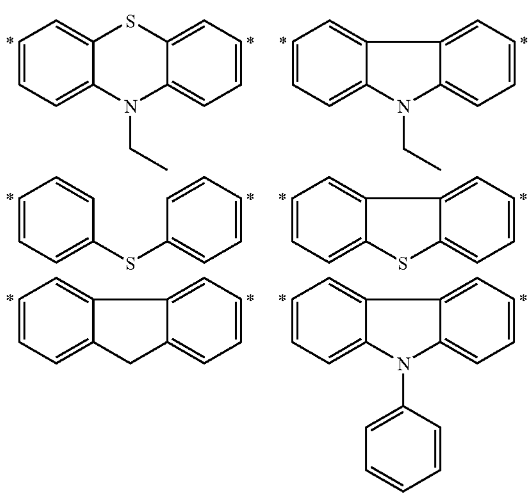

-continued

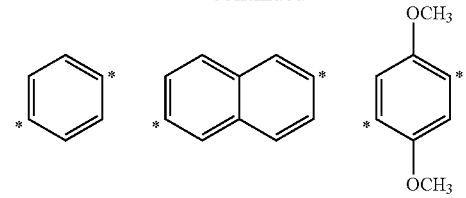

In terms of heightening sensitivity, the structures shown below are particularly preferred.

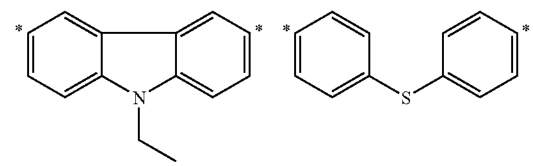

The novel oxime compound of the invention is preferably a compound represented by Formula (3) below.

(3)

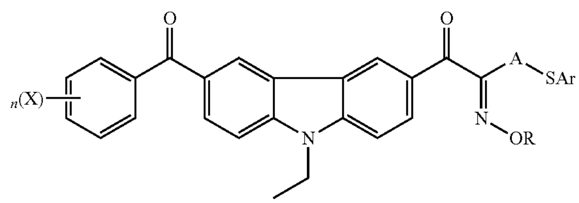

In Formula (3), R and X each independently represent a monovalent substituent, A represents a divalent organic group, Ar represents an aryl group, and n represents an integer of 0 to 5.

R, X, A, Ar, and n in Formula (3) respectively have the same definitions as those of R, X, A, Ar, and n in Formula (2), and preferred examples are also the same.

Examples of the novel oxime compound of the invention include, but are not limited to, the compounds shown below.

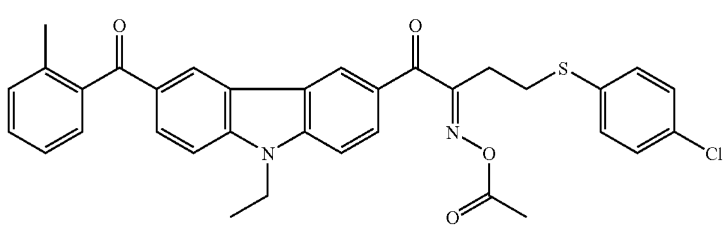

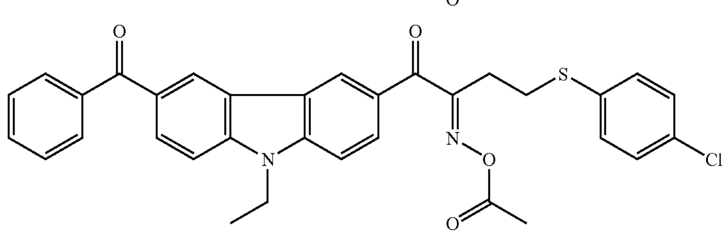

-continued
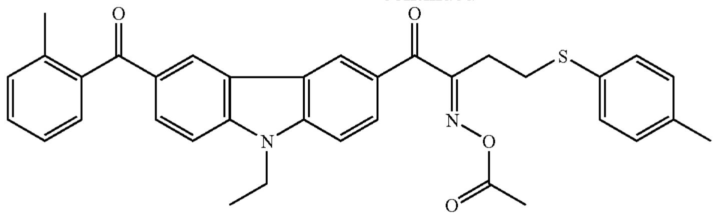
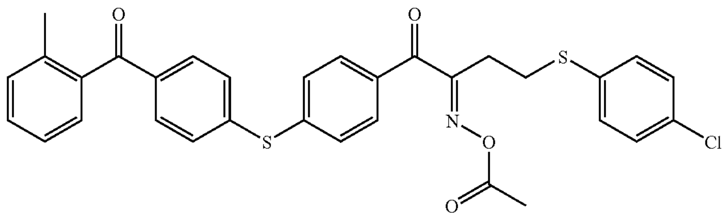
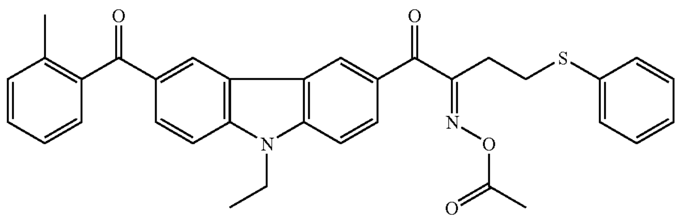
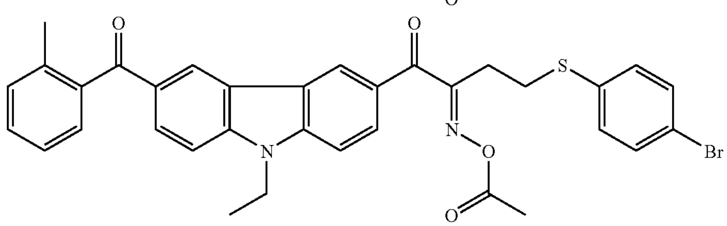
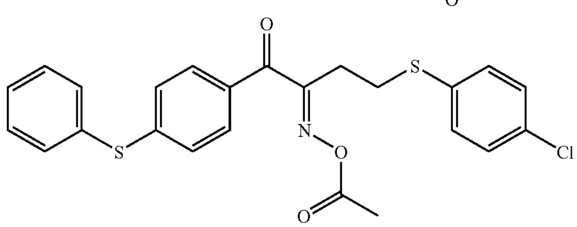
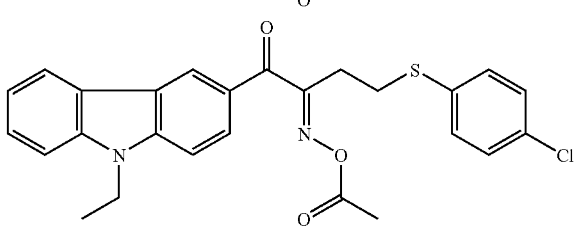
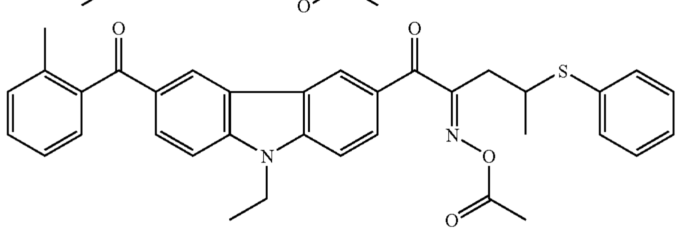
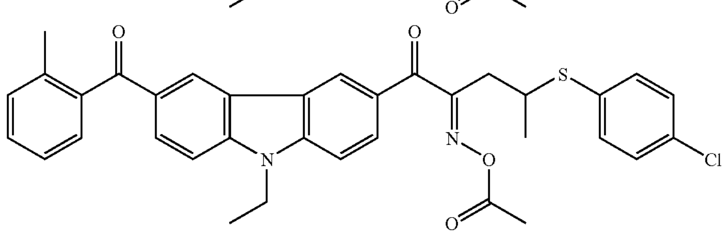

-continued
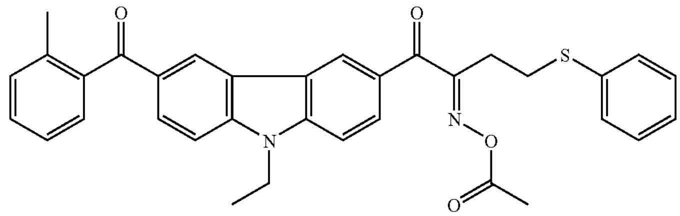
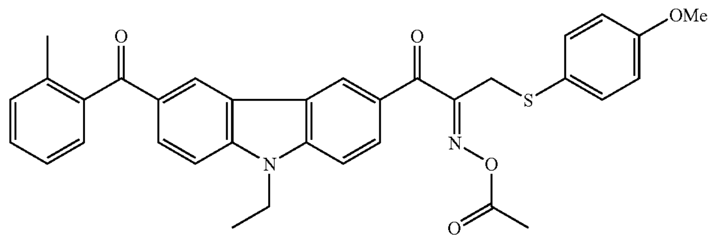
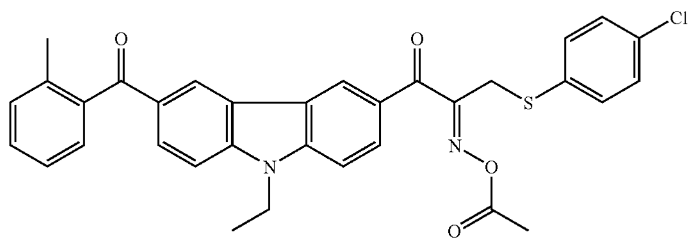
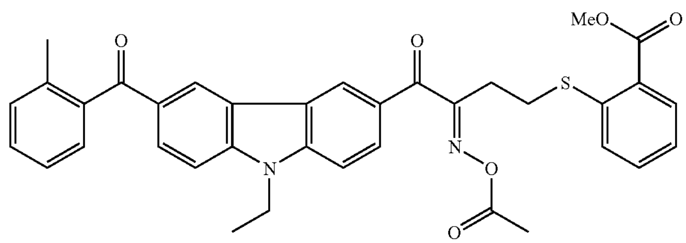
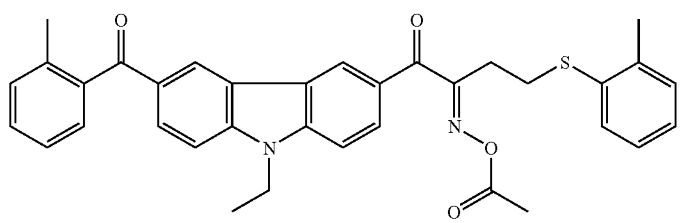
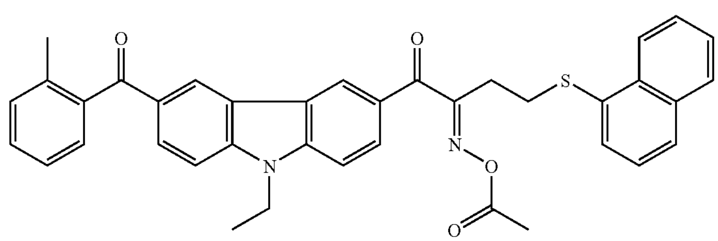
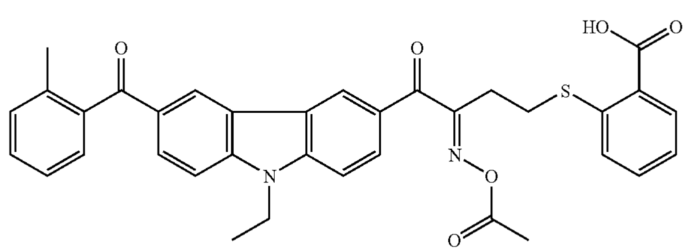

-continued
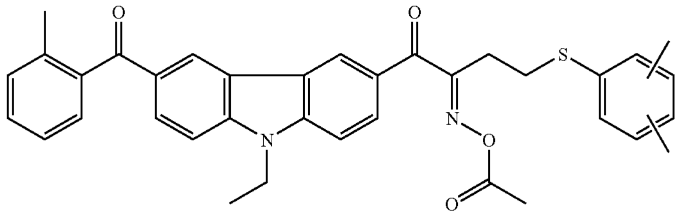
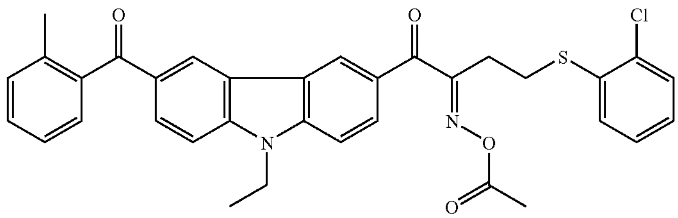
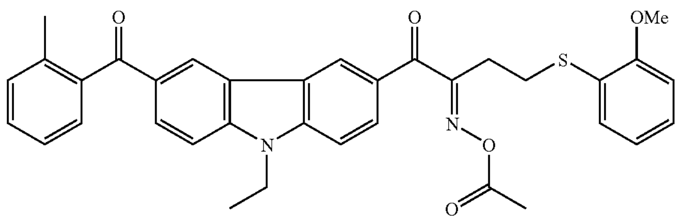
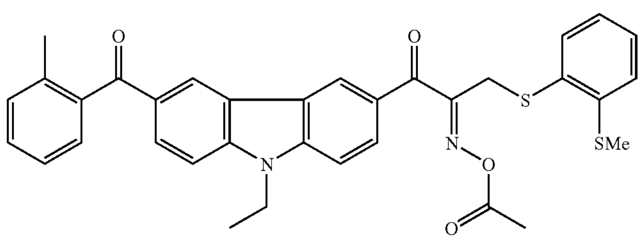
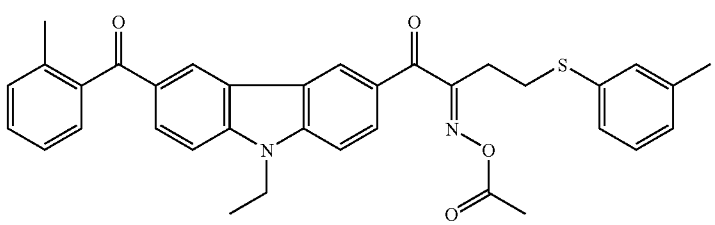
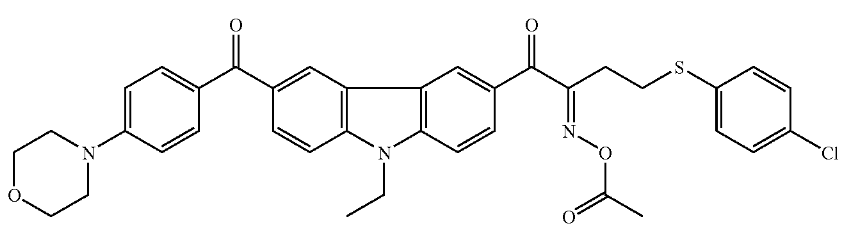
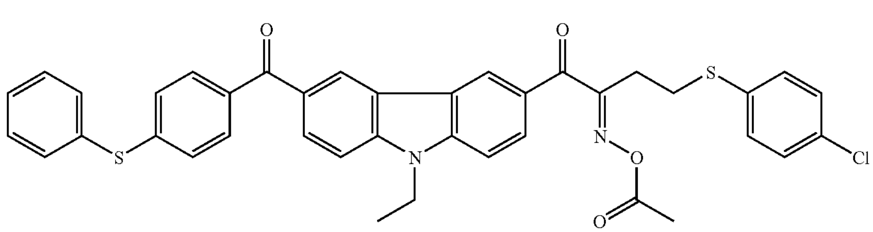

-continued
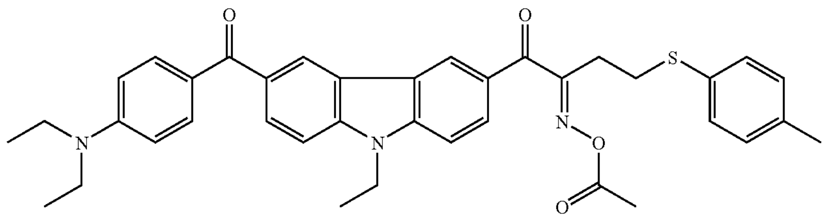
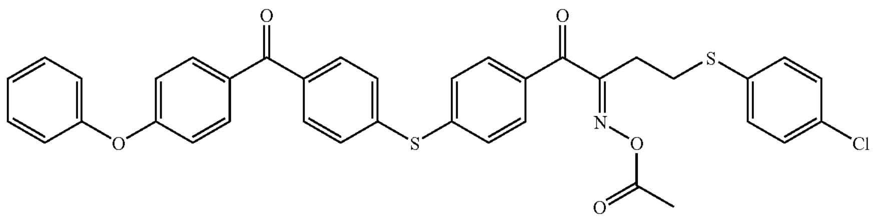
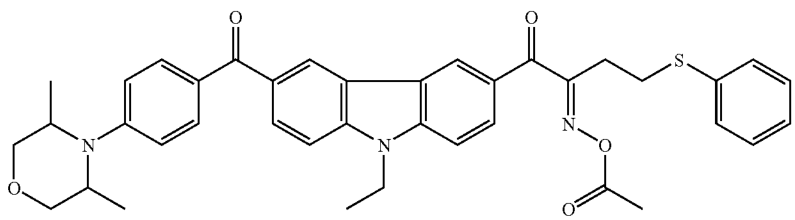
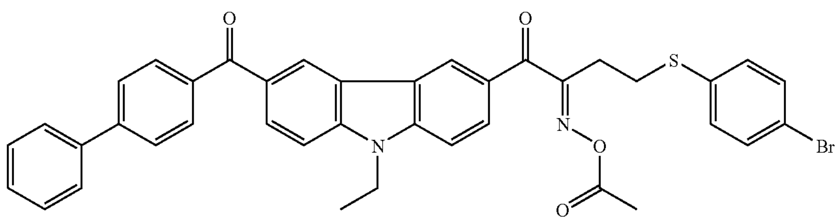
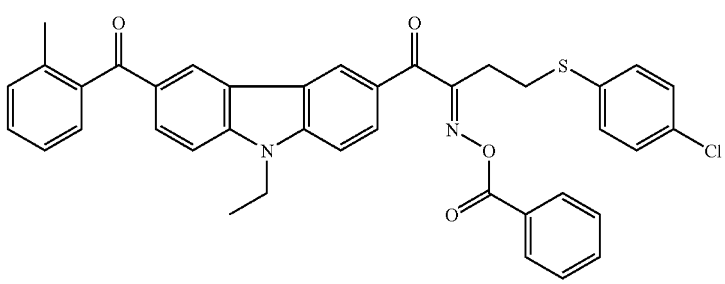
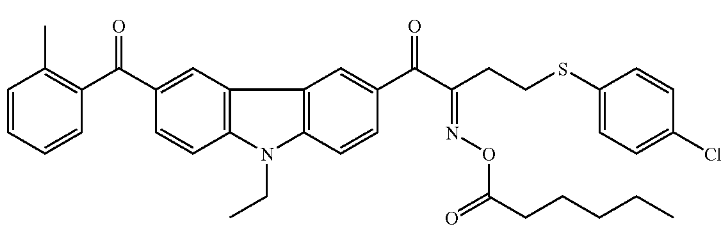
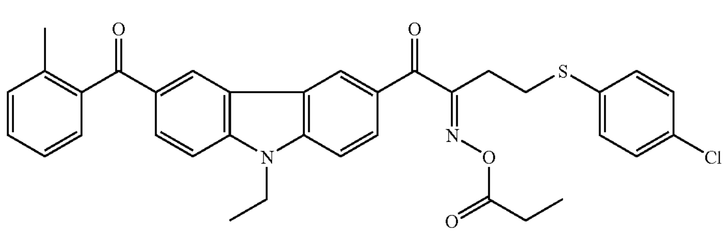

-continued
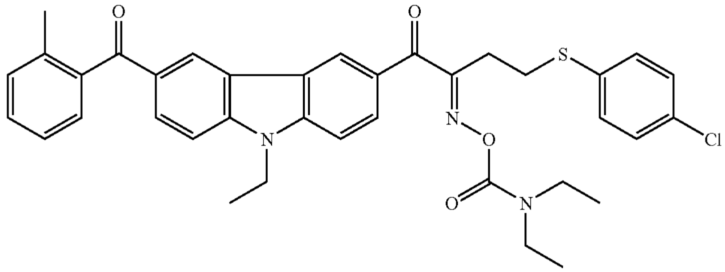
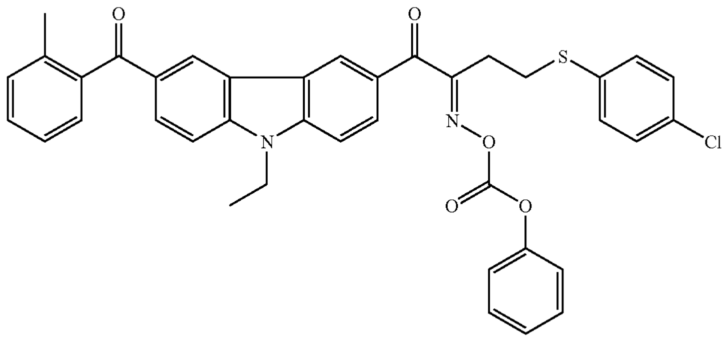
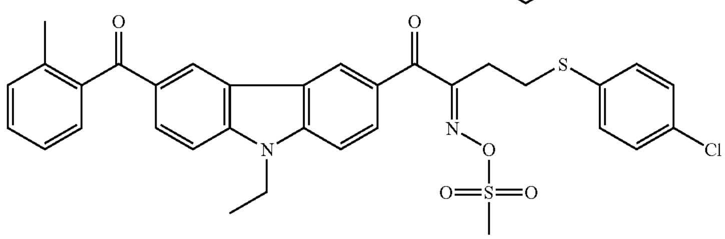
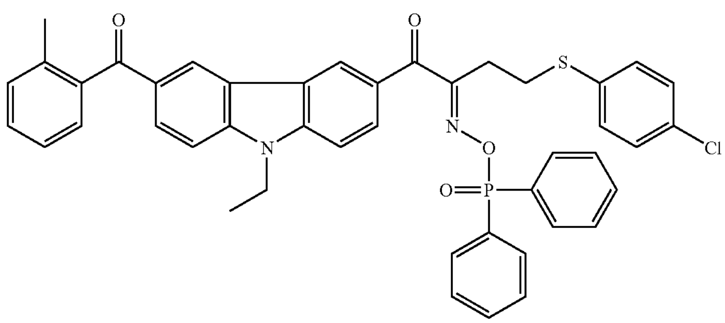
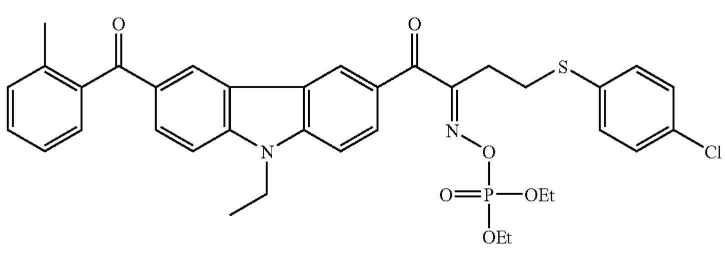
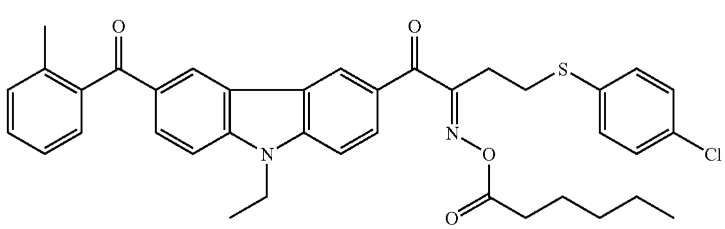

-continued
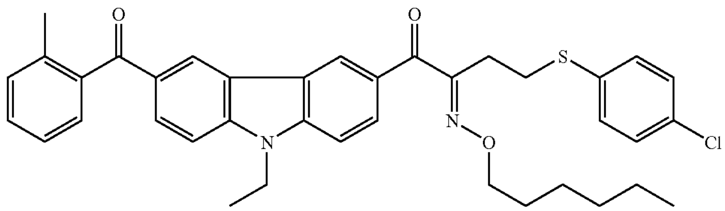
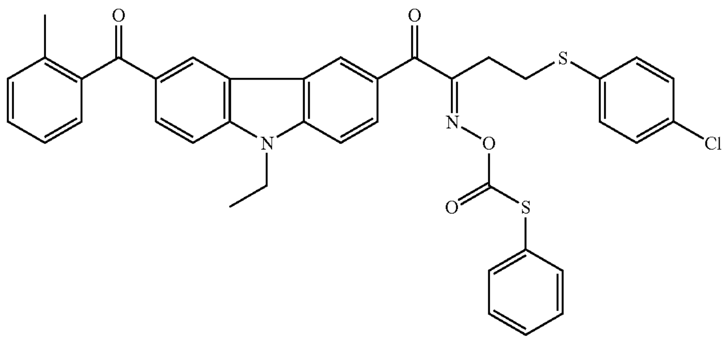
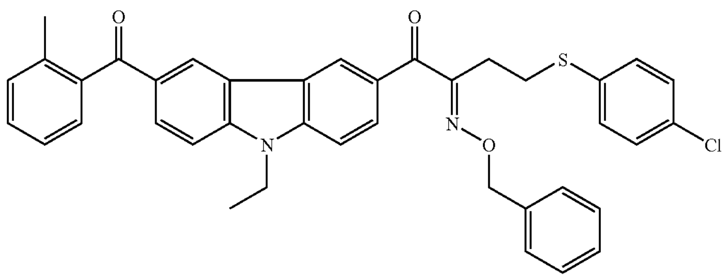
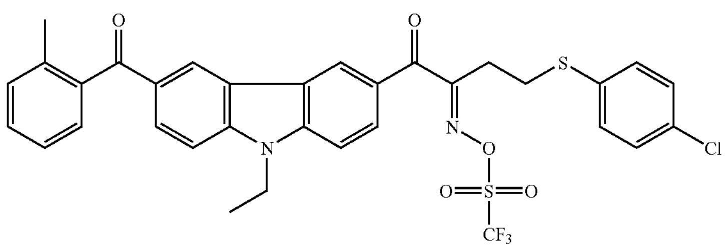
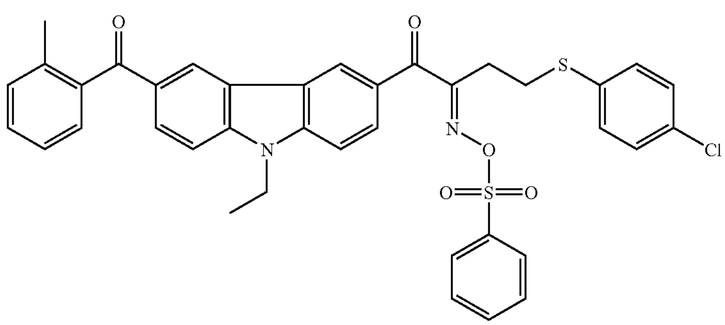
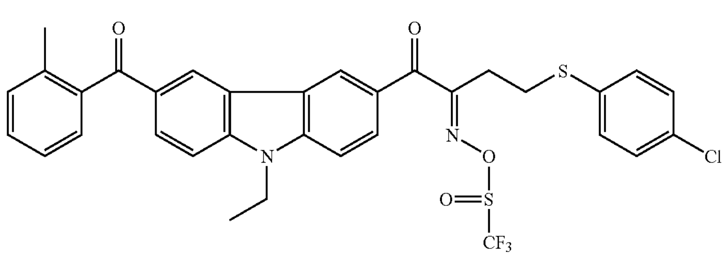

-continued
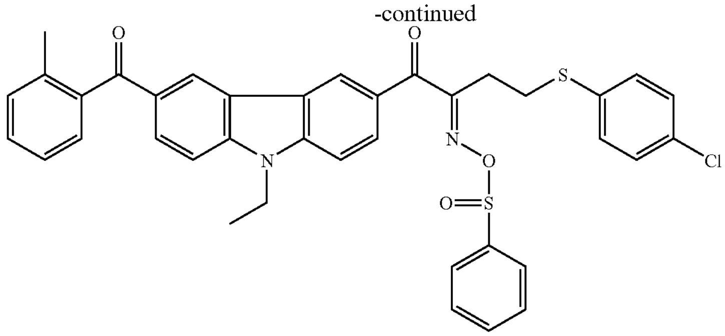
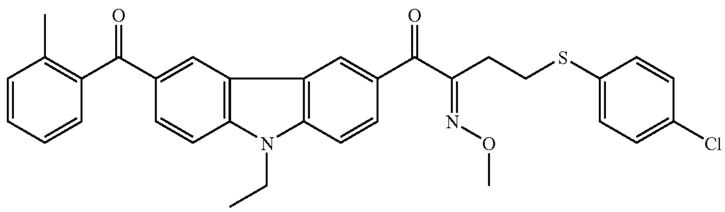
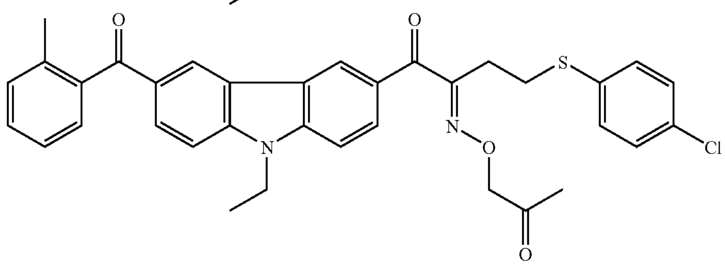
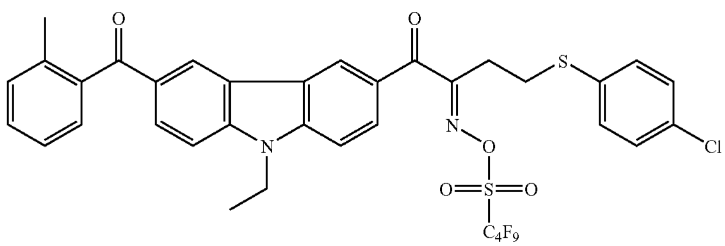
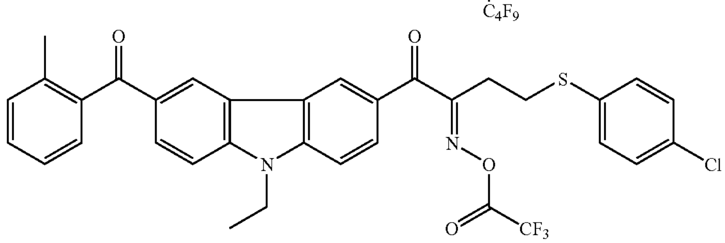
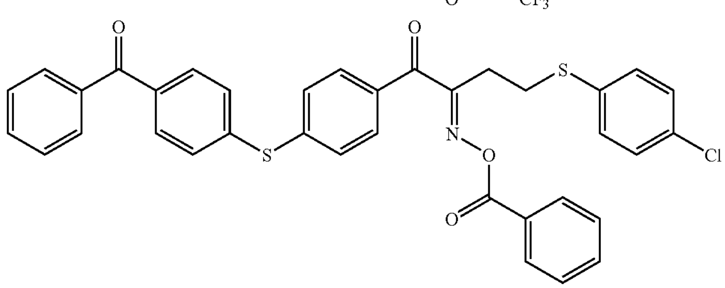
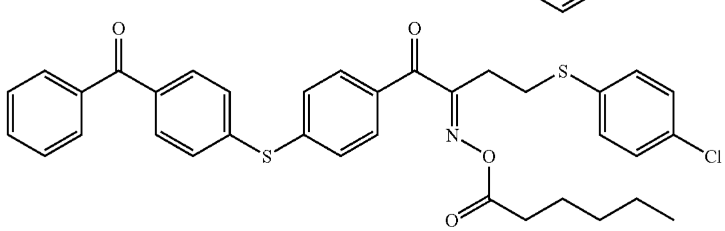

-continued
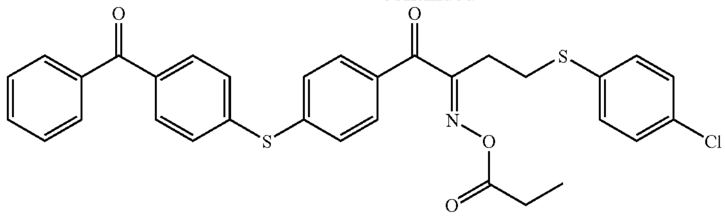
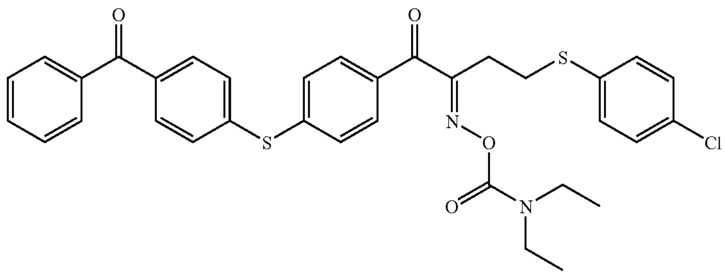
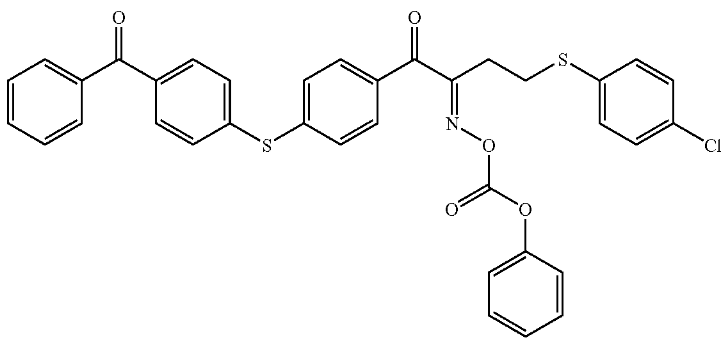
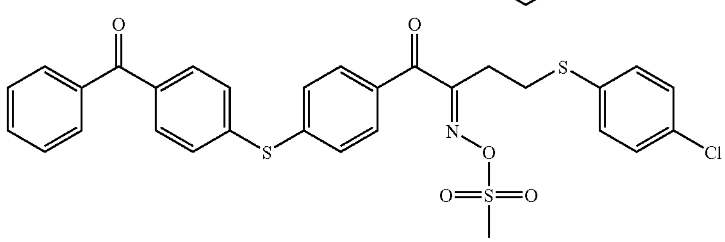
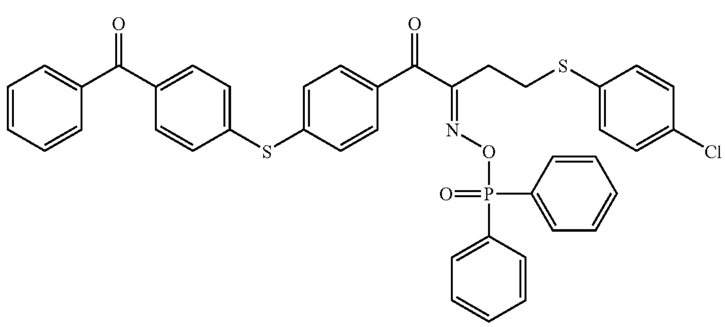
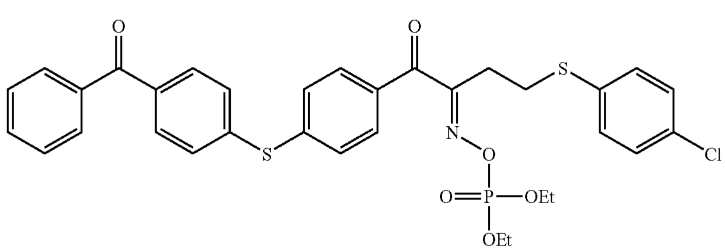

-continued
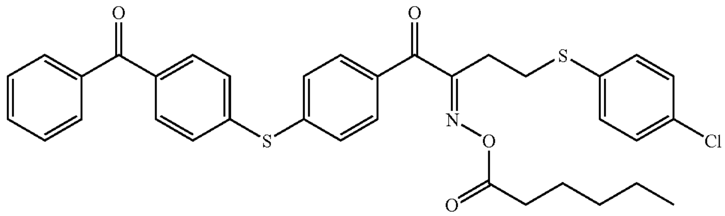
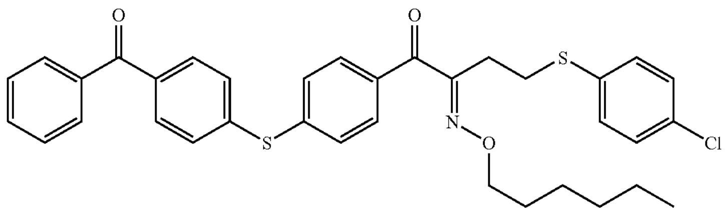
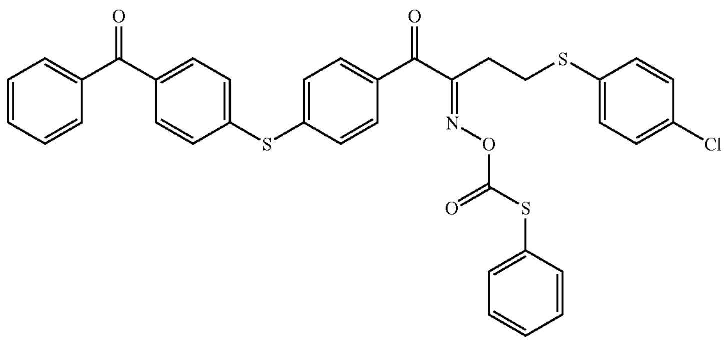
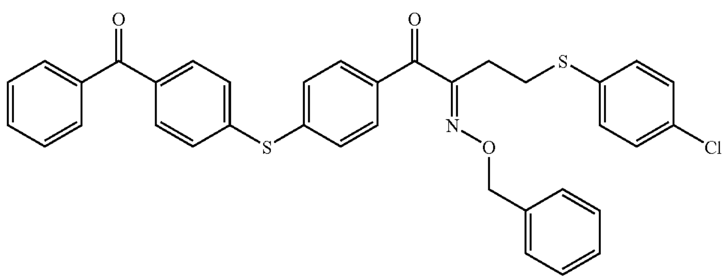
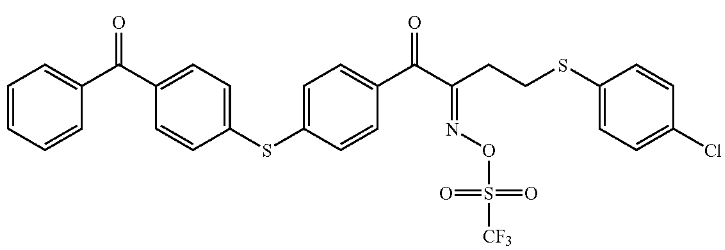
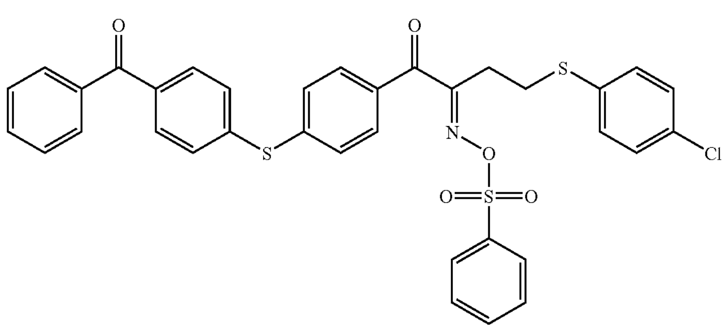

-continued
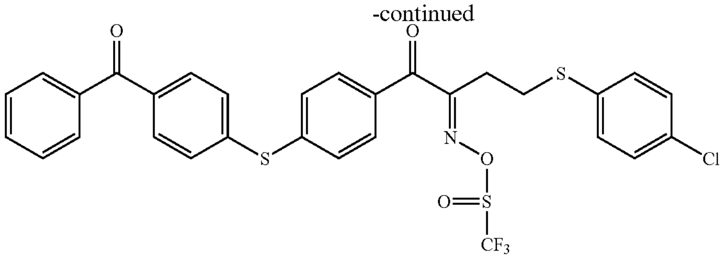
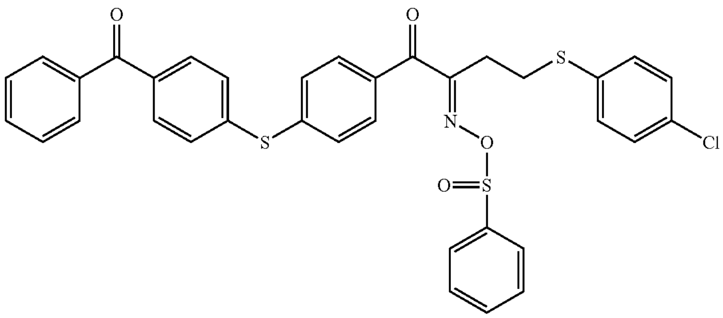
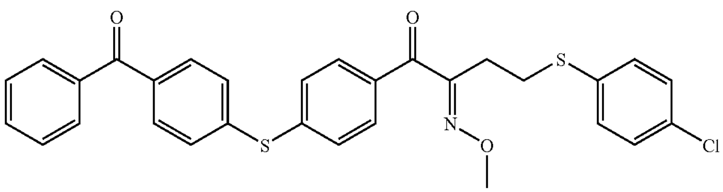
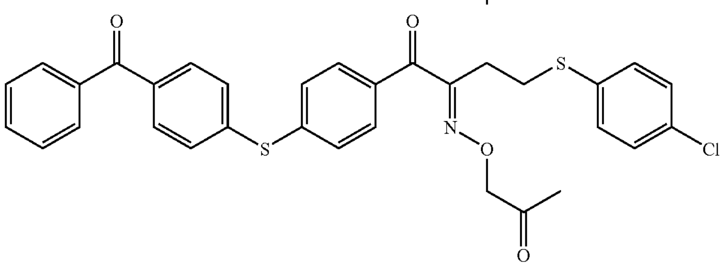
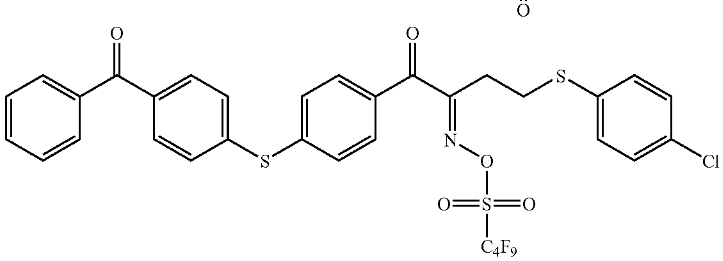
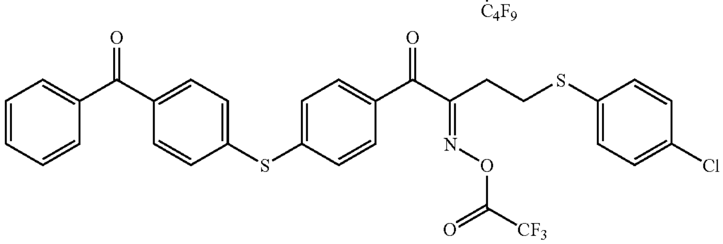
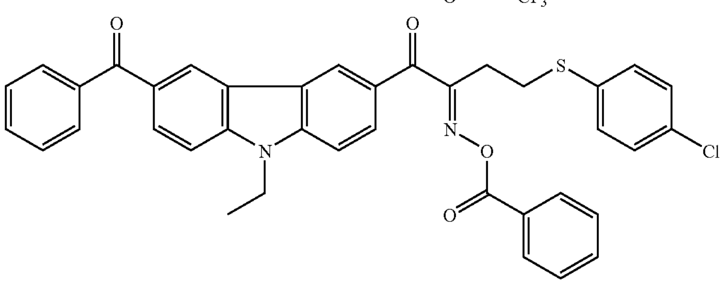

-continued
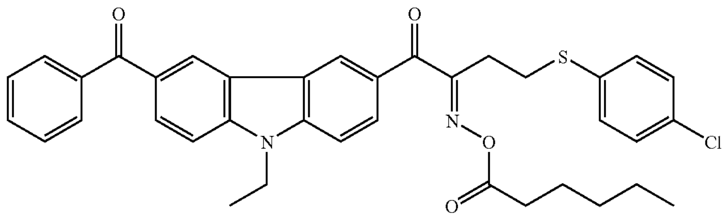
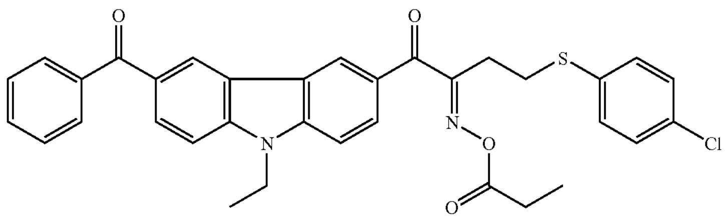
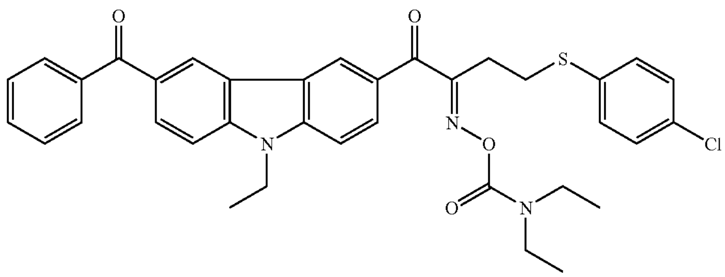
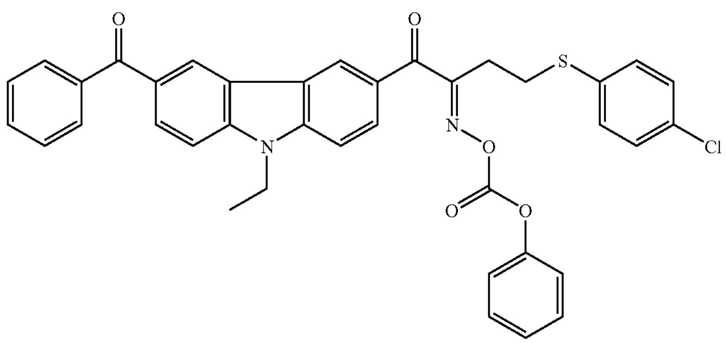
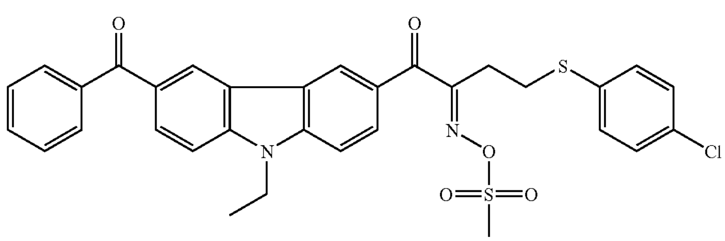
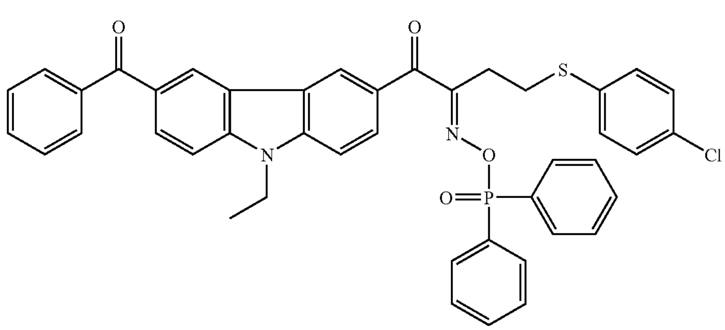

-continued
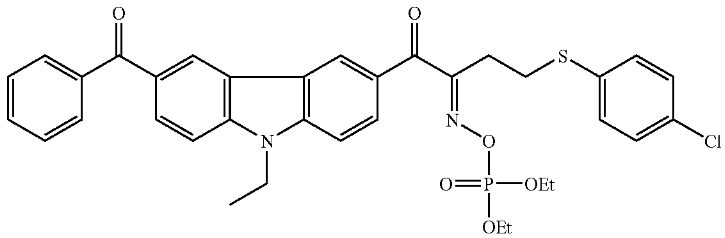
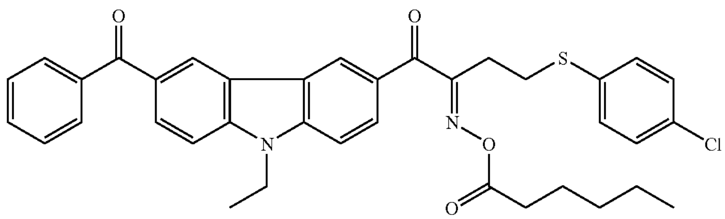
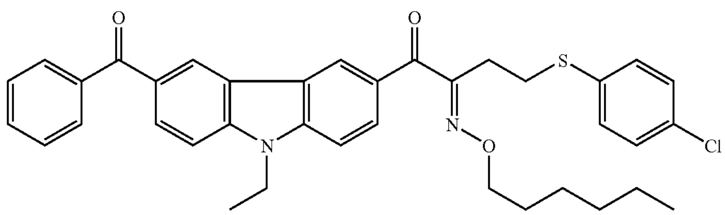
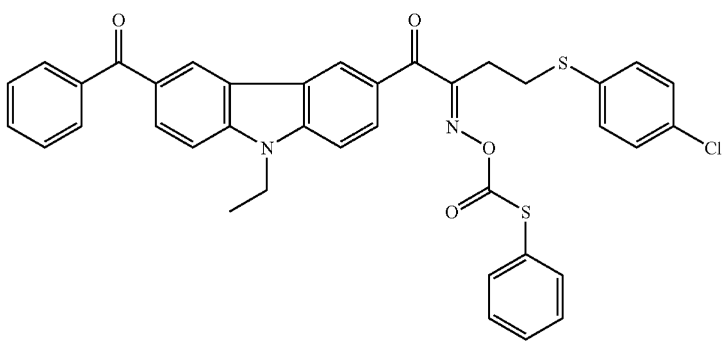
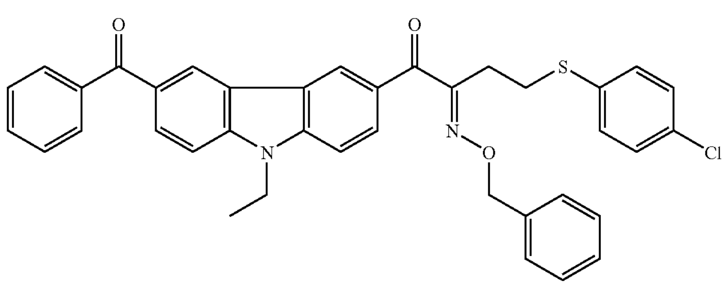
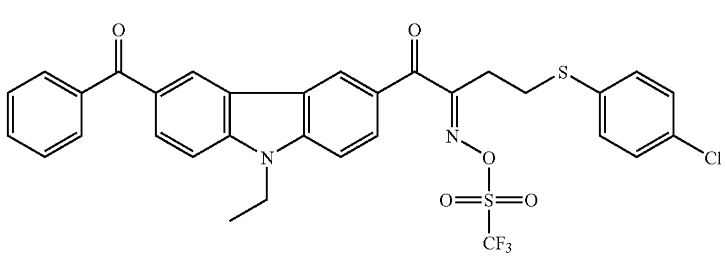

-continued
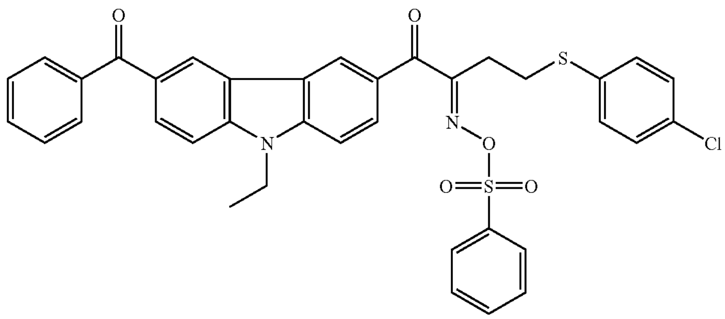
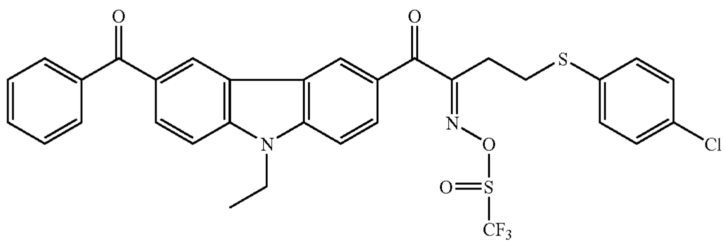
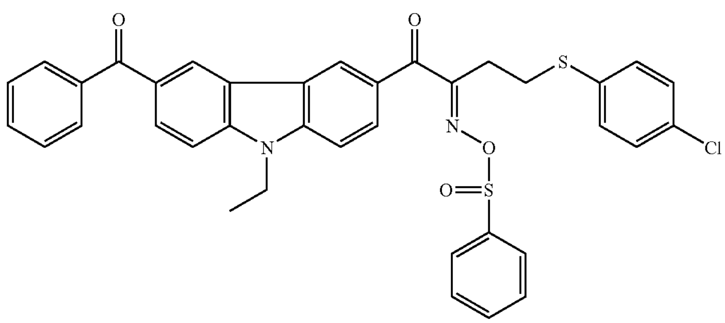
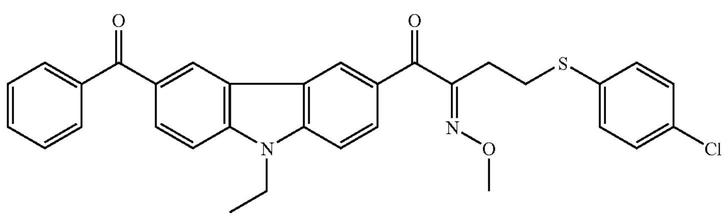
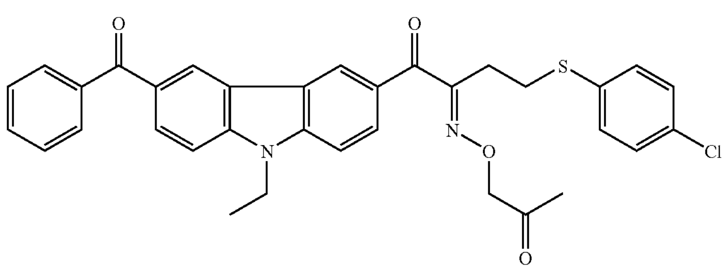
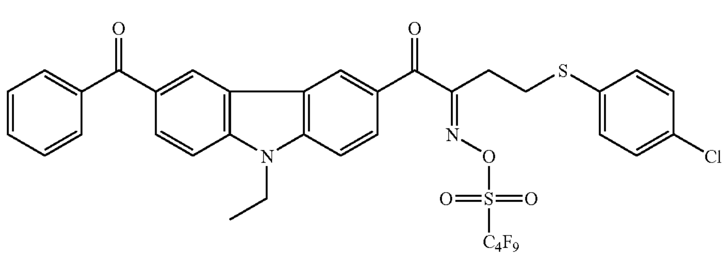

-continued

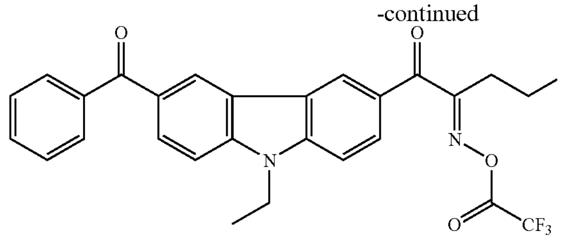

The novel oxime compound of the invention has a maximum absorption wavelength in the wavelength range of 350 nm to 500 nm, more preferably has a maximum absorption wavelength in the range of 360 nm to 480 nm. In particular, the novel oxime compound preferably has a high absorbance at 365 nm and 455 nm.

Therefore, the novel oxime compound has absorption in a longer wavelength region as compared with conventional oxime compounds, so that it can exhibit high sensitivity when exposed to light from a 365 nm or 405 nm light source.

The novel oxime compound of the invention preferably has a molar absorption coefficient of 10,000 to 300,000, more preferably of 15,000 to 300,000, particularly preferably of 20,000 to 200,000 at 365 nm or 405 nm in view of sensitivity.

The molar absorption coefficient of the novel oxime compound was measured at a concentration of 0.01 g/L in a solvent of ethyl acetate with an ultraviolet-visible spectrophotometer (trade name: CARRY-5 Spectrophotometer, manufactured by Varian Inc.).

For example, the novel oxime compound of the invention may be synthesized by the method described below, while the synthesis method is not limited thereto.

Synthesis of the Compound Represented by Formula (2)

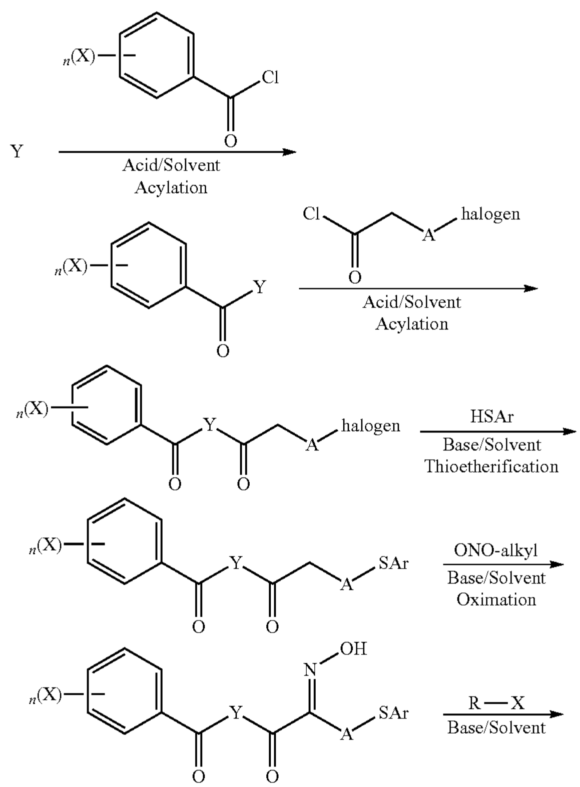

-continued

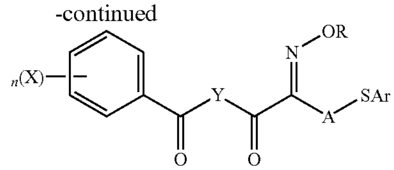

(2)

The content of the novel oxime compound in the photopolymerizable composition of the invention is preferably from 0.1 to 30% by mass, more preferably from 1 to 25% by mass, particularly preferably from 2 to 20% by mass, base on the mass of the total solids of the photopolymerizable composition.

Only a single novel oxime compound may be used, or two or more novel oxime compounds may be used in combination.

The novel oxime compound of the invention is decomposed by light and functions as a photopolymerization initiator that initiates and enhances the polymerization of polymerizable compounds. In particular, the novel oxime compound has high sensitivity to a 365 nm or 405 nm light source and thus can produce superior effects when used as a photopolymerization initiator in a photopolymerizable composition.

The novel oxime compound of the invention may also be used for applications as described blow.

Examples of applications include printing inks such as screen printing inks, offset or flexographic printing inks, and UV-curable inks; white or color finishing of woods or metals; powder coatings, specifically coating materials for paper, wood, metal or plastics; building or road marking; graphic reproduction techniques; holographic recording materials; image recording techniques; manufacture of printing plate precursors developable with organic solvents or aqueous alkali; sunlight-curable coatings for use in manufacture of screen printing masks; dental filling compositions; adhesives; pressure-sensitive adhesives; lamination reins; etching resists for both wet and dry thin films; solder resists; electroplating or permanent resists; photo-forming dielectrics for printed circuit boards and electronic circuits; various displays; optical switches; optical grating (interference grating); manufacture of optical circuits; manufacture of three-dimensional products by large-scale curing (UV curing in a transparent mold) or stereo lithography techniques (for example, as described in U.S. Pat. No. 4,575,330); manufacture of composite materials (such as styrene-based polyesters optionally containing glass fibers and/or other fibers and other aids) or other thick layer compositions; resists for coating or sealing of electronic components and integrated circuits; optical fibers or optical lenses such as coatings for use in manufacture of contact lenses or Fresnel lenses; manufactured of medical equipment, aids or implants; and manufacture of thermotropic gels as described in German Patent No. 19,700,064 and European Patent No. 678,534.

The novel oxime compound of the invention can also generate an acid when it is irradiated with an energy ray, particularly light. Therefore, it may be used for other applications where the generated acid is used as a catalyst. For example, it may be used for image forming techniques utilizing a color reaction of a pigment precursor in the presence of the generated acid serving as a catalyst, anti-counterfeit techniques, materials for detection of energy-ray dose, and positive resists for use in manufacture of semiconductors, TFTs, color filters, micromachine components, and the like utilizing a decomposition reaction in the presence of the generated acid serving as a catalyst.

As described above, the novel oxime compound of the invention may be used as a photopolymerization initiator. Therefore, it may be preferably used in combination with a polymerizable compound to form a photopolymerizable composition (the photopolymerizable composition of the invention) that polymerizes and cures upon irradiation with light.

Photopolymerizable Composition

The photopolymerizable composition of the invention includes (A) the novel oxime compound and (B) a polymerizable compound.

The photopolymerizable composition of the invention has high sensitivity to light with a wavelength of 365 nm or 405 nm and also has high stability over time. In addition, it can form a cured film in which coloration caused by heating over time can be suppressed. Although the detailed mechanism is not clear, the novel oxime compound has a structure that can inhibit radical recombination when cleaved by light absorption so that it can produce a relatively large amount of radicals to achieve high sensitivity. Since radical recombination is inhibited, it is considered that the reaction between the decomposition product molecules of the novel oxime compound can be suppressed during heating over time, thereby suppressing coloration caused by the reaction.

In the invention, a color difference ΔEab* may be used to evaluate the coloration of the cured film caused by heating over time. The color difference ΔEab* may be measured with MCPD-3000 manufactured by Otsuka Electronics Co., Ltd.

The conditions for the evaluation may be as follows. First, cured films are formed by exposing the photopolymerizable composition of the invention to light at different exposure amounts ranging from 10 $mJ/cm^2$ to 2500 mJ/cm2 in an ultra-high pressure mercury lamp proximity-type exposure system (manufactured by Hitachi High-Tech Electronics Engineering Co., Ltd.) or an i-line stepper exposure system (trade name: FPA-3000i5, manufactured by Canon Inc.) (365 nm). The cured films are developed as needed and then heated at 200° C. for 1 hour.

The color difference ΔEab* of the cured film between before and after the heating is measured so that the heat aging-induced coloration of the cured film can be evaluated.

The color difference ΔEab* between before and after the heating can be 5 or less, when the photopolymerizable composition of the invention is used.

The photopolymerization composition of the invention may be used for various applications such as molding resins, casting resins, photo-molding resins, sealing materials, dental polymerizing materials, printing inks, paints, photosensitive resins for printing plates, color proofs for printing, photopolymerizable compositions for color filters, resists for black matrices, resists for printed boards, resists for semiconductor processes, resists for microelectronics, resists for manufacture of micromachine components, insulating materials, hologram materials, waveguide materials, overcoat materials, adhesives, tackifiers, pressure-sensitive adhesives, and release coating agents.

The photopolymerizable composition of the invention is described below using, as examples, a photopolymerizable composition (1) suitable for forming color filters and the like and a photopolymerizable composition (2) suitable for forming photosensitive layers of planographic printing plate precursors.

Photopolymerizable Composition (1)

(1)-(A) Novel Oxime Compound

The novel oxime compound (A) in the photopolymerizable composition (1) may function as a polymerization initiator.

The content of the novel oxime compound in the photopolymerizable composition (1) is preferably from 0.5 to 40% by mass, more preferably from 1 to 35% by mass, even more preferably from 1.5 to 30% by mass, base on the mass of the total solids of the composition.

Any known photopolymerization initiator other than the novel oxime compound may also be used in the photopolymerizable composition (1), as long as the effects of the invention are not reduced.

The photopolymerization initiator that may be used in combination with the novel oxime compound is a compound that is decomposed by light to initiate and enhance the polymerization of the aftermentioned polymerizable compound. It preferably has absorption in the wavelength range of 300 to 500 nm. Examples of the photopolymerization initiator include organic halides, oxydiazole compounds, carbonyl compounds, ketal compounds, benzoin compounds, acridine compounds, organic peroxide compounds, azo compounds, coumarin compounds, azide compounds, metallocene compounds, biimidazole compounds, organic borate compounds, disulfonic acid compounds, oxime ester compounds, onium salt compounds, and acyl phosphine (oxide) compounds.

(1)-(B) Polymerizable Compound

Examples, preferred examples and ranges of the polymerizable compound that may be used for the photopolymerizable composition (1) are the same as those for the curable composition described above.

Details of how to use addition-polymerizable compounds, such as what structure should be used, whether they should be used alone or in combination, or what amount should be added, may be freely determined depending on the final performance design of the photopolymerizable composition. For example, they may be selected from the viewpoints below.

In view of sensitivity, a structure having a higher content of unsaturated groups per molecule is preferable, and di- or higher-functional structures are preferred in many cases. In order to increase the strength of the cured film, tri- or higher-functional structures are preferred. A method of using a combination of compounds having different numbers of functional groups and/or different types of polymerizable group (for example, compounds selected from an acrylic ester, a methacrylic ester, a styrene compound, a vinyl ether compound) is also effective for controlling both of sensitivity and strength.

How to select and use the addition-polymerizable compound is also an important factor for the compatibility with or dispersibility to other components of the photopolymerizable composition (such as a photopolymerization initiator, a colorant (a pigment and/or a dye) and a binder polymer). For example, in some cases, the compatibility can be improved by using a low-purity compound or by using a combination of two or more compounds. A particular structure may also be selected in order to improve adhesion to the hard surface of a support or the like.

(1)-(C) Colorant

The photopolymerizable composition (1) may contain (C) a colorant. When the colorant is added, a colored photopolymerizable composition of a desired color may be obtained.

The photopolymerizable composition (1) contains (A) the novel oxime compound having high sensitivity to a short-wavelength light source such as a 365 nm or 406 nm light source. Therefore, it can be cured with high sensitivity, even when it contains a colorant at high concentration.

The colorant used in the photopolymerizable composition (1) is not particularly limited. One of, or a mixture of two or more of, various known conventional dyes and pigments may be used, which may be appropriately selected depending on the use of the photopolymerizable composition. When the colored photopolymerizable composition of the invention is used for the production of color filters, either of a colorant of a chromatic color such as R, G and B for forming color pixels of the color filter or a black colorant generally used for forming black matrices may be employed.

The description of the colorant for use in the above-mentioned curable composition applies, in its entirety, to the colorant for use in the photopolymerizable composition (1).

When the photopolymerizable composition (1) is used to form black films such as black matrices, the colorant to be used may be black (black colorant).

In the invention, a variety of known black colorants such as black pigments and black dyes may be used. In order to achieve high optical density with small amount, carbon black, black titanium oxide, titanium oxide, iron oxide, manganese oxide, graphite, or the like is particularly preferred. Above all, at least one of carbon black and black titanium oxide is preferably contained.

Only a single black colorant may be used, or a mixture of two or more black colorants may be used.

In order to reduce the residue during development, the average particle size (average primary particle size) of the black colorant is preferably smaller, and specifically, it is preferably 30 nm or less. In order to reduce the residue during development in the process of manufacturing color filters requiring high resolution, the average primary particle size is preferably from 5 to 25 nm, more preferably 5 to 20 nm, particularly preferably from 5 to 15 nm.

While the content of the black colorant in the total solids of the photopolymerizable composition (1) is not particularly limited, it is preferably as high as possible in order to form a thin film with a high optical density. Specifically, it is preferably from 25 to 80% by mass, more preferably from 30 to 75% by mass, particularly preferably from 35 to 70% by mass.

If the black colorant content is too low, the film thickness must be increased to achieve high optical density. If the black colorant content is too high, photo-curing may not sufficiently proceed, the strength of the film may be reduced and development latitude at alkali development tends to be narrow.

For the photopolymerizable composition (1), plural black colorants may be used in combination. When plural black colorants including carbon black as a main component are used in combination, the mass ratio of carbon black to the additional black colorant(s) (carbon black: additional black colorant(s)) is preferably from 95:5 to 60:40, more preferably from 95:5 to 70:30, even more preferably from 90:10 to 80:20. The mass of the additional black colorant(s) refers to the total mass of the additional black colorant(s). When the mass ratio of the carbon black to the additional black colorant(s) is from 95:5 to 60:40, aggregation in the photopolymerizable composition (1) can be prevented so that the production of a uniform stable coating film can be facilitated.

Examples of carbon blacks suitable for use in the invention include Carbon Black #2400, #2350, #2300, #2200, #1000, #980, #970, #960, #950, #900, #850, MCF88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, CF9, #3050, #3150, #3250, #3750, #3950, Diablack A, Diablack N220M, Diablack N234, Diablack I, Diablack LI, Diablack II, Diablack N339, Diablack SH, Diablack SHA, Diablack LH, Diablack H, Diablack HA, Diablack SF, Diablack N550M, Diablack E, Diablack G, Diablack R, Diablack N760M, and Diablack LP (trade names) manufactured by Mitsubishi Chemical Corporation; Carbon Black Thermax N990, N991, N907, N908, N990, N991, and N908 (trade names) manufactured by Cancarb; Carbon Black Asahi #80, Asahi #70, Asahi #70L, Asahi F-200, Asahi #66, Asahi #66HN, Asahi #60H, Asahi #601J, Asahi #60, Asahi #55, Asahi #50H, Asahi #51, Asahi #50U, Asahi #50, Asahi #35, Asahi #15, and Asahi Thermal (trade names) manufactured by Asahi Carbon Co., Ltd.; Carbon Black Color Black Fw 200, Color Black Fw2, Color Black Fw2V, Color Black Fw1, Color Black Fw18, Color Black S170, Color Black S160, Special Black 6, Special Black 5, Special Black 4, Special Black 4A, Printex U, Printex V, Printex 140U, and Printex 140V (trade names) manufactured by Degussa.

In the invention, carbon black preferably has insulating properties. The carbon black having insulating properties refers to a carbon black that exhibits insulating properties when the volume resistivity of its powder is measured by the method described below. For example, such a carbon black contains an organic compound deposited on the carbon black particle surface by adsorption, coating or chemical bonding (grafting).

Carbon black and a copolymer (having a mass average molecular weight of 30,000) of benzyl methacrylate and methacrylic acid (70:30 in molar ratio) are dispersed in a mass ratio of 20:80 into propylene glycol monomethyl ether to form a coating liquid. The coating liquid is applied with a thickness of 1.1 mm to a chromium substrate of 10 cm×10 cm, so as to form a coating film having a dry film thickness of 3 μm. The coating film is further heated on a hot plate at 220° C. for about 5 minutes. Thereafter, the volume resistivity of the coating film is measured through the application of voltages under an environment at 23° C. and a relative humidity of 65% with a high resistivity meter (trade name: HIRESTER UP (MCP-HT450), manufactured by Mitsubishi Chemical Corporation) according to JIS K 6911. The volume resistivity of the carbon black is preferably $10^5$ Ω·cm or more, more preferably $10^6$ Ω·cm or more, even more preferably $10^7$ Ω·cm or more.

Examples of carbon blacks that may be used also include the resin-coated carbon blacks described in JP-A Nos. 11-60988, 11-60989, 10-330643, 11-80583, 11-80584, 09-124969, and 09-95625.

Examples of black titanium oxide suitable for use in the invention include 12S, 13M, 13M-C, and 13R-N (trade names) manufactured by Mitsubishi Chemical Corporation and TILACK D (trade name) manufactured by Ako Kasei Co., Ltd.

The photopolymerizable composition of the invention containing a black colorant, which may be selected from the above, is preferably used to form black films such as black matrices. The black films have light-shielding properties or antireflection properties and therefore may be used to produce antireflection or light-shielding films as well as black matrices.

The content of the colorant in the photopolymerizable composition (1) is preferably from 30 to 95% by mass, more preferably from 40 to 90% by mass, even more preferably from 50 to 80% by mass, based on the mass of the total solids of the photopolymerizable composition.

If the colorant content is too low, it may be difficult to obtain proper chromaticity when producing a color filter by using the photopolymerizable composition (1). If the colorant content is too high, photocuring may not sufficiently proceed, and the strength of the film may be reduced or the development latitude may be narrow in the process of alkali development. However, since (A) the novel oxime compound for use in the invention has high light absorption efficiency, the sensitivity enhancing effect can be significantly produced even when the photopolymerizable composition contains a high concentration of the colorant.

(1)-(D) Pigment Dispersing Agent

When the photopolymerizable composition (1) contains a pigment as (C) the colorant, (D) a pigment dispersing agent is preferably added to the composition in order to improve the dispersibility of the pigment.

The description of the dispersing agent for use in the curable composition exactly applies, in its entirety, to the pigment dispersing agent that may be used in the invention (including the photopolymerizable composition (1)).

In the photopolymerizable composition (1), the content of the dispersing agent is preferably from 1 to 80% by mass, more preferably from 5 to 70% by mass, even more preferably from 10 to 60% by mass, based on the mass of the pigment.

For example, when a polymeric dispersant is used, the content thereof is preferably from 5 to 100% by mass, more preferably from 10 to 80% by mass of the pigment.

When a pigment derivative is used, the content thereof is preferably from 1 to 30% by mass, more preferably from 3 to 20% by mass, particularly preferably from 5 to 15% by mass of the pigment.

When a pigment as a colorant and a dispersing agent are used in the photopolymerizable composition (1), the total content of the colorant and the dispersing agent is preferably from 30 to 90% by mass, more preferably from 40 to 85% by mass, even more preferably from 50 to 80% by mass, based on the mass of the total solids of the photopolymerizable composition, in view of curing sensitivity and color density.

If necessary, the photopolymerizable composition (1) may further contain any of the optional components described in detail below.

A description is given below of optional components that may be added to the photopolymerizable composition (1).

(1)-(E) Sensitizer

The photopolymerizable composition (1) may contain a sensitizer for the purpose of improving the radical generation efficiency of a radical initiator or making the photosensitive wavelength longer.

The sensitizer that may be used in the invention preferably heighten the sensitivity of (A) the novel oxime compound based on the electron-transfer mechanism or the energy-transfer mechanism.

The description of (c) the sensitizer in the curable composition applies, in its entirety, to the sensitizer for use in the photopolymerizable composition (1).

(1)-(F) Co-Sensitizer

The photopolymerizable composition (1) preferably further contains (F) a co-sensitizer.

In the invention, the co-sensitizer has the effect of further improving the sensitivity of (A) the novel oxime compound or (E) the sensitizer to active radiation or the effect of suppressing inhibition of polymerization of (B) the polymerizable compound caused by oxygen.

The description of (d) the co-sensitizer in the curable composition applies, in its entirety, to such a co-sensitizer that may be used in the photopolymerizable composition (1).

(1)-(G) Binder Polymer

If necessary, a binder polymer may also be used in the photopolymerizable composition (1) for the purpose of improving film characteristics and the like. The description of the binder polymer for use in the curable composition, which includes the description of the radical-polymerization initiator for use in the synthesis thereof, applies, in its entirety, to the binder for use in the photopolymerizable composition (1).

(1)-(H) Polymerization Inhibitor

A small amount of a thermal polymerization inhibitor is preferably added to the photopolymerizable composition (1) in order to inhibit unnecessary thermal polymerization of (B) the polymerizable compound during the production or storage of the photopolymerizable composition.

Examples of the thermal polymerization inhibitor that may be used in the invention include those described for the curable composition.

The content of the thermal polymerization inhibitor is preferably from about 0.01 to about 5% by mass, based on the mass of the total solids of the photopolymerizable composition (1).

If necessary, behenic acid or a higher fatty acid derivative such as behenic acid amide may be added to prevent inhibition of polymerization caused by oxygen and may be localized to the surface of a coating film in a drying process after coating. The content of the higher fatty acid derivative is preferably from about 0.5 to about 10% by mass based on the mass of the entire composition.

(1)-(I) Adhesion Improving Agent

The photopolymerizable composition (1) may contain an adhesion improving agent for improving adhesion to a hard surface such as of a support or the like. Examples of the adhesion improving agent include those described for the curable composition.

In particular, preferred examples include γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane, and γ-methacryloxypropyltrimethoxysilane is most preferred.

The content of the adhesion improving agent is preferably from 0.5 to 30% by mass, more preferably from 0.7 to 20% by mass, based on the mass of the total solids of the photopolymerizable composition (1).

(1)-(J) Diluent

Any of various organic solvents may be used as a diluent for the photopolymerizable composition (1).

Examples of the organic solvent that may be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate.

Only a single solvent may be used, or a mixture of two or more solvents may be used. The solids content relative to the organic solvent is preferably from 2 to 60% by mass.

(1)-(K) Other Additives

In addition, known additives for modifying the physical properties of cured films, such as an inorganic filler, a plasticizer and a lipophilizing agent, may also be added to the photopolymerizable composition (1).

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerol. When a binder is used, the plasticizer may be added in an amount of 10% by mass or less, based on the total mass of the polymerizable compound and the binder polymer.

The photopolymerizable composition (1) contains (A) the novel oxime compound and therefore can be cured with high sensitivity and has high storage stability. It can also suppress coloration during heating over time. When the photopolymerizable composition (1) is applied to a hard material surface and cured, the cured product can exhibit excellent adhesion to the surface.

Therefore, the photopolymerizable composition (1) including (A) the novel oxime compound, (B) the polymerizable compound and (C) the colorant is preferably used as a photopolymerizable composition for color filters (the photopolymerizable composition for a color filter of the invention).

Photopolymerizable Composition (2)

(2)-(A) Novel Oxime Compound

The novel oxime compound in the photopolymerizable composition (2) may function as a polymerization initiator.

The content of the novel oxime compound in the photopolymerizable composition (2) is preferably from 0.5 to 40% by mass, more preferably from 1 to 35% by mass, even more preferably from 1.5 to 30% by mass, base on the mass of the total solids of the composition.

Any known polymerization initiator other than the novel oxime compound may also be used in the photopolymerizable composition (2), as long as the effects of the invention are not impaired.

Examples of other polymerization initiators include (a) aromatic ketones, (b) aromatic onium salt compounds, (c) organic peroxides, (d) thio compounds, (e) hexaarylbiimidazole compounds, (f) ketoxime ester compounds, (g) borate compounds, (h) azinium compounds, (i) metallocene compounds, (j) active ester compounds, and (k) carbon-halogen bond-containing compounds. More specifically, the polymerization initiators described in Paragraphs [0081] to [0139] of JP-A No. 2006-78749 may be used.

(2)-(B) Polymerizable Compound

Examples of (B) a polymerizable compound that may be contained in the photopolymerizable composition (2) include the addition-polymerizable compounds described above for the curable composition or the photopolymerizable composition (1).

Details of how to use addition-polymerizable compounds, such as what structure should be used, whether they should be used alone or in combination, or what amount should be added, may be freely determined depending on the final performance design of the photosensitive material. For example, they may be selected from the following viewpoints. In view of photosensitive speed, a structure having a higher content of unsaturated group per molecule is preferable, and di- or higher-functional structures are preferred in many cases. In order to increase the strength of the image portion, namely the cured film, tri- or higher-functional structures are preferred. A method of using a combination of compounds having different numbers of functional groups and/or different types of polymerizable groups (for example, compounds selected from an acrylic ester, a methacrylic ester, a styrene compound, a vinyl ether compound) is also effective for controlling both of photosensitivity and strength. High-molecular-weight compounds or highly hydrophobic compounds can have high sensitive speed or form high-strength films but are not preferred in some cases in view of development speed or precipitation in a liquid developer.

How to select and use the addition-polymerizable compound is also an important factor for the compatibility with or dispersibility to other components of the photosensitive layer (such as the binder polymer, the initiator and the colorant). For example, in some cases, the compatibility may be improved by using a low-purity compound or by using a combination of two or more compounds. A particular structure may also be selected in order to improve adhesion to a support, an overcoat layer or the like. A higher content of the addition-polymerizable compound in the photosensitive layer is advantageous in terms of sensitivity. If the content is too high, however, undesirable phase separation, manufacturing process problems due to the tackiness of the photosensitive layer (such as manufacturing failures resulting from transfer or adhesion of the photosensitive material components), precipitation from a liquid developer, and the like may occur.

Form these points of view, the content of the addition-polymerizable compound is preferably from 5 to 80% by mass, more preferably from 25 to 75% by mass, base on the mass of the total solids of the photopolymerizable composition (2).

Only a single addition-polymerizable compound may be used, or two or more addition-polymerizable compounds may be used in combination. Concerning how to use the addition-polymerizable compounds, an appropriate structure, composition or content may also be freely selected in consideration of the degree of inhibition of polymerization caused by oxygen, resolution, fogging properties, changes in refractive index, surface stickiness, or other points of view. In some cases, a layered structure or coating method using an undercoat or an overcoat may also be performed.

(2)-(C) Binder Polymer

The photopolymerizable composition (2) preferably contains a binder polymer. The binder polymer may be contained in terms of improving film characteristics. Any binder polymer having the function of improving film characteristics may be used.

A linear organic high-molecular weight polymer is preferably contained as the binder polymer. Such a linear organic high-molecular-weight polymer to be used is not particularly limited, and may be any linear organic polymer. In order to enable development with water or a weakly alkaline aqueous solution, a linear organic high-molecular-weight polymer soluble or swellable in water or a weakly alkaline aqueous solution is preferably selected. The linear organic high-molecular-weight polymer may be selected and used not only as a film-forming agent for the photopolymerizable composition but also in consideration of the specifications of the developer such as water, a weakly alkaline aqueous solution or an organic solvent. For example, water development can be performed when a water-soluble organic high-molecular-weight polymer is used. Examples of such a linear organic high-molecular-weight polymer include addition polymerization products having a carboxylic acid group in a side chain, such as those described in JP-A No. 59-44615, JP-B Nos. 54-34327, 58-12577 and 54-25957, and JP-A Nos. 54-92723, 59-53836 and 59-71048, specifically, methacrylic acid copolymers, acrylic acid copolymers, itaconic acid copolymers, crotonic acid copolymers, maleic acid copolymers, and partially-esterified maleic acid copolymers.

Examples also include acidic cellulose derivatives having a carboxylic acid group in a side chain. Besides the above, a product of an addition of a cyclic acid anhydride to a hydroxyl group-containing addition polymer is also useful.

In particular, copolymers of benzyl (meth)acrylate and (meth)acrylic acid and optionally any other addition-polymerizable vinyl monomer and copolymers of allyl (meth) acrylate and (meth)acrylic acid and optionally any other addition-polymerizable vinyl monomer are preferred, because they have an excellent balance between film strength, sensitivity and developability.

An amide bond-containing binder polymer or urethane bond-containing binder polymer may also be contained. The amide bond- or urethane bond-containing binder polymer is preferably an amide bond- or urethane bond-containing linear organic high-molecular-weight polymer. Such an amide bond- or urethane bond-containing linear organic high-molecular-weight polymer may be of any type. In order to enable development with water or a weakly alkaline aqueous solution, an amide bond- or urethane bond-containing linear high-molecular-weight organic polymer soluble or swellable in water or a weakly alkaline aqueous solution is preferably selected. The amide bond- or urethane bond-containing linear organic high-molecular-weight polymer may be selected and used depending on applications not only as a film-forming agent but also in consideration of the developer such as water, a weakly alkaline aqueous solution or an organic solvent. For example, water development can be performed when a water-soluble high-molecular-weight organic polymer is used. The amide group-containing binder described in JP-A No. 11-171907 is preferably used as the amide bond- or urethane bond-containing linear organic high-molecular-weight polymer, because it has both excellent developability and high film strength.

The acid group-containing urethane binder polymers described in JP-B Nos. 07-120040, 07-120041, 07-120042, and 08-12424, JP-A Nos. 63-287944, 63-287947 and 01-271741, and Japanese Patent Application No. 10-116232 are advantageous in terms of printing durability or low exposure properties, because they have very high strength. The amide group-containing binder described in JP-A No. 11-171907 is also preferred, because it has both excellent developability and high film strength.

Useful water-soluble linear organic high-molecular-weight polymers also include polyvinyl pyrrolidone and polyethylene oxide. Alcohol-soluble nylon or polyether of 2,2-bis-(4-hydroxyphenyl)-propane and epichlorohydrin is also useful for increasing the strength of cured films.

Any amount of the binder polymer may be mixed into the photopolymerizable composition (2). In view of image strength or the like, the content of the binder polymer is preferably from 30 to 85% by mass, base on the mass of the total solids content of the photosensitive layer. The mass ratio of the addition-polymerizable compound to the binder polymer is preferably in the range of from 1/9 to 7/3.

In a preferred exemplary embodiment, the binder polymer to be used is substantially water-insoluble but alkali-soluble. This can eliminate the use of an environmentally-unfriendly organic solvent for a developer or limit the used amount to a very low level. In such a method of use, the acid value (the acid content per g of polymer expressed in chemical equivalent members) and the molecular weight of the binder polymer may be appropriately selected in consideration of image strength and developability. The acid value is preferably from 0.4 to 3.0 meq/g, more preferably from 0.6 to 2.0 meq/g, and the molecular weight is preferably from 3,000 to 500,000, more preferably from 10,000 to 300,000.

(2)-(D) Sensitizer

The photopolymerizable composition (2) preferably contains a sensitizer together with the novel oxime compound or the like as a polymerization initiator. Examples of the sensitizer that may be used in the invention include spectral sensitizing dyes and pigments or dyes capable of interacting with polymerization initiators upon absorption of light from a light source.

Examples of preferred spectral sensitizing dyes or pigments include polycyclic aromatic compounds (such as pyrene, perylene and triphenylene), xanthenes (such as fluorescein, eosin, erythrosine, rhodamine B, and rose bengal), cyanines (such as thiacarbocyanine and oxacarbocyanine), melocyanines (such as melocyanine and carbomelocyanine), thiazines (such as thionine, methylene blue and toluidine blue), acridines (such as acridine orange, chloroflavin, and acriflavin), phthalocyanines (such as phthalocyanine and metallophthalocyanine), porphyrins (such as tetraphenylporphyrin and center metal-substituted porphyrin), chlorophylls (such as chlorophyll, chlorophyllin and center metal-substituted chlorophyll), metal complexes (such as the compound shown below), anthraquinones (such as anthraquinone), and squaryliums (such as squarylium).

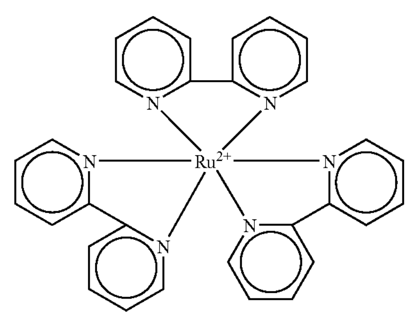

Examples of more preferred spectral sensitizing dyes or pigments include the compounds described in Paragraphs [0144] to [0202] of JP-A No. 2006-78749.

Examples of sensitizers that may be used for the photopolymerizable composition (2) also include those described above for the curable composition or the photopolymerizable composition (1).

Only one sensitizer may be used, or two or more sensitizers may be used in combination. In the photopolymerizable composition (2), the molar ratio of all the polymerization initiator(s) to the sensitizing dye (all the polymerization initiator(s) sensitizing dye) may be from 100:0 to 1:99, more preferably from 90:10 to 10:90, most preferably from 80:20 to 20:80.

(2)-(E) Co-Sensitizer

A known compound having the effect of further improving the sensitivity or the effect of suppressing inhibition of polymerization caused by oxygen may be added as a co-sensitizer to the photopolymerizable composition (2).

Examples of the co-sensitizer also include those described above for the curable composition or the photopolymerizable composition (1). Other examples include the phosphorus compounds (diethyl phosphite and the like) described in JP-A No. 06-250387 and the Si—H and Ge—H compounds described in Japanese Patent Application No. 06-191605.

When the co-sensitizer is used, the amount of the co-sensitizer may appropriately be from 0.01 to 50 parts by mass, based on 1 part by mass of the polymerization initiator in the photopolymerizable composition (2).

(2)-(F) Polymerization Inhibitor

A small amount of a thermal polymerization inhibitor is preferably added to the photopolymerizable composition (2) in order to inhibit unnecessary thermal polymerization of the compound containing a polymerizable ethylenic unsaturated double bond during the production or storage of the composition. Examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and cerous N-nitrosophenylhydroxylamine.

The content of the thermal polymerization inhibitor is preferably from about 0.01 to about 5% by mass, based on the mass of the composition.

If necessary, behenic acid or a higher fatty acid derivative such as behenic acid amide may be added to prevent oxygen-induced inhibition of polymerization and may be localized to the surface of the photosensitive layer in a drying process after coating. The content of the higher fatty acid derivative is preferably from about 0.5 to about 10% by mass of the entire composition.

(2)-(G) Colorant and the Like

In order to form a colored photosensitive layer, a dye or a pigment may be added to the composition. This allows an improvement in the so-called plate checking capability of a printing plate, such as the visibility of the photosensitive layer after plate making and suitability for measurements with image density measuring machines. Many dyes used as colorants can reduce the sensitivity of the photopolymerizable photosensitive layer. In particular, therefore, pigments are preferably used as colorants. Examples of colorants include pigments such as phthalocyanine pigments, azo pigments, carbon blacks, and titanium oxide; and dyes such as ethyl violet, crystal violet, azo dyes, anthraquinone dyes, and cyanine dyes. The content of the dye or the pigment is preferably from about 0.5 to about 5% by mass of the composition.

(2)-(H) Other Additives

In addition, known additives such as an inorganic filler or plasticizer for modifying the physical properties of the cured film, and lipophilizing agents capable of improving the fixation of inks on the surface of photosensitive layers, may also be added to the composition.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerol. When a binder is used, the plasticizer may be added in an amount of 10% by mass or less, based on the total mass of the ethylenic unsaturated double bond-containing compound and the binder.

In order to improve the film strength (printing durability), a UV initiator or a thermal crosslinking agent for enhancing the effect of heating and/or exposure after development may also be added to the composition.

<Color Filter and Methods for Production Thereof>

A description is given blow of the color filter and the method for producing a color filter according to the invention.

The color filter of the invention includes a colored pattern provided on a support, the colored pattern being produced by using the photopolymerizable composition for a color filter of the invention.

The color filter of the invention is described in detail below together with the method for production thereof (the method of the invention for producing a color filter).

The method of the invention for producing a color filter includes the steps of: applying the photopolymerizable composition for a color filter of the invention onto a support to form a colored photopolymerizable composition layer (hereinafter also simply referred to as "the colored photopolymerizable composition layer-forming step"); exposing the colored photopolymerizable composition layer to light through a mask (hereinafter also simply referred to as "the exposure step"); and developing the exposed composition layer to form a colored pattern (hereinafter also simply referred to as "the development step").

Specifically, the photopolymerizable composition for a color filter of the invention is applied to a support (substrate) directly or with another layer interposed therebetween to form a photopolymerizable composition layer (the colored photopolymerizable composition layer-forming step); the coating film is exposed to light through a specific patterned mask to cure the irradiated portion of the coating film (the exposure step); and the coating film is developed with a liquid developer to form a patterned film including pixels of the respective colors (three or four colors) so that a color filter of the invention is produced.

Each step of the method of the invention for producing a color filter is described below.

Colored Photopolymerizable Composition Layer-Forming Step

In the colored photopolymerizable composition layer forming step, the photopolymerizable composition for a color filter of the invention is applied to a support to form a colored photopolymerizable composition layer.

Examples of the support that may be used in this step include soda glass substrates, PYREX (registered trademark) glass substrates, quartz glass substrates, and a substrate obtained by attaching a transparent electrically-conductive film onto any of the above glass substrates, which are for use in liquid crystal displays and the like, and photoelectric converting substrates for use in imaging devices, such as silicon substrates and complementary metal oxide film semiconductors (CMOS). In some cases, these substrates may have black stripes for separating pixels from one another.

If necessary, an undercoat layer may be formed on the support in order to improve adhesion to the upper layer, prevent the substance diffusion or flatten the substrate surface.

The photopolymerizable composition for a color filter of the invention may be applied to the support by various coating methods such as slit coating, inkjet method, spin coating, cast coating, roll coating, and screen printing.

The thickness of the coating film of the photopolymerizable composition for a color filter is preferably from 0.1 μm to 10 μm, more preferably from 0.2 μm to 5 μm, even more preferably from 0.2 μm to 3 μm.

When producing a color filter for use in a solid-state imaging device, the thickness of the coating film of the photopolymerizable composition for a color filter is preferably from 0.35 μm to 1.5 μm, more preferably from 0.40 μm to 1.0 μm, in view of resolution and developability.

The coating of the photopolymerizable composition for a color filter on the support is generally dried under the conditions of 70 to 110° C. for 2 to 4 minutes to form a colored photopolymerizable composition layer.

Exposure Step

In the exposure step, the colored photopolymerizable composition layer formed in the colored photopolymerizable composition layer forming step is exposed to light through a mask so that only the irradiated portion of the coating film is cured.

The exposure is preferably performed by irradiation with a radiation. In particular, ultraviolet rays such as g-line or i-line is preferably used as the radiation for exposure, and high-pressure mercury lamps are more preferred. The irradiation intensity is preferably from 5 mJ to 1500 mJ, more preferably from 10 mJ to 1000 mJ, most preferably from 10 mJ to 800 mJ.

Development Step

After the exposure step, alkali development (the development step) may be performed so that the unexposed portion resulting from the exposure step can be dissolved in an aqueous alkali solution. In this step, only the photo-cured portion is left.

The liquid developer is preferably an organic alkali developer that does not damage underlying circuits or the like. The development is generally performed at a temperature of 20° C. to 30° C. for a time period of 20 to 90 seconds.

Examples of the alkali for use in the liquid developer include ammonia water and organic alkaline compounds such as ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene. An aqueous alkaline solution prepared by diluting the alkali with pure water to a concentration of 0.001 to 10% by mass, preferably of 0.01 to 1% by mass may be used. When a liquid developer comprising such an aqueous alkaline solution is used, washing (rinsing) with pure water is generally performed after the development.

If necessary, the method of the invention for producing a color filter may further include the step of curing the colored pattern by heating and/or exposure to light after the photopolymerizable composition layer-forming step, the exposure step and the development step have been conducted.

The colored photopolymerizable composition layer-forming step, the exposure step and the development step (and optionally the curing step) may be repeated for the number of times corresponding to the number of the desired hues, whereby a color filter of the desired hues may be produced.

While the method of the invention for producing a color filter has been described based on an exemplary embodiment where the photopolymerizable composition for a color filter of the invention is used in a process of forming a colored pattern of a color filter, such an exemplary embodiment is not intended to limit the scope of the invention. For example, the photopolymerizable composition for a color filter of the invention may also be used to form black matrices for separating colored patterns (pixels) in a color filter.

The colored photopolymerizable composition layer-forming step, the exposure step and the development step (and optionally the curing step) of the color filter production method of the invention may also be used in a process of forming a black matrix on a substrate. Specifically, the colored photopolymerizable composition layer-forming step, the exposure step and the development step (and optionally the curing step) are performed as described above using the photopolymerizable composition for a color filter of the invention containing a black colorant such as carbon black or black titanium oxide, so that a black matrix (black pattern) is formed on the substrate.

The color filter of the invention is produced with the photopolymerizable composition for a color filter of the invention. In the color filter, therefore, the colored pattern exhibits excellent adhesion to the supporting substrate, and the cured composition has excellent resistance to development. Therefore, the exposure sensitivity is high, the adhesion to the substrate of the exposed portion is excellent, and a high-resolution pattern having a desired cross-sectional shape can be formed. Therefore, the color filter of the invention is suitable for use in liquid crystal displays and solid-state imaging devices such as CCDs and particularly suitable for use in high-resolution CCD devices or CMOS devices having more than a million pixels. Specifically, the color filter of the invention is preferably used for solid-state imaging devices.

For example, the color filter of the invention may be placed between the light-receiving part of each pixel of a CCD and a converging microlens.

<Planographic Printing Plate Precursor>

A description is given below of the planographic printing plate precursor of the invention.

The planographic printing plate precursor includes a support and a photosensitive layer that is placed on the support and contains the photopolymerizable composition of the invention.

If necessary, the planographic printing plate precursor may further include any other layer such as a protective layer and an intermediate layer. Since the planographic printing plate precursor contains the photopolymerizable composition of the invention in the photosensitive layer and thus have a high sensitivity, stability over time and printing durability. Each element of the planographic printing plate precursor of the invention is described below.

Photosensitive Layer

The photosensitive layer is a layer containing the photopolymerizable composition of the invention. Specifically, the photosensitive layer may be formed by a process that includes using the photopolymerizable composition (2) (a preferred example of the photopolymerizable composition of the invention) as a composition for forming a photosensitive layer (hereinafter also referred to as "the photosensitive layer-forming composition"), applying a coating liquid containing the composition to a support and dying the coating to form a photosensitive layer.

For the application of the photosensitive layer-forming composition to the support, the respective components to be contained in the composition may be used in the form of solutions in various organic solvents. Examples of solvents that may be used in this process include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. Only a single solvent may be used, or a mixture of two or more solvents may be used. The coating solution appropriately has a solids content of 2 to 50% by mass.

The coating amount of the photosensitive layer on the support is preferably selected as appropriate depending on applications, because it may have effects on the sensitivity and/or developability of the photosensitive layer and on the strength and/or printing durability of the exposed film. If the coating amount is too small, the printing durability may be insufficient. If the coating amount is too large, the sensitivity may be reduced so that the necessary exposure time may increase, and the development time may also undesirably increase. For a main object of the invention, namely for a planographic printing plate for scanning exposure, the coating amount in terms of the mass after drying may be appropriately from 0.1 $g/m^2$ to 10 $g/m^2$, more preferably from 0.5 $g/m^2$ to 5 $g/m^2$.

Support

In the planographic printing plate precursor of the invention, the support preferably has a hydrophilic surface. The hydrophilic support may be selected from known conventional hydrophilic supports used for planographic printing plates, without particular limitations.

The support is preferably a dimensionally stable plate-shaped material, examples of which include paper, paper laminated with plastic (such as polyethylene, polypropylene, or polystyrene), a metal plate (such as of an aluminum, zinc or copper plate), a plastic film (such as a film of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), and paper or a plastic film on which metal such as those listed above is laminated or vapor-deposited. If necessary, the surface of these materials may be subjected to an appropriate known physical and/or chemical treatment for the purpose of imparting hydrophilicity, improving strength or the like.

Paper, a polyester film or an aluminum plate is preferred as the support. The aluminum plate is particularly preferred, because it has excellent dimensional stability, is relatively inexpensive and can provide a highly hydrophilic or strong surface by being subjected to surface treatment that may be conducted as necessary. A composite sheet comprising a polyethylene terephthalate film and an aluminum sheet bonded thereto as described in JP-B No. 48-18327 is also preferable.

Preferred examples of the aluminum plate include a pure aluminum plate and a plate of an aluminum alloy comprising aluminum as the main component and a small amount of other elements. A plastic film on which aluminum is laminated or vapor-deposited may also be used. Examples of such other elements to be contained in aluminum alloys include silicon, iron, manganese, copper, magnesium, chromium, zinc, bismuth, nickel, and titanium. The content of foreign elements in the alloy is at most 10% by mass or less. In the invention, pure aluminum is particularly preferred. However, it is difficult to produce completely pure aluminum in terms of refinement technology, and therefore, trace amounts of other elements may be contained. The aluminum plate for use in the invention is not limited to have a particular composition, and may be appropriately selected from aluminum plates of any known conventional material. The aluminum plate for use in the invention preferably may have a thickness of about 0.1 mm to about 0.6 mm, preferably of 0.15 mm to 0.4 mm, particularly preferably of 0.2 mm to 0.3 mm.

When the support has a metallic surface, specifically an aluminum surface, it preferably has undergone surface treatment such as surface roughening (graining), immersion into an aqueous solution of sodium silicate, potassium fluorozirconate, phosphate, or the like, or anodic oxidation.

Surface roughening of the aluminum plate may be performed by various methods such as methods of mechanically roughening the surface, methods of electrochemically dissolving and roughening the surface, and methods of chemically and selectively dissolving the surface. The mechanical roughening may be a known mechanical method such as ball polishing, brush polishing, blast polishing, and buff polishing. Electrochemical surface roughening methods may be performed in an electrolytic solution of hydrochloric acid, nitric acid or the like under alternating or direct current. A combination of both methods may also be used in combination as disclose in JP-A No.54-63902. Prior to roughening of the surface of the aluminum plate, if necessary, degreasing with a surfactant, an organic solvent or an aqueous alkaline solution may be performed to remove rolling oil from the surface.

An aluminum plate that has undergone immersion in an aqueous sodium silicate solution after surface roughening is preferably used. An aluminum plate that has undergone the processes of anodic oxidation of the aluminum plate and immersion in an aqueous alkali metal silicate solution as described in JP-B No. 47-5125 may also preferably be used. For example, the anodic oxidation may be performed by allowing a current to flow through the aluminum plate serving as an anode in an electrolyte solution containing one or more of aqueous or nonaqueous solutions of inorganic acids such as phosphoric acid, chromic acid, sulfuric acid, and boric acid, organic acids such as oxalic acid and sulfamic acid, or salts thereof.

The silicate electrodeposition described in U.S. Pat. No. 3,658,662 is also effective.

The surface treatment disclosed in JP-B No. 46-27481 and JP-A Nos. 52-58602 and 52-30503 is also useful which uses an electrolytically grained support in combination with the anodic oxidation and sodium silicate treatment.

In a preferred treatment, mechanical surface roughening, chemical etching, electrolytic graining, anodic oxidation, and sodium silicate treatment are sequentially performed as described in JP-A No. 56-28893.

After these treatments, undercoating may be preferably performed. The undercoating may include a water-soluble resin such as polyvinyl phosphonic acid, a polymer or copolymer having a sulfonic acid group in a side chain, or polyacrylic acid; a water-soluble metal salt (such as zinc borate); a yellow dye; or an amine salt.

A sol-gel-treated substrate is also preferably used in which a functional group capable of undergoing a radical addition reaction is covalently bonded as disclosed in JP-A No. 07-154983.

In another preferred example, a water-resistant hydrophilic layer may be formed as a surface layer on an arbitrary support. Examples of such a surface layer include a layer comprising an inorganic pigment and a binding agent as described in U.S. Pat. No. 3,055,295 and JP-A No. 56-13168, a hydrophilic swelling layer as described in JP-A No. 09-80744, and a sol-gel film of titanium oxide, polyvinyl alcohol or silicates as described in Japanese Patent Application National Publication (Laid-Open) No. 08-507727.

These hydrophilizing treatments may be performed not only to hydrophilize the surface of the support but also to prevent an undesirable reaction of the photopolymerizable composition to be provided thereon and to improve adhesion of the photosensitive layer.

Protective Layer

The planographic printing plate precursor of the invention preferably further includes a protective layer on the photosensitive layer. The protective layer can prevent low-molecular compounds such as basic substances or oxygen in the air, which inhibits image-forming reaction in the photosensitive layer caused by exposure to light, from entering the photosensitive layer, and enables exposure in the air. Therefore, the protective layer preferably has such characteristics that the protective layer is less permeable to low-molecular compounds such oxygen, does not substantially inhibit transmission of light for exposure, is excellent in adhesion property to the photosensitive layer, and is easily removable by a development process after exposure.

Improvements of the protective layer have been made as described in detail in U.S. Pat. No. 3,458,311 and JP-A No.55-49729. For example, water-soluble polymer compounds having relatively high crystallinity may be preferably used for the protective layer. Examples of such materials include water-soluble polymers such as polyvinyl alcohol, polyvinylpyrrolidone, acidic celluloses, gelatin, gum arabic, and polyacrylic acid. In particular, the best result in terms of basic characteristics such as oxygen barrier characteristics and removability by development can be obtained using polyvinyl alcohol as a main component.

Polyvinyl alcohol for use in the protective layer may be partially substituted by at least one of an ester, an ether and an acetal, as long as it has an unsubstituted vinyl alcohol unit for imparting necessary oxygen barrier characteristics and water solubility. The polyvinyl alcohol may partially have at least one other copolymerization component. Specifically, the polyvinyl alcohol may be hydrolyzed to a degree of 71 to 100 mol % and may have a mass average molecular weight in the range of 300 to 2400. Examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 manufactured by Kuraray Co., Ltd.

The components (choice of PVAs, use of additives and the like), the coating amount and the like of the protective layer may be selected in consideration of on oxygen barrier characteristics, removability by development, fogging, adhesion property, or scratch resistance. In general, a higher rate of hydrolysis of the PVA to be used (a higher content of unsubstituted vinyl alcohol units in the protective layer) or a larger thickness of the film leads to a higher level of oxygen barrier characteristics, which is advantageous in terms of sensitivity. When oxygen barrier characteristics are increased excessively, problems may occur such as unnecessary polymerization reactions during manufacture or storage and unnecessary fogging or thickening of image lines during imagewise exposure. The adhesion to the image portion and the scratch resistance are also very important for the handleability of the printing plate. Methods for applying the protective layer are described in detail in, for example, U.S. Pat. No. 3,458,313 and JP-A No. 55-49729.

The protective layer may also have another function. For example, a colorant (such as a water-soluble dye) capable of efficiently transmitting light in the range of 350 nm to 450 nm to be used for exposure and efficiently absorbing light at 500 nm or more may be added to the protective layer so that safe light suitability can be further improved without a reduction in sensitivity.

Other Layers

Other layers such as layers for improving adhesion between the photosensitive layer and the support and layers for improving the removability of the unexposed photosensitive layer by development may also be provided. For example, the adhesion or the printing durability may be improved by adding a diazonium structure-containing compound or a compound capable of relatively strongly interacting with the substrate, such as phosphonic compounds or by providing an undercoat layer of such a compound. On the other hand, the developability of the non-image portion or the antifouling properties may be improved by adding a hydrophilic polymer such as polyacrylic acid or polysulfonic acid or by providing an undercoat layer of such a polymer.

Plate Making

In general, the planographic printing plate precursor is imagewise exposed to light and then the unexposed portion is removed by using a liquid developer to form an image.

Any known light exposure method may be applied to the planographic printing plate precursor of the invention, without limitations. The wavelength of the light source is preferably from 350 nm to 450 nm, and specifically InGaN semiconductor lasers are preferred. The exposure mechanism may be of any system such as an internal drum system, an external drum system or a flathead system. A highly water-soluble component may be used for the photosensitive layer so that the layer can dissolved in neutral water or weakly alkaline water. The planographic printing plate having such a constitution may be subjected to on-press exposure and development after mounted on a printing machine.

Available laser light sources in the range of 350 nm to 450 nm include the lasers described below.

Gas lasers include Ar ion lasers (364 nm, 351 nm, 10 mW to 1 W), Kr ion lasers (356 nm, 351 nm, 10 mW to 1 W) and He—Cd lasers (441 nm, 325 nm, 1 to 100 mW); Solid-state lasers include a combination of Nd:YAG ($YVO_4$) and SHG crystal (twice) (355 nm, 5 mW to 1 W) and a combination of Cr:LiSAF and SHG crystal (430 nm, 10 mW); Semiconductor lasers include $KNbO_3$ ring resonators (430 nm, 30 mW), a combination of a waveguide type wavelength converting device and an AlGaAs or InGaAs semiconductor (380 to 450 nm, 5 to 100 mW), a combination of a waveguide type wavelength converting device and an AlGaInP or AlGaAs semiconductor (300 to 350 nm, 5 to 100 mW), and AlGaInN lasers (350 to 450 nm, 5 to 30 mW); Other lasers include pulsed lasers such as $N_2$ lasers (337 nm, 0.1 to 10 mJ pulse) and XeF lasers (351 nm, 10 to 250 mJ pulse).

Above all, AlGaInN semiconductor lasers (commercially available InGaN semiconductor lasers (400 to 410 nm, 5 to 30 mW) are particularly preferred in view of wavelength characteristics and cost.

For scanning exposure type planographic printing plate exposure systems, internal drum, external drum, or flathead systems may be used as exposure mechanisms, and all of the light sources describe above, except for pulsed lasers, may be used as light sources. Practically, the exposure systems described below are particularly preferred in view of the relationship between the sensitivity of the material and plate making time.

A single-beam exposure system of an internal drum system using a single gas or solid-state laser source;

A multi-beam exposure system of a flathead system using a number of (ten or more) semiconductor lasers; and A multi-beam exposure system of an external drum system using a number of (ten or more) semiconductor lasers.

For laser direct drawing type planographic printing plates as described above, the equation (eq1): $X \cdot S = n \cdot q \cdot t$ is generally established, wherein $X(J/cm^2)$ is the sensitivity of the photosensitive material, $S(cm^2)$ is the exposed area of the photosensitive material, q(W) is the power of one laser light source, n is the number of the laser light sources, and t(s) is the total exposure time.

In the case of (i) the internal drum system (single beam), the equation (eq2): $f \cdot Z \cdot t = Lx$ is generally established, wherein f(radian/s) is the rotational frequency of the laser, Lx(cm) is the sub-scanning length of the photosensitive material, Z(dots/cm) is the resolution, and t(s) is the total exposure time.

In the case of (ii) the external drum system (multi-beam), the equation (eq3): $F \cdot Z \cdot n \cdot t = Lx$ is generally established, wherein F (radian/s) is the rotational frequency of the drum, Lx(cm) is the sub-scanning length of the photosensitive material, Z(dots/cm) is the resolution, t(s) is the total exposure time, and n is the number of the beams.

In the case of (iii) the flathead system (multi-beam), the equation (eq4): $H \cdot Z \cdot n \cdot t = Lx$ is generally established, wherein H(radian/s) is the rotational frequency of the polygon mirror, Lx(cm) is the sub-scanning length of the photosensitive material, Z(dots/cm) is the resolution, t(s) is the total exposure time, and n is the number of the beams.

Substitution of the resolution (2560 dpi) required of a practical printing plate, the size of the plate (A1/B1, 42 inches in sub-scanning length), the exposure condition of about 20 sheets per hour, and the photosensitive characteristics of the photopolymerizable composition of the invention (the photosensitive wavelength, and a sensitivity of about 0.1 $mJ/cm^2$) into the equations suggests that the photosensitive material of the invention should preferably be used in combination with a semiconductor laser of a multi-beam exposure type. Also taking handleability and cost into account, it is suggested that the photosensitive material of the invention is most preferably used in combination with a semiconductor laser, multi-beam exposure system of an external drum system.

Other examples of light sources that may be used for exposure include any of ultra-high pressure, high pressure, medium pressure, and low pressure mercury lamps, chemical lamps, carbon arc lamps, xenon lamps, metal halide lamps, a variety of visible and ultraviolet laser lamps, fluorescent lamps, tungsten lamps, and sunlight.

Liquid developers suitable for the planographic printing plate precursor of the invention include the developers described in JP-B No. 57-7427. Appropriate developers include aqueous solutions of inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and ammonia water, and aqueous solutions of organic alkaline agents such as monoethanolamine and diethanolamine. The alkaline agent may be added such that the alkaline solution may have a concentration of 0.1 to 10% by mass, preferably of 0.5 to 5% by mass.

If necessary, the alkaline aqueous solution may contain a small amount of a surfactant or an organic solvent such as benzyl alcohol, 2-phenoxyethanol, or 2-butoxyethanol. Examples of such additives include those described in U.S. Pat. Nos. 3,375,171 and 3,615,480.

The liquid developers described in JP-A Nos. 50-26601 and 58-54341 and JP-B Nos. 56-39464 and 56-42860 are also excellent.

The liquid developer described in JP-A No. 2002-202616 is particularly preferred which contains a nonionic compound represented by Formula (VIII) and has a pH of 11.5 to 12.8 and a conductivity of 3 to 30 mS/cm.

A–W    Formula (VIII)

In Formula (VIII), A represents such a hydrophobic organic group that A–H has a log P of 1.5 or more, and W represents such a nonionic hydrophilic organic group that W–H has a log P of less than 1.0.

The components of the liquid developer are described in detail in Paragraphs [0024] to [0067] of JP-A No. 2002-202616.

It is effective to add the nonionic compound represented by Formula (VIII) such that its concentration in the liquid developer becomes 0.1 to 15% by mass, preferably of 1.0 to 8.0% by mass.

If necessary, the process of making a printing plate from the planographic printing plate precursor may further include heating the whole surface before or during exposure or between exposure and development. Such heating can facilitate the image forming reaction in the photosensitive layer so that advantages such as an increase in sensitivity or printing durability and stabilization of sensitivity can be achieved. In addition, whole surface exposure or whole surface post heating may be effectively performed on the image after the development in order to improve the strength or printing durability of the image. In general, heating before the development is preferably performed under mild conditions at 150° C. or lower. At 150° C. or lower, the non-image portion can be free of the problem of fogging. Very strong conditions should be used for heating after the development. Such conditions are generally in the range of 200 to 500° C. At 200° C. or higher, the image strengthening effect can be sufficiently obtained. At 500° C. or lower, problems such as deterioration of the support and thermal decomposition of the image portion do not occur.

EXAMPLES

The present invention is more specifically described using examples below. However, the present invention is not limited to the examples. Many alternatives, variations and modifications are possible without departing from the gist of the invention.

Tables 1 and 2 below show details of the specific oxime compounds (Compounds 1 to 8) and the compounds for comparison (Comparative Compounds 1 to 3) used in the examples and the comparative examples.

TABLE 1

| Compound No. | Structure and Molar Absorption Coefficient |
|---|---|
| Compound 1 | 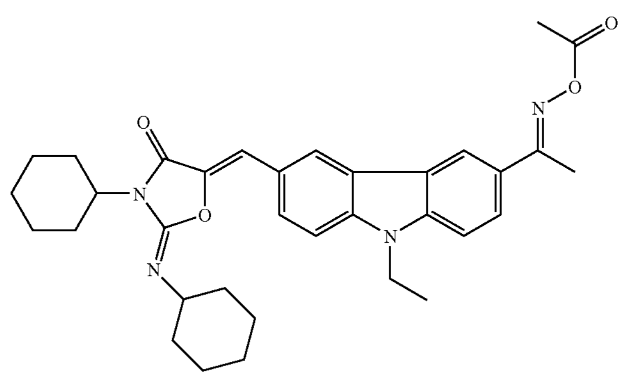 with a molar absorption coefficient of 20,000 or more at 365 nm |

TABLE 1-continued

| Compound No. | Structure and Molar Absorption Coefficient |
| --- | --- |
| Compound 2 | 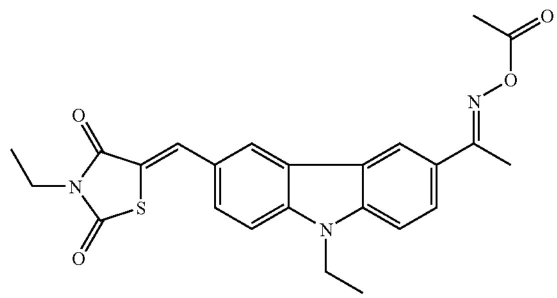 with a molar absorption coefficient of 20,000 or more at 405 nm |
| Compound 3 | 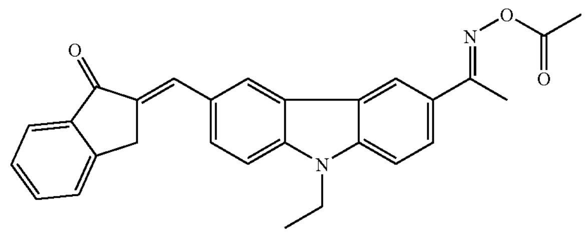 with a molar absorption coefficient of 20,000 or more at 405 nm |
| Compound 4 | 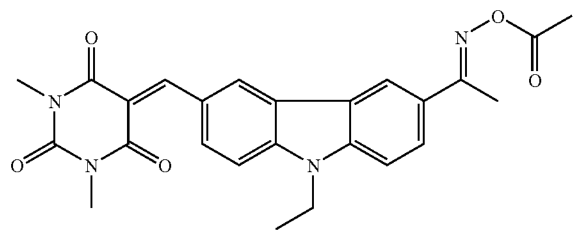 with a molar absorption coefficient of 20,000 or more at 405 nm |
| Compound 5 | 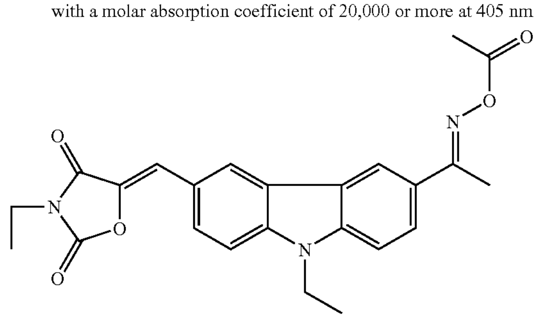 with a molar absorption coefficient of 20,000 or more at 365 nm |

TABLE 2

| Compound No. | Structure and Molar Absorption Coefficient |
| --- | --- |
| Compound 6 | 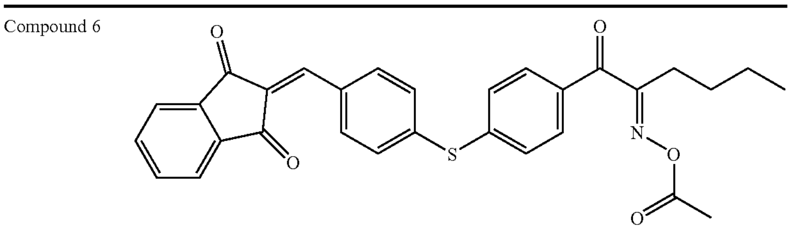 with a molar absorption coefficient of 20,000 or more at 405 nm |

TABLE 2-continued

| Compound No. | Structure and Molar Absorption Coefficient |
|---|---|
| Compound 7 | 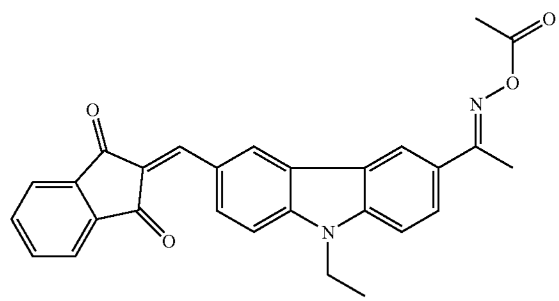 with a molar absorption coefficient of 20,000 or more at 405 nm |
| Compound 8 | 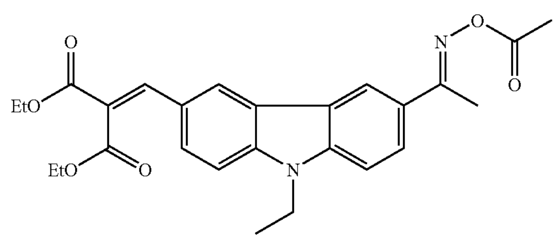 with a molar absorption coefficient of 20,000 or more at 405 nm |
| Comparative Compound 1 | IRGACURE OXE01 (manufactured by Ciba Specialty Chemicals Inc.) with a molar absorption coefficient of 5,226 at 365 nm and a molar absorption coefficient of 1,855 at 405 nm |
| Comparative Compound 2 | IRGACURE OXE02 (manufactured by Ciba Specialty Chemicals Inc.) with a molar absorption coefficient of 2,410 at 365 nm and a molar absorption coefficient of 0 at 405 nm |
| Comparative Compound 3 | IRGACURE 369 (manufactured by Ciba Specialty Chemicals Inc.) with a molar absorption coefficient of 982 at 365 nm and a molar absorption coefficient of 0 at 405 nm |

Synthesis Example 1

Synthesis of Compound 1 Corresponding to the Specific Oxime Compound

N-hydroxyoxime (10.00 g, 19.0 mmol) having the structure shown below and triethylamine (2.31 g, 22.8 mmol) were dissolved in 200 ml of THF and cooled to 0° C. Acetyl chloride (1.79 g, 22.8 mmol) was then added dropwise thereto. After the mixture was stirred at room temperature for 1 hour, 100 ml of distilled water was added thereto, and the organic layer was extracted with ethyl acetate. After the solvent was removed by distillation under reduced pressure, the resulting residue was purified by silica gel chromatography (ethyl acetate/hexane=1/4) to give Compound 1 having the structure shown below (9.5 g, 88% yield).

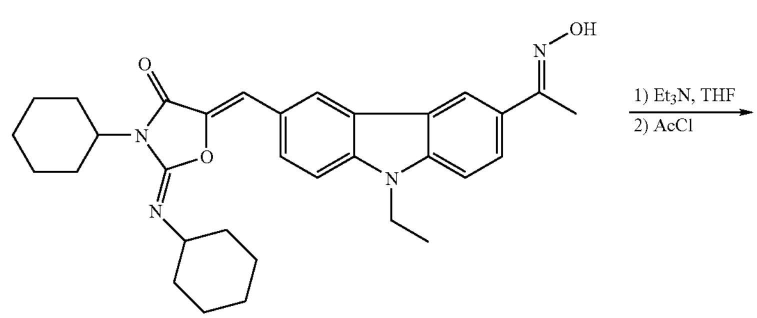

-continued

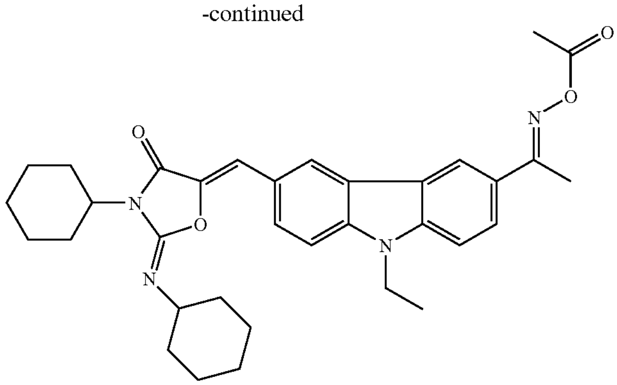

Compound 1

The molar absorption coefficient of the resulting Compound 1 at 365 nm was measured in an ethyl acetate solution at a concentration of 0.01 g/L with an ultraviolet-visible spectrophotometer (trade name: CARRY-5 Spectrophotometer, manufactured by Varian), and found to be 29,059.

The structure of the resulting Compound 1 was identified by NMR. $^{1}$H-NMR, 400 MHz, $CDCl_3$: 8.54 (s, 1H), 8.41 (s, 1H), 8.04 (d, 1H, J=8.0 Hz), 7.79 (d, 1H, J=8.0 Hz), 7.45 (d, 1H, J=9.6 Hz), 7.43 (d, 1H, 9.6 Hz), 6.68 (s, 1H), 4.41 (q, 2H, J=7.2 Hz), 4.14-4.04 (m, 1H), 3.94-3.87 (m, 1H), 2.53 (s, 3H), 2.31 (s, 3H), 1.95-1.24 (m, 23H).

The UV absorption spectrum of the resulting Compound 1 (0.01 g/L, in ethyl acetate) is also shown in FIG. 1.

Synthesis Example 2

Synthesis of Compound 7 Corresponding to the Specific

Oxime Compound

N-hydroxyoxime (10.00 g, 22.9 mmol) having the structure shown below and triethylamine (2.78 g, 27.5 mmol) were dissolved in 200 ml of THF and cooled to 0° C. Acetyl chloride (2.16 g, 27.5 mmol) was then added dropwise thereto. After the mixture was stirred at room temperature for 1 hour, 100 ml of distilled water was added thereto, and the organic layer was extracted with ethyl acetate. After the solvent was removed by distillation under reduced pressure, the precipitated crystal was recrystallized with methanol to give Compound 7 having the structure shown below (9.2 g, 84% yield).

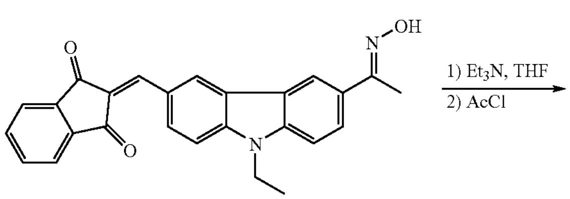

-continued

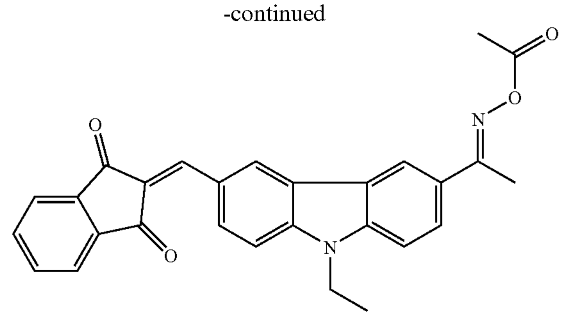

Compound 7

The molar absorption coefficient of the resulting Compound 7 at 405 nm was measured in an ethyl acetate solution at a concentration of 0.01 g/L with an ultraviolet-visible spectrophotometer (trade name: Carry-5 Spectrophotometer, manufactured by Varian), and found to be 21,380.

The structure of the resulting Compound 7 was identified by NMR. $^{1}$H-NMR, 400 MHz, $CDCl_3$: 9.47 (s, 1H), 8.73 (d, 1H, J=12.0 Hz), 8.55 (s, 1H), 8.13 (s, 1H), 8.07-8.02 (m, 3H), 7.82-7.79 (m, 2H), 7.52 (d, 1H, J=8.8 Hz), 7.46 (d, 1H, J=8.8 Hz), 4.44 (q, 2H, J=7.2 Hz), 2.58 (s, 3H), 2.33 (s, 3H), 1.50 (t, 3H, J=7.2 Hz).

Figure 2:
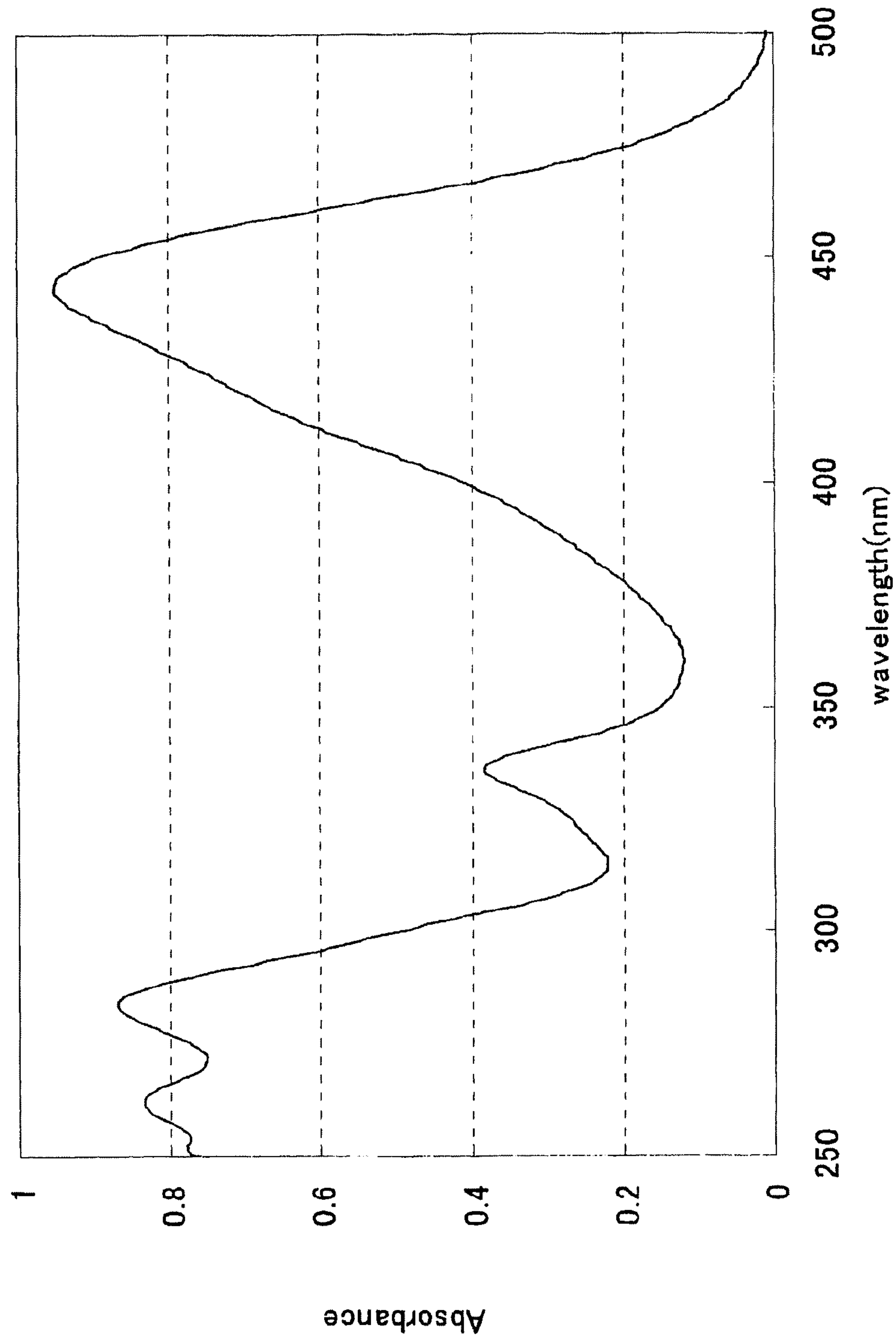
FIG. 2 is the UV absorption spectrum of Compound 7, which is a specific oxime compound according to the invention.

The UV absorption spectrum of the resulting Compound 7 (0.01 g/L in ethyl acetate) is also shown in FIG. 2.

Compounds 2, 3, 4, 5, 6, and 8 shown in Table 1 and 2 and each corresponding to the specific oxime compound were synthesized using a process similar to that used in Synthesis Example 1 or 2.

Comparative Compounds 1 to 3 shown in Table 2 have the structures shown below.

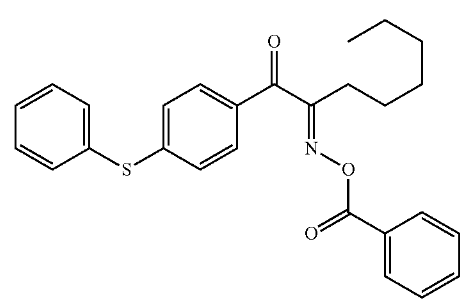

IRGACURE OXE 01

-continued

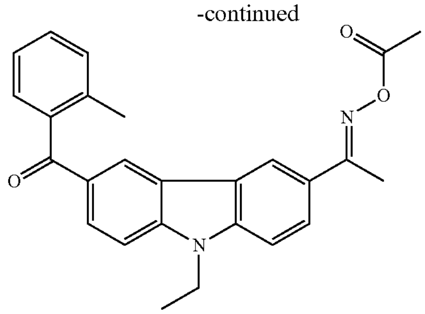

IRGACURE OXE 02

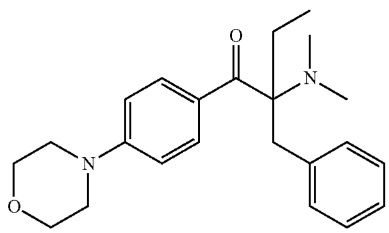

IRGACURE 369

Example 1-1

<Preparation and Evaluation of Photosensitive Composition 1>

Photosensitive Composition 1 was prepared as described below, and its sensitivity was evaluated.

A uniform composition was prepared that contained 0.08 mmol of Compound 1 as the specific oxime compound, 1 g of pentaerythritol tetraacrylate as a radical-polymerizable compound, 1 g of polymethyl methacrylate (c.a. 996,000 in molecular weight, manufactured by Aldrich) as a binder resin, and 16 g of cyclohexanone as a solvent. The resulting composition was used as a coating liquid, applied to a glass plate with a spin coater and dried at 40° C. for 10 minutes to form a 1.5 μm-thick coating film. A 21 √2 step tablet (a gray scale film manufactured by Dainippon Screen Mfg. Co., Ltd.) was placed on the coating film. The coating film was exposed to light from a 500 mW high-pressure mercury lamp (manufactured by Ushio Inc.) through a heat-ray-cutting filter for 30 seconds and then immersed in toluene for 60 seconds so as to be developed. According to the step tablet, the step number where the film was completely cured and insolubilized was evaluated as the sensitivity. As a result, the sensitivity was step No. 8.

The larger the step number, the higher the sensitivity.

Examples 1-2 to 1-8 and Comparative Examples 1-1 to 1-3

Photosensitive Compositions 2 to 8 were each prepared using the same process as in Example 1-1, except that 0.08 mmol of each of Compounds 2 to 8 shown in Table 1 was used in place of 0.08 mmol of Compound 1 used as the specific oxime compound, and the step number for the sensitivity was evaluated in the same way as in Example 1-1.

The results of the evaluation of Examples 1-1 to 1-8 and Comparative Examples 1-1 to 1-3 are shown in Table 3 below.

TABLE 3

| | Specific Oxime Compound or Comparative Compound | Sensitivity Step Number |
|---|---|---|
| Example 1-1 | Compound 1 | 8 |
| Example 1-2 | Compound 2 | 8 |
| Example 1-3 | Compound 3 | 8 |
| Example 1-4 | Compound 4 | 8 |
| Example 1-5 | Compound 5 | 8 |
| Example 1-6 | Compound 6 | 7 |
| Example 1-7 | Compound 7 | 7 |
| Example 1-8 | Compound 8 | 6 |
| Comparative Example 1-1 | Comparative Compound 1 | 5 |
| Comparative Example 1-2 | Comparative Compound 2 | 5 |
| Comparative Example 1-3 | Comparative Compound 3 | 4 |

Example 2-1

1. Preparation of Colored Curable Composition A-1

A negative colored curable composition (A-1) containing a colorant (pigment) was prepared as a curable composition for use in forming color filters. A color filter was prepared using the colored curable composition.

1-1. Preparation of Pigment Dispersion Liquid (P1)

A liquid mixture composed of 40 parts by mass of a pigment mixture of C.I. Pigment Green 36 and C.I. Pigment Yellow 219 (30/70 in mass ratio), 10 parts by mass (4.51 parts by mass in terms of solid content) of BYK 2001 (DISPERBYK, manufactured by BYK-Chemie, 45.1% by mass in solids content) as a dispersing agent, and 150 parts by mass of ethyl 3-ethoxypropionate as a solvent was mixed and dispersed in a bead mill for 15 hours so that a pigment dispersion liquid (P1) was prepared.

The average particle size of the pigment in the resulting pigment dispersion liquid (P1) was measured to be 200 nm by dynamic light scattering.

1-2. Preparation of Colored Curable Composition A-1 (Coating Liquid)

The components for Composition A-1 shown below were mixed and dissolved to form a colored curable composition A-1.

| <Composition A-1> | |
|---|---|
| Pigment Dispersion Liquid (P1) | 600 parts by mass |
| Alkali-soluble resin (benzyl methacrylate/methacrylic acid/hydroxyethyl methacrylate (80/10/10 in molar ratio) copolymer (Mw: 10,000) | 200 parts by mass |
| Polyfunctional monomer dipentaerythritol hexaacrylate | 60 parts by mass |
| Specific oxime compound: Compound 1 | 60 parts by mass |
| Solvent: propylene glycol monomethyl ether acetate | 1,000 parts by mass |
| Surfactant (trade name: TETRANIC 150R1, BASF) | 1 part by mass |
| γ-methacryloxypropyltriethoxysilane | 5 parts by mass |

2. Preparation of Color Filter 2-1. Formation of Curable Composition Layer

The resulting pigment-containing colored curable composition A-1 was used as a resist solution. The resist solution was applied to a glass substrate of 550 mm×650 mm by slit coating under the conditions described below and then allowed to stand for 10 minutes. The solution was then dried under vacuum and pre-baked (100° C. for 80 seconds) to form a curable composition coating film (curable composition layer).

(Slit Coating Conditions)

Opening gap of the top of the coating head: 50 μm

Coating speed: 100 mm/second

Clearance between the substrate and the coating head: 150 μm

Coating thickness (dry thickness): 2 μm

Coating temperature: 23° C.

2-2. Exposure and Development

The curable composition layer was then patternwise exposed to light from a 2.5 kW ultra-high pressure mercury lamp. After the exposure to light, the entire surface of the exposed composition layer was covered with an aqueous 10% solution of a liquid organic developer (trade name: CD, manufactured by Fuji Film Electronics Materials Co., Ltd.) and allowed to stand for 60 seconds.

2-3. Heat Treatment

A shower of pure water was then sprayed on the composition layer so that the liquid developer was washed away. The composition was then heated in an oven at 220° C. for 1 hour (post-baking) so that a color filter having a colored pattern on the glass substrate was obtained.

3. Performance Evaluation

Evaluations were performed as described below with respect to the storage stability and exposure sensitivity of the colored curable composition, the developability of a colored patterned product formed on a glass substrate by using the colored curable composition, the adhesion of the colored patterned product to the substrate, and the cross-sectional shape of the patterned product. A summary of the evaluation results is shown in Table 4.

3-1. Storage Stability of Colored Curable Composition

After the colored curable composition was stored at room temperature for one month, the degree of precipitation of matters was visually evaluated according to the following criteria:

A: No precipitation was observed;

B: Precipitation was slightly observed;

C: Precipitation was observed.

3-2. Exposure Sensitivity of Colored Curable Composition

The colored curable composition was applied to a glass substrate by spin coating and then dried to form a coating film with a thickness of 1.0 μm. Spin coating conditions were 300 rpm for 5 seconds and then 800 rpm for 20 seconds. Drying conditions were 100° C. for 80 seconds. The resulting coating film was then exposed to light through a test photomask with a line width of 2.0 μm at different exposure amounts in the range of 10 mJ/cm$^2$ to 1,600 mJ/cm$^2$ using a proximity-type exposure system equipped with a ultra-high pressure mercury lamp (manufactured by Hitachi High-Tech Electronics Engineering Co., Ltd.). The exposed coating film was then developed with a liquid developer 60% CD-2000 (mamifactured by Fuji Film Electronics Materials Co., Ltd.) at 25° C. for 60 seconds. Thereafter, the film was rinsed with running water for 20 seconds and then spray-dried so that the patterning was completed.

Regarding the evaluation of exposure sensitivity, the minimum exposure amount at which the post-development thickness of the region that was irradiated with light in the exposure step became 95% or more of the thickness (100%) of the film before the exposure was evaluated as the exposure requirement amount. A smaller exposure requirement amount indicates a higher sensitivity.

3-3. Developability, Cross-Sectional Shape of Pattern, Adhesion to Substrate

After the post-baking described in the section 2-3 "Heat Treatment", the surface and the cross-sectional shape of the substrate were observed by common methods with an optical microscope and SEM photographs, so as to evaluate the developability, the adhesion to the substrate and the cross-sectional shape of the pattern. Details of the evaluation method are as described below.

<Developability>

The presence or absence of residues in the region (unexposed portion) which was not irradiated with light in the exposure step was observed, so as to evaluate the developability. The evaluation was preformed according to the following criteria:

A: No residue was observed in the unexposed portion;

B: Residues were slightly observed in the unexposed portion, but the residue level was practically acceptable;

C: Residues were significantly observed in the unexposed portion.

Adhesion to Substrate

The presence or absence of pattern defects was observed, and the adhesion to the substrate was evaluated according to the following criteria:

A: No pattern defect was observed;

B: Pattern defects were hardly observed but observed in part;

C: Many pattern defects were significantly observed.

<Cross-Sectional Shape of Pattern>

The cross-sectional shape of the pattern was observed and evaluated. The cross-sectional shape of the pattern is preferably rectangular, most preferably forward-tapered. The inversely-tapered shape is not preferred. The results are shown in Table 4.

Examples 2-2 to 2-15 and Comparative Examples 2-1 to 2-3

Colored curable compositions A-2 to A-15 and A'-1 to A'-3 and color filters were prepared in the same manner as in Example 2-1, except that the respective compounds in the amounts shown in Table 4 below were used in place of 60 parts by mass of Compound 1 (the specific oxime compound) of the composition A-1 used in the preparation of the colored curable composition A-1 and that a sensitizer and/or a co-sensitizer of the type and in the amount shown in Table 4 was further added in each of Examples 2-9 to 2-15. Evaluations were also performed in the same way as in Example 2-1. The results are shown in Table 4.

TABLE 4

| | | Specific Oxime Compound or Comparative Compound | | Sensitizer | | Co-Sensitizer | | | Exposure | | | |
|---|---|---|---|---|---|---|---|---|---|---|---|---|
| | Composition | Type | Amount (parts by mass) | Type | Amount (parts by mass) | Type | Amount (parts by mass) | Storage Stability | requirement amount (mJ/cm$^2$) | Developability | Adhesion to Substrate | Cross-Sectional Shape of Pattern |
| Ex. 2-1 | A-1 | Compound 1 | 60 | — | — | — | — | A | 100 | A | A | Forward Tapered |
| Ex. 2-2 | A-2 | Compound 2 | 60 | — | — | — | — | A | 100 | A | A | Forward Tapered |
| Ex. 2-3 | A-3 | Compound 3 | 60 | — | — | — | — | A | 110 | A | A | Rectangular |
| Ex. 2-4 | A-4 | Compound 4 | 60 | — | — | — | — | A | 100 | A | A | Forward Tapered |
| Ex. 2-5 | A-5 | Compound 5 | 60 | — | — | — | — | A | 100 | A | A | Forward Tapered |
| Ex. 2-6 | A-6 | Compound 6 | 60 | — | — | — | — | A | 120 | A | A | Rectangular |
| Ex. 2-7 | A-7 | Compound 7 | 60 | — | — | — | — | A | 120 | A | A | Rectangular |

TABLE 4-continued

| | Com-po-sition | Specific Oxime Compound or Comparative Compound Type | Amount (parts by mass) | Sensitizer Type | Amount (parts by mass) | Co-Sensitizer Type | Amount (parts by mass) | Storage Stability | Exposure requirement amount (mJ/cm$^2$) | Develop-ability | Adhesion to Substrate | Cross-Sectional Shape of Pattern |
|---|---|---|---|---|---|---|---|---|---|---|---|---|
| Ex. 2-8 | A-8 | Compound 8 | 60 | — | — | — | — | A | 130 | A | A | Rectangular |
| Ex. 2-9 | A-9 | Compound 1 | 30 | A1 | 30 | — | — | A | 90 | A | A | Forward Tapered |
| Ex. 2-10 | A-10 | Compound 1 | 30 | A2 | 30 | — | — | A | 90 | A | A | Forward Tapered |
| Ex. 2-11 | A-11 | Compound 1 | 30 | A3 | 30 | — | — | A | 80 | A | A | Forward Tapered |
| Ex. 2-12 | A-12 | Compound 1 | 30 | — | — | F1 | 30 | A | 90 | A | A | Forward Tapered |
| Ex. 2-13 | A-13 | Compound 1 | 20 | A2 | 20 | F1 | 20 | A | 80 | A | A | Forward Tapered |
| Ex. 2-14 | A-14 | Compound 1 | 20 | A2 | 20 | F2 | 20 | A | 80 | A | A | Forward Tapered |
| Ex. 2-15 | A-15 | Compound 1 | 20 | A2 | 20 | F3 | 20 | A | 70 | A | A | Forward Tapered |
| Comp. Ex. 2-1 | A'-1 | Comparative compound 1 | 60 | — | — | — | — | A | 150 | A | A | Rectangular |
| Comp. Ex. 2-2 | A'-2 | Comparative compound 2 | 60 | — | — | — | — | A | 140 | A | A | Rectangular |
| Comp. Ex. 2-3 | A'-3 | Comparative compound 3 | 60 | — | — | — | — | A | 200 | A | B | Inversely Tapered |

Sensitizers A1 to A3 and Co-Sensitizers F1 to F3 shown in Table 4 are the following compounds:

A1: 4,4-bisdiethylaminobenzophenone

A2: diethylthioxanthone

A3:

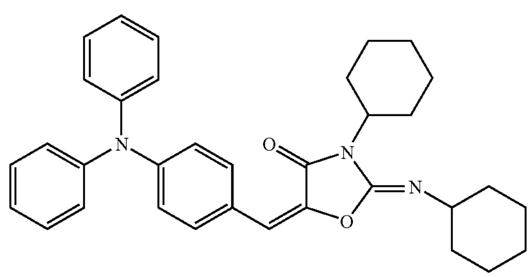

F1: 2-mercaptobenzimidazole

F2: 2-mercaptobenzothiazole

F3: N-phenyl-2-mercaptobenzimidazole

The results of Table 4 indicate that the colored curable composition of each Example containing the specific oxime compound (each of Compounds 1 to 8) has high storage stability (stability over time). It is also apparent that these colored curable compositions have high sensitivity at exposure, show high developability in the process of forming colored patterns for a color filter, and form a colored pattern with excellent adhesion to the substrate and with an excellent cross-sectional shape.

Example 3-1

1. Preparation of Resist Liquid

The components for the composition described below were mixed and dissolved to form a resist liquid.

| Composition of Resist Liquid | |
|---|---|
| Propylene glycol monomethyl ether acetate (PGMEA) | 19.20 parts by mass |
| Ethyl lactate | 36.67 parts by mass |
| Resin (a 40% PGMEA solution of a benzyl methacrylate/methacrylic acid/2-hydroxyethyl methacrylate (60/22/18 in molar ratio) copolymer | 30.51 parts by mass |
| Dipentaerythritol hexaacrylate (polymerizable compound) | 12.20 parts by mass |
| Polymerization inhibitor (p-methoxyphenol) | 0.0061 parts by mass |
| Fluorosurfactant (F-475, manufactured by Dainippon Ink and Chemicals, Incorporated) | 0.83 parts by mass |
| Photopolymerization initiator (TAZ-107 (a trihalomethyltriazine-based photopolymerization initiator), manufactured by Midori Kagaku Co., Ltd.) | 0.586 parts by mass |

2. Preparation of Silicon Wafer Substrate Having Undercoat Layer

A 6 inch silicon wafer was heated in an oven at 200° C. for 30 minutes. The resist liquid was applied to the silicon wafer so as to provide a dry thickness of 2 μm and then heated and dried in an oven at 220° C. for 1 hour to form an undercoat layer. As a result, an silicon wafer substrate having an undercoat layer was obtained.

3. Preparation of Colored Curable Composition B-1

The compounds for the composition B-1 described below were mixed and dissolved to form a colorant (dye)-containing colored curable composition B-1.

| Composition B-1 | |
|---|---|
| Cyclohexanone | 80 parts by mass |
| Colorant C.I. Acid Blue 108 | 7.5 parts by mass |
| Colorant C.I. Solvent Yellow 162 | 2.5 parts by mass |
| Radical-polymerizable monomer (polymerizable compound) (a mixture of pentaerythritol triacrylate and dipentaerythritol hexaacrylate (3:7)) | 7.0 parts by mass |
| Compound 1 (specific oxime compound) | 2.5 parts by mass |
| Glycerol propoxylate (number average molecular weight Mn: 1,500, molar absorption coefficient ε = 0) | 0.5 parts by mass |

4. Evaluation of Storage Stability of Colored Curable Composition B-1 (Coating Liquid)

After the colored curable composition B-1 was stored at room temperature for 1 month, the degree of precipitation of matters was visually evaluated according to the criteria below. The results are shown in Table 5.

A: No precipitation was observed;
B: Precipitation was slightly observed;
C: Precipitation was observed.

5. Preparation of Color Filter by Using Colored Curable Composition B-1 and Evaluation Thereof The colored curable composition B-1 prepared in the section 3. was applied to the undercoat layer of the silicon wafer substrate having an undercoat layer obtained in the section 2. so that a photosetting coating film was formed. The coating film was then heated (pre-baked) with a hot plate at 100° C. for 120 seconds so as to provide a dry thickness of 0.9 μm.

The film was then exposed to light with a wavelength of 365 nm through a mask having a 2 μm square island pattern at exposure amounts in the range of 10 to 1,600 mJ/cm$^2$ using an i-line stepper exposure system (trade name: FPA-3000i5+, manufactured by Cannon Inc.).

The silicon wafer substrate having the irradiated coating film was then mounted on a horizontal rotary table of a spin-shower developing machine (trade name: Model DW-30, manufactured by Chemitronics Co., Ltd.) and subjected to a paddle development process at 23° C. for 60 seconds with CD-2000 (manufactured by Fuji Film Electronics Materials Co., Ltd.) so that a colored pattern was formed on the silicon wafer substrate).

The silicon wafer substrate having the colored pattern was fixed on the horizontal rotary table by vacuum chucking. The colored pattern was rinsed with a shower of pure water supplied from above the rotation center by using a spray nozzle, while the silicon wafer substrate was rotated at a rotation number of 50 rpm by means of a rotator, and then the colored pattern was spray-dried.

As a result, a color filter comprising the substrate and the colored pattern formed thereon was obtained.

<Exposure Sensitivity and Size of Pattern>

The minimum exposure amount at which the post-development thickness of the region that was irradiated with light in the exposure step became 95% or more of the thickness (100%) of the film before the exposure was evaluated as the exposure requirement amount. A smaller exposure requirement amount indicates a higher sensitivity.

In this process, the size of the colored pattern was measured using a length measuring SEM (trade name: S-9260A, manufactured by Hitachi High-Technologies Corporation). A pattern size that is closer to 2 μm indicates sufficient curing, and higher sensitivity.

The results are shown in Table 5.

Developability, Adhesion to Substrate, and Cross-Sectional Shape of Pattern

Developability, adhesion to the substrate and the cross-sectional shape of the pattern were evaluated according to the methods and the criteria used in Example 2-1. The results are shown in Table 5 below.

Examples 3-2 to 3-9 and Comparative Examples 3-1 to 3-3

Colored curable compositions B-2 to B-9 and B'3-1 to B'3-3 and color filters were prepared in the same manner as in Example 3-1, except that each compound in the amount shown in Table 5 below were used in place of 2.5 parts by mass of Compound 1 (the specific oxime compound) of the composition B-1 used in the preparation of the colored curable composition B-1 and that a sensitizer and a co-sensitizer of the type and in the amount shown in Table 5 were further added in Example 3-9. Evaluations were also performed in the same way as in Example 3-1. The results are shown in Table 5.

TABLE 5

| | | Specific Oxime Compound or Comparative Compound | | Sensitizer | | Co-Sensitizer | | | | | | | |
|---|---|---|---|---|---|---|---|---|---|---|---|---|---|
| | Composition | Type | Amount (parts by mass) | Type | Amount (parts by mass) | Type | Amount (parts by mass) | Storage Stability | Exposure requirement amount (mJ/cm$^2$) | Pattern size (μm) | Developability | Adhesion to Substrate | Cross-Sectional Shape of Pattern |
| Ex. 3-1 | B-1 | Compound 1 | 2.5 | — | — | — | — | A | 1000 | 1.96 | A | A | Forward Tapered |
| Ex. 3-2 | B-2 | Compound 2 | 2.5 | — | — | — | — | A | 1000 | 1.96 | A | A | Forward Tapered |
| Ex. 3-3 | B-3 | Compound 3 | 2.5 | — | — | — | — | A | 1100 | 1.95 | A | A | Rectangular |
| Ex. 3-4 | B-4 | Compound 4 | 2.5 | — | — | — | — | A | 1000 | 1.96 | A | A | Forward Tapered |
| Ex. 3-5 | B-5 | Compound 5 | 2.5 | — | — | — | — | A | 1000 | 1.96 | A | A | Forward Tapered |
| Ex. 3-6 | B-6 | Compound 6 | 2.5 | — | — | — | — | A | 1100 | 1.95 | A | A | Rectangular |
| Ex. 3-7 | B-7 | Compound 7 | 2.5 | — | — | — | — | A | 1100 | 1.95 | A | A | Forward Tapered |
| Ex. 3-8 | B-8 | Compound 8 | 2.5 | — | — | — | — | A | 1200 | 1.94 | A | A | Forward Tapered |
| Ex. 3-9 | B-9 | Compound 2 | 1.0 | A3 | 1.0 | F3 | 1.0 | A | 500 | 1.98 | A | A | Forward Tapered |
| Comp. Ex. 3-1 | B'-1 | Comparative compound 1 | 2.5 | — | — | — | — | A | 1400 | 1.92 | A | A | Rectangular |

TABLE 5-continued

| | Com-po-sition | Specific Oxime Compound or Comparative Compound Type | Amount (parts by mass) | Sensitizer Type | Amount (parts by mass) | Co-Sensitizer Type | Amount (parts by mass) | Storage Stability | Exposure requirement amount (mJ/cm$^2$) | Pattern size (μm) | De-velop-ability | Adhesion to Substrate | Cross-Sectional Shape of Pattern |
|---|---|---|---|---|---|---|---|---|---|---|---|---|---|
| Comp. Ex. 3-2 | B'-2 | Comparative compound 2 | 2.5 | — | — | — | — | A | 1300 | 1.92 | A | A | Rectangular |
| Comp. Ex. 3-3 | B'-3 | Comparative compound 3 | 2.5 | — | — | — | — | A | 2000 | 1.90 | A | B | Inversely Tapered |

Sensitizers A1 to A3 and Co-Sensitizers F1 to F3 shown in Table 5 are the compounds described above.

Example 3-10

The compounds for the composition C-1 described below were mixed and dissolved to form a colorant (pigment)-containing colored curable composition C-1.

| <Composition C-1> | |
|---|---|
| Cyclohexanone | 80 parts by mass |
| Colorant C.I. Pigment Red 254 | 6.0 parts by mass |
| Colorant C.I. Pigment Yellow 139 | 4.0 parts by mass |
| Radical-polymerizable monomer (polymerizable compound) (a mixture of pentaerythritol triacrylate and dipentaerythritol hexaacrylate (3:7)) | 7.0 parts by mass |

-continued

| <Composition C-1> | |
|---|---|
| Compound 1 (specific oxime compound) | 2.5 parts by mass |
| Glycerol propoxylate (number average molecular weight Mn: 1,500) | 0.5 parts by mass |

Examples 3-11 to 3-18 and Comparative Examples 3-5 to 3-8

Colored curable compositions C-2 to C-9 and C'-1 to C'-3 were prepared in the same manner as in Example 3-10, except that each compound in the amount shown in Table 6 below were used in place of 2.5 parts by mass of Compound 1 (the specific oxime compound) of the composition C-1 used in the preparation of the colored curable composition C-1 and that a sensitizer and a co-sensitizer of the type and in the amount shown in Table 6 were further added in each of Examples 3-16 to 3-18.

Each of the resulting colored curable compositions was evaluated in the same way as in Example 3-1. The results are shown in Table 6.

TABLE 6

| | Com-po-sition | Specific Oxime Compound or Comparative Compound Type | Amount (parts by mass) | Sensitizer Type | Amount (parts by mass) | Co-Sensitizer Type | Amount (parts by mass) | Storage Stability | Exposure requirement amount (mJ/cm$^2$) | Pat-tern size (μm) | De-velop-ability | Adhesion to Substrate | Cross-Sectional Shape of Pattern |
|---|---|---|---|---|---|---|---|---|---|---|---|---|---|
| Ex. 3-10 | C-1 | Compound 1 | 2.5 | — | — | — | — | A | 800 | 1.96 | A | A | Forward Tapered |
| Ex. 3-11 | C-2 | Compound 2 | 2.5 | — | — | — | — | A | 800 | 1.96 | A | A | Forward Tapered |
| Ex. 3-12 | C-3 | Compound 3 | 2.5 | — | — | — | — | A | 900 | 1.96 | A | A | Rectangular |
| Ex. 3-13 | C-4 | Compound 4 | 2.5 | — | — | — | — | A | 800 | 1.96 | A | A | Forward Tapered |
| Ex. 3-14 | C-5 | Compound 5 | 2.5 | — | — | — | — | A | 800 | 1.96 | A | A | Forward Tapered |
| Ex. 3-15 | C-6 | Compound 6 | 2.5 | — | — | — | — | A | 900 | 1.96 | A | A | Rectangular |
| Ex. 3-16 | C-7 | Compound 2 | 1.0 | A1 | 1.0 | F2 | 1.0 | A | 500 | 1.98 | A | A | Forward Tapered |
| Ex. 3-17 | C-8 | Compound 2 | 1.0 | A2 | 1.0 | F2 | 1.0 | A | 400 | 1.99 | A | A | Forward Tapered |
| Ex. 3-18 | C-9 | Compound 2 | 1.0 | A3 | 1.0 | F3 | 1.0 | A | 300 | 2.00 | A | A | Forward Tapered |
| Comp. Ex. 3-4 | C'-1 | Comparative compound 1 | 2.5 | — | — | — | — | A | 1200 | 1.92 | A | A | Rectangular |

TABLE 6-continued

| | Com-po-sition | Specific Oxime Compound or Comparative Compound Type | Amount (parts by mass) | Sensitizer Type | Amount (parts by mass) | Co-Sensitizer Type | Amount (parts by mass) | Storage Stability | Exposure requirement amount (mJ/cm$^2$) | Pat-tern size (μm) | De-velop-ability | Adhesion to Substrate | Cross-Sectional Shape of Pattern |
|---|---|---|---|---|---|---|---|---|---|---|---|---|---|
| Comp. Ex. 3-5 | C'-2 | Comparative compound 2 | 2.5 | — | — | — | — | A | 1300 | 1.92 | A | A | Rectangular |
| Comp. Ex. 3-6 | C'-3 | Comparative compound 3 | 2.5 | — | — | — | — | A | 1500 | 1.93 | A | B | Inversely Tapered |

Sensitizers A1 to A3 and Co-Sensitizers F1 to F3 shown in Table 6 are the compounds described above.

The results of Tables 5 and 6 indicate that the colored curable composition of each Example containing the specific oxime compound (each of Compounds 1 to 8) has high storage stability (stability over time). It is also apparent that these colored curable compositions have high sensitivity at exposure, show high developability in the process of forming colored patterns for a color filter, and form a colored pattern with excellent adhesion to the substrate and with an excellent cross-sectional shape.

Details of the novel oxime compounds (Compounds 31 to 38) used for Examples and the comparative compounds (Comparative Compounds 31 to 34) used for Comparative Examples are shown in Tables 7 and 8 below.

TABLE 7

| Compound No. | Structure |
|---|---|
| Compound 31 | 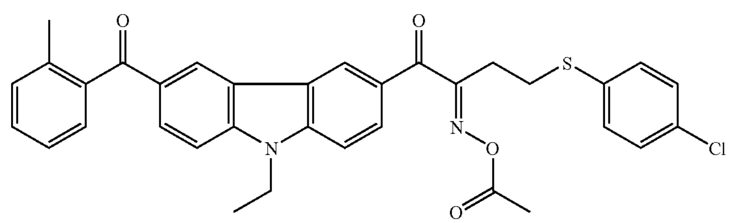 |
| Compound 32 | 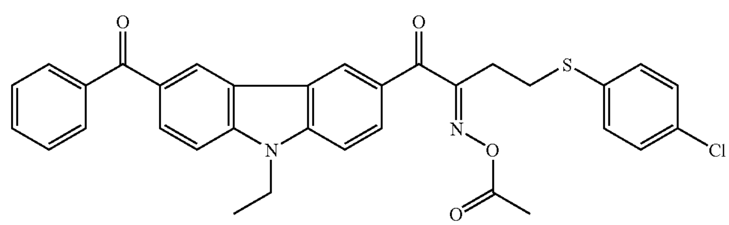 [SMILES: CCn1c2ccc(C(=O)/C(CCSc3ccc(Cl)cc3)=N/OC(C)=O)cc2c2cc(C(=O)c3ccccc3)ccc21] |
| Compound 33 | 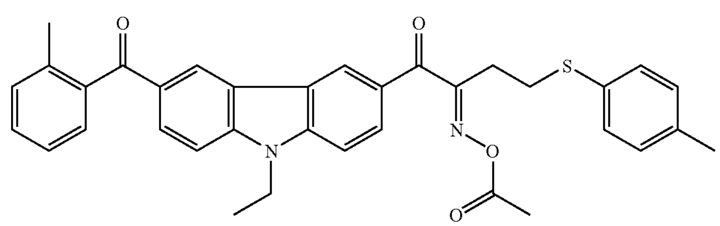 [SMILES: CCn1c2ccc(C(=O)/C(CCSc3ccc(C)cc3)=N/OC(C)=O)cc2c2cc(C(=O)c3ccccc3C)ccc21] |
| Compound 34 | 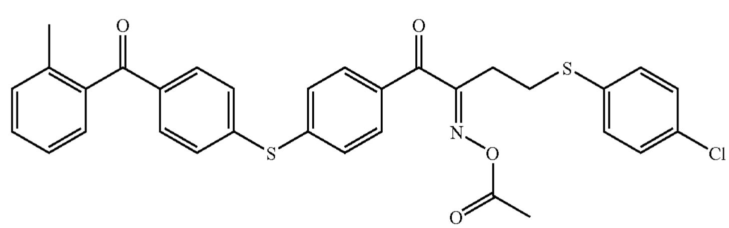 [SMILES: CC(=O)O/N=C(\CCSc1ccc(Cl)cc1)C(=O)c1ccc(Sc2ccc(C(=O)c3ccccc3C)cc2)cc1] |

TABLE 7-continued

| Compound No. | Structure |
| --- | --- |
| Compound 35 | 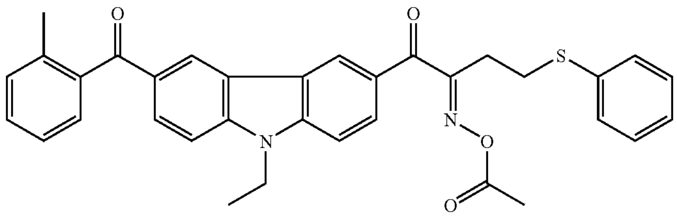 [SMILES: CCn1c2ccc(C(=O)/C(CCSc3ccccc3)=N/OC(C)=O)cc2c2cc(C(=O)c3ccccc3C)ccc21] |
| Compound 36 | 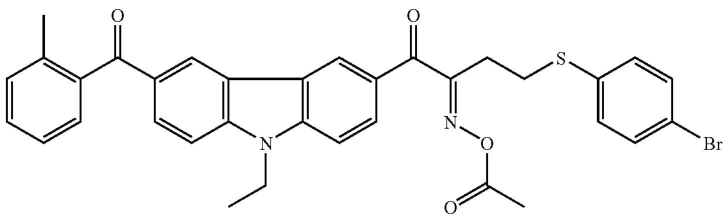 [SMILES: CCn1c2ccc(C(=O)/C(CCSc3ccc(Br)cc3)=N/OC(C)=O)cc2c2cc(C(=O)c3ccccc3C)ccc21] |

TABLE 8

| Compound No. | Structure and Molar Absorption Coefficient |
| --- | --- |
| Compound 37 | 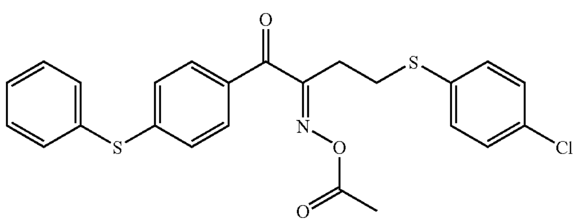 [SMILES: CC(=O)O/N=C(\CCSc1ccc(Cl)cc1)C(=O)c1ccc(Sc2ccccc2)cc1] |
| Compound 38 | 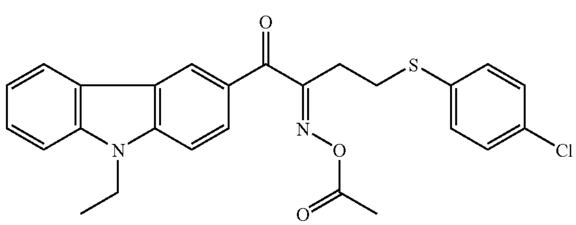 [SMILES: CCn1c2ccccc2c2cc(C(=O)/C(CCSc3ccc(Cl)cc3)=N/OC(C)=O)ccc21] |
| Comparative Compound 31 | IRGACURE OXE01 (manufactured by Ciba Specialty Chemicals Inc.) |
| Comparative Compound 32 | IRGACURE OXE02 (manufactured by Ciba Specialty Chemicals Inc.) |
| Comparative Compound 33 | IRGACURE 369 (manufactured by Ciba Specialty Chemicals Inc.) |
| Comparative Compound 34 | 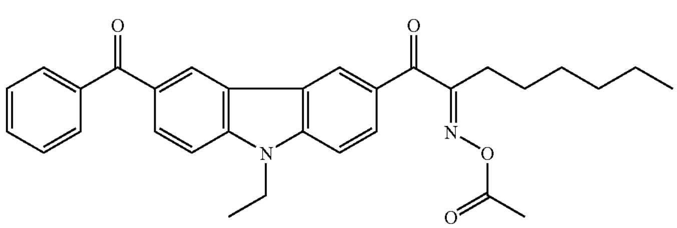 [SMILES: CCCCCC/C(=N\OC(C)=O)C(=O)c1ccc2c(c1)c1cc(C(=O)c3ccccc3)ccc1n2CC] |

Compounds 31 to 34 in Table 7 each corresponding to the novel oxime compound were synthesized by the method described below.

Synthesis Example 3

Synthesis of Compound 31 Corresponding to the Novel Oxime Compound

First, Compound A was synthesized according to the scheme shown below.

Ethylcarbazole (100.0 g, 0.512 mol) was dissolved in 260 ml of chlorobenzene. After the solution was cooled to 0° C., aluminum chloride (70.3 g, 0.527 mol) was added thereto. Subsequently, o-tolyl chloride (81.5 g, 0.527 mol) was added dropwise thereto over 40 minutes, and the mixture was warmed to room temperature and stirred for 3 hours. After the mixture was cooled to 0° C., aluminum chloride (75.1 g, 0.563 mol) was added to the mixture. Over 40 minutes, 4-chlorobutyryl chloride (79.4 g, 0.563 mol) was added dropwise, and the mixture was warmed to room temperature and stirred for 3 hours. A mixed solution of 156 ml of an aqueous 35% by mass hydrochloric acid solution and 392 ml of distilled water was cooled to 0° C., and the reaction solution was added dropwise thereto. After the precipitated solid was separated by suction filtration, the solid was washed with distilled water and methanol and recrystallized with acetonitrile to give Compound A having the structure shown below (164.4 g, 77% yield).

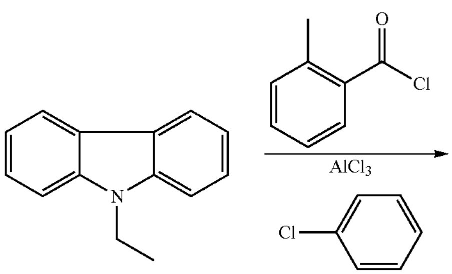

-continued

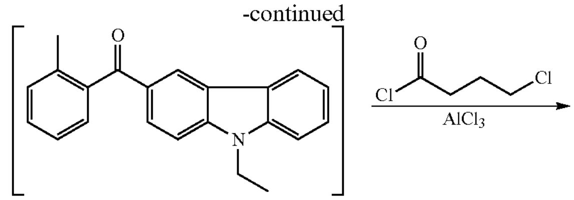

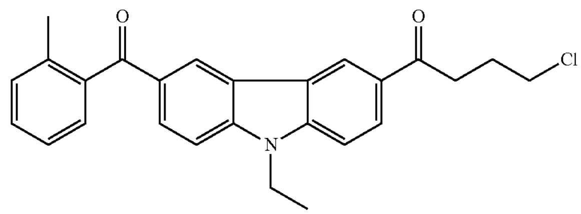

Compound A

Compound B was synthesized using Compound A according to the scheme shown below.

Compound A (20.0 g, 47.9 mmol) was dissolved in 64 ml of THF, and 4-chlorobenzenethiol (7.27 g, 50.2 mmol) and sodium iodide (0.7 g, 4.79 mmol) were added to the solution. Subsequently, sodium hydroxide (2.0 g, 50.2 mmol) was added to the reaction liquid and refluxed for 2 hours. After the mixture was cooled to 0° C., SM-28 (11.1 g, 57.4 mmol) was added dropwise thereto over 20 minutes, and the mixture was warmed to room temperature and stirred for 2 hours. After the mixture was cooled to 0° C., isopentyl nitrite (6.73 g, 57.4 mmol) was added dropwise over 20 minutes, and the mixture was warmed to room temperature and stirred for 3 hours. The reaction liquid was diluted with 120 ml of acetone, and an aqueous 0.1 N hydrochloric acid solution cooled at 0° C. was added dropwise to the diluted liquid. After the precipitated solid was separated by suction filtration, the solid was washed with distilled water and then recrystallized with acetonitrile to give Compound B having the structure shown below (17.0 g, 64% yield).

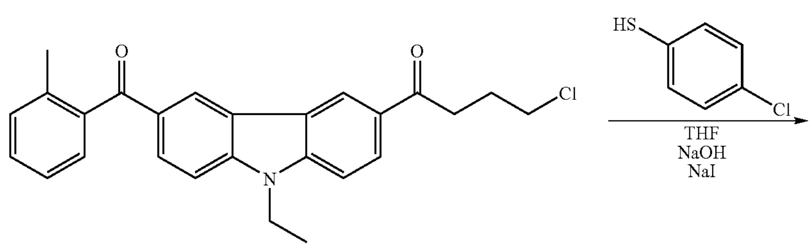

Compound A

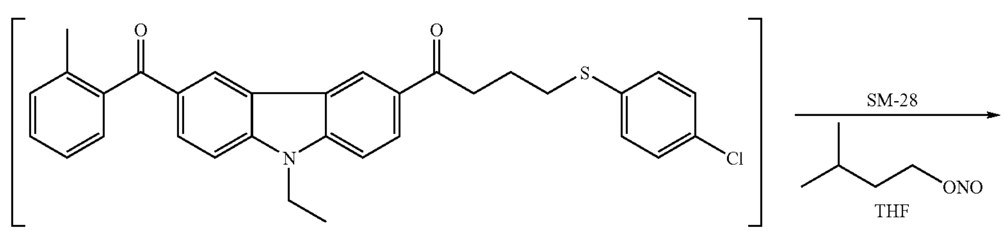

-continued

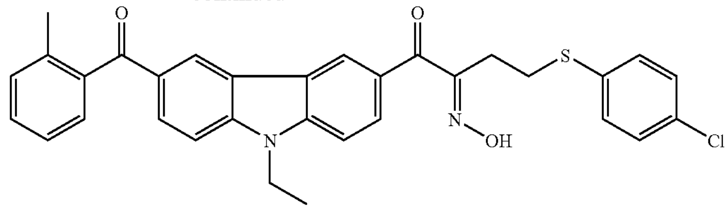

Compound B

Subsequently, Compound 31 was synthesized using Compound B according to the scheme shown below.

Compound B (18.0 g, 32.4 mmol) was dissolved in 90 ml of N-methylpyrrolidone, and triethylamine (3.94 g, 38.9 mmol) was added to the solution. After the mixture was cooled to 0° C., acetyl chloride (3.05 g, 38.9 mmol) was added dropwise over 20 minutes, and the mixture was warmed to room temperature and stirred for 2 hours. The reaction liquid was added dropwise to 150 ml of distilled water cooled at 0° C. After the precipitated solid was separated by suction filtration, the solid was washed with 200 ml of isopropyl alcohol cooled at 0° C. and then dried to give Compound 31 having the structure shown below (19.5 g, 99% yield).

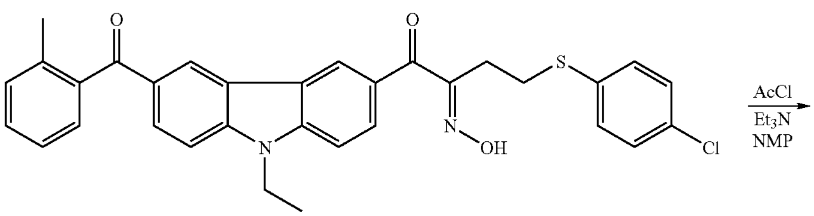

Compound B

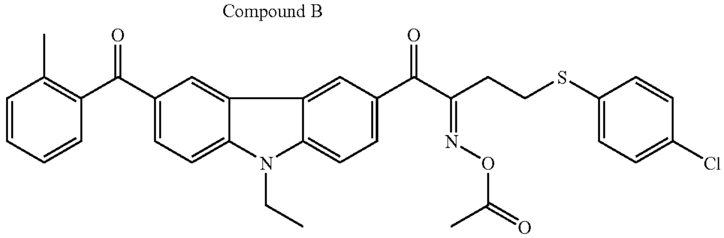

Compound 31

The structure of the resulting Compound 31 was identified by NMR. $^{1}$H-NMR, 400 MHz, CDCl$_3$: 8.86 (s, 1H), 8.60 (s, 1H), 8.31 (d, 1H, J=8.0 Hz), 8.81 (d, 1H, J=8.0 Hz), 7.51-7.24 (m, 10H), 7.36 (q, 2H, 7.4 Hz), 3.24-3.13 (m, 4H), 2.36 (s, 3H), 2.21 (s, 3H), 1.50 (t, 3H, 7.4 Hz).

Synthesis Example 4

Synthesis of Compound 32 Corresponding to the Novel Oxime Compound

Oxime Compound C having the structure shown below (17.6 g, 32.4 mmol) was dissolved in 90 ml of N-methylpyrrolidone, and triethylamine (3.94 g, 38.9 mmol) was added to the solution. After the mixture was cooled to 0° C., acetyl chloride (3.05 g, 38.9 mmol) was added dropwise over 20 minutes, and the mixture was warmed to room temperature and stirred for 2 hours. The reaction liquid was added dropwise to 150 ml of distilled water cooled at 0° C. After the precipitated solid was separated by suction filtration, the solid was washed with 200 ml of isopropyl alcohol cooled at 0° C. and then dried to give Compound 32 (17.5 g, 92% yield).

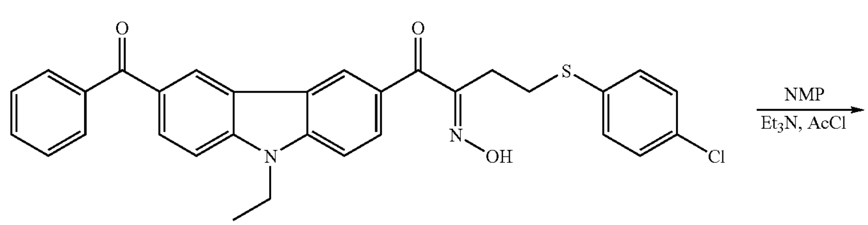

Oxime Compound C

-continued

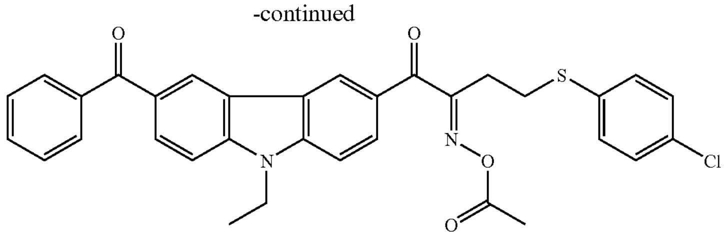

Compound 32

The structure of the resulting Compound 32 was identified by NMR. $^1$H-NMR, 400 MHz, $CDCl_3$: 8.89 (s, 1H), 8.65 (s, 1H), 8.32 (d, 1H, J=8.8 Hz), 8.10 (d, 1H, J=8.8 Hz), 7.86 (d, 1H, J=7.0 Hz), 7.56-7.49 (m, 4H), 7.30-7.23 (m, 4H), 4.46 (q, 2H, J=7.2 Hz), 3.24-3.14 (m, 4H), 2.21 (s, 3H), 2.17 (s, 3H), 1.51 (t, 3H, J=7.2 Hz).

Synthesis Example 5

Synthesis of Compound 33 Corresponding to the Novel Oxime Compound

Oxime Compound D having the structure shown below (17.3 g, 32.4 mmol) was dissolved in 90 ml of N-methylpyrrolidone, and triethylamine (3.94 g, 38.9 mmol) was added to the solution. After the mixture was cooled to 0° C., acetyl chloride (3.05 g, 38.9 mmol) was added dropwise over 20 minutes, and the mixture was warmed to room temperature and stirred for 2 hours. The reaction liquid was added dropwise to 150 ml of distilled water cooled at 0° C. After the precipitated solid was separated by suction filtration, the solid was washed with 200 ml of isopropyl alcohol cooled at 0° C. and then dried to give Compound 33 (18.5 g, 99% yield).

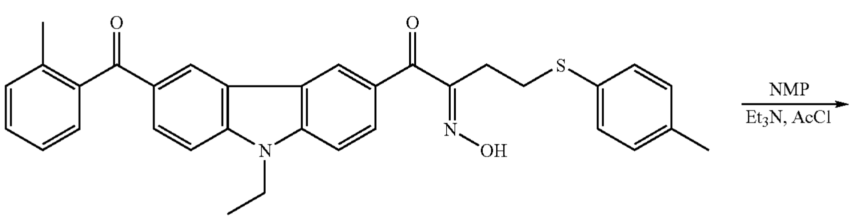

Oxime Compound D

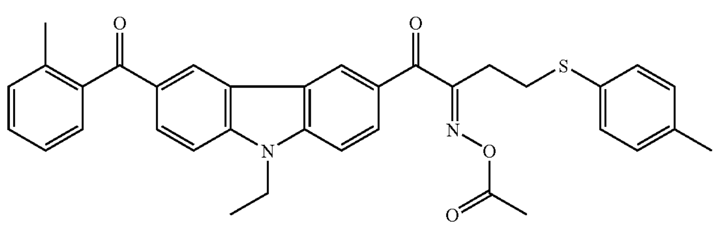

Compound 33

The structure of the resulting Compound 33 was identified by NMR. $^1$H-NMR, 400 MHz, $CDCl_3$: 8.86 (s, 1H), 8.59 (s, 1H), 8.33 (d, 1H, J=8.4 Hz), 8.07 (d, 1H, J=8.4 Hz), 7.50-7.26 (m, 8H), 7.11 (d, 2H, J=9.2 Hz), 4.34 (q, 2H, J=7.4 Hz), 3.19-3.14 (m, 4H), 2.37 (s, 3H), 2.31 (s, 3H), 2.18 (s, 3H), 1.49 (t, 3H, J=7.4 Hz).

Synthesis Example 6

Synthesis of Compound 34 Corresponding to the Novel Oxime Compound

Oxime Compound E having the structure shown below (17.7 g, 32.4 mmol) was dissolved in 90 ml of N-methylpyrrolidone, and triethylamine (3.94 g, 38.9 mmol) was added to the solution. After the mixture was cooled to 0° C., acetyl chloride (3.05 g, 38.9 mmol) was added dropwise over 20 minutes, and the mixture was warmed to room temperature and stirred for 2 hours. The reaction liquid was added dropwise to 150 ml of distilled water cooled at 0° C. After the precipitated solid was separated by suction filtration, the solid was washed with 200 ml of isopropyl alcohol cooled at 0° C. and then dried to give Compound 34 (17.5 g, 92% yield).

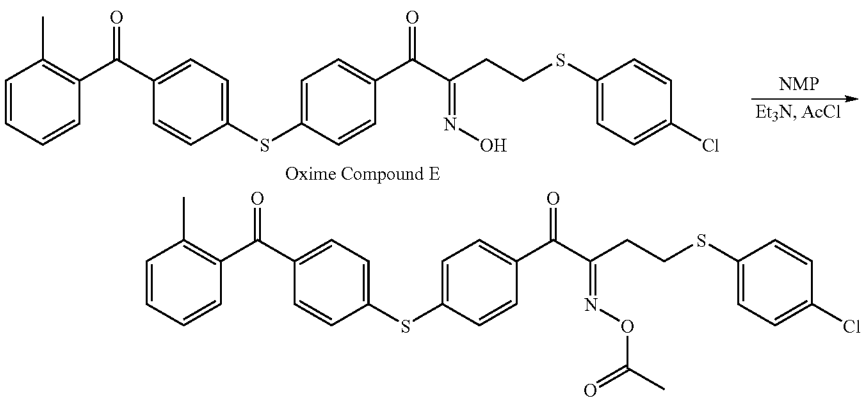

Compound 34

The structure of the resulting Compound 34 was identified by NMR. $^1$H-NMR, 400 MHz, $CDCl_3$: 8.05 (d, 1H, J=8.8 Hz), 7.78 (d, 1H, J=8.8 Hz), 7.74 (d, 1H, J=8.0 Hz), 7.42-7.26 (m, 10H), 3.19-3.08 (m, 4H), 2.35 (s, 3H), 2.17 (s, 3H).

Compounds 35 to 38 shown in Tables 7 and 8 and each corresponding to the specific oxime compound were synthesized in a manner similar to Synthesis Examples 3 to 6.

Comparative Compounds 31 to 33 shown in Table 8 each have the structure shown below.

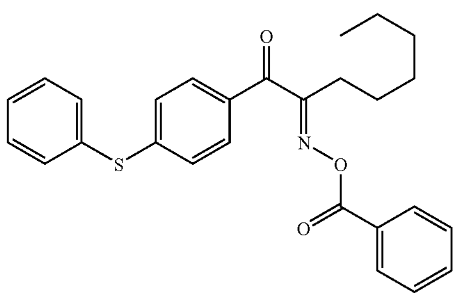

IRGACURE OXE 01

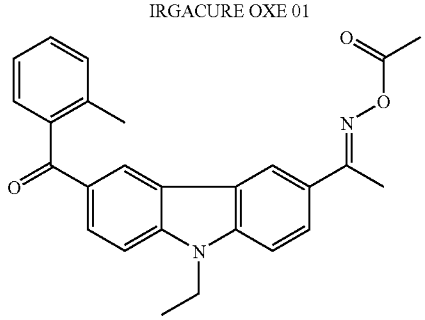

IRGACURE OXE 02

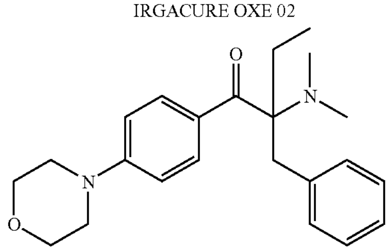

IRGACURE 369

Example4-1

Preparation and Evaluation of Photopolymerizable Composition 1

Photopolymerizable Composition 1 was prepared as described below, and its sensitivity was evaluated.

A uniform composition was prepared that contained 0.08 mmol of Compound 31 as the novel oxime compound, 1 g of pentaerythritol tetraacrylate as a radical-polymerizable compound, 1 g of polymethyl methacrylate (c.a. 996,000 in molecular weight, manufactured by Aldrich) as a binder resin, and 16 g of cyclohexanone as a solvent. The resulting composition was used as a coating liquid, applied to a glass plate with a spin coater and dried at 40° C. for 10 minutes to form a 1.5 μm-thick coating film. A 21 √2 step tablet (a gray scale film manufactured by Dainippon Screen Mfg. Co., Ltd.) was placed on the coating film. The coating film was exposed to light from a 500 mW high-pressure mercury lamp (manufactured by Ushio Inc.) through a heat-ray-cutting filter for 30 seconds and then immersed in toluene for 60 seconds so as to be developed. According to the step tablet, the step number where the film was completely cured and insolubilized was evaluated as the sensitivity. As a result, the sensitivity was step No. 9.

A larger step number indicates a higher sensitivity.

Examples 4-2 to 4-8 and Comparative Examples 4-1 to 4-4

Photopolymerizable Compositions 2 to 12 were each prepared in the same manner as in Example 4-1, except that 0.08 mmol of each of Compounds 32 to 38 and Comparative Compounds 31 to 34 shown in Tables 7 and 8 was used in place of 0.08 mmol of Compound 31 used as the specific oxime compound, and the step number for the sensitivity was evaluated in the same way as in Example 4-1.

The results of the evaluation of Examples 4-1 to 4-8 and Comparative Examples 4-1 to 4-4 are shown in Table 9 below.

TABLE 9

| | Specific Oxime Compound or Comparative Compound | Polymerizable Composition No. | Sensitivity Step Number |
|---|---|---|---|
| Example 4-1 | Compound 31 | 1 | 9 |
| Example 4-2 | Compound 32 | 2 | 8 |
| Example 4-3 | Compound 33 | 3 | 9 |

TABLE 9-continued

| | Specific Oxime Compound or Comparative Compound | Polymerizable Composition No. | Sensitivity Step Number |
|---|---|---|---|
| Example 4-4 | Compound 34 | 4 | 7 |
| Example 4-5 | Compound 35 | 5 | 9 |
| Example 4-6 | Compound 36 | 6 | 9 |
| Example 4-7 | Compound 37 | 7 | 6 |
| Example 4-8 | Compound 38 | 8 | 6 |
| Comparative example 4-1 | Comparative comound 31 | 9 | 5 |
| Comparative example 4-2 | Comparative comound 32 | 10 | 5 |
| Comparative example 4-3 | Comparative comound 33 | 11 | 4 |
| Comparative example 4-4 | Comparative comound 34 | 12 | 5 |

Example 5-1

1. Preparation of Colored Photopolymerizable Composition A-1

A negative colored photopolymerizable composition (A-1) containing a colorant (pigment) was prepared as a photopolymerizable composition for forming color filters. A color filter was prepared using the colored photopolymerizable composition.

1-1. Preparation of Pigment Dispersion Liquid (P1)

A liquid mixture composed of 40 parts by mass of a pigment mixture of C.I. Pigment Green 36 and C.I. Pigment Yellow 219 (30/70 in mass ratio), 10 parts by mass (4.51 parts by mass in terms of solids content) of BYK 2001 (DISPERBYK, manufactured by BYK-Chemie, 45.1% by mass in solids content) as a dispersing agent, and 150 parts by mass of ethyl 3-ethoxypropionate as a solvent was mixed and dispersed in a bead mill for 15 hours so that a pigment dispersion liquid (P1) was prepared.

The average particle size of the pigment in the resulting pigment dispersion liquid (P1) was measured to be 200 nm by dynamic light scattering.

1-2. Preparation of Colored Photopolymerizable Composition A-1 (Coating Liquid)

The components for Composition A-1 shown below were mixed and dissolved to form a colored photopolymerizable composition A-1.

| Composition A-1 | |
|---|---|
| Pigment Dispersion Liquid (P1) | 600 parts by mass |
| Alkali-soluble resin (benzyl methacrylate/methacrylic acid/hydroxyethyl methacrylate (80/10/10 in molar ratio) copolymer (Mw: 10,000)) | 200 parts by mass |
| Polyfunctional monomer dipentaerythritol hexaacrylate | 60 parts by mass |
| Novel oxime compound: Compound 31 | 60 parts by mass |
| Solvent: propylene glycol monomethyl ether acetate | 1,000 parts by mass |
| Surfactant (trade name: Tetranic 150R1, BASF) | 1 part by mass |
| γ-methacryloxypropyltriethoxysilane | 5 parts by mass |

2. Preparation of Color Filter 2-1. Formation of Photopolymerizable Composition Layer The resulting pigment-containing colored photopolymerizable composition A-1 was used as a resist solution. The resist solution was applied to a glass substrate of 550 mm×650 mm by slit coating under the conditions described below and then allowed to stand for 10 minutes. The solution was then dried under vacuum and pre-baked (100° C. for 80 seconds) to form a photopolymerizable composition coating film (photopolymerizable composition layer).

Slit Coating Conditions

Opening gap of the top of the coating head: 50 μm

Coating speed: 100 mm/second

Clearance between the substrate and the coating head: 150 μm

Coating thickness (dry thickness): 2 μm

Coating temperature: 23° C.

2-2. Exposure and Development

The photopolymerizable composition layer was then patternwise exposed to light from a 2.5 kW ultra-high pressure mercury lamp. After the exposure to light, the entire surface of the exposed composition layer was covered with an aqueous 10% solution of a liquid organic developer (trade name: CD, manufactured by Fuji Film Electronics Materials Co., Ltd.) and allowed to stand for 60 seconds.

2-3. Heat Treatment

A shower of pure water was then sprayed onto the composition layer so that the liquid developer was washed away. The composition was then heated in an oven at 220° C. for 1 hour (post-baking) so that a color filter having a colored pattern on the glass substrate was obtained.

3. Performance Evaluation

Evaluations were performed as described below with respect to the storage stability and exposure sensitivity of the colored photopolymerizable composition, the developability of a colored patterned product formed by using the colored photopolymerizable composition on a glass substrate, coloration caused by heating over time of the colored patterned product, the adhesion of the colored patterned product to the substrate, and the cross-sectional shape of the patterned product. A summary of the evaluation results is shown in Table 10.

3-1. Storage Stability of Colored Photopolymerizable Composition

After the colored photopolymerizable composition was stored at room temperature for one month, the degree of precipitation of matters was visually evaluated according to the following criteria:

A: No precipitation was observed;

B: Precipitation was slightly observed;

C: Precipitation was observed.

3-2. Exposure Sensitivity of Colored Photopolymerizable Composition

The colored photopolymerizable composition was applied to a glass substrate by spin coating and then dried to form a coating film with a thickness of 1.0 μm. Spin coating conditions were 300 rpm for 5 seconds and then 800 rpm for 20 seconds. Drying conditions were 100° C. for 80 seconds. The resulting coating film was then exposed to light through a test photomask with a line width of 2.0 μm at different exposure amounts in the range of 10 mJ/cm$^2$ to 1,600 mJ/cm$^2$ using a proximity-type exposure system equipped with a ultra-high pressure mercury lamp (manufactured by Hitachi High-Tech Electronics Engineering Co., Ltd.). The exposed coating film was then developed with a liquid developer 60% CD-2000 (manufactured by Fuji Film Electronics Materials Co., Ltd.) at 25° C. for 60 seconds. Thereafter, the film was rinsed with running water for 20 seconds and then spray-dried so that the patterning was completed.

Regarding the evaluation of exposure sensitivity, the minimum exposure amount at which the post-development thickness of the region that was irradiated with light in the exposure step became 95% or more of the thickness (100%) of the film before the exposure was evaluated as the exposure requirement amount. A smaller exposure requirement amount indicates a higher sensitivity.

3-3. Developability, Cross-Sectional Shape of Pattern, Adhesion to Substrate

After the post-baking described in the section 2-3. "Heat Treatment", the surface and the cross-sectional shape of the substrate were observed by common methods with an optical microscope and SEM photographs, so as to evaluate the developability, the adhesion to the substrate and the cross-sectional shape of the pattern. Details of the evaluation method are as described below.

Developability

The presence or absence of residues in the region (unexposed portion) which was not irradiated with light in the exposure step was observed, so as to evaluate the developability. The evaluation was preformed according to the following criteria:

A: No residue was observed in the unexposed portion;

B: Residues were slightly observed in the unexposed portion, but the residue level was practically acceptable;

C: Residues were significantly observed in the unexposed portion.

Evaluation of Coloration by Forced Heat Aging

The exposed and developed composition layer (the colored pattern) was heated on a hot plate at 200° C. for 1 hour, and the color difference ΔEab* between before and after the heating was evaluated with MCPD-3000 (trade name) manufactured by Otsuka Electronics Co., Ltd. according to the following criteria:

A: ΔEab*≤5

B: 5<*ΔEab*<8

C: ΔEab*≥8

Adhesion to Substrate

The presence or absence of pattern defects was observed, and the adhesion to the substrate was evaluated according to the following criteria:

A: No pattern defect was observed;

B: Pattern defects were hardly observed but observed in part;

C: Many pattern defects were significantly observed.

Cross-Sectional Shape of Pattern

The cross-sectional shape of the obtained pattern was observed and evaluated. The cross-sectional shape of the pattern is preferably rectangular, most preferably forward-tapered. The inversely-tapered shape is not preferred. The results are shown in Table 10.

Examples 5-2 to 5-15 and Comparative Examples 5-1 to 5-4

Colored photopolymerizable compositions A-2 to A- 15 and A'-1 to A'-4 and color filters were prepared in the same manner as in Example 5-1, except that each compound in the amount shown in Table 10 below were used in place of 60 parts by mass of Compound 31 (the novel oxime compound) of the composition A-1 used in the preparation of the colored photopolymerizable composition A-1 and that a sensitizer and/or a co-sensitizer of the type and in the amount shown in Table 10 was further added in each of Examples 5-9 to 5-15. Evaluations were also performed in the same way as in Example 5-1. The results are shown in Table 10.

TABLE 10

| | Com-po-sition | Specific Oxime Compound or Comparative Compound: Type | Specific Oxime Compound or Comparative Compound: Amount (parts by mass) | Sensitizer: Type | Sensitizer: Amount (parts by mass) | Co-Sensitizer: Type | Co-Sensitizer: Amount (parts by mass) | Storage Stability | Exposure require-ment amount (mJ/cm$^2$) | Pat-tern size (μm) | De-velop-ability | Adhesion to Substrate | Cross-Sectional Shape of Pattern |
|---|---|---|---|---|---|---|---|---|---|---|---|---|---|
| Ex. 5-1 | A-1 | Compound 31 | 60 | — | — | — | — | A | 100 | A | A | A | F-tapered |
| Ex. 5-2 | A-2 | Compound 32 | 60 | — | — | — | — | A | 110 | A | A | A | F-tapered |
| Ex. 5-3 | A-3 | Compound 33 | 60 | — | — | — | — | A | 100 | A | A | A | F-tapered |
| Ex. 5-4 | A-4 | Compound 34 | 60 | — | — | — | — | A | 120 | A | A | A | F-tapered |
| Ex. 5-5 | A-5 | Compound 35 | 60 | — | — | — | — | A | 100 | A | A | A | F-tapered |
| Ex. 5-6 | A-6 | Compound 36 | 60 | — | — | — | — | A | 100 | A | A | A | F-tapered |
| Ex. 5-7 | A-7 | Compound 37 | 60 | — | — | — | — | A | 140 | A | A | A | Rectangular |
| Ex. 5-8 | A-8 | Compound 38 | 60 | — | — | — | — | A | 140 | A | A | A | Rectangular |
| Ex. 5-9 | A-9 | Compound 31 | 30 | A1 | 30 | — | — | A | 90 | A | A | A | F-tapered |
| Ex. 5-10 | A-10 | Compound 31 | 30 | A2 | 30 | — | — | A | 90 | A | A | A | F-tapered |
| Ex. 5-11 | A-11 | Compound 31 | 30 | A3 | 30 | — | — | A | 80 | A | A | A | F-tapered |
| Ex. 5-12 | A-12 | Compound 31 | 30 | — | — | F1 | 30 | A | 90 | A | A | A | F-tapered |
| Ex. 5-13 | A-13 | Compound 31 | 20 | A2 | 20 | F1 | 20 | A | 80 | A | A | A | F-tapered |
| Ex. 5-14 | A-14 | Compound 31 | 20 | A2 | 20 | F2 | 20 | A | 80 | A | A | A | F-tapered |
| Ex. 5-15 | A-15 | Compound 31 | 20 | A2 | 20 | F3 | 20 | A | 80 | A | A | A | F-tapered |
| Comp. Ex. 5-1 | A'-1 | Comparative compound 31 | 60 | — | — | — | — | A | 150 | A | B | A | Rectangular |
| Comp. Ex. 5-2 | A'-2 | Comparative compound 32 | 60 | — | — | — | — | A | 140 | A | C | A | Rectangular |
| Comp. Ex. 5-3 | A'-3 | Comparative compound 33 | 60 | — | — | — | — | A | 200 | A | A | B | Inversely Tapered |
| Comp. Ex. 5-4 | A'-4 | Comparative compound 34 | 60 | | — | — | — | A | 140 | A | B | A | Rectangular |

*F-tapered refers to "forward-tapered"

Sensitizers A1 to A3 and Co-Sensitizers F1 to F3 shown in Table 10 are the following compounds:

A1: 4,4-bisdiethylaminobenzophenone

A2: diethylthioxanthone

A3:

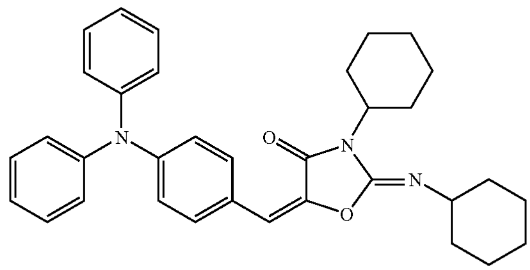

F1: 2-mercaptobenzimidazole

F2: 2-mercaptobenzothiazole

F3: N-phenyl-2-mercaptobenzimidazole

The results of Table 10 indicate that the colored photopolymerizable composition of each Example containing the novel oxime compound (each of Compounds 31 to 38) has high storage stability (stability over time). It is also apparent that these colored photopolymerizable compositions have high sensitivity at exposure, show high developability in the process of forming colored patterns for a color filter, show suppressed coloration of the obtained colored pattern during heat aging, and form a colored pattern with excellent adhesion to the substrate and with an excellent cross-sectional shape.

Example 6-1

1. Preparation of Resist Liquid

The components for the composition described below were mixed and dissolved to form a resist liquid.

| Composition of Resist Liquid | |
|---|---|
| Propylene glycol monomethyl ether acetate (PGMEA) | 19.20 parts by mass |
| Ethyl lactate | 36.67 parts by mass |
| Resin (a 40% PGMEA solution of a benzyl methacrylate/methacrylic acid/2-hydroxyethyl methacrylate (60/22/18 in molar ratio) copolymer | 30.51 parts by mass |
| Dipentaerythritol hexaacrylate (polymerizable compound) | 12.20 parts by mass |
| Polymerization inhibitor (p-methoxyphenol) | 0.0061 parts by mass |
| Fluorosurfactant (F-475, manufactured by Dainippon Ink and Chemicals, Incorporated) | 0.83 parts by mass |
| Photopolymerization initiator (TAZ-107 (a trihalomethyltriazine-based photopolymerization initiator), manufactured by Midori Kagaku Co., Ltd.) | 0.586 parts by mass |

2. Preparation of Silicon Wafer Substrate Having an Undercoat Layer

A 6 inch silicon wafer was heated in an oven at 200° C. for 30 minutes. The resist liquid was applied to the silicon wafer so as to provide a dry thickness of 2 μm and then heated and dried in an oven at 220° C. for 1 hour to form an undercoat layer. As a result, an silicon wafer substrate having an undercoat layer was obtained.

3. Preparation of Colored Photopolymerizable Composition B-1

The compounds for the composition B-1 described below were mixed and dissolved to form a colorant (dye)-containing colored photopolymerizable composition B-1.

| Composition B-1 | |
|---|---|
| Cyclohexanone | 80 parts by mass |
| Colorant C.I. Acid Blue 108 | 7.5 parts by mass |
| Colorant C.I. Solvent Yellow 162 | 2.5 parts by mass |
| Radical-polymerizable monomer (polymerizable compound) (a mixture of pentaerythritol triacrylate and dipentaerythritol hexaacrylate (3:7)) | 7.0 parts by mass |
| Compound 31 (novel oxime compound) | 2.5 parts by mass |
| Glycerol propoxylate (number average molecular weight Mn: 1,500, molar absorption coefficient $\epsilon = 0$) | 0.5 parts by mass |

4. Evaluation of Storage Stability of Colored Photopolymerizable Composition B-1 (Coating Liquid)

After the colored photopolymerizable composition B-1 was stored at room temperature for 1 month, the degree of precipitation of matters was visually evaluated according to the criteria below. The results are shown in Table 11.

A: No precipitation was observed;

B: Precipitation was slightly observed;

C: Precipitation was observed.

5. Preparation of Color Filter by Using Colored Photopolymerizable Composition B-1 and Evaluation Thereof The colored photopolymerizable composition B-1 prepared in the section 3 was applied to the undercoat layer of the silicon wafer substrate having an undercoat layer obtained in the section 2 so that a photosetting coating film was formed. The coating film was then heated (pre-baked) with a hot plate at 100° C. for 120 seconds so as to provide a dry thickness of 0.9 ηm.

The film was then exposed to light with a wavelength of 365 nm through a mask having a 2 μm square island pattern at exposure amounts in the range of 10 to 1,600 mJ/cm$^2$ using an i-line stepper exposure system (trade name: FPA-3000i5+, manufactured by Cannon Inc.).

The silicon wafer substrate having the irradiated coating film was then mounted on a horizontal rotary table of a spin-shower developing machine (trade name: Model DW-30, manufactured by Chemitronics Co., Ltd.) and subjected to a paddle development process at 23° C. for 60 seconds with CD-2000 (manufactured by Fuji Film Electronics Materials Co., Ltd.) so that a colored pattern was formed on the silicon wafer substrate.

The silicon wafer substrate having the colored pattern formed thereon was fixed on the horizontal rotary table by vacuum chucking. The colored pattern was rinsed with a shower of pure water supplied from above the rotation center with a spray nozzle, while the silicon wafer substrate was rotated at a rotation number of 50 r.p.m by means of a rotator, and then the colored pattern was spray-dried.

As a result, a color filter comprising the substrate and the colored pattern formed thereon was obtained.

Exposure Sensitivity and Size of Pattern

The minimum exposure amount at which the post-development thickness of the region that was irradiated with light in the exposure step became 95% or more of the thickness (100%) of the film before the exposure was evaluated as the exposure requirement amount. A smaller exposure requirement amount indicates a higher sensitivity.

In this process, the size of the colored pattern was measured using a length measuring SEM (trade name: S-9260A, manufactured by Hitachi High-Technologies Corporation). A pattern size that is closer to 2 μm indicates sufficient curing and higher sensitivity.

The results are shown in Table 11.

Developability, Coloration by Heat Aging, Adhesion to Substrate, and Cross-Sectional Shape of Pattern Developability, coloration by heat aging, adhesion to the substrate, and the cross-sectional shape of the pattern were evaluated according to the methods and the criteria employed in Example 5-1. The results are shown in Table 11 below.

Examples 6-2 to 6-9 and Comparative Examples 6-1 to 6-4

Colored photopolymerizable compositions B-2 to B-9 and B'-1 to B'-4 and color filters were prepared in the same manner as in Example 6-1, except that each compound in the amount shown in Table 11 below were used in place of 2.5 parts by mass of Compound 31 (the novel oxime compound) of the composition B-1 used in the preparation of the colored photopolymerizable composition B-1 and that a sensitizer and a co-sensitizer of the type and in the amount shown in Table 11 were further added in Example 6-9. Evaluations were also performed in the same way as in Example 6-1. The results are shown in Table 11.

TABLE 11

| | Composition | Specific Oxime Compound or Comparative Compound: Type | Specific Oxime Compound or Comparative Compound: Amount (parts by mass) | Sensitizer: Type | Sensitizer: Amount (parts by mass) | Co-Sensitizer: Type | Co-Sensitizer: Amount (parts by mass) | Storage Stability | Exposure requirement amount (mJ/cm²) | Pattern size (μm) | Developability | Coloration by heat aging | Adhesion to Substrate | Cross-Sectional Shape of Pattern |
|---|---|---|---|---|---|---|---|---|---|---|---|---|---|---|
| Ex. 6-1 | B-1 | Compound 31 | 2.5 | — | — | — | — | A | 1000 | 1.96 | A | A | A | Forward Tapered |
| Ex. 6-2 | B-2 | Compound 32 | 2.5 | — | — | — | — | A | 1100 | 1.95 | A | A | A | Forward Tapered |
| Ex. 6-3 | B-3 | Compound 33 | 2.5 | — | — | — | — | A | 1000 | 1.96 | A | A | A | Forward Tapered |
| Ex. 6-4 | B-4 | Compound 34 | 2.5 | — | — | — | — | A | 1200 | 1.94 | A | A | A | Rectangular |
| Ex. 6-5 | B-5 | Compound 35 | 2.5 | — | — | — | — | A | 1000 | 1.96 | A | A | A | Forward Tapered |
| Ex. 6-6 | B-6 | Compound 36 | 2.5 | — | — | — | — | A | 1000 | 1.96 | A | A | A | Forward Tapered |
| Ex. 6-7 | B-7 | Compound 37 | 2.5 | — | — | — | — | A | 1300 | 1.92 | A | A | A | Rectangular |
| Ex. 6-8 | B-8 | Compound 38 | 2.5 | — | — | — | — | A | 1300 | 1.92 | A | A | A | Rectangular |
| Ex. 6-9 | B-9 | Compound 31 | 1.5 | A3 | 0.5 | F3 | 0.5 | A | 900 | 1.97 | A | A | A | Forward Tapered |
| Comp. Ex. 6-1 | B'-1 | Comparative Compound 31 | 2.5 | — | — | — | — | A | 1400 | 1.92 | A | C | A | Rectangular |
| Comp. Ex. 6-2 | B'-2 | Comparative Compound 32 | 2.5 | — | — | — | — | A | 1300 | 1.92 | A | C | A | Rectangular |
| Comp. Ex. 6-3 | B'-3 | Comparative Compound 33 | 2.5 | — | — | — | — | A | 2000 | 1.90 | A | B | B | Inversely Tapered |
| Comp. Ex. 6-4 | B'-4 | Comparative Compound 34 | 2.5 | — | — | — | — | A | 1300 | 1.92 | A | C | A | Rectangular |

Sensitizer A3 and Co-Sensitizer F3 shown in Table 11 are the compounds described above.

Example 6-10

The compounds for the composition C-1 described below were mixed and dissolved to form a colorant (pigment)-containing colored photopolymerizable composition C-1.

| Composition C-1 | |
|---|---|
| Ethyl 3-ethoxypropionate (solvent) | 17.9 parts by mass |
| Colorant: a dispersion liquid of C.I. Pigment Red 254 (solids content: 15% by mass, the pigment content in the solids: 60%) | 26.7 parts by mass |
| Colorant: a dispersion liquid of C.I. Pigment Yellow 139 (solids content: 15% by mass, the pigment content in the solids: 60%) | 17.8 parts by mass |
| Radical-polymerizable monomer (polymerizable compound) (a mixture of pentaerythritol triacrylate and dipentaerythritol hexaacrylate (3:7)) | 3.5 parts by mass |
| Compound 31 (novel oxime compound) | 0.5 parts by mass |
| Benzyl methacrylate/methacrylic acid copolymer (70/30 in molar ratio) | 2.0 parts by mass |

Examples 6-11 to 6-20 and Comparative Examples 6-5 to 6-8

Colored photopolymerizable compositions C-2 to C-11 and C'-1 to C'-4 were prepared in the same manner as in Example 6-10, except that each compound in the amount shown in Table 12 below were used in place of 0.5 parts by mass of Compound 31 (the novel oxime compound) of the composition C-1 used in the preparation of the colored photopolymerizable composition C-1 and that a sensitizer and a co-sensitizer of the type and in the amount shown in Table 12 were further added in each of Examples 6-18 to 6-20.

Each of the resulting colored photopolymerizable compositions was evaluated in the same way as in Example 6-1. The results are shown in Table 12.

TABLE 12

| | Composition | Specific Oxime Compound or Comparative Compound Type | Amount (parts by mass) | Sensitizer Type | Amount (parts by mass) | Co-Sensitizer Type | Amount (parts by mass) | Storage Stability | Exposure requirement amount (mJ/cm$^2$) | Pattern size (μm) | Developability | Coloration by heat aging | Adhesion to Substrate | Cross-Sectional Shape of Pattern |
|---|---|---|---|---|---|---|---|---|---|---|---|---|---|---|
| Ex. 6-10 | Compound C-1 | 31 | 0.5 | — | — | — | — | A | 800 | 1.97 | A | A | A | Forward Tapered |
| Ex. 6-11 | Compound C-2 | 32 | 0.5 | — | — | — | — | A | 900 | 1.97 | A | A | A | Forward Tapered |
| Ex. 6-12 | Compound C-3 | 33 | 0.5 | — | — | — | — | A | 800 | 1.97 | A | A | A | Forward Tapered |
| Ex. 6-13 | Compound C-4 | 34 | 0.5 | — | — | — | — | A | 1000 | 1.96 | A | A | A | Forward Tapered |
| Ex. 6-14 | Compound C-5 | 35 | 0.5 | — | — | — | — | A | 800 | 1.97 | A | A | A | Forward Tapered |
| Ex. 6-15 | Compound C-6 | 36 | 0.5 | — | — | — | — | A | 800 | 1.97 | A | A | A | Forward Tapered |
| Ex. 6-16 | Compound C-7 | 37 | 0.5 | — | — | — | — | A | 1100 | 1.95 | A | A | A | Rectangular |
| Ex. 6-17 | Compound C-8 | 38 | 0.5 | — | — | — | — | A | 1100 | 1.95 | A | A | A | Rectangular |
| Ex. 6-18 | Compound C-9 | 31 | 0.3 | A1 | 0.1 | F2 | 0.1 | A | 700 | 1.98 | A | A | A | Forward Tapered |
| Ex. 6-19 | Compound C-10 | 32 | 0.3 | A3 | 0.1 | F2 | 0.1 | A | 700 | 1.98 | A | A | A | Forward Tapered |
| Ex. 6-20 | Compound C-11 | 32 | 0.3 | A3 | 0.1 | F3 | 0.1 | A | 600 | 1.98 | A | A | A | Forward Tapered |
| Comp. Ex. 6-5 | Comparative Compound C'-1 | 31 | 0.5 | — | — | — | — | A | 1200 | 1.92 | A | C | A | Rectangular |
| Comp. Ex. 6-6 | Comparative Compound C'-2 | 32 | 0.5 | — | — | — | — | A | 1300 | 1.92 | A | C | A | Rectangular |
| Comp. Ex. 6-7 | Comparative Compound C'-3 | 33 | 0.5 | — | — | — | — | A | 1500 | 1.93 | A | B | B | Inversely Tapered |
| Comp. Ex. 6-8 | Comparative Compound C'-4 | 34 | 0.5 | — | — | — | — | A | 1200 | 1.92 | A | C | A | Rectangular |

Sensitizers A1 and A3 and Co-Sensitizers F2 and F3 shown in Table 12 are the compounds described above.

Example 6-21

The compounds for the composition D-1 described below were mixed and dissolved to form a colorant (pigment)-containing colored photopolymerizable composition D-1.

| Composition D-1 | |
|---|---|
| Ethyl 3-ethoxypropionate (solvent) | 17.9 parts by mass |
| Colorant: a dispersion liquid of C.I. Pigment Red 254 (solids content: 15% by mass, the pigment content in the solids: 60%) | 33.34 parts by mass |
| Colorant: a dispersion liquid of C.I. Pigment Yellow 139 (solids content: 15% by mass, the pigment content in the solids: 60%) | 22.23 parts by mass |
| Radical-polymerizable monomer (polymerizable compound) (a mixture of pentaerythritol triacrylate and dipentaerythritol hexaacrylate (3:7)) | 2.5 parts by mass |

-continued

| Composition D-1 | |
|---|---|
| Compound 31 (novel oxime compound) | 0.5 parts by mass |
| Benzyl methacrylate/methacrylic acid copolymer (70/30 in molar ratio) | 2.0 parts by mass |

Examples 6-22 to 6-28 and Comparative Examples 6-9 to 6-12

Colored photopolymerizable compositions D-2 to D-8 and D'-1 to D'-4 were prepared in the same manner as in Example 6-21, except that 0.5 parts by mass of each compound shown in Table 13 below was used in place of 0.5 parts by mass of Compound 31 (the novel oxime compound) of the composition D-1 used in the preparation of the colored photopolymerizable composition D-1.

Each of the resulting colored photopolymerizable compositions was evaluated in the same way as in Example 6-1. The results are shown in Table 13.

TABLE 13

| | Composition | Specific Oxime Compound or Comparative Compound Type | Amount (parts by mass) | Storage Stability | Exposure requirement amount (mJ/cm$^2$) | Pattern size (μm) | Developability | Coloration by heat aging | Adhesion to Substrate | Cross-Sectional Shape of Pattern |
|---|---|---|---|---|---|---|---|---|---|---|
| Ex. 6-21 | D-1 | Compound 31 | 0.5 | A | 1500 | 1.96 | A | A | A | Forward Tapered |
| Ex. 6-22 | D-2 | Compound 32 | 0.5 | A | 1600 | 1.95 | A | A | A | Forward Tapered |
| Ex. 6-23 | D-3 | Compound 33 | 0.5 | A | 1500 | 1.96 | A | A | A | Forward Tapered |
| Ex. 6-24 | D-4 | Compound 34 | 0.5 | A | 1700 | 1.94 | A | A | A | Rectangular |
| Ex. 6-25 | D-5 | Compound 35 | 0.5 | A | 1500 | 1.96 | A | A | A | Forward Tapered |
| Ex. 6-26 | D-6 | Compound 36 | 0.5 | A | 1500 | 1.96 | A | A | A | Forward Tapered |
| Ex. 6-27 | D-7 | Compound 37 | 0.5 | A | 2000 | 1.92 | A | A | A | Rectangular |
| Ex. 6-28 | D-8 | Compound 38 | 0.5 | A | 2000 | 1.92 | A | A | A | Rectangular |
| Comp. Ex. 6-9 | D'-1 | Comparative Compound 31 | 0.5 | A | 3000 | 1.92 | A | C | A | Rectangular |
| Comp. Ex. 6-10 | D'-2 | Comparative Compound 32 | 0.5 | A | 2800 | 1.92 | A | C | A | Rectangular |
| Comp. Ex. 6-11 | D'-3 | Comparative Compound 33 | 0.5 | A | 5000 | 1.93 | A | B | B | Inversely Tapered |
| Comp. Ex. 6-12 | D'-4 | Comparative Compound 34 | 0.5 | A | 2800 | 1.93 | A | B | A | Inversely Tapered |

The results of Tables 11 to 13 indicate that the colored photopolymerizable composition of each Example containing the novel oxime compound (each of Compounds 31 to 38) has high storage stability (stability over time). It is also apparent that these colored photopolymerizable compositions have high sensitivity at exposure, show high developability in the process of forming colored patterns for a color filter, and form a colored pattern with excellent adhesion to the substrate and with an excellent cross-sectional shape but without a coloration during heating over time.

Table 13 also indicates that even when the pigment content is relatively high, the composition of each Example still has high sensitivity at exposure.

Examples 7-1 to 7-7 and Comparative Examples 7-1 and 7-3

Preparation of Support

The surface of a 0.30 mm-thick aluminum (grade 1S) plate was grained with a nylon brush (No. 8) and an aqueous suspension of 800-mesh pumice stone and then sufficiently washed with water. After the aluminum plate was etched by immersing it in an aqueous solution of 10% sodium hydroxide at 70° C. for 60 seconds, it was washed with running water and then neutralized with a 20% $HNO_3$ solution and washed with water. The surface of the aluminum plate was then electrolytically roughened in an aqueous solution of 1% nitric acid aqueous solution at VA=12.7 V under the application of a sinusoidal alternating current with an anodic electric quantity of 300 C/dm$^2$. The resulting surface roughness was measured to be 0.45 μm (in terms of Ra). Subsequently, the aluminum plate was immersed in an aqueous solution of 30% $H_2SO_4$ at 55° C. for 2 minutes for desmutting. The aluminum plate was then anodized in an aqueous solution of 20% $H_2SO_4$ at 33° C. for 50 seconds at a current density of 5 A/dm$^2$ with a cathode placed on the grained surface so that an anodized layer having a thickness of 2.7 g/m$^2$was formed.

As a result, a support for a planographic printing plate precursor was obtained.

Formation of Photosensitive Layer

A photosensitive layer coating liquid with the composition described below was applied to the resulting support so as to provide a dry coating amount of 1.4 g/m$^2$ and dried at 95° C. so that a photosensitive layer was formed.

| Photosensitive Layer Coating Liquid Composition | |
|---|---|
| Addition-polymerizable compound (the compound shown in Table 14 below) | 0.80 parts by mass |
| Binder polymer (the compound shown in Table 14) | 0.90 parts by mass |
| Sensitizer (the compound shown in Table 14) | absent or 0.10 parts by mass |
| Specific Oxime Compound or Comparative Compound (the compound shown in Table 14) | 0.05 parts by mass |
| Co-sensitizer (the compound shown in Table 14) | absent or 0.25 parts by mass |
| Fluorosurfactant (Magafac F-177 (trade name) manufactured by Dainippon Ink and Chemicals, Incorporated) | 0.02 parts by mass |
| Thermal polymerization inhibitor (N-nitrosohydroxylamine aluminum salt) | 0.03 parts by mass |
| ϵ type copper phthalocyanine dispersion | 0.2 parts by mass |
| Methyl ethyl ketone | 16.0 parts by mass |
| Propylene glycol monomethyl ether | 16.0 parts by mass |

Formation of Protective Layer

An aqueous solution of 3% by mass of polyvinyl alcohol (98% by mole in saponification degree and 550 in polymerization degree) was applied to the resulting photosensitive layer so as to provide a dry coating mass of 2 g/m$^2$ and dried at 100° C. for 2 minutes so that a protective layer was formed.

As a result of the process described above, planographic printing plate precursors of Examples and Comparative Examples were obtained, respectively.

Plate Making

Each planographic printing plate precursor was subjected to the exposure process and the development process described below.

Exposure

The planographic printing plate precursor was subjected to scanning exposure with a 405 nm (wavelength) violet LD (trade name: Violet Boxer, manufactured by FFEI Ltd.) at a exposure amount of 50 μJ/cm$^2$ under the conditions of 4,000 dpi and 175 lines/inch with respect to a solid image and a 1-99% dot image (at intervals of 1%).

Development

An automatic processor (trade name: LP-850P2, manufactured by FUJIFILM Corporation) into which Developer 1 shown below and a finishing gum liquid (trade name: FP-2W, manufactured by FUJIFILM Corporation) was loaded was used to perform a standard process. Preheating was performed under the conditions where the plate surface reached 100° C. The developer temperature was 30° C., and the time of immersion in the developer was about 15 seconds.

Developer 1 had the composition shown below, a pH of 11.5 at 25° C. and a conductivity of 5 mS/cm.

Composition of Developer 1

Potassium hydroxide 0.15 g

Polyoxyethylene phenyl ether (n=13) 5.0 g

CHELEST 400 (chelating agent) 0.1 g

Water 94.75 g

Evaluations

The sensitivity and storage stability of the planographic printing plate precursor were evaluated by the methods described below. The results are summarized and shown in Table 14.

1. Evaluation of Sensitivity

The planographic printing plate precursor was exposed to light under the conditions described above. Immediately after the exposure, the plate was developed under the conditions described above so that an image was formed. The area % of 50%-halftone dots was measured with a dot area measuring meter (Gretag Macbeth). A greater member indicates a higher sensitivity.

2. Test for Printing Durability of Image Portion

Printing with the planographic printing plate precursor was performed using an printing machine R201 (trade name) manufactured by Roland DG Corporation and "GEOS-G (N)" ink manufactured by Dainippon Ink and Chemicals, Incorporated. The solid image portion of each print was observed, the number of the prints obtained until the image began to fade was used to determine the printing durability. A greater number indicates a higher printing durability.

3. Evaluation of Storage Stability (Amount of Change by Forced Aging)

Each planographic printing plate precursor was sealed with aluminum kraft paper and interleaf paper and allowed to stand at 60° C. for 4 days. Thereafter, the dot area was measured by the same method as in the evaluation of the sensitivity. The difference between the dot area after being left for 4 days at 60° C. and the dot area before being left for 4 day at 60° C. was calculated so that the change (Δ%) in dot area by forced aging was determined. When the absolute value of the number is smaller, it is suggested that the influence of the forced aging is smaller, namely the stability over time is higher.

TABLE 14

| | Photosensitive Layer | | | | | | Amount of Change (%) by Forced Aging | Printing Durability Test on Image Portion (sheets) |
|---|---|---|---|---|---|---|---|---|
| | Novel Oxime Compound or Comparative Compound | Polymerizable Compound | Binder Polymer | Sensitizer | Co-Sensitizer | Sensitivity (%) | | |
| Ex. 7-1 | Compound 31 | M | B1 | — | — | 55 | 2.0 | 60000 |
| Ex. 7-2 | Compound 31 | M | B1 | A1 | F2 | 55 | 2.0 | 70000 |
| Ex. 7-3 | Compound 31 | N | B2 | A1 | F2 | 55 | 2.0 | 70000 |
| Ex. 7-4 | Compound 31 | O | B3 | A1 | F2 | 55 | 2.0 | 100000 |
| Ex. 7-5 | Compound 31 | O | B3 | A2 | F2 | 57 | 2.0 | 100000 |
| Ex. 7-6 | Compound 31 | O | B3 | A3 | F3 | 58 | 2.0 | 100000 |
| Ex. 7-7 | Compound 31 | O | B3 | A3 | F3 | 60 | 2.0 | 100000 |
| Comp. Ex. 7-1 | Comparative compound 31 | M | B1 | — | — | 50 | 2.0 | 40000 |
| Comp. Ex. 7-2 | Comparative compound 32 | M | B1 | — | — | 51 | 2.0 | 40000 |
| Comp. Ex. 7-3 | LD-5 | M | B1 | A1 | F2 | 53 | 2.0 | 40000 |

Table 14 above indicates that the planographic printing plate precursor of each of Examples 7-1 to 7-7 containing the novel oxime compound of the invention in the photosensitive layer showed a high level of sensitivity, stability over time and printing durability.

In contrast, the sensitivity, stability over time and printing durability of the planographic printing plate precursor of each of the Comparative Examples 7-1 to 7-3 were all lower than those of the planographic printing plates of Examples.

In Table 14, Sensitizers A1 to A3 and Co-Sensitizers F2 and F3 are the compound as described above, and Comparative Compound LD-5 is 2,2'-bis(2-chlorophenyl)-4,4',5'-tetraphenyl-1,2'-biimidazole.

Polymerizable Compounds M, N and O and Binder Polymers B1, B2 and B3 shown in Table 14 have the structures shown below.

M

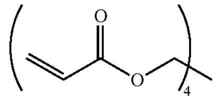

N

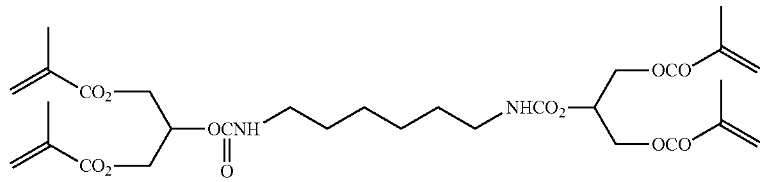

Isomer Mixture of the Following

O

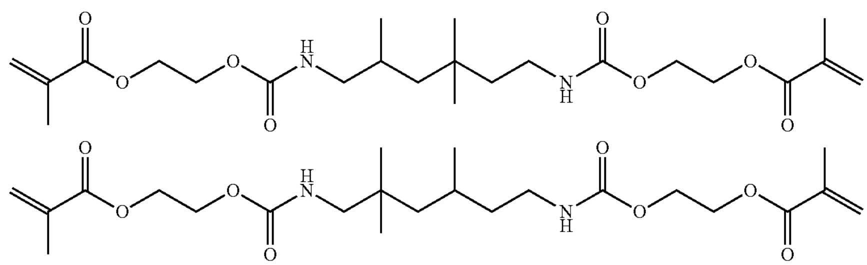

B1

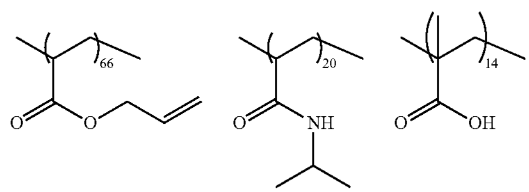

B2

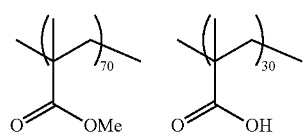

B3

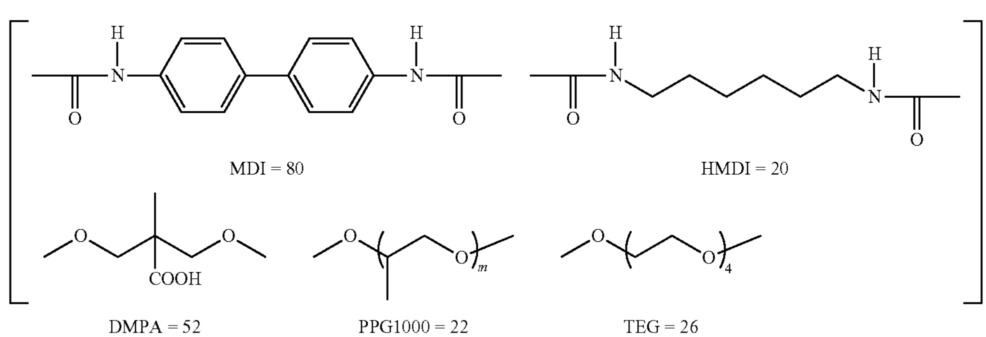

Examples 8-1 to 8-24 and Comparative Examples 8-1 to 8-16

Preparation of Black Photopolymerizable Composition

Preparation of Carbon Black Dispersion Liquid A

The composition 1 shown below was subjected to a high-viscosity dispersion process with two rolls to form a dispersion with a viscosity of 70,000 mPa·s.

The composition 2 shown below was then added to the dispersion, and the mixture was stirred with a homogenizer at 3,000 rpm for 3 hours. The resulting mixture solution was subjected to a micro-dispersion process for 4 hours in a dispersing machine (trade name: DISPERMAT, manufactured by Getzmann) with 0.3 mm zirconia beads so that a carbon black dispersion liquid A (hereinafter referred to as CB dispersion liquid A) was prepared. In this process, the mixture solution had a viscosity of 37 mPa·s.

| Composition 1 | |
|---|---|
| Carbon black (Pigment Black 7) with an average primary particle size of 15 nm: | 23 parts |
| A 45% solution of a benzyl methacrylate-methacrylic acid copolymer in propylene glycol monomethyl ether acetate (BzMA/MAA = 70/30, Mw: 30,000): | 22 parts |
| SOLSPERSE 5000 (manufactured by Zeneca Ltd.) | 1.2 parts |

| Composition 2 | |
|---|---|
| A 45% solution of a benzyl methacrylate-methacrylic acid copolymer in propylene glycol monomethyl ether acetate (BzMA/MAA = 70/30, Mw: 30,000): | 22 parts |
| Propylene glycol monomethyl ether acetate: | 200 parts |

Preparation of Black Titanium Oxide Dispersion Liquid A

The composition 3 shown below was subjected to a high-viscosity dispersion process with two rolls to form a dispersion liquid with a viscosity of 40,000 mPa·s.

Optionally, kneading with a kneader may be performed for 30 minutes before the high-viscosity dispersion process.

| Composition 3 | |
|---|---|
| Black titanium oxide 13M-C with an average primary particle size of 75 nm (Pigment Black 35, manufactured by Mitsubishi Materials Corporation): | 39 parts |
| A solution of a benzyl (meth)acrylate-(meth)acrylic acid copolymer in propylene glycol monomethyl ether acetate (BzMA/MAA = 70/30, Mw: 30,000, solids content: 40% by mass): | 8 parts |
| SOLSPERSE 5000 (manufactured by Zeneca Ltd.): | 1 part |

The composition 4 shown below was then added to the resulting dispersion, and the mixture was stirred with a homogenizer at 3,000 rpm for 3 hours. The resulting mixture solution was subjected to a micro-dispersion process for 4 hours in a dispersing machine (trade name: DISPERMAT, manufactured by Getzmann) with 0.3 mm zirconia beads so that a black titanium oxide dispersion liquid A (hereinafter referred to as TB dispersion liquid A) was prepared.

In this process, the mixture solution had a viscosity of 7.0 mPa·s.

| Composition 4 | |
|---|---|
| A solution of a benzyl (meth)acrylate-(meth)acrylic acid copolymer in propylene glycol monomethyl ether acetate (BzMA/MAA = 70/30, Mw: 30,000, solids content: 40% by mass): | 8 parts |
| Propylene glycol monomethyl ether acetate: | 200 parts |

Preparation of Black Photopolymerizable Compositions E-1 to E-24 and E'-1 to E'-16

The components for the composition E-a shown below were mixed in a mixer to form each of black photopolymerizable compositions E-1 to E-14 and E'-1 to E'-8.

| Composition E-a | |
|---|---|
| Methacrylate-acrylic acid copolymer (alkali-soluble resin): | 1.6 parts by mass |
| Dipentaerythritol hexaacrylate: | 2.3 parts by mass |
| Ethoxylated pentaerythritol tetraacrylate: | 0.8 parts by mass |
| CB dispersion liquid A or TB dispersion liquid A shown in Table 15 below: | 24 parts by mass |
| Propylene glycol monomethyl ether acetate: | 10 parts by mass |
| Ethyl-3-ethoxypropionate: | 8 parts by mass |
| Novel oxime compound (the compound shown in Table 15): | the amount shown in Table 15 |
| Co-sensitizer (F3 shown above): | absent or 0.1 parts by mass |

The components for the composition E-b shown below were mixed in an agitator to form each of black photopolymerizable compositions E-15 to E-24 and E'-9 to E'-16.

| Composition E-b | |
|---|---|
| Dipentaerythritol hexaacrylate: | 2.3 parts by mass |
| CB dispersion liquid A or TB dispersion liquid A shown in Table 16 below: | 24 parts by mass |
| Propylene glycol monomethyl ether acetate: | 10 parts by mass |
| Ethyl-3-ethoxypropionate: | 8 parts by mass |
| Novel oxime compound (the compound shown in Table 16): | the amount shown in Table 16 |
| Co-sensitizer (F3 shown above): | absent or 0.1 parts by mass |

Evaluations

The resulting black photopolymerizable composition E-1 to E-24 and E'-1 to E'-16 were each evaluated as described below. The results are summarized and shown in Tables 15 and 16.

Evaluation of Exposure Sensitivity

The exposure sensitivity of each of the black photopolymerizable compositions E-1 to E-24 and E'-1 to E'-16 was determined and evaluated by the method described below.

Each of the black photopolymerizable compositions E-1 to E-24 and E'-1 to E'-16 was used and uniformly applied to a silicon wafer by spin coating at a rotational speed that was controlled such that the thickness of the coating would be 1.0 μm after the coating was subjected to heat treatment on a hot plate at a surface temperature of 120° C. for 120 seconds conducted after the coating.

The resulting 1.0 μm-thick coating film was exposed to light from an i-line stepper (trade name: FPA-3000iS+, manufactured by Canon Inc.) at different exposure amounts in the range of 10 mJ/cm$^2$ to 5,100 mJ/cm$^2$ through a mask having a 10 nm L & S (line and space) pattern.

After the exposure, the coating film was subjected to a paddle development process at 23° C. for 60 seconds with an aqueous solution of 0.3% tetramethylammonium hydroxide (TMAH). The film was then rinsed with pure water for 20 seconds by spin shower and further washed with pure water. Thereafter, the deposited droplets of water were removed with high speed air, and the substrate was naturally dried, so that a black patterned image was obtained.

Each of the resulting colored patterned images was evaluated with an optical microscope according to the criteria below.

The minimum exposure amount at which the post-development thickness of the region that was irradiated with light in the exposure step became 95% or more of the thickness (100%) of the film before the exposure was measured and evaluated as the exposure requirement amount.

A smaller exposure amount indicates a higher sensitivity.

Evaluation of Storage Stability (Stability Over Time)

The stability over time (storage stability) of the resulting black photopolymerizable compositions E-1 to E-24 and E'-1 to E'-16 was evaluated by the method described below.

After the black photopolymerizable compositions E-1 to E-24 and E'-1 to E'-16 were each stored at room temperature for one month, the degree of precipitation of matters was visually evaluated according to the following criteria:

A: No precipitation was observed;

B: Precipitation was slightly observed;

C: Precipitation was observed.

Evaluation of Developability

The developability of the resulting black photopolymerizable compositions E-1 to E-24 and E'-1 to E'-16 was evaluated by the method described below.

The presence or absence of residues in the region (unexposed portion) which was not irradiated with light in the exposure step for the sensitivity evaluation was observed, so as to evaluate the developability. The evaluation was preformed according to the following criteria:

A: No residue was observed in the unexposed portion;

B: Residues were slightly observed in the unexposed portion, but the residue level was practically acceptable;

C: Residues were significantly observed in the unexposed portion.

TABLE 15

| | Composition | Composition | Dispersion liquid | Specific Oxime Compound or Comparative Compound Type | Specific Oxime Compound or Comparative Compound Amount (parts by mass) | Co-Sensitizer Type | Co-Sensitizer Amount | Exposure requirement amount (mJ/cm$^2$) | Storage Stability | Developability |
|---|---|---|---|---|---|---|---|---|---|---|
| Ex. 8-1 | E-1 | E-a | CB Dispersion liquid A | Compound 31 | 0.8 parts by mass | — | — | 100 | A | A |
| Ex. 8-2 | E-2 | E-a | CB Dispersion liquid A | Compound 32 | 0.8 parts by mass | — | — | 100 | A | A |
| Ex. 8-3 | E-3 | E-a | CB Dispersion liquid A | Compound 33 | 0.8 parts by mass | — | — | 100 | A | A |
| Ex. 8-4 | E-4 | E-a | CB Dispersion liquid A | Compound 34 | 0.8 parts by mass | — | — | 100 | A | A |
| Ex. 8-5 | E-5 | E-a | CB Dispersion liquid A | Compound 37 | 0.8 parts by mass | — | — | 300 | A | A |
| Ex. 8-6 | E-6 | E-a | CB Dispersion liquid A | Compound 38 | 0.7 parts by mass | — | — | 300 | A | A |
| Ex. 8-7 | E-7 | E-a | CB Dispersion liquid A | Compound 31 | 0.1 parts by mass | F3 | 0.1 parts by mass | 80 | A | A |
| Ex. 8-8 | E-8 | E-a | TB Dispersion liquid A | Compound 31 | 0.8 parts by mass | — | — | 200 | A | A |
| Ex. 8-9 | E-9 | E-a | TB Dispersion liquid A | Compound 32 | 0.8 parts by mass | — | — | 200 | A | A |
| Ex. 8-10 | E-10 | E-a | TB Dispersion liquid A | Compound 33 | 0.8 parts by mass | — | — | 200 | A | A |
| Ex. 8-11 | E-11 | E-a | TB Dispersion liquid A | Compound 34 | 0.8 parts by mass | — | — | 200 | A | A |
| Ex. 8-12 | E-12 | E-a | TB Dispersion liquid A | Compound 37 | 0.8 parts by mass | — | — | 400 | A | A |
| Ex. 8-13 | E-13 | E-a | TB Dispersion liquid A | Compound 38 | 0.8 parts by mass | — | — | 400 | A | A |
| Ex. 8-14 | E-14 | E-a | TB Dispersion liquid A | Compound 31 | 0.7 parts by mass | F3 | 0.1 parts by mass | 150 | A | A |
| Comp. Ex. 8-1 | E'-1 | E-a | CB Dispersion liquid A | Comparative compound 31 | 0.8 parts by mass | — | — | 600 | A | A |
| Comp. Ex. 8-2 | E'-2 | E-a | CB Dispersion liquid A | Comparative compound 32 | 0.8 parts by mass | — | — | 500 | A | A |
| Comp. Ex. 8-3 | E'-3 | E-a | CB Dispersion liquid A | Comparative compound 33 | 0.8 parts by mass | — | — | 2000 | A | A |
| Comp. Ex. 8-4 | E'-4 | E-a | CB Dispersion liquid A | Comparative compound 34 | 0.8 parts by mass | — | — | 500 | A | A |
| Comp. Ex. 8-5 | E'-5 | E-a | TB Dispersion liquid A | Comparative compound 31 | 0.8 parts by mass | — | — | 800 | A | A |
| Comp. Ex. 8-6 | E'-6 | E-a | TB Dispersion liquid A | Comparative compound 32 | 0.8 parts by mass | — | — | 700 | A | A |
| Comp. Ex. 8-7 | E'-7 | E-a | TB Dispersion liquid A | Comparative compound 33 | 0.8 parts by mass | — | — | 3000 | A | A |
| Comp. Ex. 8-8 | E'-8 | E-a | TB Dispersion liquid A | Comparative compound 34 | 0.8 parts by mass | — | — | 700 | A | A |

TABLE 16

| | Composition | Composition | Dispersion liquid | Specific Oxime Compound or Comparative Compound Type | Specific Oxime Compound or Comparative Compound Amount (parts by mass) | Co-Sensitizer Type | Co-Sensitizer Amount | Exposure requirement amount (mJ/cm$^2$) | Storage Stability | Developability |
|---|---|---|---|---|---|---|---|---|---|---|
| Ex. 8-15 | E-15 | E-b | CB Dispersion liquid A | Compound 31 | 0.8 parts by mass | — | — | 500 | A | A |
| Ex. 8-16 | E-16 | E-b | CB Dispersion liquid A | Compound 31 | 0.8 parts by mass | — | — | 500 | A | A |
| Ex. 8-17 | E-17 | E-b | CB Dispersion liquid A | Compound 37 | 0.8 parts by mass | — | — | 700 | A | A |
| Ex. 8-18 | E-18 | E-b | CB Dispersion liquid A | Compound 38 | 0.8 parts by mass | — | — | 700 | A | A |
| Ex. 8-19 | E-19 | E-b | CB Dispersion liquid A | Compound 31 | 0.7 parts by mass | F3 | 0.1 | 300 | A | A |
| Ex. 8-20 | E-20 | E-b | TB Dispersion liquid A | Compound 31 | 0.7 parts by mass | — | — | 600 | A | A |
| Ex. 8-21 | E-21 | E-b | TB Dispersion liquid A | Compound 32 | 0.7 parts by mass | — | — | 600 | A | A |
| Ex. 8-22 | E-22 | E-b | TB Dispersion liquid A | Compound 37 | 0.7 parts by mass | — | — | 800 | A | A |
| Ex. 8-23 | E-23 | E-b | TB Dispersion liquid A | Compound 38 | 0.7 parts by mass | — | — | 800 | A | A |
| Ex. 8-24 | E-24 | E-b | TB Dispersion liquid A | Compound 31 | 1.5 parts by mass | F3 | 0.1 | 400 | A | A |
| Comp. Ex. 8-9 | E'-9 | E-b | CB Dispersion liquid A | Comparative compound 31 | 0.8 parts by mass | — | — | 900 | A | B |
| Comp. Ex. 8-10 | E'-10 | E-b | CB Dispersion liquid A | Comparative compound 32 | 0.8 parts by mass | — | — | 800 | A | B |

TABLE 16-continued

| | Composition | Composition | Dispersion liquid | Specific Oxime Compound or Comparative Compound Type | Specific Oxime Compound or Comparative Compound Amount (parts by mass) | Co-Sensitizer Type | Co-Sensitizer Amount | Exposure requirement amount (mJ/cm$^2$) | Storage Stability | Developability |
|---|---|---|---|---|---|---|---|---|---|---|
| Comp. Ex. 8-11 | E'-11 | E-b | CB Dispersion liquid A | Comparative compound 33 | 0.8 parts by mass | — | — | 4000 | A | A |
| Comp. Ex. 8-12 | E'-12 | E-b | CB Dispersion liquid A | Comparative compound 34 | 0.8 parts by mass | — | — | 800 | A | B |
| Comp. Ex. 8-13 | E'-13 | E-b | TB Dispersion liquid A | Comparative compound 31 | 0.8 parts by mass | — | — | 1000 | A | B |
| Comp. Ex. 8-14 | E'-14 | E-b | TB Dispersion liquid A | Comparative compound 32 | 0.8 parts by mass | — | — | 900 | A | B |
| Comp. Ex. 8-15 | E'-15 | E-b | TB Dispersion liquid A | Comparative compound 33 | 0.8 parts by mass | — | — | 5000 | A | A |
| Comp. Ex. 8-16 | E'-16 | E-b | TB Dispersion liquid A | Comparative compound 34 | 0.8 parts by mass | — | — | 900 | A | B |

Tables 15 and 16 indicate that the black photopolymerizable composition of each Example containing the novel oxime compound has high storage stability (stability over time). It is also apparent that these black photopolymerizable compositions have high sensitivity at exposure and high developability of unexposed portions as compared with the comparative examples and thus can form excellent black patterns (colored patterns) even with a relatively low exposure amount.

What is claimed is:

1. A compound represented by the following Formula (2):

(2)

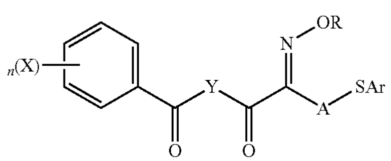

wherein, in Formula (2), R and X each independently represent a monovalent substituent, A and Y each independently represent a divalent organic group, Ar represents an aryl group, and n represents an integer of 0 to 5.

2. A photopolymerizable composition comprising:

the compound of claim 1; and a polymerizable compound.

3. A planographic printing plate precursor comprising a photosensitive layer provided on a support, wherein the photosensitive layer comprises the photopolymerizable composition of claim 2.

4. The photopolymerizable composition of claim 2, further comprising a colorant.

5. The photopolymerizable composition of claim 4, wherein the colorant is a pigment, and the photopolymerizable composition further comprises a pigment dispersing agent.

6. The photopolymerizable composition of claim 4, wherein the colorant is a black colorant.

7. A photopolymerizable composition for a color filter, comprising the photopolymerizable composition of claim 4.

8. A color filter comprising a colored pattern provided on a support, wherein the colored pattern is produced by using the photopolymerizable composition of claim 7.

9. A solid-state imaging device comprising the color filter of claim 8.

10. A method for producing a color filter comprising:

applying the photopolymerizable composition of claim 7 to a support to form a photopolymerizable composition layer;

exposing the photopolymerizable composition layer to light through a mask; and developing the exposed composition layer to form a colored pattern.

11. A compound represented by the following Formula (3):

(3)

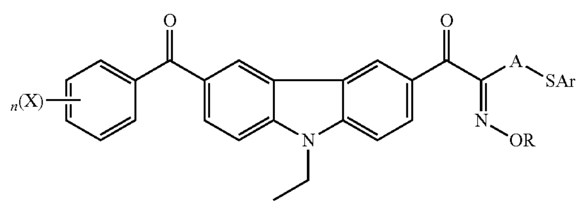

wherein, in Formula (3), R and X each independently represent a monovalent substituent, A represents a divalent organic group, Ar represents an aryl group, and n represents an integer of 0 to 5.

12. A compound represented by the following Formula (1):

(1)

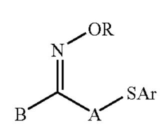

wherein, in Formula (1), R and B each independently represent a monovalent substituent, A represents an unsubstituted alkylene group, and Ar represents an aryl group.

13. A compound represented by the following Formula (1):

(1)

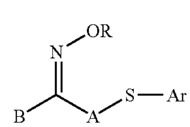

wherein, in Formula (1), R represents a monovalent substituent, B represents an optionally substituted heterocyclic carbonyl group, A represents a divalent organic group, and Ar represents an aryl group.

14. A photosensitive composition comprising a compound represented by the following Formula (I-I) or Formula (I-II):

(I-I)

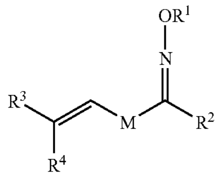

wherein, in Formula (I-I), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, $R^3$ and $R^4$ each independently represent an alkoxycarbonyl group, a cyano group or a phenyl group, and $R^3$ and $R^4$ may be bonded to each other to form a ring, (I-II)

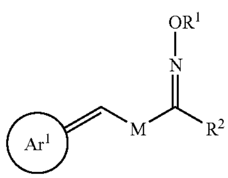

wherein, in Formula (I-II), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, and $Ar^1$ represents a hydrocarbon ring group or a heterocyclic group.

15. A curable composition comprising a compound represented by the following Formula (I-I) or Formula (I-II) and a polymerizable compound:

(I-I)

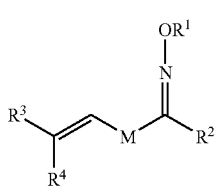

wherein, in Formula (I-I), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, $R^3$ and $R^4$ each independently represent an alkoxycarbonyl group, a cyano group or a phenyl group, and $R^3$ and $R^4$ may be bonded to each other to form a ring, (I-II)

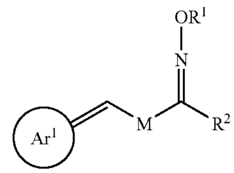

wherein, in Formula (I-II), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, and $Ar^1$ represents a hydrocarbon ring group or a heterocyclic group.

16. The curable composition of claim 15, wherein $R^2$ in Formulae (I-I) and (I-II) represents a hydrogen atom, an alkyl group having 1 to 20 carbon atoms, an alkenyl group having 1 to 20 carbon atoms, a halogen atom, an aryl group, a cycloalkyl group having 3 to 8 carbon atoms, or an alkanoyl group having 2 to 20 carbon atoms.

17. The curable composition of claim 15, wherein $R^1$ in Formulae (I-I) and (I-II) represents an acyl group having 2 to 20 carbon atoms.

18. The curable composition of claim 15, further comprising a sensitizer.

19. The curable composition of claim 15, further comprising a thiol compound.

20. The curable composition of claim 15, further comprising a colorant.

21. A curable composition for a color filter, comprising the curable composition of claim 20.

22. A color filter, comprising a colored pattern provided on a support, wherein the colored pattern is produced by using the curable composition of claim 21.

23. A method for producing a color filter comprising:

applying the curable composition of claim 21 to a support to form a curable composition layer;

exposing the curable composition layer to light through a mask; and developing the exposed composition layer to form a colored pattern.

24. The curable composition of claim 15, wherein $R^2$ in Formulae (I-I) and (I-II) represents an alkyl group having 1 to 20 carbon atoms.

25. A photosensitive composition comprising a compound represented by the following Formula (I-I) or Formula (I-II):

(I-I)

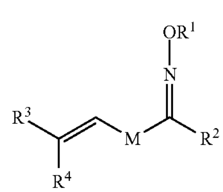

wherein, in Formula (I-I), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, $R^3$ and $R^4$ each independently represent a hydrogen atom or a monovalent substituent, and $R^3$ and $R^4$ may be bonded to each other to form a ring, and at least one of $R^3$ and $R^4$ represents an alkoxycarbonyl group, a cyano group or a phenyl group, (I-II)

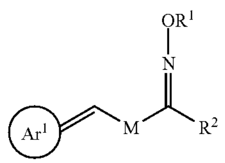

wherein, in Formula (I-II), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, and $Ar^1$ represents a hydrocarbon ring group or a heterocyclic group.

26. A curable composition comprising a compound represented by the following Formula (I-I) or Formula (I-II) and a polymerizable compound:

(I-I)

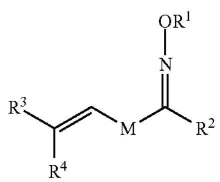

wherein, in Formula (I-I), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, $R^3$ and $R^4$ each independently represent a hydrogen atom or a monovalent substituent, and $R^3$ and $R^4$ may be bonded to each other to form a ring, and at least one of $R^3$ and $R^4$ represents an alkoxycarbonyl group, a cyano group or a phenyl group, (I-II)

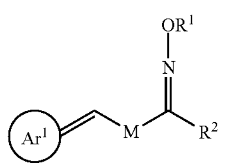

wherein, in Formula (I-II), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, and $Ar^1$ represents a hydrocarbon ring group or a heterocyclic group.

27. A photosensitive composition comprising a compound represented by the following Formula (I-I) or Formula (I-II):

(I-I)

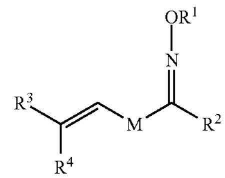

wherein, in Formula (I-I), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, $R^3$ and $R^4$ each independently represent a hydrogen atom or a monovalent substituent, and $R^3$ and $R^4$ may be bonded to each other to form a ring, and the divalent linking group represented by M is (A), (B), (C) or (D) as follows:

(A)

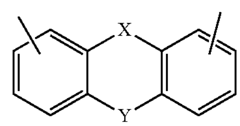

(B)

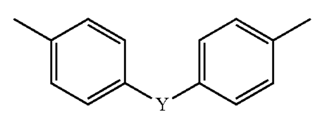

(C)

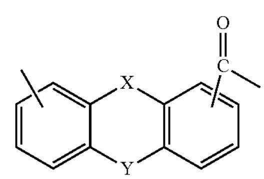

(D)

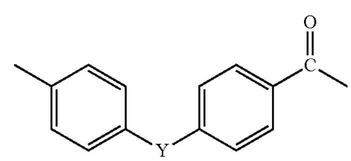

wherein in groups (A), (B), (C), and (D), X is a single bond, —O—, —S—, $NR^5$—, or —CO—, and Y is —O—, —S—, —$NR^5$—, —CO—, or —$CH_2$—, $R^5$ represents a hydrogen atom, an alkyl group having 1 to 20 carbon atoms, a hydroxyalkyl group having 2 to 4 carbon atoms, an alkoxyalkyl group having 2 to 10 carbon atoms, an alkenyl group having 2 to 5 carbon atoms, a cycloalkyl group having 3 to 8 carbon atoms, a phenyl-$C_1$ to $C_3$ alkyl group, alkanoyl group having 1 to 8 carbon atoms, an alkenoyl group having 3 to 12 carbon atoms, a benzoyl group, a phenyl group, or a naphthyl group, each of which may be unsubstituted or substituted by an alkyl of 1 to 12 carbon atoms, a benzoyl group or an alkoxy group having 1 to 12 carbon atoms, (I-II)

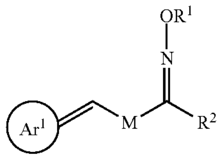

wherein, in Formula (I-II), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, and $Ar^1$ represents a hydrocarbon ring group or a heterocyclic group.

28. A curable composition comprising a compound represented by the following Formula (I-I) or Formula (I-II) and a polymerizable compound:

(I-I)

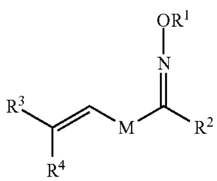

wherein in Formula (I-I), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, $R^3$ and $R^4$ each independently represent a hydrogen atom or a monovalent substituent, and $R^3$ and $R^4$ may be bonded to each other to form a ring, and the divalent linking group represented by M is (A), (B), (C) or (D) as follows:

(A)

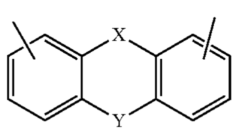

-continued (B)

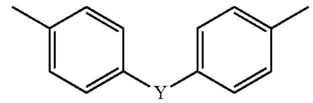

(C)

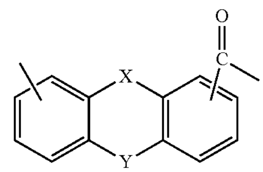

(D)

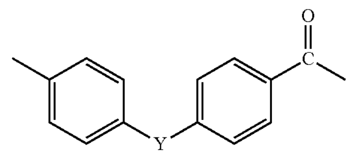

wherein in groups (A), (B), (C), and (D), X is a single bond, —O—, —S—, $NR^5$—, or —CO—, and Y is —O—, —S—, —$NR^5$—, —CO—, or —$CH_2$—, $R^5$ represents a hydrogen atom, an alkyl group having 1 to 20 carbon atoms, a hydroxyalkyl group having 2 to 4 carbon atoms, an alkoxyalkyl group having 2 to 10 carbon atoms, an alkenyl group having 2 to 5 carbon atoms, a cycloalkyl group having 3 to 8 carbon atoms, a phenyl-$C_1$ to $C_3$ alkyl group, alkanoyl group having 1 to 8 carbon atoms, an alkenoyl group having 3 to 12 carbon atoms, a benzoyl group, a phenyl group, or a naphthyl group, each of which may be unsubstituted or substituted by an alkyl of 1 to 12 carbon atoms, a benzoyl group or an alkoxy group having 1 to 12 carbon atoms, (I-II)

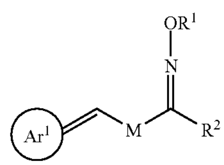

wherein, in Formula (I-II), $R^1$ represents a hydrogen atom, an alkyl group, an aryl group, an alkenyl group, an alkynyl group, an acyl group, an alkoxycarbonyl group, an aryloxycarbonyl group, heterocyclic group, or a dialkylaminocarbonyl group and $R^2$ represents a hydrogen atom or a monovalent substituent, M represents a divalent linking group, and $Ar^1$ represents a hydrocarbon ring group or a heterocyclic group.

* * * * *